US009760010B2

(12) United States Patent
Hatakeyama et al.

(10) Patent No.: US 9,760,010 B2
(45) Date of Patent: Sep. 12, 2017

(54) PATTERNING PROCESS

(71) Applicant: SHIN-ETSU CHEMICAL CO., LTD., Tokyo (JP)

(72) Inventors: Jun Hatakeyama, Joetsu (JP); Teppei Adachi, Joetsu (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 0 days.

(21) Appl. No.: 15/176,967

(22) Filed: Jun. 8, 2016

(65) Prior Publication Data

US 2016/0363866 A1 Dec. 15, 2016

(30) Foreign Application Priority Data

Jun. 9, 2015 (JP) ................................ 2015-116739

(51) Int. Cl.

| | |
|---|---|
| ***G03F 7/00*** | (2006.01) |
| ***G03F 7/38*** | (2006.01) |
| ***G03F 7/16*** | (2006.01) |
| ***C08F 220/22*** | (2006.01) |
| ***C08F 220/24*** | (2006.01) |
| ***G03F 7/32*** | (2006.01) |
| ***C08F 220/38*** | (2006.01) |
| ***G03F 7/26*** | (2006.01) |
| ***C08L 33/16*** | (2006.01) |
| ***G03F 7/20*** | (2006.01) |
| ***C08F 220/26*** | (2006.01) |
| ***B05D 3/04*** | (2006.01) |
| ***B05D 3/00*** | (2006.01) |
| ***H01L 21/027*** | (2006.01) |
| ***B05D 1/00*** | (2006.01) |
| ***G03F 7/004*** | (2006.01) |
| ***G03F 7/039*** | (2006.01) |
| ***G03F 7/11*** | (2006.01) |
| *H01L 21/308* | (2006.01) |

(52) U.S. Cl.

CPC ............... *G03F 7/38* (2013.01); *B05D 1/005* (2013.01); *B05D 3/007* (2013.01); *B05D 3/0433* (2013.01); *C08F 220/22* (2013.01); *C08F 220/24* (2013.01); *C08F 220/26* (2013.01); *C08F 220/38* (2013.01); *C08L 33/16* (2013.01); *G03F 7/0046* (2013.01); *G03F 7/0048* (2013.01); *G03F 7/0397* (2013.01); *G03F 7/11* (2013.01); *G03F 7/168* (2013.01); *G03F 7/2041* (2013.01); *G03F 7/26* (2013.01); *G03F 7/32* (2013.01); *H01L 21/0274* (2013.01); *C08L 2205/025* (2013.01); *H01L 21/3081* (2013.01)

(58) Field of Classification Search

CPC .......... G03F 7/004; G03F 7/11; G03F 7/2041; G03F 7/26; G03F 7/32; G03F 7/38; C08F 220/38; C08F 220/26; C08F 220/22; C08F 220/24; C08L 33/16; C08L 2205/025; H01L 21/0274; H01L 21/3081; B05D 1/005; B05D 3/007; B05D 3/0433; B05D 3/0485

USPC ......... 430/270.1, 271, 273.1, 322, 325, 329, 430/330, 331; 526/242, 319

See application file for complete search history.

(56) References Cited

U.S. PATENT DOCUMENTS

| | | | | |
|---|---|---|---|---|
| 6,643,604 | B1 * | 11/2003 | Subramanian .... H01L 21/67115 | 356/450 |
| 7,179,504 | B2 | 2/2007 | Kitano et al. | |
| 7,531,287 | B2 | 5/2009 | Kanda et al. | |
| 7,771,914 | B2 | 8/2010 | Hatakeyama et al. | |
| 8,124,320 | B2 * | 2/2012 | Blalock .................. G03F 7/422 | 430/311 |
| 8,349,549 | B2 * | 1/2013 | Maemori ................. G03F 7/38 | 430/270.1 |
| 8,411,246 | B2 * | 4/2013 | Inatomi .................... G03F 7/40 | 118/301 |
| 8,563,231 | B2 * | 10/2013 | Wang ...................... G03F 7/265 | 430/270.1 |
| 8,841,058 | B2 * | 9/2014 | Chang .................. G03F 7/0046 | 430/270.1 |
| 8,906,452 | B1 * | 12/2014 | Hillman ................. G03F 7/162 | 118/320 |
| 9,064,914 | B2 * | 6/2015 | Kaneyama ................ G03F 7/38 | |
| 9,250,523 | B2 | 2/2016 | Hatakeyama et al. | |
| 9,395,623 | B2 * | 7/2016 | Slafer ................ B29C 33/3857 | |
| 2002/0045105 | A1 * | 4/2002 | Brown ...................... G03F 1/78 | 430/5 |
| 2003/0211756 | A1 | 11/2003 | Ito et al. | |
| 2005/0022732 | A1 | 2/2005 | Ito et al. | |
| 2005/0026456 | A1 | 2/2005 | Ito et al. | |
| 2006/0246373 | A1 * | 11/2006 | Wang .................... G03F 7/0046 | 430/270.1 |
| 2007/0002296 | A1 * | 1/2007 | Chang ................ G03F 7/70341 | 355/53 |
| 2008/0090001 | A1 | 4/2008 | Ito et al. | |
| 2009/0239176 | A1 * | 9/2009 | Kanda .................. G03F 7/0046 | 430/285.1 |
| 2011/0008545 | A1 | 1/2011 | Ito et al. | |

(Continued)

FOREIGN PATENT DOCUMENTS

| | | |
|---|---|---|
| JP | 2003-17402 A | 1/2003 |
| JP | 2003-68632 A | 3/2003 |

(Continued)

OTHER PUBLICATIONS

Office Action dated Dec. 29, 2016, issued in counterpart Taiwanese Application No. 105117808. (7 pages).

*Primary Examiner* — Amanda C Walke
(74) *Attorney, Agent, or Firm* — Westerman, Hattori, Daniels & Adrian, LLP

(57) ABSTRACT

A pattern is formed by coating a resist composition comprising a fluorine-containing polymer, a base resin, an acid generator, and an organic solvent, baking the composition at 50-300° C. in an atmosphere of a solvent having a boiling point of 60-250° C., exposure, and development. In immersion lithography, the resist film is improved in water repellency and water slip, and LWR after pattern formation is reduced. In EB or EUV lithography, outgassing is suppressed and LWR is reduced.

11 Claims, No Drawings

(56) References Cited

U.S. PATENT DOCUMENTS

| | | | | |
|---|---|---|---|---|
| 2011/0262863 | A1* | 10/2011 | Tachibana | G03F 7/091<br>430/272.1 |
| 2012/0034558 | A1* | 2/2012 | Chang | G03F 7/0046<br>430/270.1 |
| 2013/0316510 | A1* | 11/2013 | Wang | H01L 21/0274<br>438/299 |
| 2014/0065544 | A1 | 3/2014 | Hatakeyama et al. | |
| 2015/0243520 | A1* | 8/2015 | Park | H01L 21/0273<br>438/703 |
| 2016/0141171 | A1* | 5/2016 | Xu | H01L 21/0274<br>438/694 |
| 2016/0254142 | A1* | 9/2016 | Chang | H01L 21/0274<br>438/694 |

FOREIGN PATENT DOCUMENTS

| | | | |
|---|---|---|---|
| JP | 2006-48029 | A | 2/2006 |
| JP | 2008-122932 | A | 5/2008 |
| JP | 2014-67012 | A | 4/2014 |
| TW | 200306460 | B | 11/2003 |
| TW | 201418887 | A | 5/2014 |

* cited by examiner

PATTERNING PROCESS

CROSS-REFERENCE TO RELATED APPLICATION

This non-provisional application claims priority under 35 U.S.C. §119(a) on Patent Application No. 2015-116739 filed in Japan on Jun. 9, 2015, the entire contents of which are hereby incorporated by reference.

TECHNICAL FIELD

This invention relates to a pattern forming process for use in the fabrication of microelectronic devices.

BACKGROUND OF THE INVENTION

In the drive for higher integration and operating speeds in LSI devices, the pattern rule is made drastically finer. The rapid advance toward finer pattern rules is grounded on the development of a projection lens with an increased NA, a resist material with improved performance, and a light source with a shorter wavelength.

Resist materials adapted for KrF excimer laser (248 nm) started use on the 0.3 μm process and entered the mass production phase on the 0.13 μm rule. A wavelength change-over from KrF to shorter wavelength ArF excimer laser (193 nm) is expected to enable miniaturization of the design rule to below 0.13 μm. Since commonly used novolak resins and polyvinylphenol resins have very strong absorption in proximity to 193 nm, they cannot be used as the base resin for resists. To ensure transparency and dry etch resistance, acrylic resins and alicyclic (typically cycloolefin) resins are investigated, leading to mass-scale production of devices by the ArF lithography.

For the next 45-nm node devices which required an advancement to reduce the wavelength of exposure light, the $F_2$ lithography of 157 nm wavelength became a candidate. However, for the reasons that the projection lens uses a large amount of expensive $CaF_2$ single crystal, the scanner thus becomes expensive, hard pellicles are introduced due to the extremely low durability of soft pellicles, the optical system must be accordingly altered, and the etch resistance of resist is low; the $F_2$ lithography was postponed and instead, the early introduction of ArF immersion lithography was advocated. This enables mass-scale production of 45-nm node devices. For the mass-scale production of 32-nm node devices, the double patterning process utilizing sidewall spacer technology is used although the process suffers from complexity and length.

For the purpose of increasing the throughput of an ArF immersion lithography tool, an attempt is made to increase the scanning rate of the scanner. To this end, it is necessary to improve water slip on the surface of a resist film in contact with immersion water. Patent Documents 1 and 2 disclose a liquid immersion resist composition to which a fluorinated additive is added to increase water repellency on resist surface. Although a water repellent polymer is mixed with a base resin, acid generator and other components in a resist composition, the polymer will segregate, after spin coating, on the resist surface to improve water repellency. Another advantage of the water repellent polymer is that by virtue of fluoroalcohol groups, it dissolves in alkaline developer, causing few defects after development. To compensate for a lowering of productivity by double patterning, stepper manufacturers make efforts to accelerate the scanning rate of the scanner. It is thus necessary to further improve water repellency on the resist surface.

For the fabrication of sub-32-nm node devices, the onset of extreme ultraviolet (EUV) lithography using an exposure wavelength of 13.5 nm which is shorter than the conventional lasers by one order of magnitude and thus featuring improved resolution is expected rather than the double patterning process with noticeable costs.

In the EUV lithography, a low laser power and light attenuation by reflecting mirror lead to a reduced quantity of light. Then light with a low intensity reaches the wafer surface. It is urgently demanded to develop a high-sensitivity resist material in order to gain a throughput despite a low light quantity. However, a trade-off relationship of sensitivity is pointed out that the sensitivity of resist material can be increased at the sacrifice of resolution and edge roughness (LER, LWR).

For the purpose of suppressing outgassing from a resist film during EUV exposure, Patent Document 3 proposes to add a copolymer comprising fluoroalcohol-containing recurring units and aromatic group-containing recurring units to a resist composition. After spin coating, the copolymer will segregate on the resist surface so that the aromatic groups serve to shut out outgassing from the resist film.

Patent Document 4 proposes spin coating of a resist composition in a solvent atmosphere. Patent Document 5 discloses prebaking of a spin-coated resist in a solvent atmosphere under reduced pressure. In either of these methods, the resist composition may be coated by dispensing a small amount thereof, and the resulting resist film is improved in flatness.

Studies are made on a patterning process utilizing the direct self-assembly (DSA) phenomenon of a block copolymer. For DSA, heating above 200° C. for several hours is necessary. For attaining DSA within a short time, heating in a solvent atmosphere is effective. As the solvent penetrates into the block copolymer, the polymer is improved in mobility so that the rate of DSA is accelerated.

CITATION LIST

Patent Document 1: JP-A 2006-048029

Patent Document 2: JP-A 2008-122932 (U.S. Pat. No. 7,771,914)

Patent Document 3: JP-A 2014-067012

Patent Document 4: JP-A 2003-068632

Patent Document 5: JP-A 2003-017402

SUMMARY OF INVENTION

An object of the invention is to provide a pattern forming process which is successful in further enhancing water slip on the resist film surface and reducing edge roughness (LWR) after pattern formation in the case of immersion lithography, and in suppressing outgassing and reducing LWR in the case of EB or EUV lithography.

The inventors have found that the above object is attained by using a resist composition comprising a fluorine-containing polymer and baking a coating thereof in a solvent atmosphere because the fluorine-containing polymer segregates on the resist surface at an accelerated rate and in an increased proportion.

In one aspect, the invention provides a pattern forming process comprising the steps of coating a resist composition comprising a fluorine-containing polymer, a base resin adapted to change its alkaline solubility under the action of acid, an acid generator, and an organic solvent, baking the composition at a temperature of 50 to 300° C. in an atmosphere of a solvent having a boiling point of 60 to 250° C. under atmospheric pressure, exposure, and development.

As a result of the baking step, preferably the resist film is surface covered with the fluorine-containing polymer.

Typically, the solvent having a boiling point of 60 to 250° C. under atmospheric pressure is selected from the group consisting of ester solvents of 4 to 10 carbon atoms, ketone solvents of 5 to 10 carbon atoms, ether solvents of 8 to 12 carbon atoms, aromatic solvents of 7 to 12 carbon atoms, and amide solvents of 4 to 8 carbon atoms.

Suitable ester solvents of 4 to 10 carbon atoms include propylene glycol monomethyl ether acetate, propylene glycol monoethyl ether acetate, propylene glycol monopropyl ether acetate, propylene glycol monobutyl ether acetate, propylene glycol mono-t-butyl ether acetate, ethyl pyruvate, methyl 3-methoxypropionate, methyl 3-ethoxypropionate, ethyl 3-methoxypropionate, ethyl 3-ethoxypropionate, t-butyl acetate, t-butyl propionate, propyl acetate, butyl acetate, isobutyl acetate, pentyl acetate, butenyl acetate, isopentyl acetate, propyl formate, butyl formate, isobutyl formate, pentyl formate, isopentyl formate, methyl valerate, methyl pentenoate, methyl crotonate, ethyl crotonate, methyl propionate, ethyl propionate, ethyl 3-ethoxypropionate, methyl lactate, ethyl lactate, propyl lactate, butyl lactate, isobutyl lactate, pentyl lactate, isopentyl lactate, methyl 2-hydroxyisobutyrate, ethyl 2-hydroxyisobutyrate, methyl benzoate, ethyl benzoate, phenyl acetate, benzyl acetate, methyl phenylacetate, benzyl formate, phenylethyl formate, methyl 3-phenylpropionate, benzyl propionate, ethyl phenylacetate, and 2-phenylethyl acetate, suitable ketone solvents of 5 to 10 carbon atoms include 2-octanone, 2-nonanone, 2-heptanone, 3-heptanone, 4-heptanone, 2-hexanone, 3-hexanone, diisobutyl ketone, methyl cyclohexanone, acetophenone, methylacetophenone, cyclopentanone, cyclohexanone, cyclooctanone, and methyl-2-n-pentyl ketone, suitable ether solvents of 8 to 12 carbon atoms include di-n-butyl ether, diisobutyl ether, di-s-butyl ether, di-n-pentyl ether, diisopentyl ether, di-s-pentyl ether, di-t-pentyl ether, di-n-hexyl ether, and anisole, suitable aromatic solvents of 7 to 12 carbon atoms include toluene, xylene, ethylbenzene, isopropylbenzene, t-butylbenzene, and mesitylene, and suitable amide solvents of 4 to 8 carbon atoms include N,N-dimethylacetamide, N,N-diethylacetamide, N,N-dimethylpropionamide, N-ethylpropionamide, and pivalamide.

In a preferred embodiment, the fluorine-containing polymer contains an α-trifluoromethylhydroxy or fluorosulfonamide group, and dissolves in an alkaline developer.

More preferably, the fluorine-containing polymer comprises recurring units having the formula (1) and/or recurring units having the formula (2).

(1)

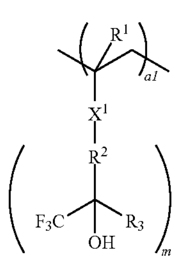

-continued (2)

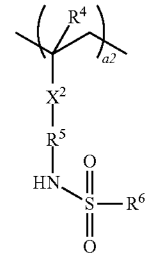

Herein $R^1$ and $R^4$ are each independently hydrogen or methyl, $R^2$ is a single bond, a straight, branched or cyclic $C_1$-$C_{12}$ alkylene group which may contain an ether, ester or carbonyl moiety, or a phenylene group, $R^3$ is hydrogen, fluorine, methyl, trifluoromethyl or difluoromethyl, or $R^3$ may bond with $R^2$ to form a ring which may contain an ether moiety, fluorinated alkylene moiety or trifluoromethyl moiety, $R^5$ is a single bond or a straight, branched or cyclic $C_1$-$C_{12}$ alkylene group which may contain an ether, ester or carbonyl moiety, $R^6$ is a fluorinated, straight, branched or cyclic $C_1$-$C_{10}$ alkyl or phenyl group, in is 1 or 2, in case of m=1, $X^1$ is a single bond, phenylene group, —O—, —C(═O)—O—$R^7$— or —C(═O)—NH—$R^7$—, $R^7$ is a straight, branched or cyclic $C_1$-$C_{10}$, alkylene group which may contain an ester or ether moiety, in case of m=2, $X^1$ is benzenetriyl, —C(═O)—O—$R^8$═ or —C(═O)—NH—$R^8$═, $R^8$ is an optionally ester or ether-containing, straight, branched or cyclic $C_1$-$C_{10}$ alkylene group, with one hydrogen atom eliminated, $X^2$ is a single bond, phenylene group, —O—, —C(═O)—O—$R^7$— or —C(═O)—NH—$R^7$—, a1 and a2 are positive numbers satisfying $0 \le a1 < 1.0$, $0 \le a2 < 1.0$, and $0.5 \le a1+a2 \le 1.0$.

In a preferred embodiment, the exposure step is to expose the resist film to KrF excimer laser of wavelength 248 nm, ArF excimer laser of wavelength 193 nm, EUV of wavelength 3 to 15 nm, or EB. More preferably, the exposure step is to expose the resist film to ArF excimer laser by immersion lithography.

In a preferred embodiment, the base resin comprises recurring units having the formula (7) and/or recurring units having the formula (8).

(7)

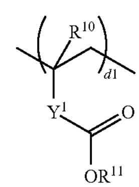

(8)

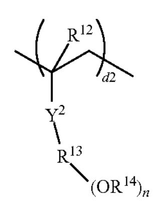

Herein $R^{10}$ and $R^{12}$ are each independently hydrogen or methyl, $R^{11}$ and $R^{14}$ are each independently hydrogen or an acid labile group, $Y^1$ is a single bond, phenylene, naphthylene or —C(═O)—O—$R^{15}$—, $R^{15}$ is a straight, branched or cyclic $C_1$-$C_{10}$ alkylene group which may contain an ether moiety, ester moiety, lactone ring or hydroxyl moiety, a phenylene group or naphthylene group, $Y^2$ is a single bond, phenylene, naphthylene, —C(=O)—O—$R^{16}$—, —C(=O)—NH—$R^{16}$—, —O—$R^{16}$— or —S—$R^{16}$—, $R^{16}$ is a straight, branched or cyclic $C_1$-$C_{10}$ alkylene group which may contain an ether moiety, ester moiety, lactone ring or hydroxyl moiety, $R^{13}$ is a single bond, a straight, branched or cyclic $C_1$-$C_{16}$ divalent to pentavalent aliphatic hydrocarbon group which may contain an ether or ester moiety, or a phenylene group, d1 and d2 are positive numbers satisfying $0 \leq d1 < 1.0$, $0 \leq d2 < 1.0$, and $0 < d1+d2 \leq 1.0$, and n is an integer of 1 to 4.

In the resist composition, 0.1 to 15 parts by weight of the fluorine-containing polymer is preferably present per 100 parts by weight of the base resin.

Advantageous Effects of Invention

According to the pattern forming process of the invention wherein a coating of a resist composition comprising a fluorine-containing polymer and a base resin on a substrate is prebaked in a solvent atmosphere. The bake in a solvent atmosphere functions to accelerate the rate at which the fluorine-containing polymer segregates on the resist surface and to increase a separation factor between the fluorine-containing polymer and the base resin. In the case of immersion lithography, the resist film is improved in water repellency and water slip (which is accounted for by a decrease of sliding angle and an increase of receding contact angle), and in consequence, the scanning rate of the scanner is accelerated, the throughput is increased, and LWR after pattern formation is reduced. In the case of EB or EUV lithography, the resist surface is effectively covered with the fluorine-containing polymer, and in consequence, outgassing during exposure in vacuum is suppressed and LWR after pattern formation is reduced.

DESCRIPTION OF PREFERRED EMBODIMENT

The singular forms "a," "an" and "the" include plural referents unless the context clearly dictates otherwise. "Optional" or "optionally" means that the subsequently described event or circumstances may or may not occur, and that description includes instances where the event or circumstance occurs and instances where it does not. The notation (Cn-Cm) means a group containing from n to m carbon atoms per group. In chemical formulae, the broken line denotes a valence bond: Me stands for methyl, Ac for acetyl, and Ph for phenyl.

The abbreviations have the following meaning.

EB: electron beam
UV: ultraviolet
EUV: extreme ultraviolet
PAG: photoacid generator
PEB: post-exposure bake
LWR: line width roughness The term "high-energy radiation" is intended to encompass KrF excimer laser, ArF excimer laser, EB, and EUV.

Briefly stated, the invention provides a pattern forming process comprising the steps of coating a resist composition onto a substrate, baking the composition at a temperature of 50 to 300° C. in an atmosphere of a solvent having a boiling point of 60 to 250° C. under atmospheric pressure, exposure, and development. The resist composition is defined as comprising a fluorine-containing polymer, a base resin adapted to change its alkaline solubility under the action of acid, an acid generator, and an organic solvent, which are described below in detail.

Fluorine-Containing Polymer

The fluorine-containing polymer used herein is preferably a polymer comprising recurring units containing an α-trifluoromethylalcohol group, represented by the formula (1) and/or recurring units containing a fluorosulfonamide group, represented by the formula (2), which are referred to as recurring units (a1) and (a2), respectively.

(1)

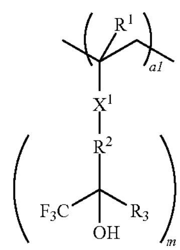

(2)

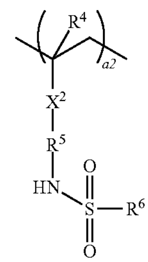

Herein $R^1$ and $R^4$ are each independently hydrogen or methyl. $R^2$ is a single bond, a straight, branched or cyclic $C_1$-$C_{12}$ alkylene group which may contain an ether, ester or carbonyl moiety, or a phenylene group. $R^3$ is hydrogen, fluorine, methyl, trifluoromethyl or difluoromethyl, or $R^3$ may bond with $R^2$ to form a ring which may contain an ether moiety, fluorinated alkylene moiety or trifluoromethyl moiety. $R^5$ is a single bond or a straight branched or cyclic. $C_1$-$C_{12}$ alkylene group which may contain an ether, ester or carbonyl moiety. $R^6$ is a fluorinated, straight, branched or cyclic $C_1$-$C_{10}$ alkyl or phenyl group. The subscript m is 1 or 2. In case of m=1, $X^1$ is a single bond, phenylene group, —O—, —C(=O)—O—$R^7$— or —C(=O)—NH—$R^7$—, wherein $R^7$ is a straight, branched or cyclic $C_1$-$C_{10}$ alkylene group which may contain an ester or ether moiety. In case of m=2, $X^1$ is benzenetriyl, —C(=O)—O—$R^8$= or —C(=O)—NH—$R^8$=, wherein $R^8$ is an optionally ester or ether-containing, straight, branched or cyclic $C_1$-$C_{10}$ alkylene group, with one hydrogen atom eliminated. $X^2$ is a single bond, phenylene group, —O—, —C(=O)—O—$R^7$— or —C(=O)—NH—$R^7$—, a1 and a2 are positive numbers satisfying $0 \leq a1 < 1.0$, $0 \leq a2 < 1.0$, and $0.5 \leq a1+a2 \leq 1.0$.

Examples of the monomer from which recurring unit (a1) is derived are given below, but not limited thereto. Notably, $R^1$ is as defined above.

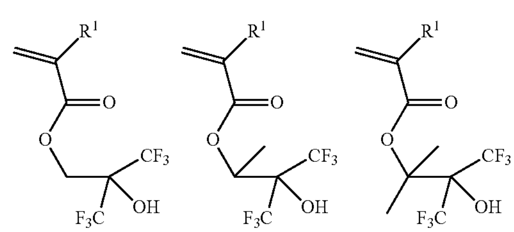

-continued
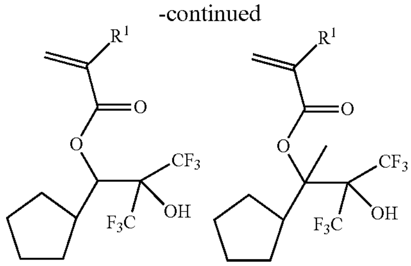
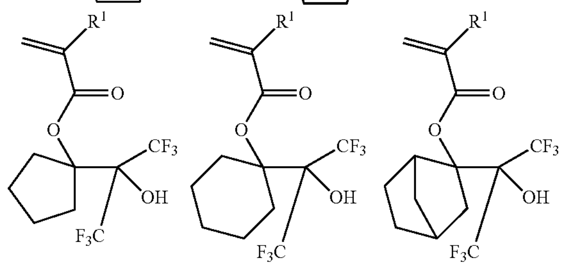
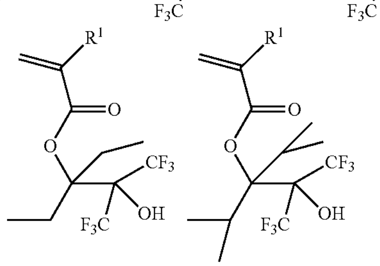
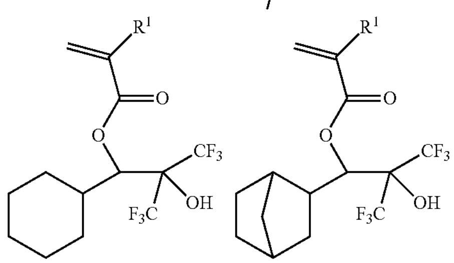
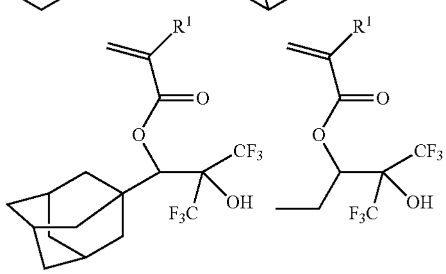
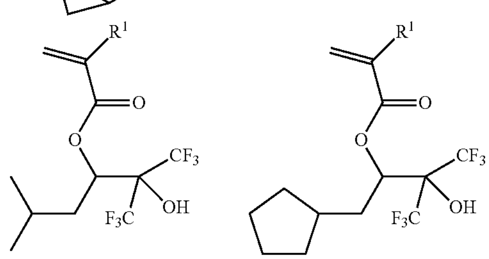
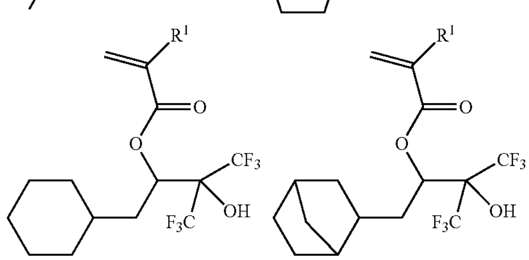
-continued
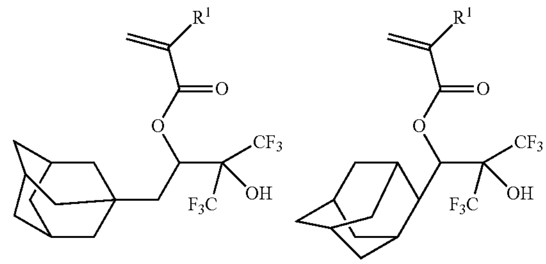
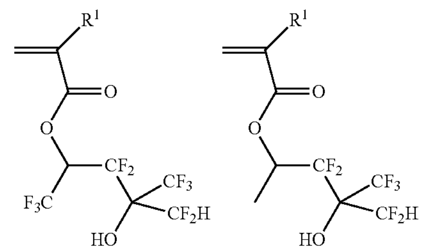
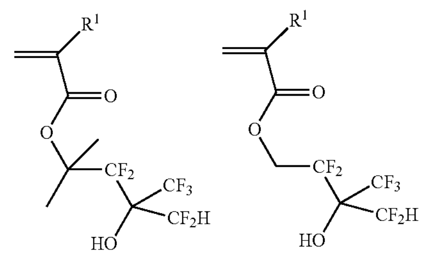
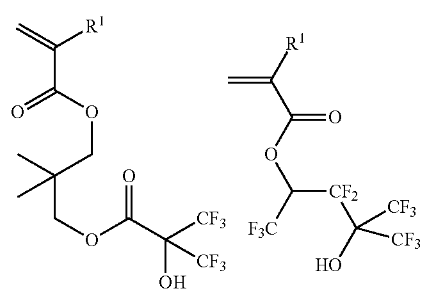
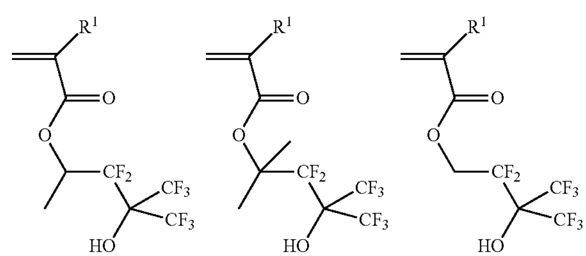
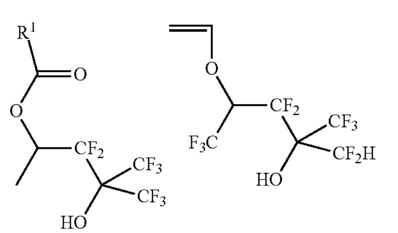

-continued
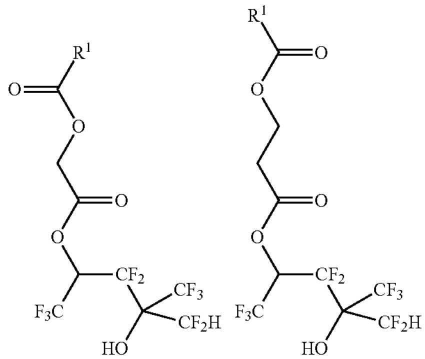
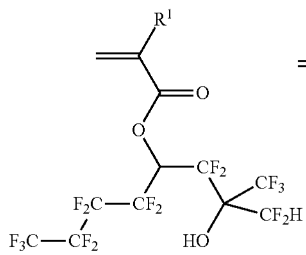
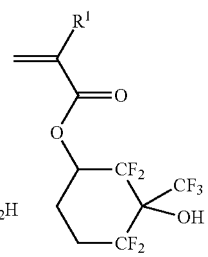
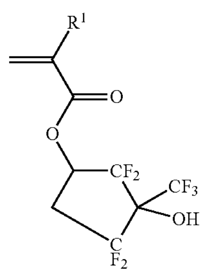
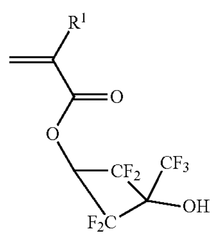
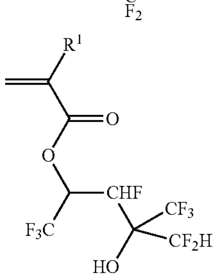
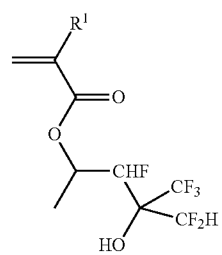
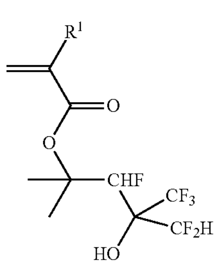
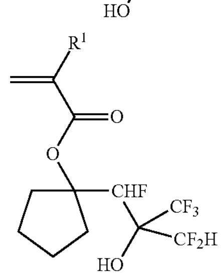
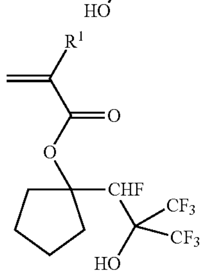
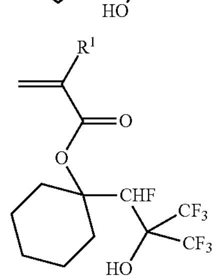
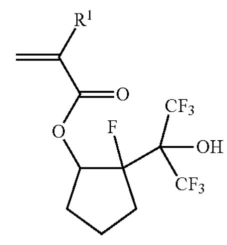
-continued
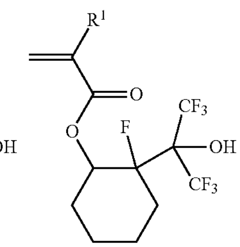
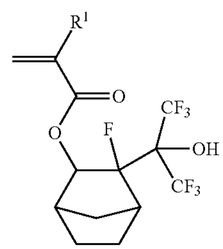
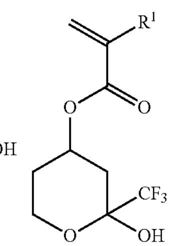
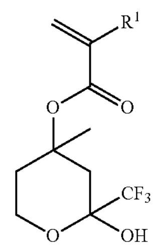
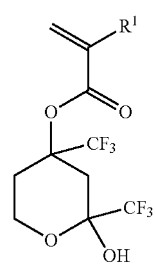
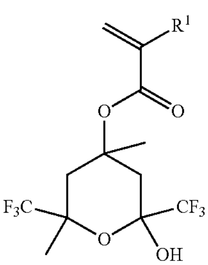
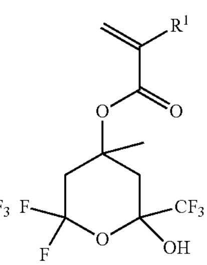
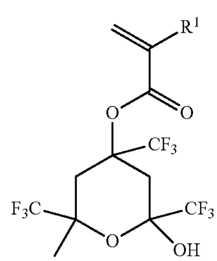
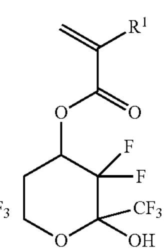
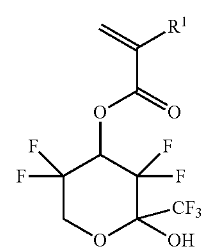
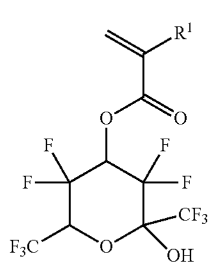
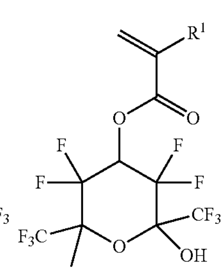
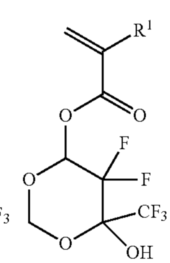
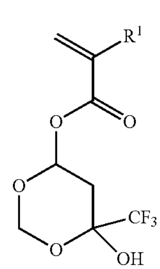
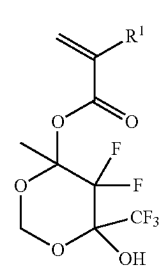
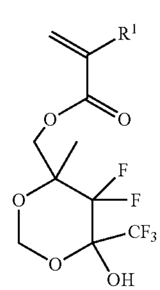

-continued
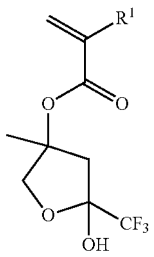
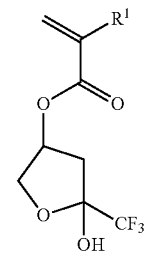
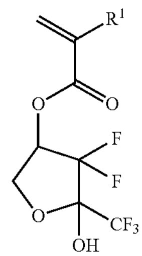
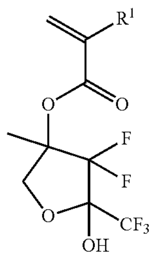
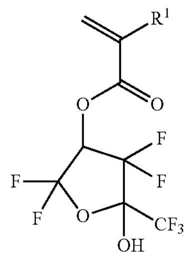
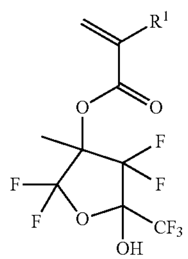
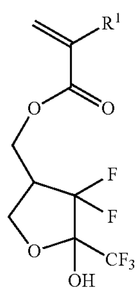
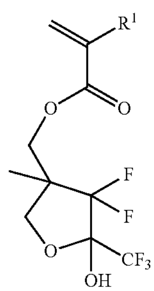
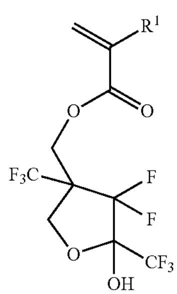
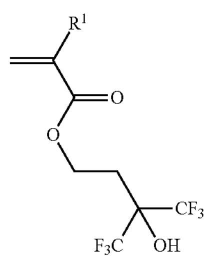
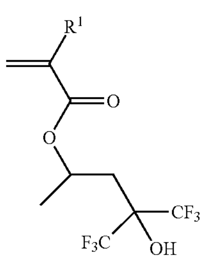
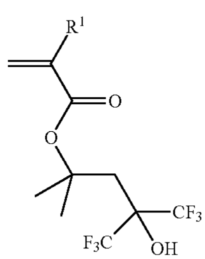
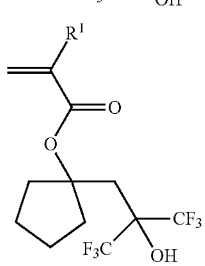
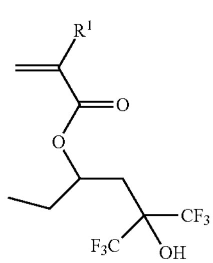
-continued
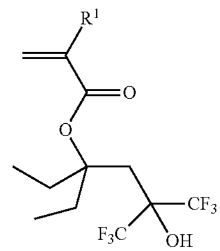
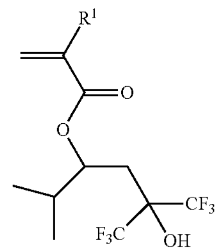
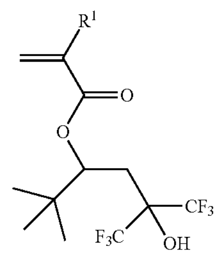
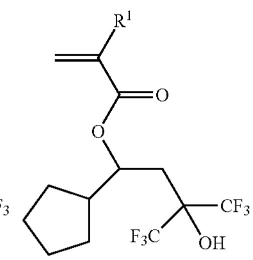
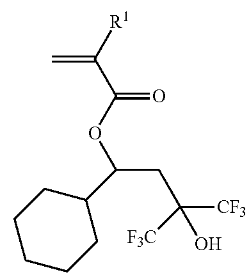
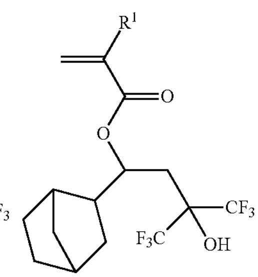
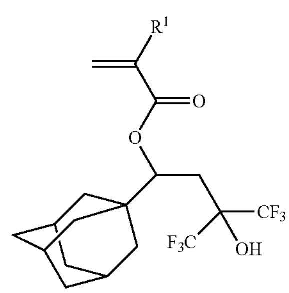
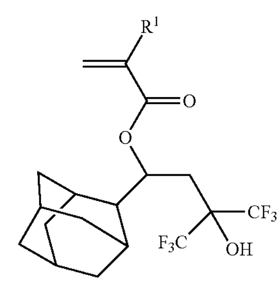
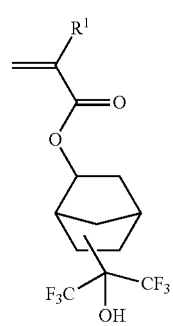
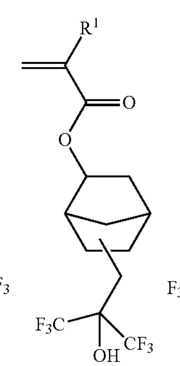
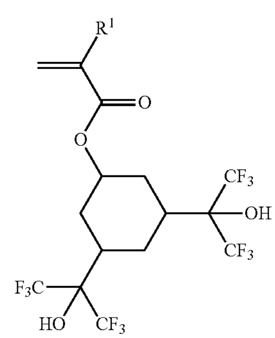

-continued
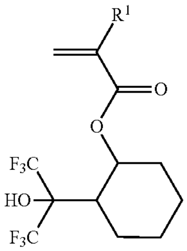
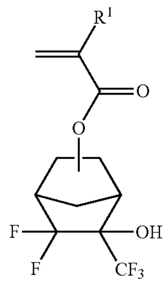
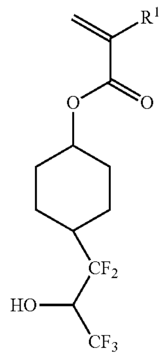
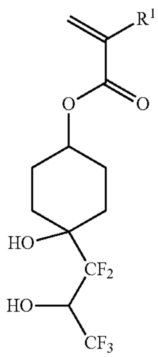
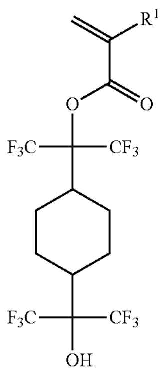
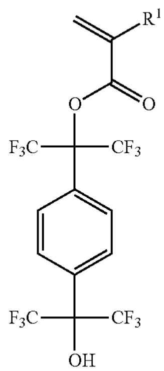
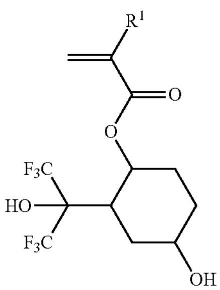
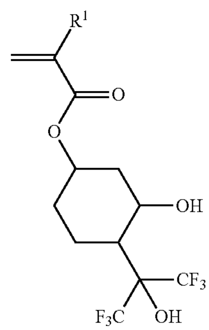
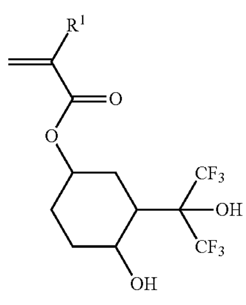
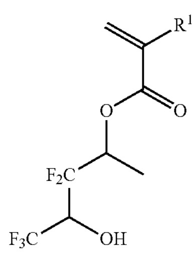
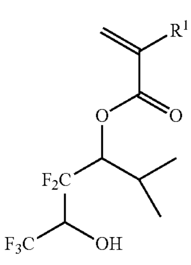
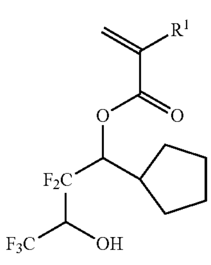
-continued
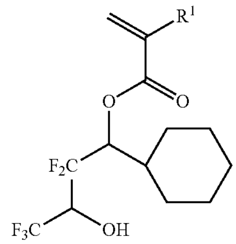
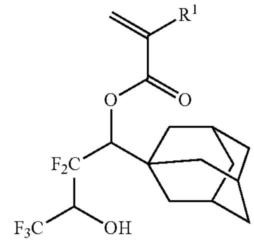
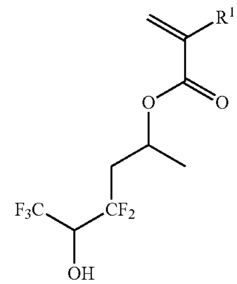
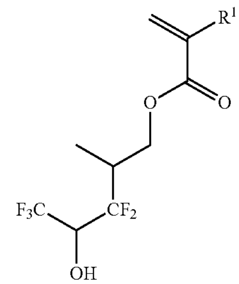
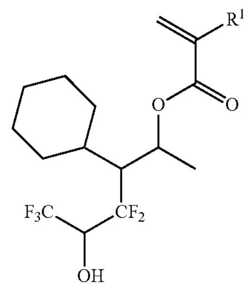
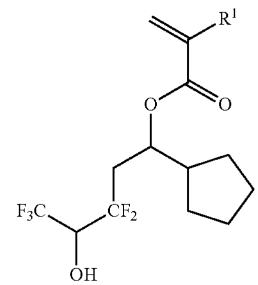
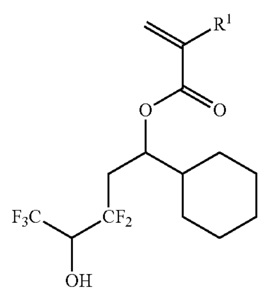
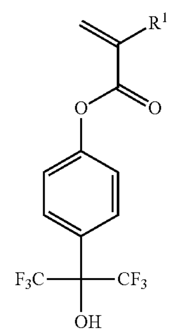
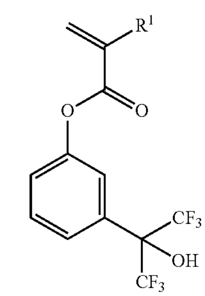
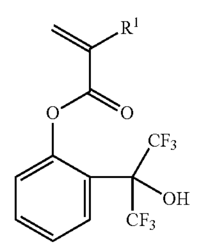
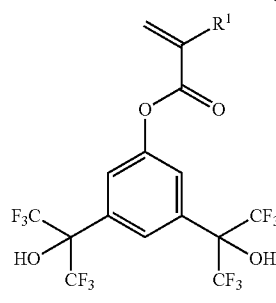
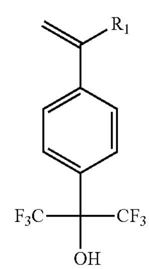

-continued
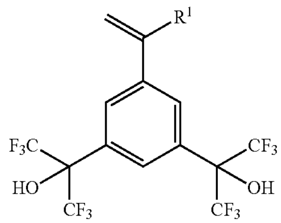
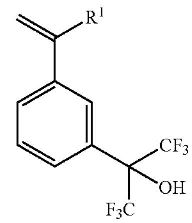
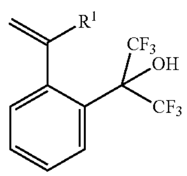
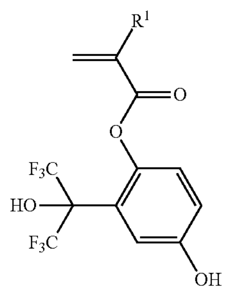
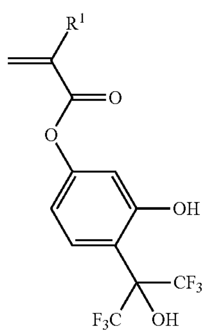
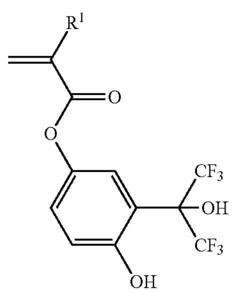
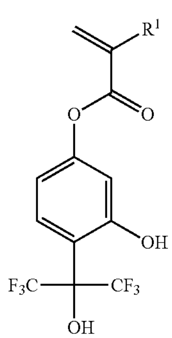
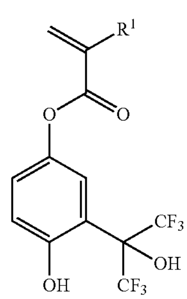
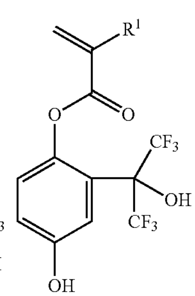
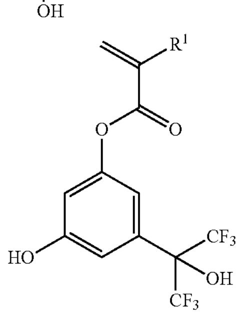
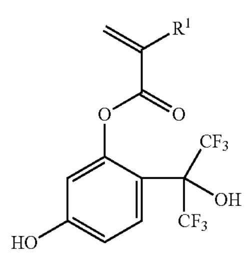
-continued
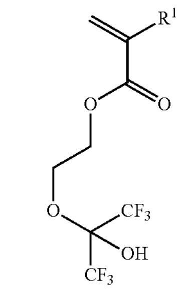
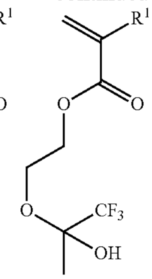
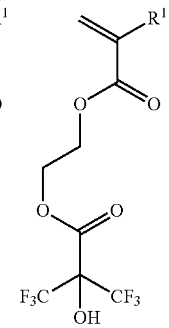
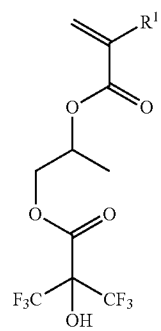
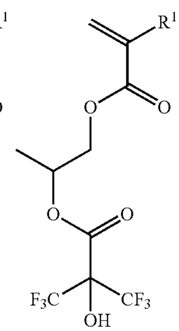
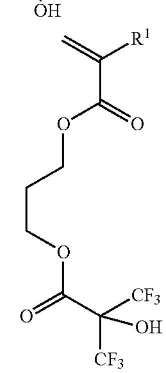
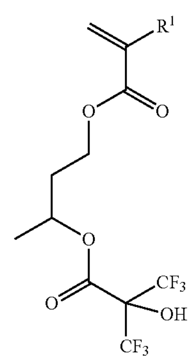
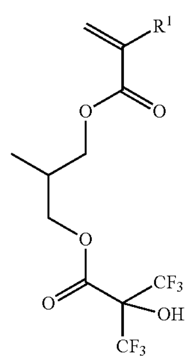
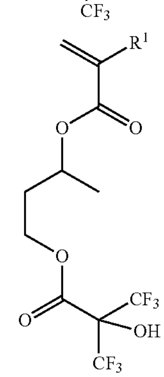
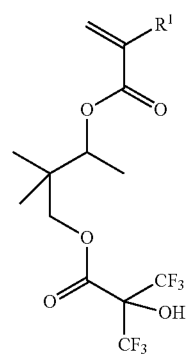
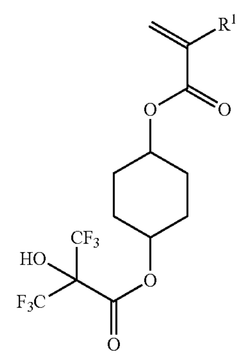
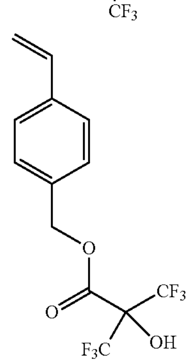
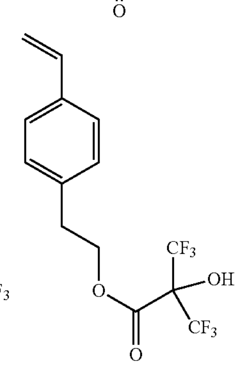

-continued
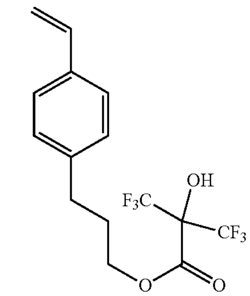
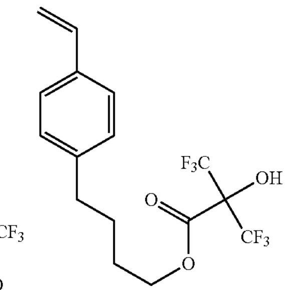
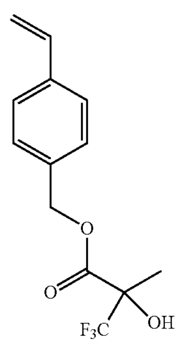
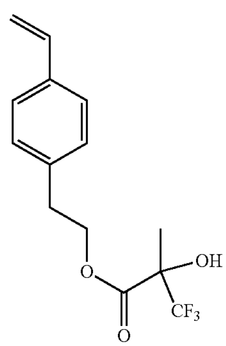
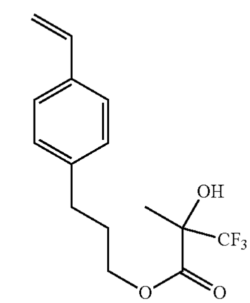
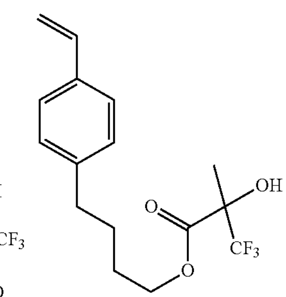
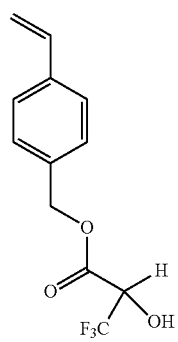
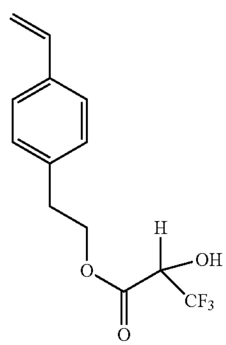
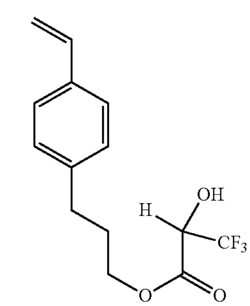
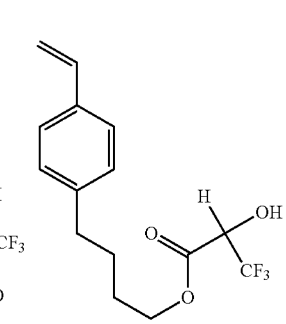
-continued
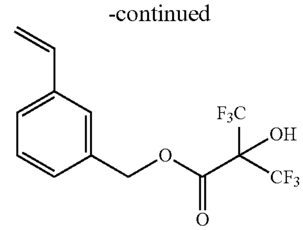
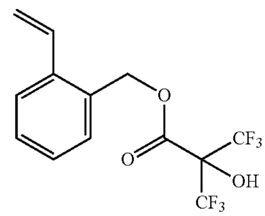
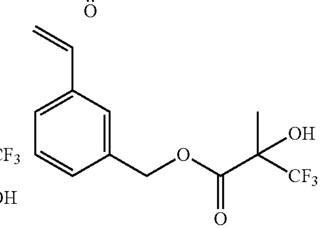
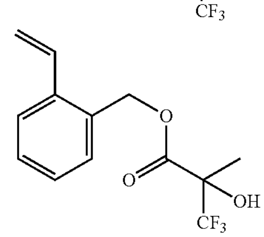
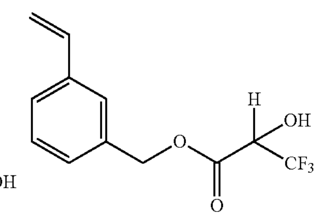
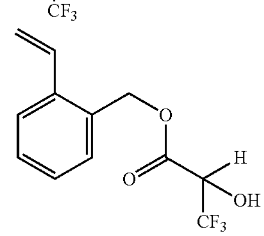
Examples of the monomer from which recurring unit (a2) As derived are given below, but not limited thereto. Notably, $R^4$ is as defined above.
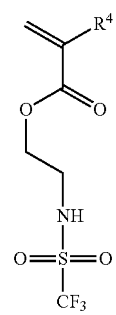
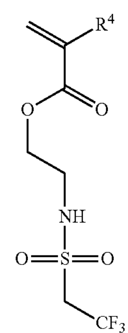
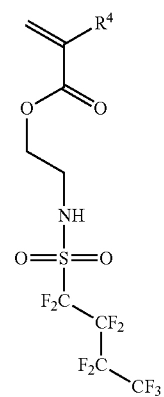
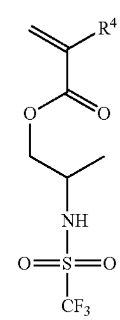
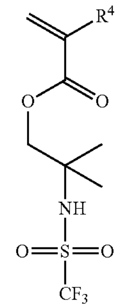
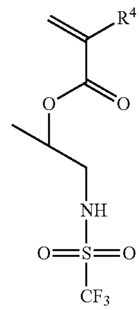
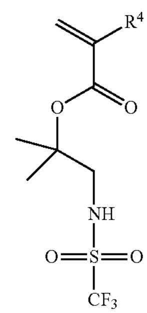

-continued
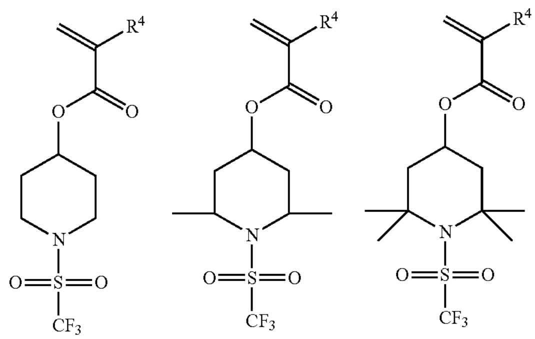
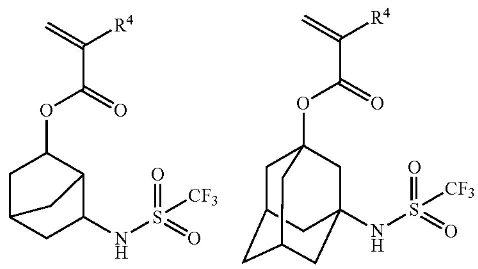
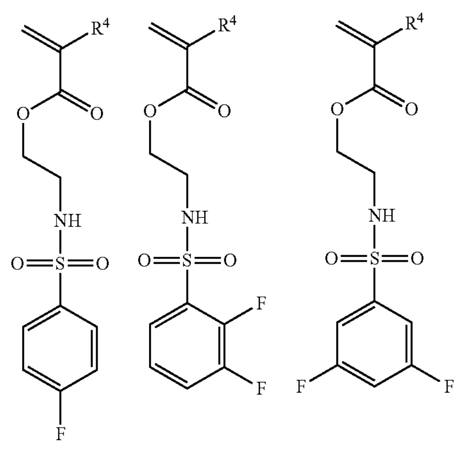
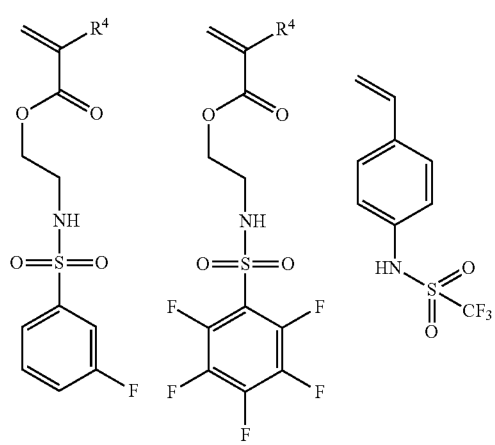
-continued
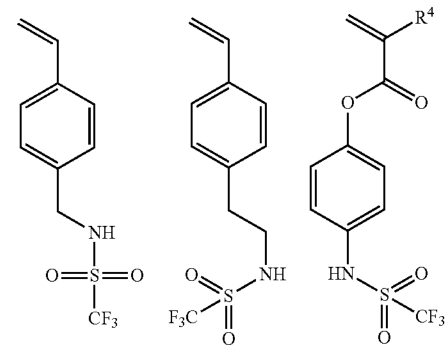
The fluorine-containing polymer may further comprise recurring units (a3) having a fluorinated alkyl or aryl group. Examples of the monomer from which recurring unit (a3) is derived are given below, but not limited thereto. Notably, $R^4$ is as defined above.
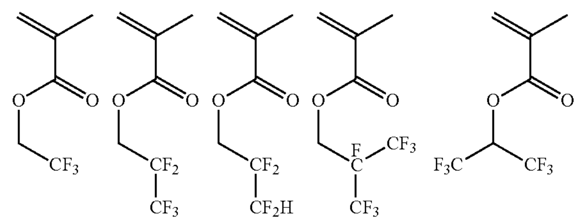
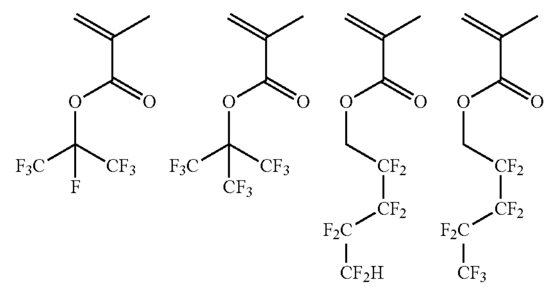
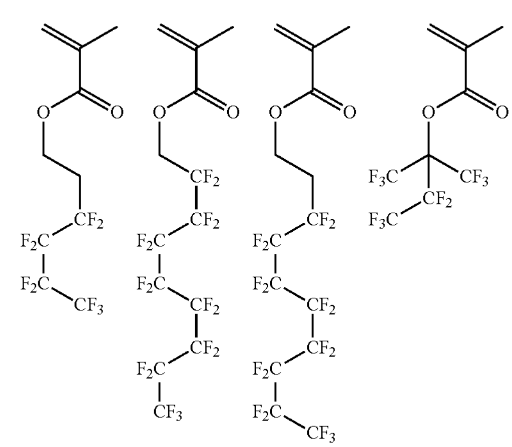

-continued
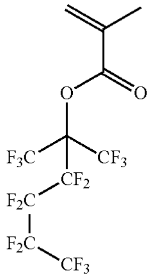
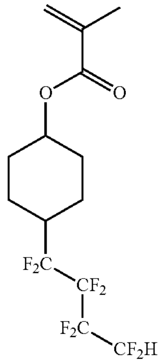
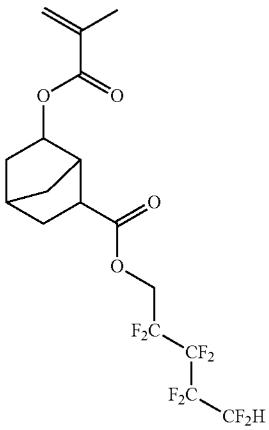
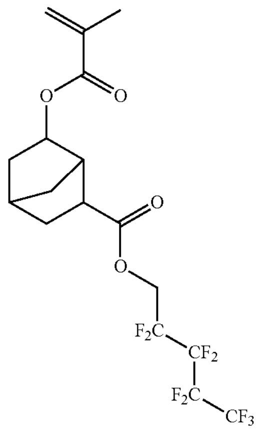
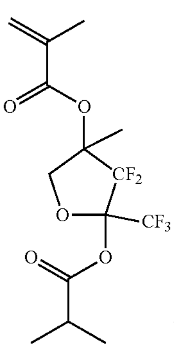
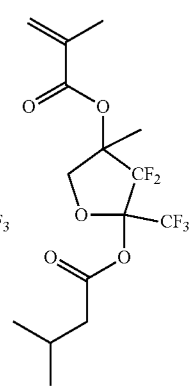
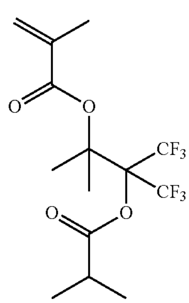
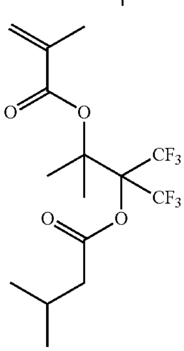
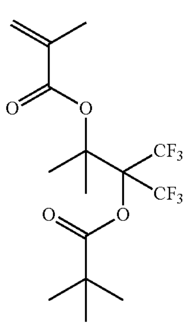
-continued
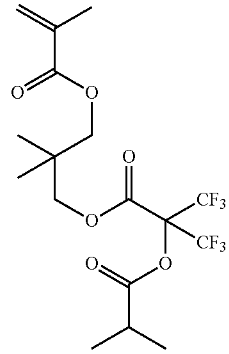
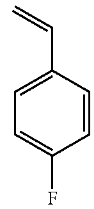
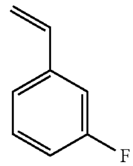
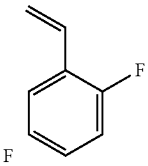
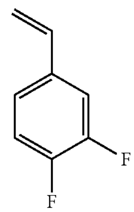
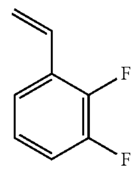
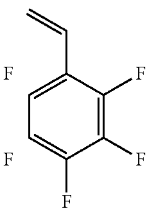
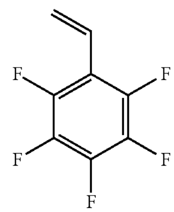
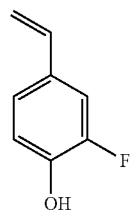
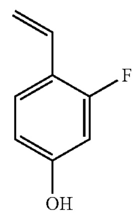
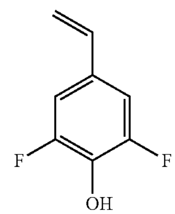
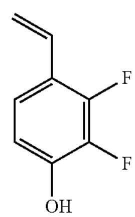
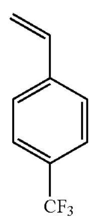
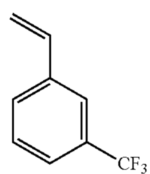
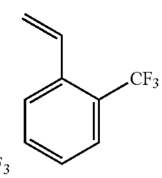
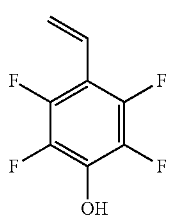
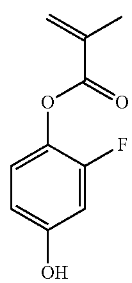
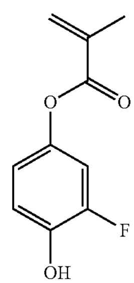
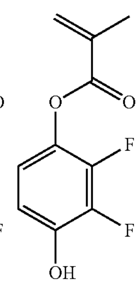
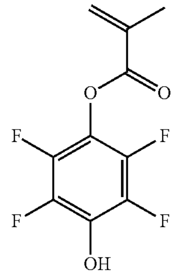
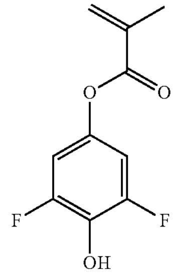
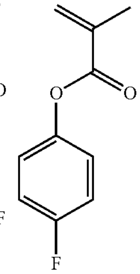

-continued
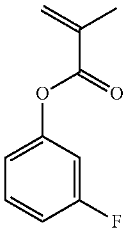
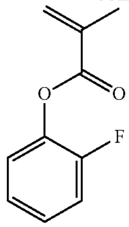
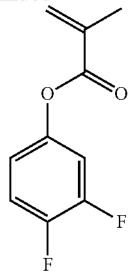
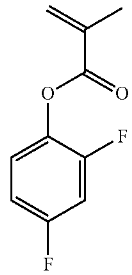
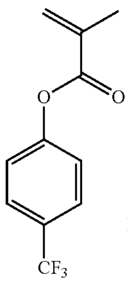
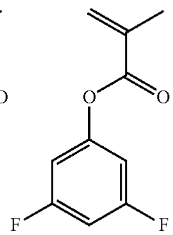
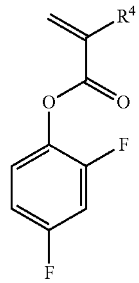
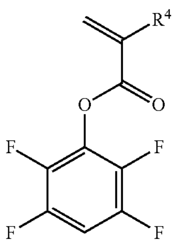
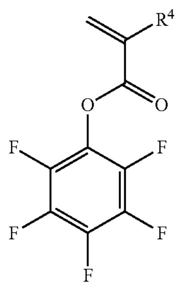
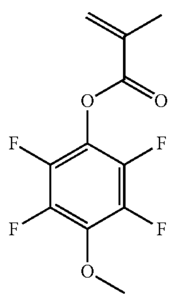
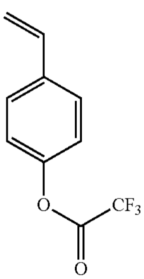
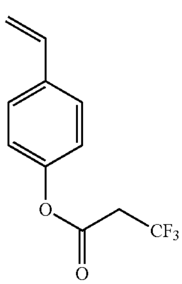
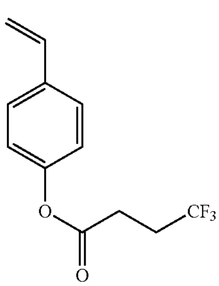
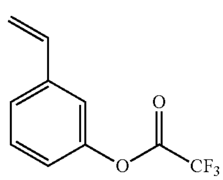
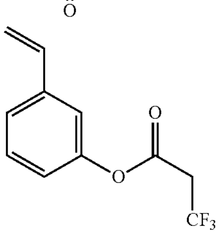
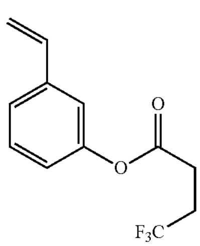
-continued
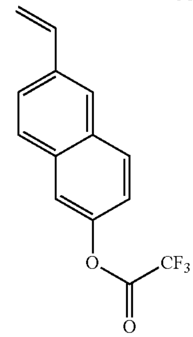
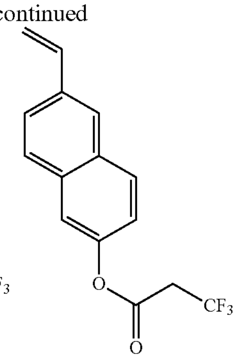
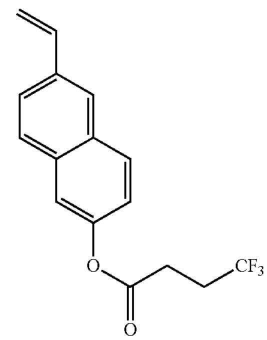
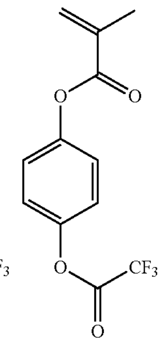
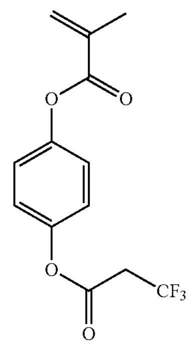
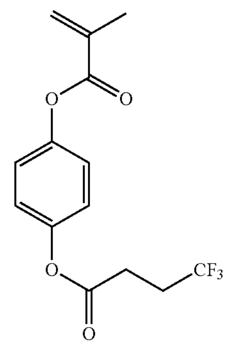
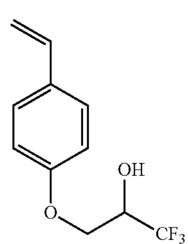
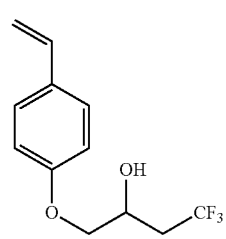
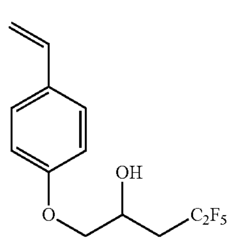
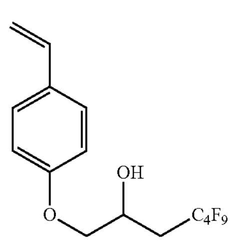

-continued
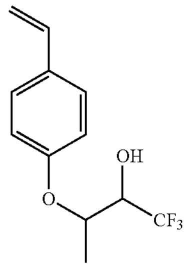
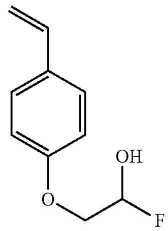
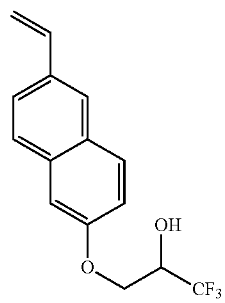
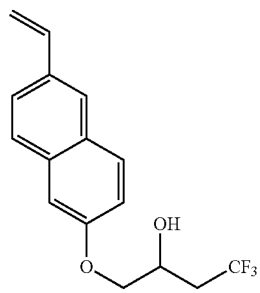
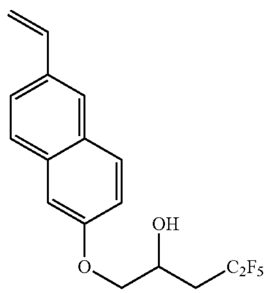
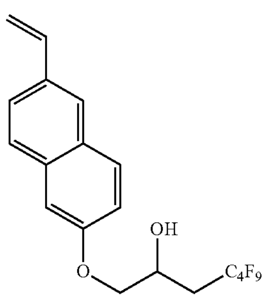
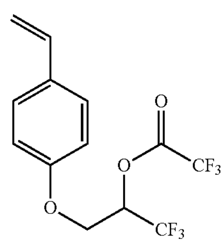
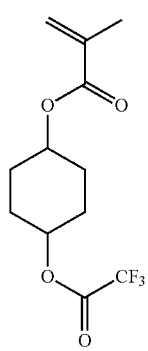
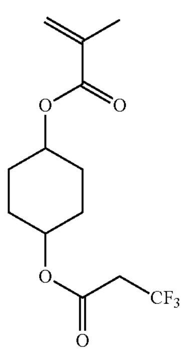
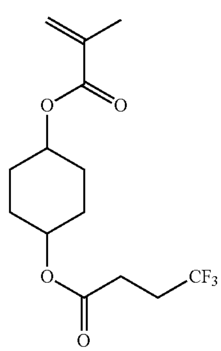
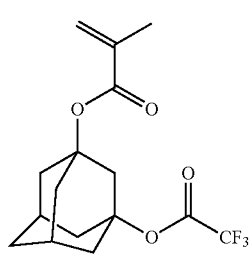
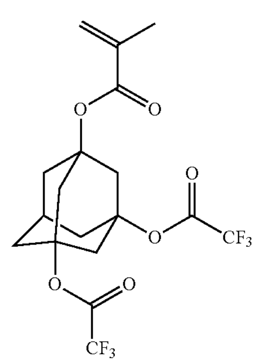
-continued
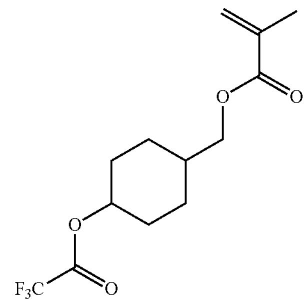
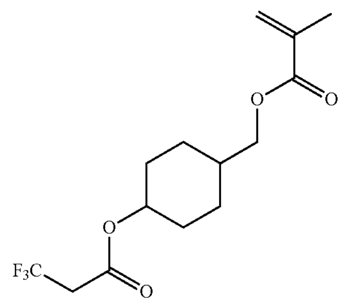
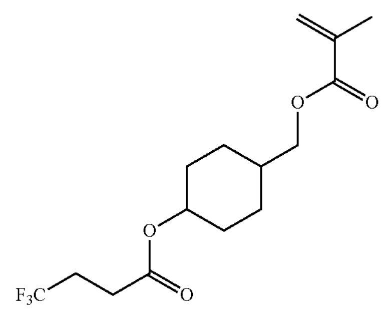
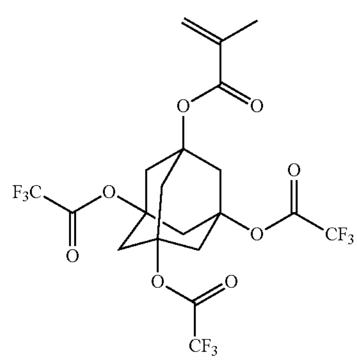
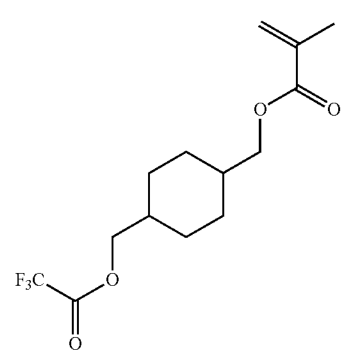

-continued
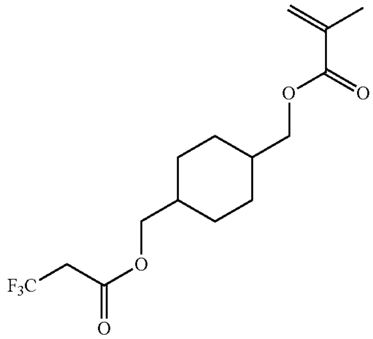
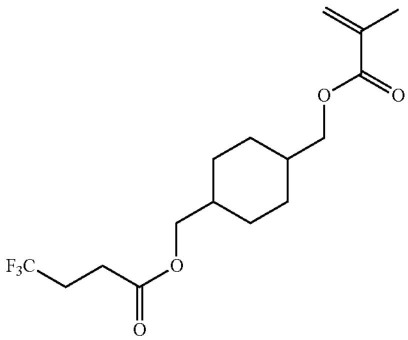
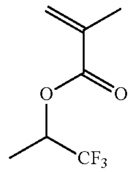
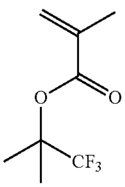
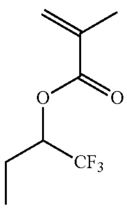
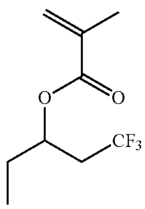
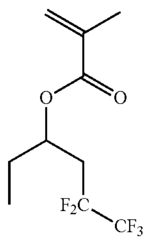
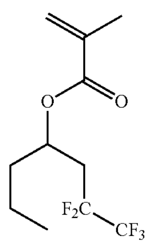
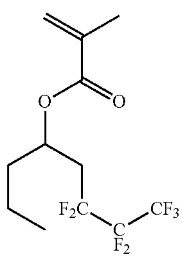
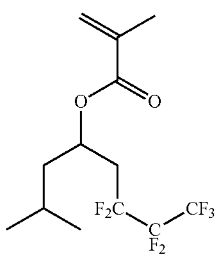
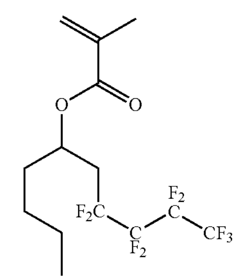
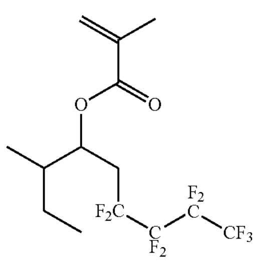
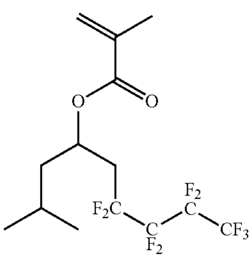
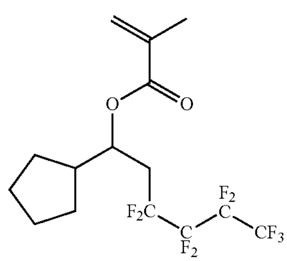
-continued
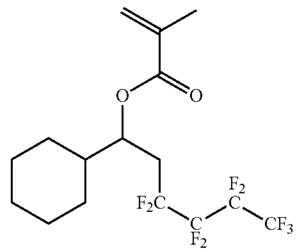
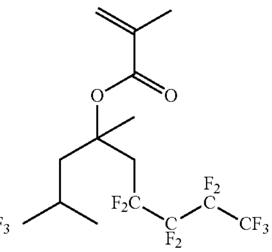
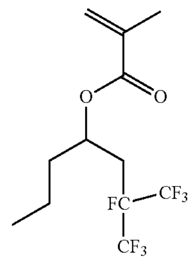
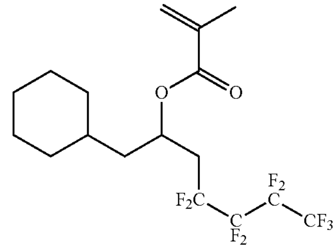
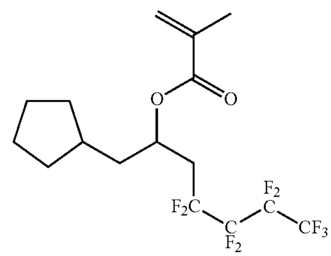
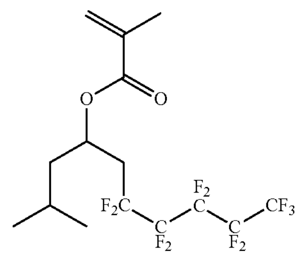
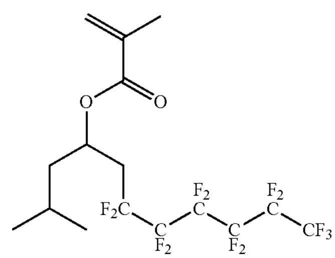
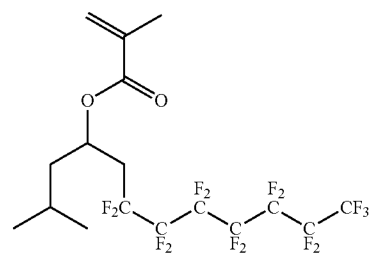

-continued
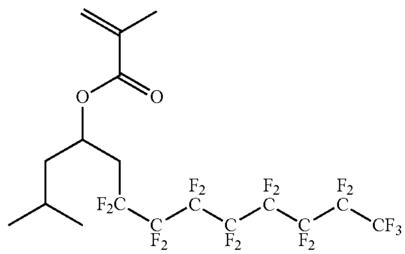
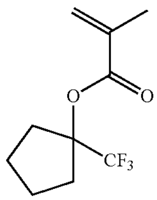
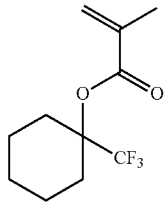
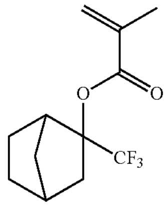
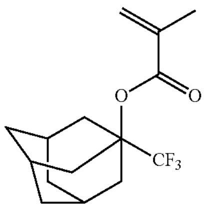
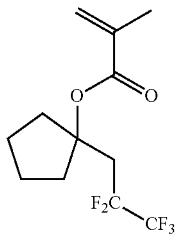
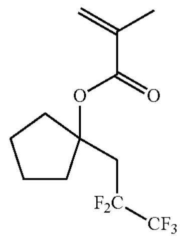
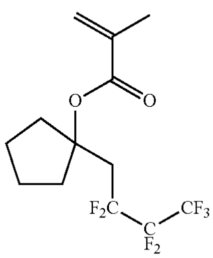
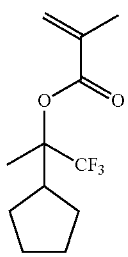
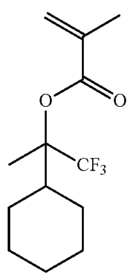
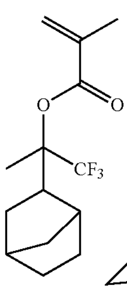
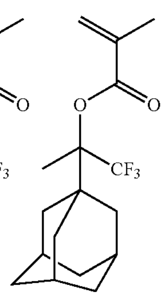
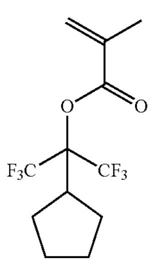
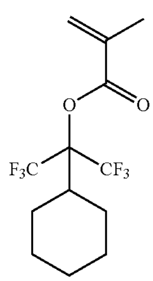
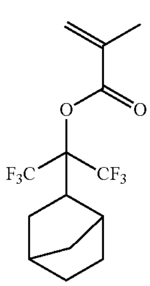
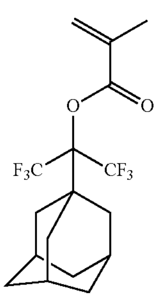
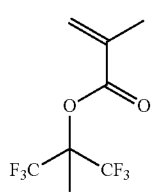
-continued
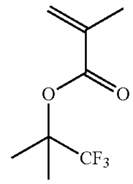
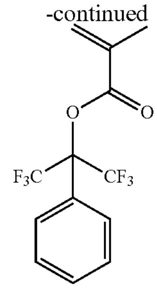
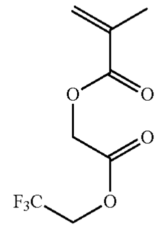
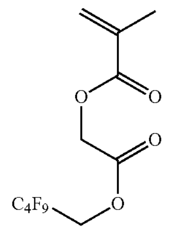
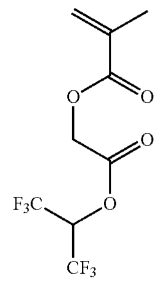
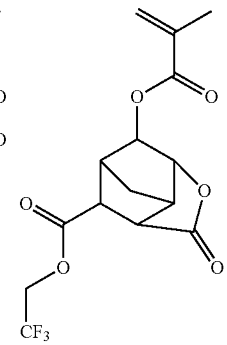
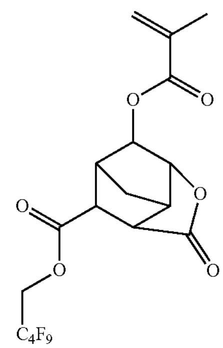
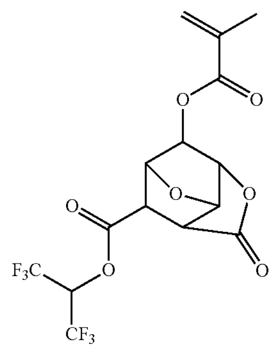
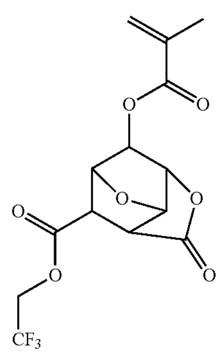
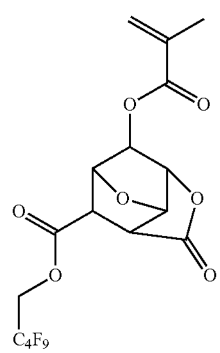
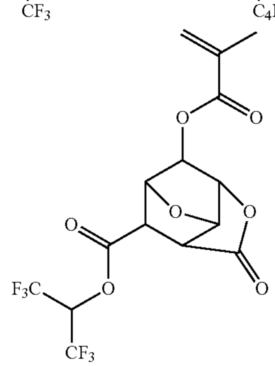
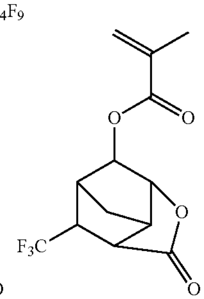

-continued

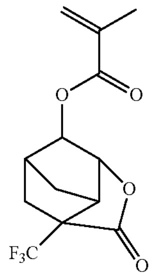
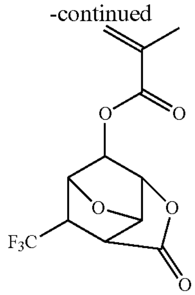
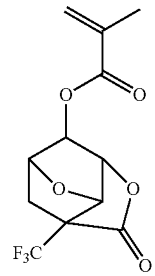
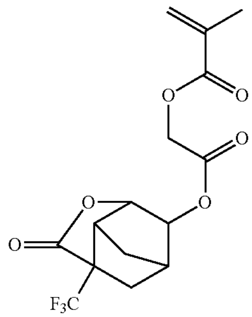
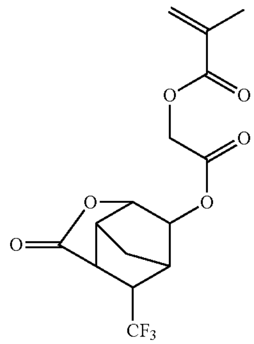
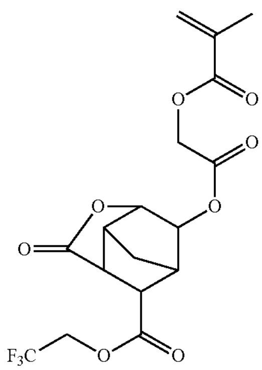
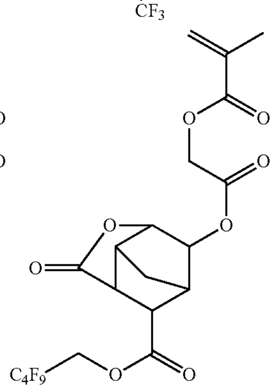
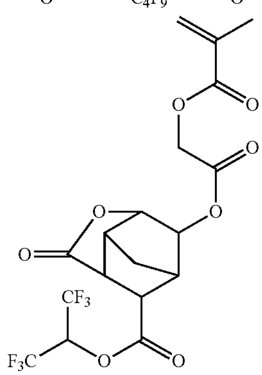

Since the fluorine-containing polymer is added to the resist composition, it is desirable to enhance polymer transparency to EUV radiation for thereby reducing outgassing from within the resist film. In this context, recurring units which are rich in hydrocarbon which is less absorptive of EUV radiation, specifically recurring units containing an aromatic group may be incorporated in the fluorine-containing polymer. These recurring units are units derived from methacrylate, vinyl ether, styrene, vinylnaphthalene, stilbene, styrylnaphthalene, dinaphthylethylene, acenaphthylene, indene, benzofuran and benzothiophene derivatives, as represented by the following formulae (3) to (6), which are referred to as recurring units (b1) to (b4), respectively.

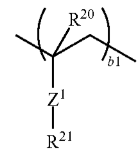
(3)

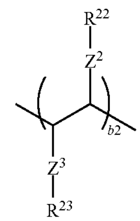
(4)

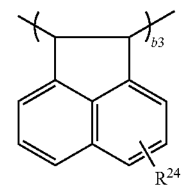
(5)

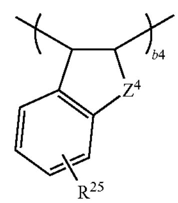
(6)

Herein $R^{20}$ is hydrogen or methyl. $Z^1$ is a single bond, —C(=O)—O— or —O—. $Z^2$ and $Z^3$ are each independently phenylene or naphthylene. $Z^4$ is methylene, —O— or —S—. $R^{21}$ is a $C_6$-$C_{20}$ aryl group or $C_2$-$C_{20}$ alkenyl group. $R^{22}$, $R^{23}$, $R^{24}$ and $R^{25}$ are each independently hydrogen, hydroxyl, cyano, nitro, amino, halogen, straight, branched or cyclic $C_1$-$C_{10}$ alkyl group, straight, branched or cyclic $C_2$-$C_6$ alkenyl group, $C_6$-$C_{10}$ aryl group, straight, branched or cyclic $C_1$-$C_{10}$ alkoxy group, or straight, branched or cyclic $C_2$-$C_{10}$ acyloxy group. The subscripts b1 to b4 are positive numbers satisfying $0 \le b1 < 1.0$, $0 \le b2 < 1.0$, $0 \le b3 < 1.0$, $0 \le b4 < 1.0$, and $0 \le b1+b2+b3+b4 < 1.0$.

Examples of the monomer from which recurring unit (b1) is derived are given below, but not limited thereto. Notably, $R^{20}$ is as defined above.

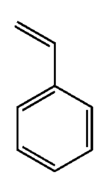
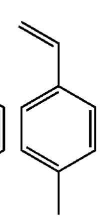
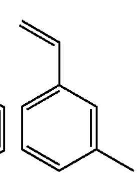
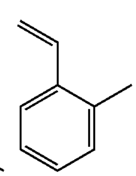
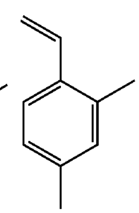
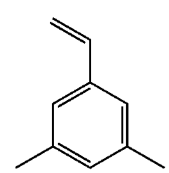
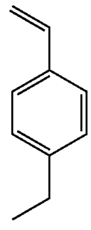
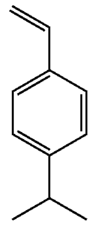
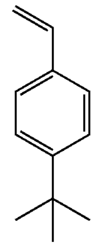
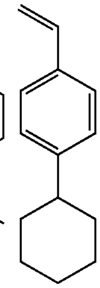

-continued
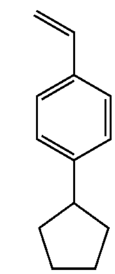
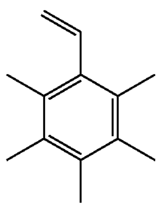
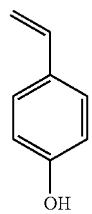
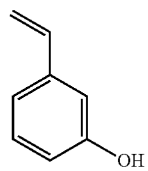
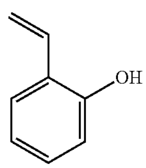
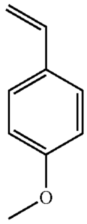
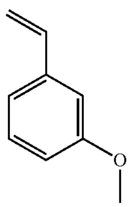
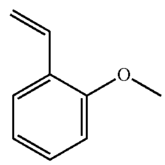
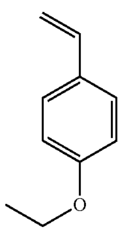
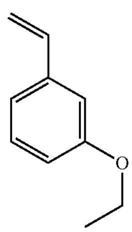
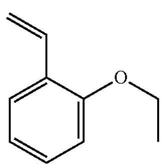
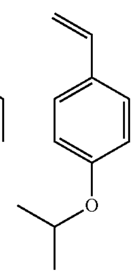
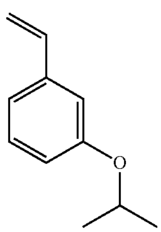
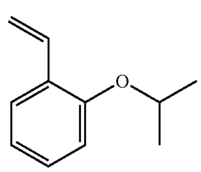
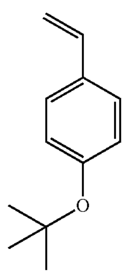
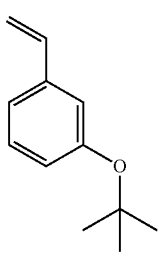
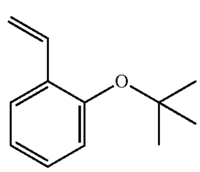
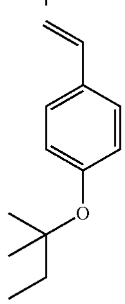
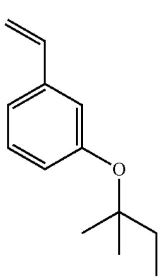
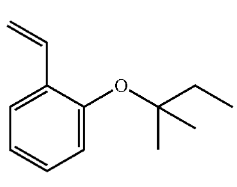
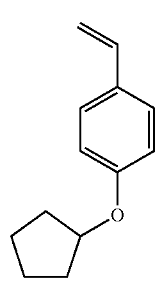
-continued
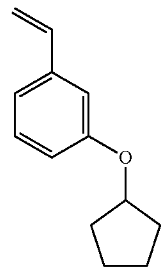
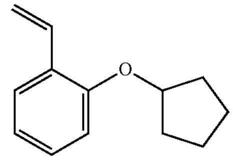
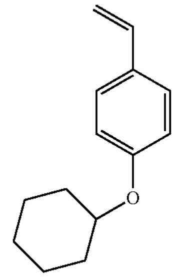
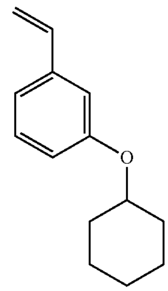
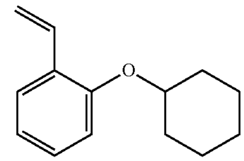
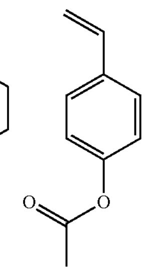
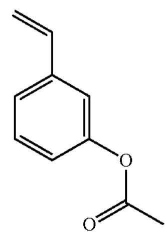
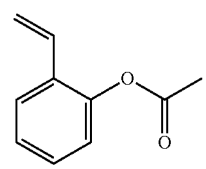
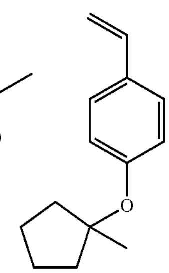
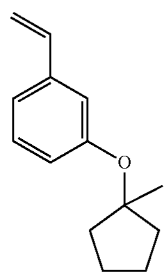
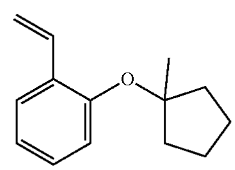
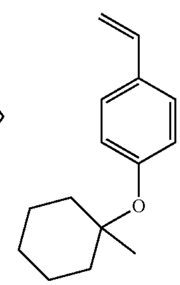
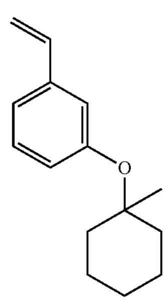
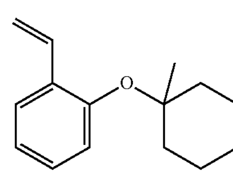
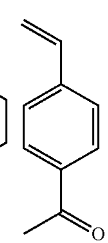
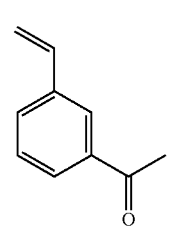
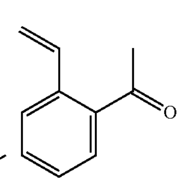
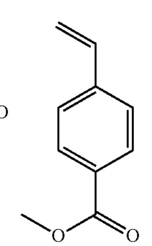

-continued
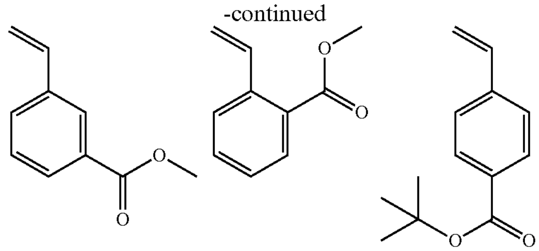
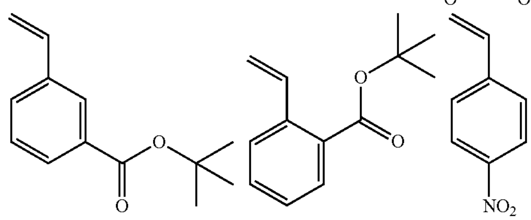
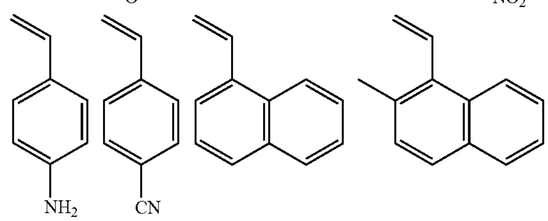
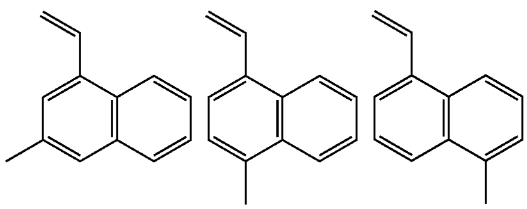
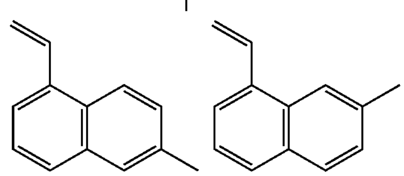
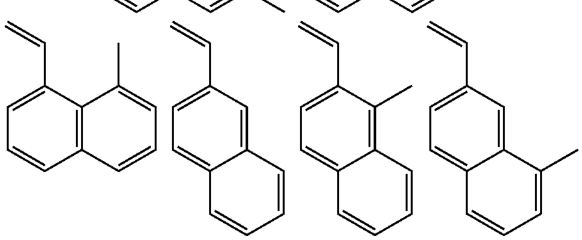
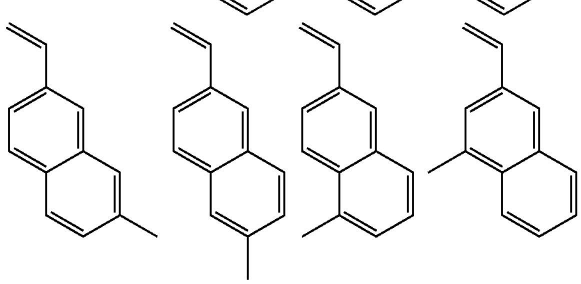
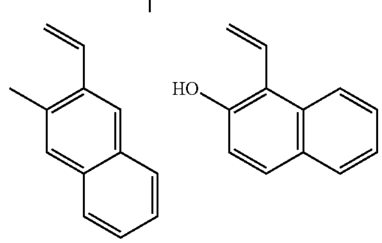
-continued
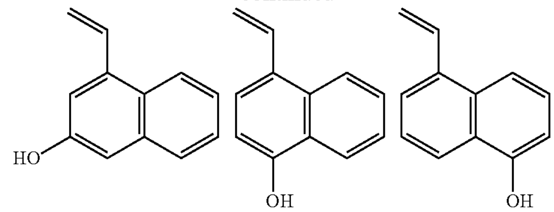
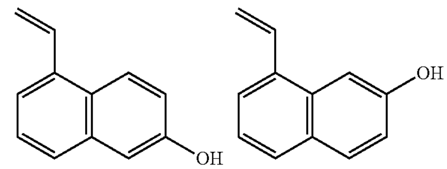
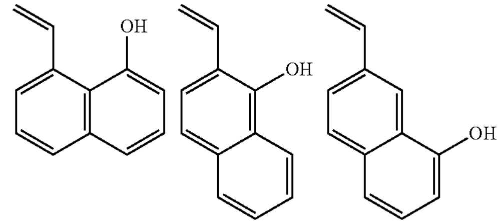
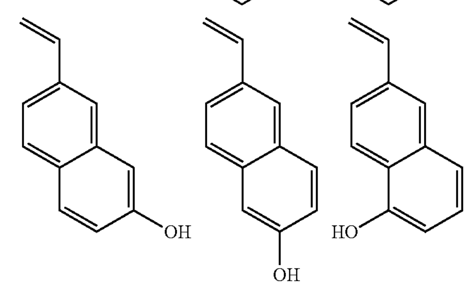
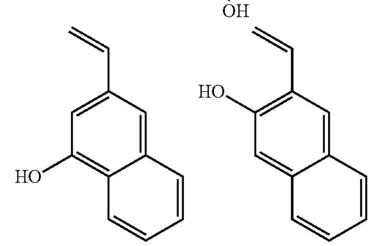
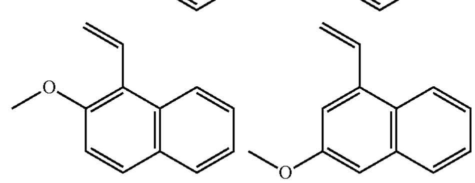
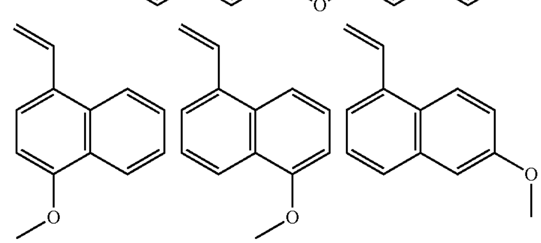
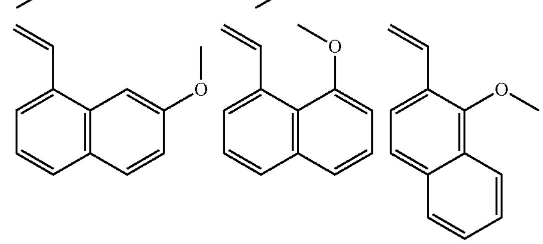

-continued
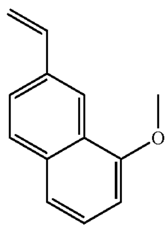
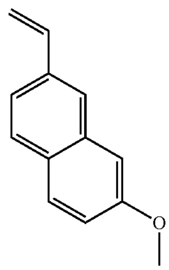
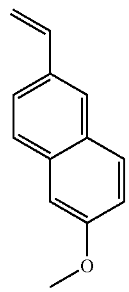
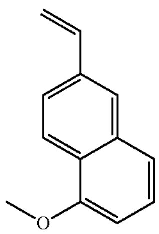
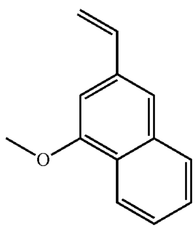
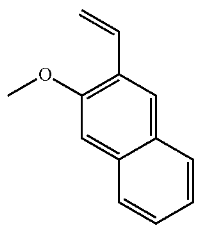
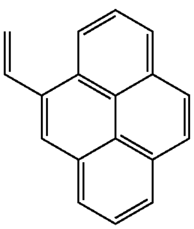
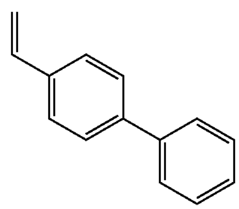
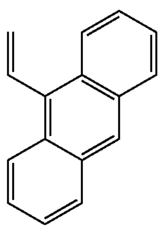
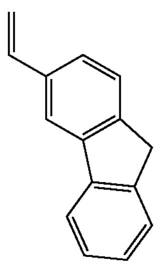
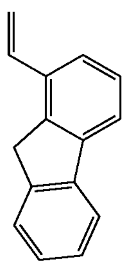
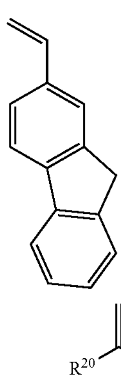
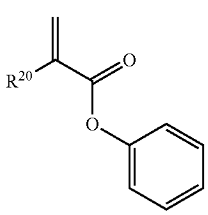
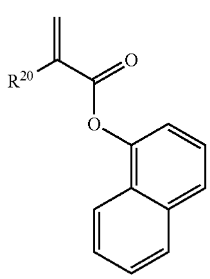
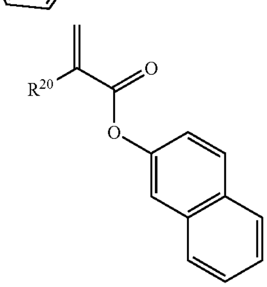
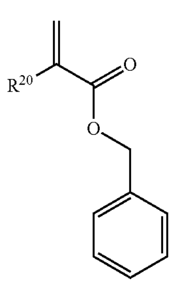
-continued
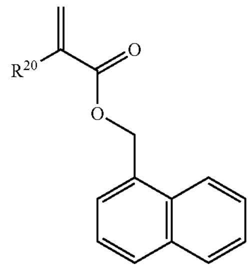
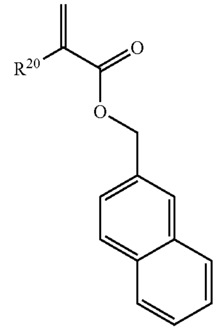
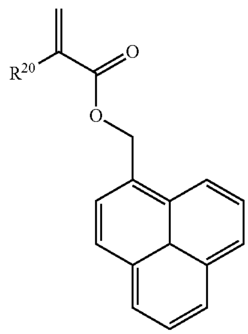
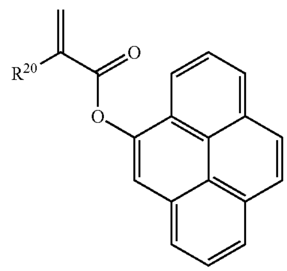
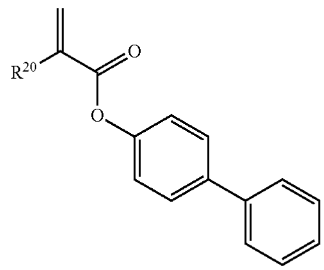
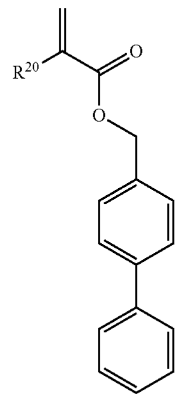
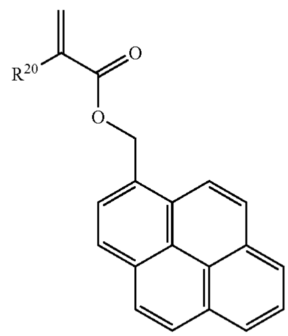
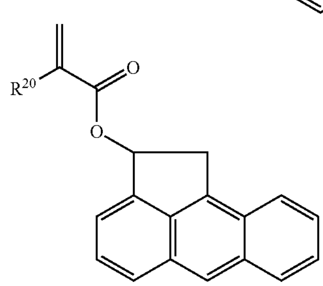
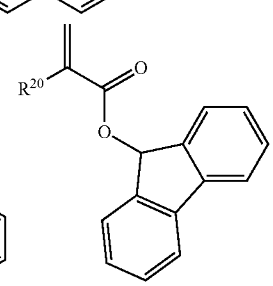

-continued
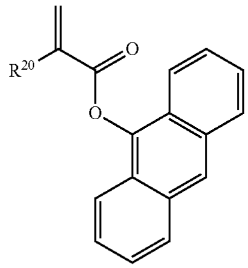
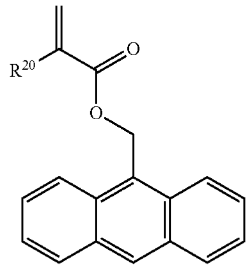
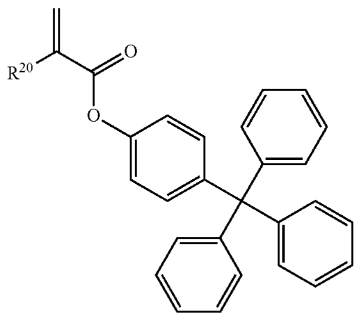
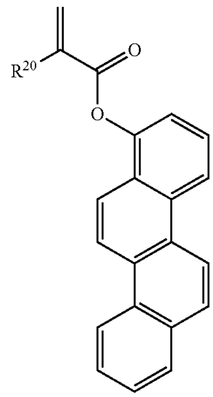
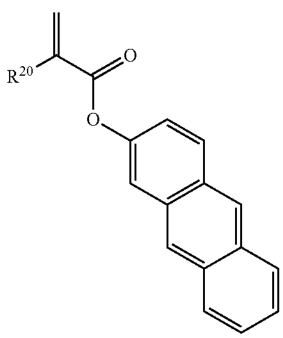
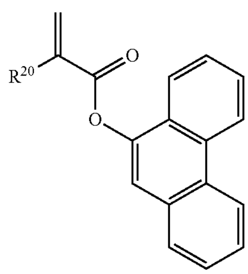
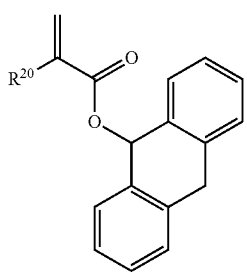
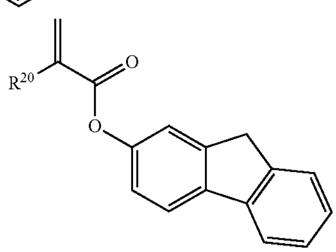
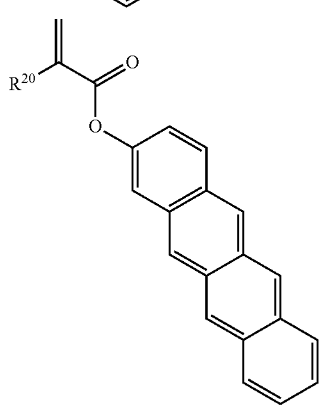
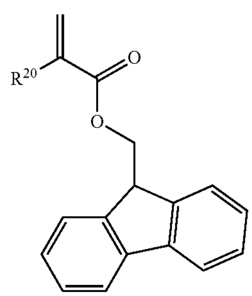
-continued
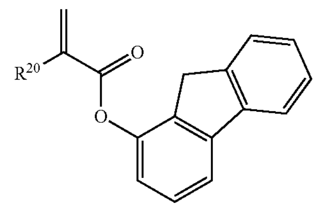
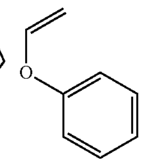
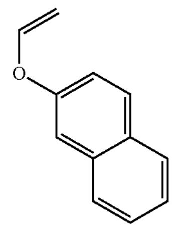
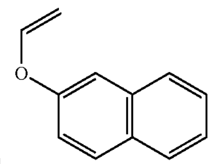
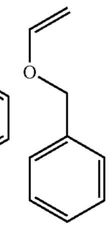
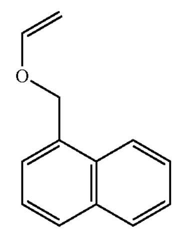
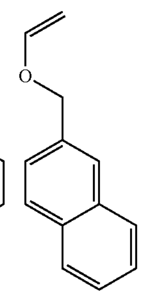
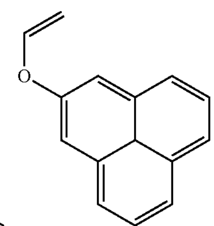
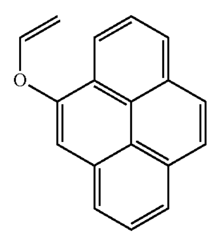
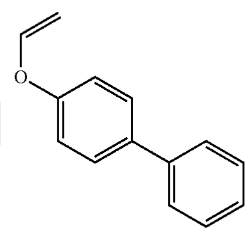
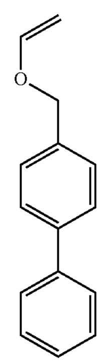
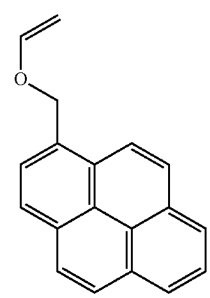
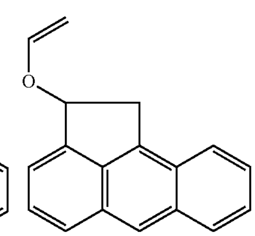
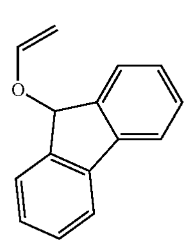
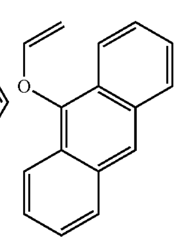

-continued
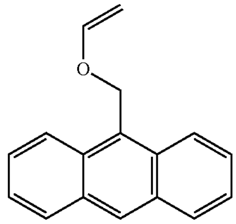
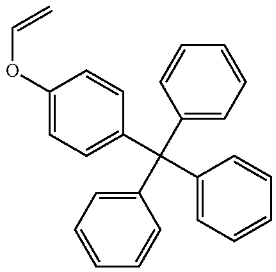
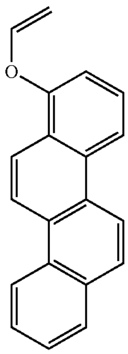
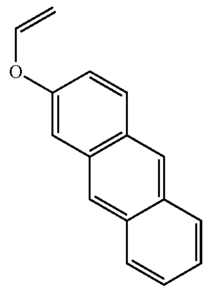
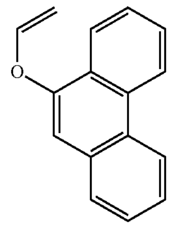
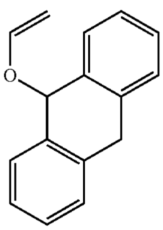
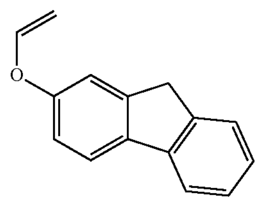
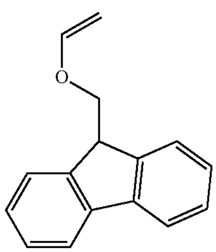
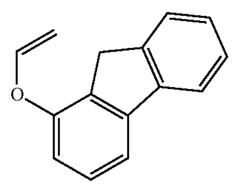
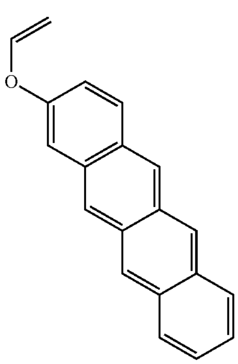
Examples of the monomer from which recurring unit (b2) As derived are given below, but not limited thereto.
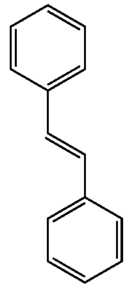
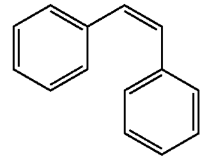
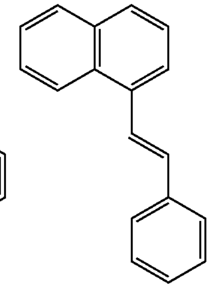
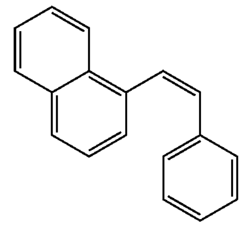
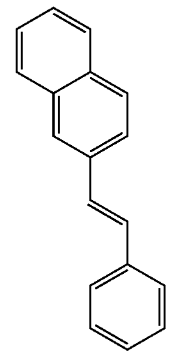
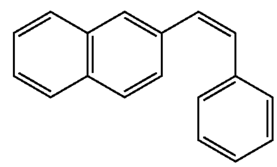
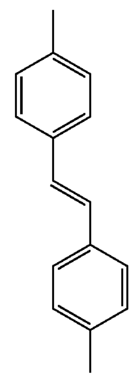
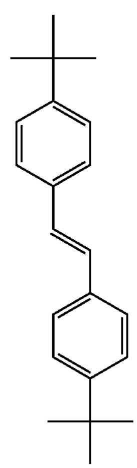
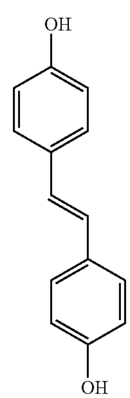
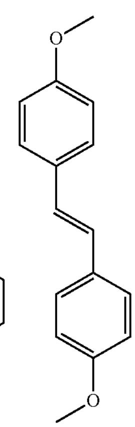
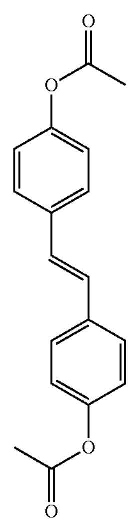

-continued
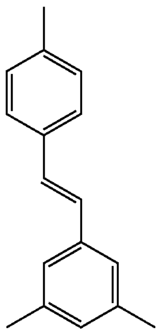
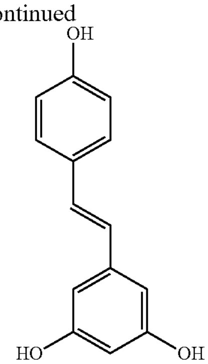
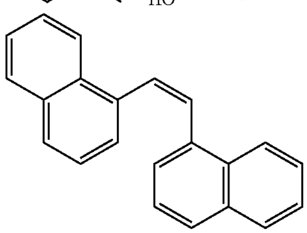
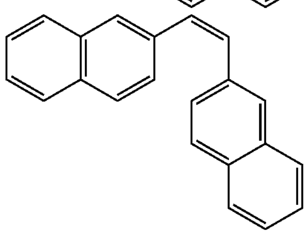
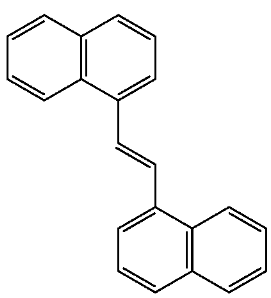
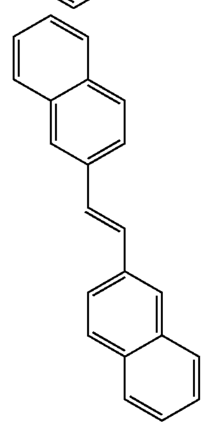
Examples of the monomer from which recurring unit (b3) is derived are given below, but not limited thereto.
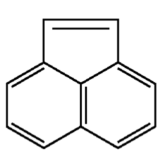
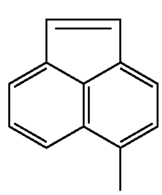
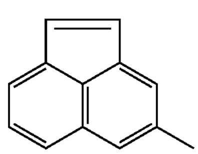
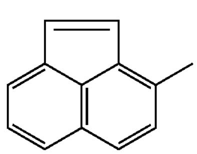
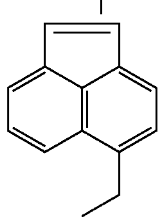
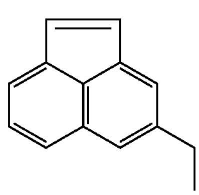
-continued
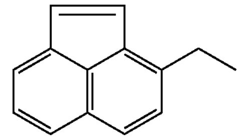
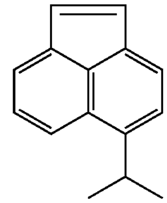
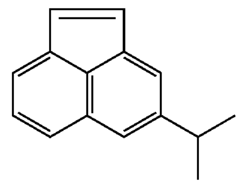
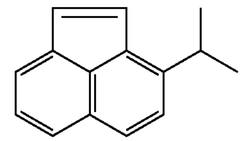
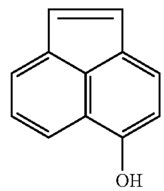
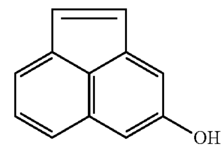
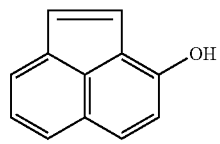
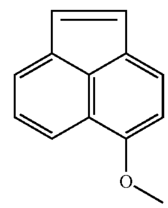
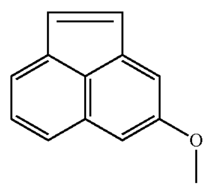
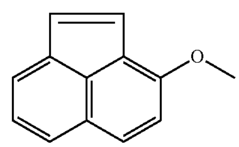
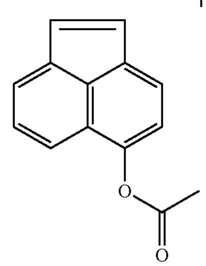
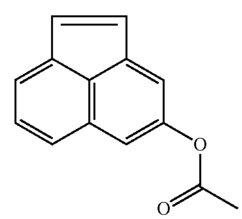
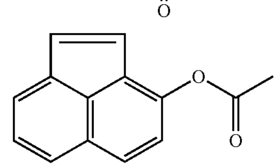
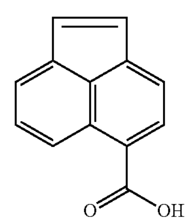
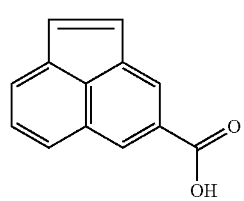
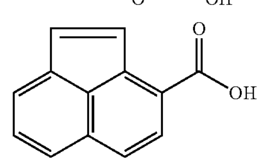

-continued
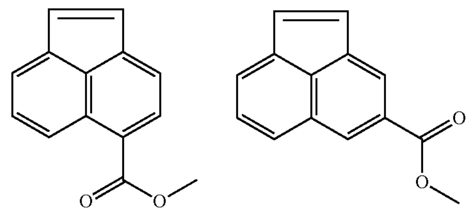
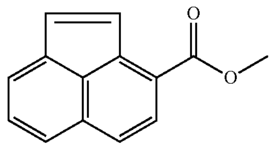
Examples of the monomer from which recurring unit (b4) is derived are given below, but not limited thereto.
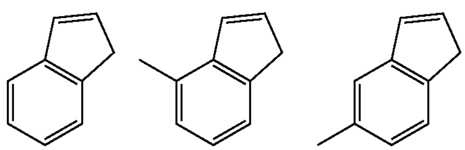
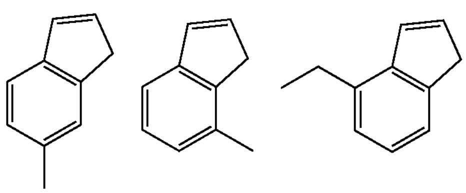
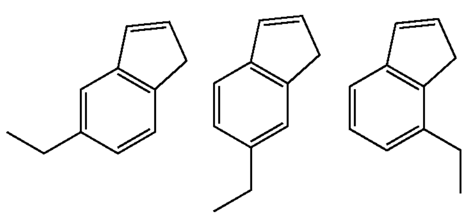
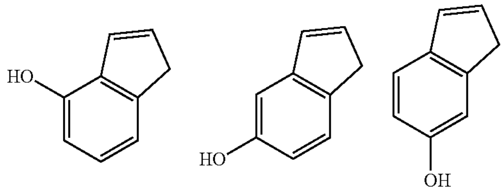
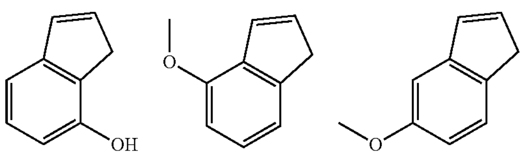
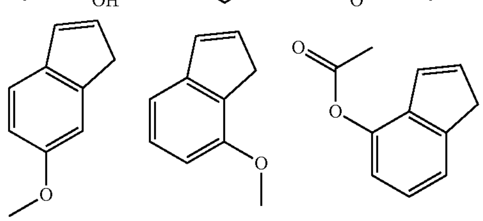
-continued
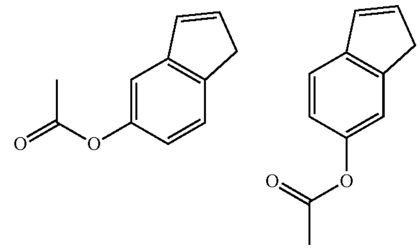
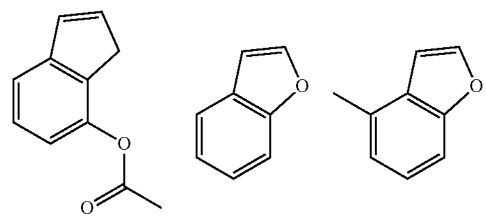
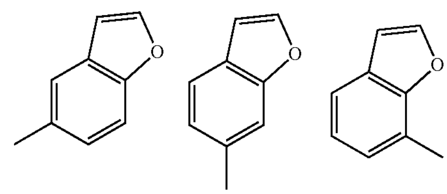
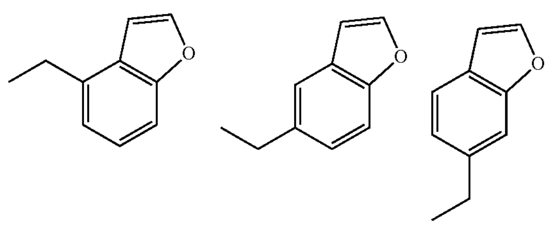
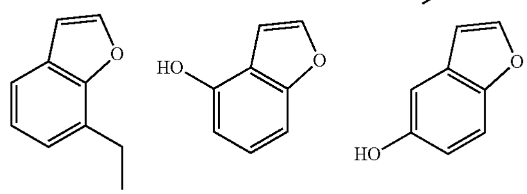
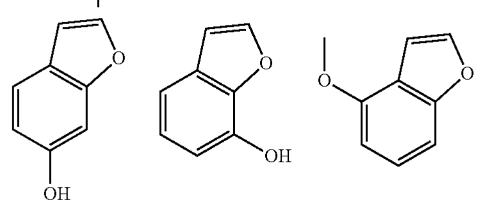
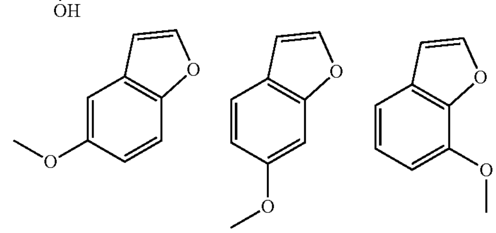
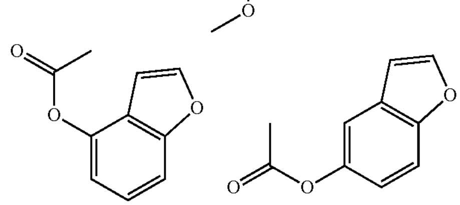

-continued

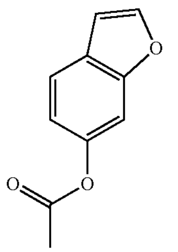
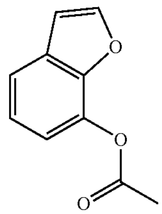
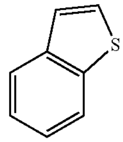
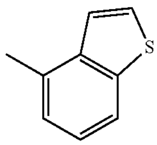
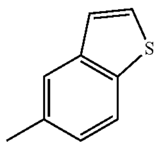
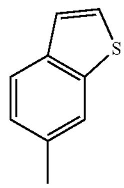
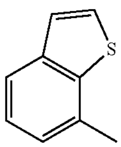
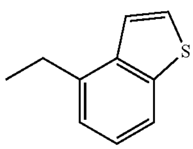
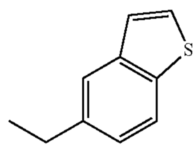
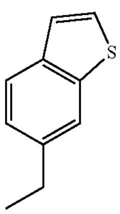
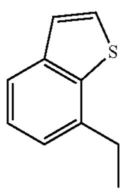
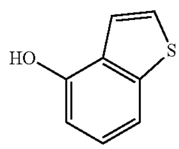
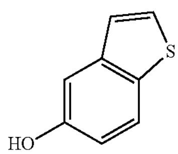
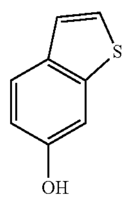
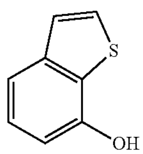
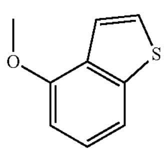
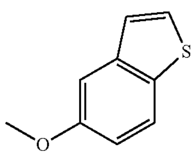
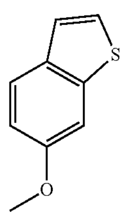
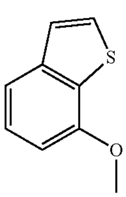
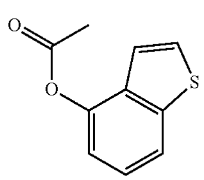
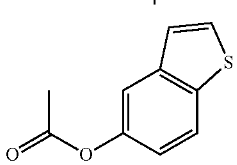
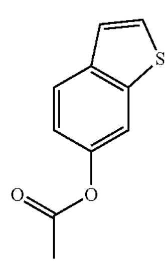

-continued

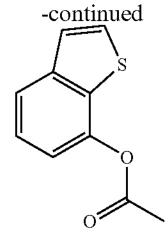

For the purpose of improving alkaline solubility, the fluorine-containing polymer may further comprise recurring units (c1) having a carboxyl or sulfa group as described in JP-A 2008-065304.

In the (co)polymer, recurring units (a1) to (a3), recurring units (b1) to (b4), and recurring units (c1) may be incorporated in the following range:

preferably $0 \le a1 \le 1.0$, $0 \le a2 \le 1.0$, $0 \le a3 < 1.0$, $0 < a1+a2+a3 \le 1.0$, $0 \le b1 \le 0.9$, $0 \le b2 \le 0.9$, $0 \le b3 \le 0.9$, $0 \le b4 \le 0.9$, $0 \le b1+b2+b3+b4 \le 0.9$, and $0 \le c1 \le 0.6$; more preferably $0 \le a1 \le 1.0$, $0 \le a2 \le 1.0$, $0 \le a3 \le 0.8$, $0.2 \le a1+a2+a3 \le 1.0$, $0 \le b1 \le 0.8$, $0 \le b2 \le 0.8$, $0 \le b3 \le 0.8$, $0 \le b4 \le 0.8$, $0 \le b1+b2+b3+b4 \le 0.8$, and $0 \le c1 \le 0.5$; even more preferably $0 \le a1 \le 1.0$, $0 \le a2 \le 1.0$, $0 \le a3 \le 0.7$, $0.3 \le a1+a2+a3 \le 1.0$, $0 \le b1 \le 0.7$, $0 \le b2 \le 0.7$, $0 \le b3 \le 0.7$, $0 \le b4 \le 0.7$, $0 \le b1+b2+b3+b4 \le 0.7$, and $0 \le c1 \le 0.4$.

The fluorine-containing polymer has a weight average molecular weight (Mw) of preferably 1,000 to 20,000, more preferably 2,000 to 10,000. As long as Mw is equal to or more than 1,000, the risk that the resist pattern as developed experiences a film thickness loss as a result of mixing with resist base resin is avoided. As long as Mw is equal to or less than 20,000, the polymer is fully soluble in a resist solvent and alkaline developer. Throughout the disclosure, Mw is as measured by gel permeation chromatography (GPC) versus polystyrene standards using tetrahydrofuran solvent.

The fluorine-containing polymer is generally prepared by radical polymerization using a radical polymerization initiator or ionic (anionic) polymerization using a catalyst such as alkyl lithium. Either polymerization may be performed by its standard procedure.

Examples of the radical polymerization initiator used herein include, but are not limited to, azo compounds such as 2,2'-azobis(4-methoxy-2,4-dimethylvaleronitrile), 2,2'-azobis(2,4-dimethylvaleronitrile), 2,2'-azobisisobutyronitrile, 2,2'-azobis(2,4,4-trimethylpentane), peroxides such as t-butyl peroxypivalate, lauroyl peroxide, benzoyl peroxide, and t-butyl peroxylaurate, water-soluble initiators in the form of persulfates such as potassium persulfate, and redox initiators based on a combination of a peroxide such as potassium persulfate or hydrogen peroxide with a reducing agent such as sodium sulfite. Although an amount of the initiator used may vary with its type and polymerization conditions, it is preferably used in an amount of 0.001 to 5%, more preferably 0.01 to 2% by weight based on the total weight of monomers to be polymerized.

The polymerization reaction may be performed in a solvent. A solvent which does not retard polymerization reaction is preferable. Typical solvents include esters such as ethyl acetate and n-butyl acetate; ketones such as acetone, methyl ethyl ketone and methyl isobutyl ketone; aliphatic and aromatic hydrocarbons such as toluene, xylene and cyclohexane; alcohols such as isopropyl alcohol and ethylene glycol monomethyl ether; and ether solvents such as diethyl ether, dioxane and tetrahydrofuran, which may be used alone or in admixture. Any well-known molecular weight regulator such as dodecylmercaptan may be used in combination.

For the polymerization reaction, the temperature may be set appropriate depending on the type of the initiator and the boiling point of the solvent. Most often, the temperature is preferably in the range of 20 to 200° C., more preferably 50 to 140° C. The reactor used for polymerization reaction is not particularly limited.

At the end of reaction, the desired polymer may be recovered by removing the solvent by any well-known procedure such as re-precipitation or distillation.

Base Resin

The base resin used in the resist composition is preferably defined as comprising recurring units having the formula (7) and/or recurring units having the formula (8), which are referred to as recurring units (d1) and (d2), respectively.

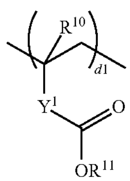

(7)

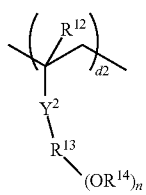

(8)

Herein $R^{10}$ and $R^{12}$ are each independently hydrogen or methyl. $R^{11}$ and $R^{14}$ are each independently hydrogen or an acid labile group. $Y^1$ is a single bond, phenylene, naphthylene or —C(═O)—O—$R^{15}$—, wherein $R^{15}$ is a straight, branched or cyclic $C_1$-$C_{10}$ alkylene group which may contain an ether moiety, ester moiety, lactone ring or hydroxyl moiety, a phenylene group or naphthylene group. $Y^2$ is a single bond, phenylene, naphthylene, —C(═O)—O—$R^{16}$—, —C(═O)—NH—$R^{16}$—, —O—$R^{16}$— or —S—$R^{16}$—, wherein $R^{16}$ is a straight, branched or cyclic $C_1$-$C_{10}$ alkylene group which may contain an ether moiety, ester moiety, lactone ring or hydroxyl moiety. $R^{13}$ is a single bond, a straight, branched or cyclic $C_1$-$C_{16}$ divalent to pentavalent aliphatic hydrocarbon group which may contain an ether or ester moiety, or a phenylene group, d1 and d2 are positive numbers satisfying $0 \le d1 < 1.0$, $0 \le d2 < 1.0$, and $0 < d1+d2 \le 1.0$, and n is an integer of 1 to 4.

The recurring unit (d1) is a unit having a carboxyl group or a unit having a carboxyl group in which the hydrogen atom is substituted by an acid labile group. Examples of the monomer from which recurring units (d1) are derived are shown below, but not limited thereto. Notably, $R^{10}$ and $R^{11}$ are as defined above.

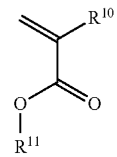
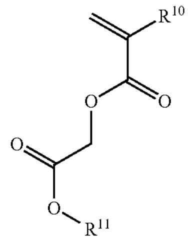
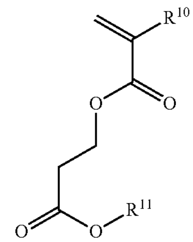
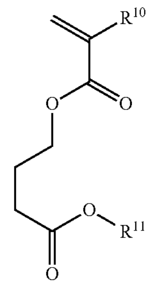
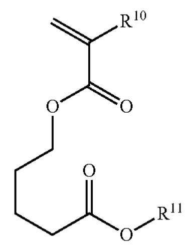
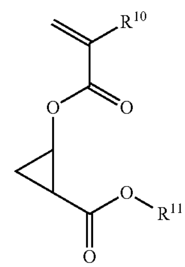
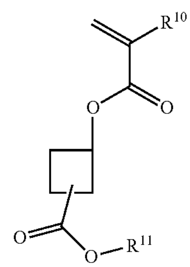
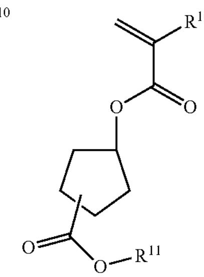
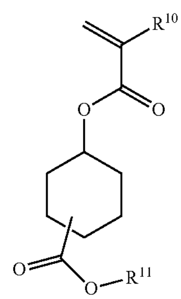
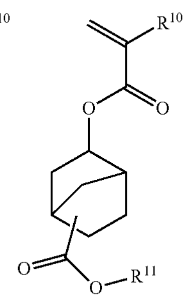
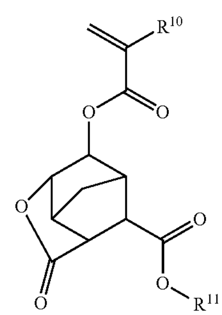
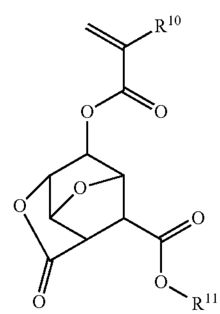
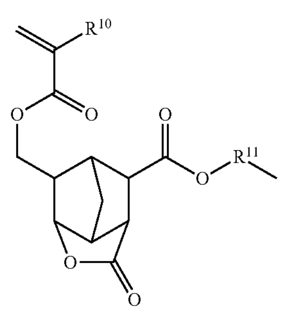

-continued
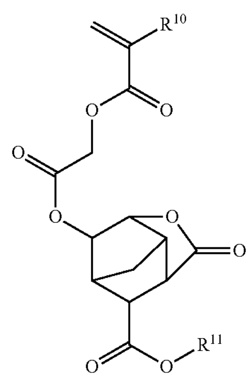
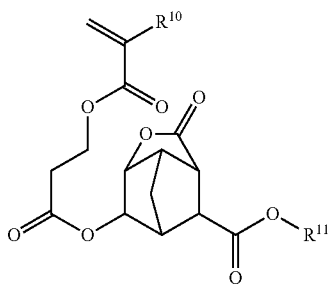
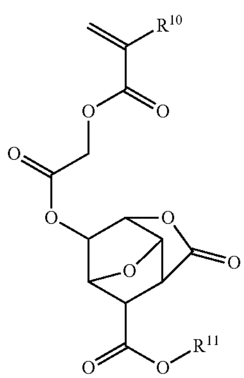
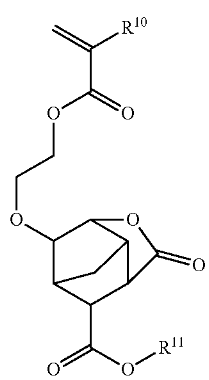
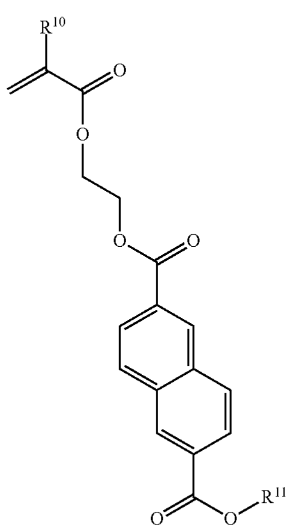
-continued
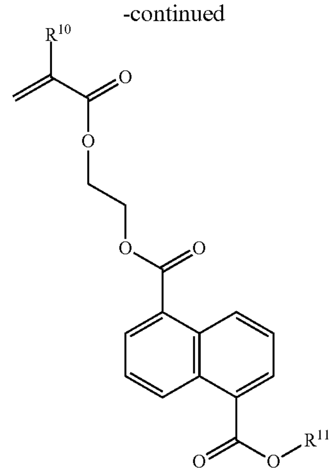
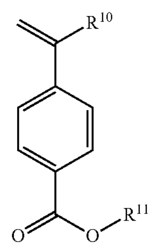
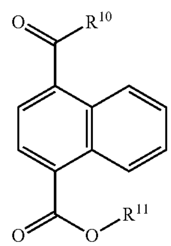
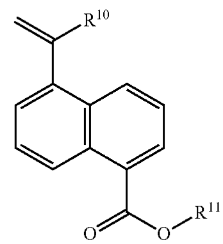
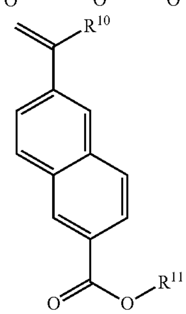
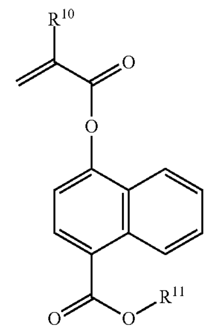
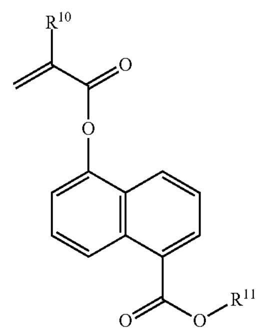
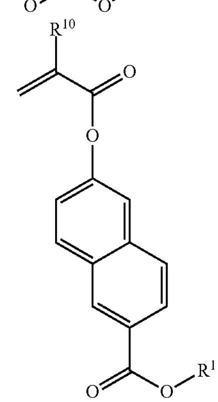
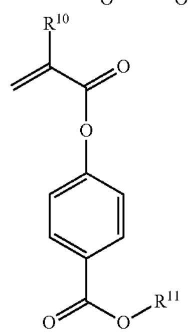
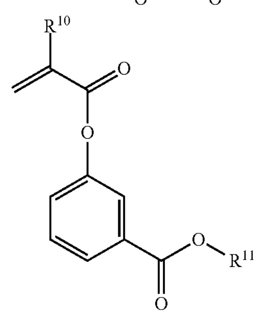

-continued

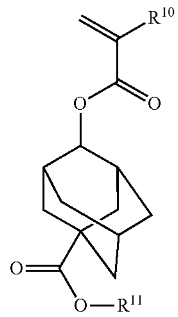

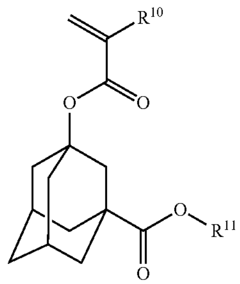

The recurring unit (d2) is a unit having a hydroxyl or phenolic hydroxyl group or a unit having a hydroxyl or phenolic hydroxyl group in which the hydrogen atom is substituted by an acid labile group. Examples of the monomer from which recurring units (d2) are derived are shown below, but not limited thereto. Notably, $R^{12}$ and $R^{13}$ are as defined above.

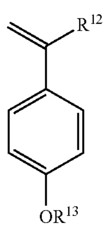

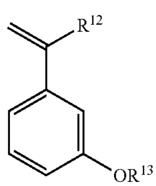

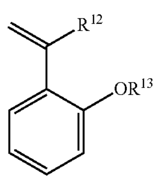

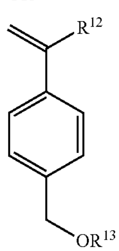

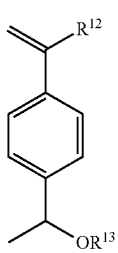

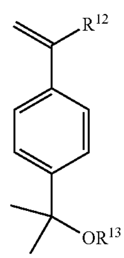

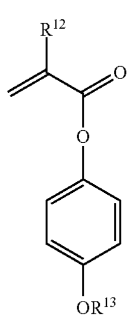

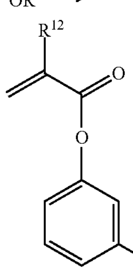

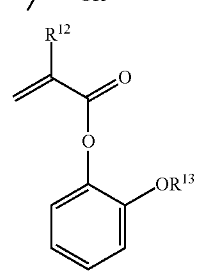

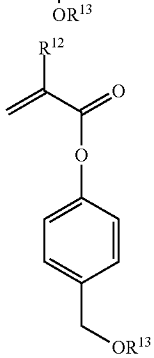

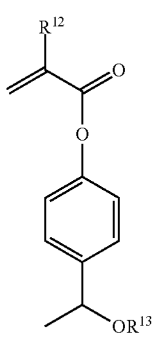

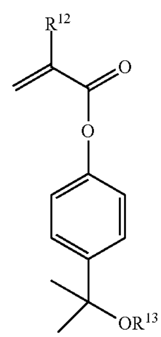

-continued

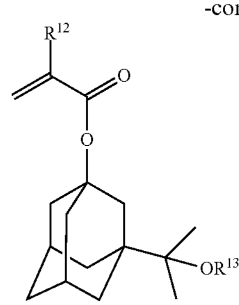

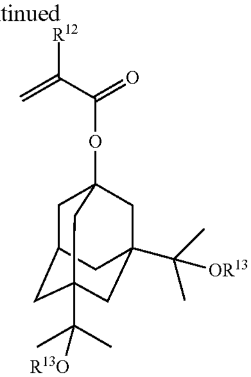

The acid labile groups represented by $R^{11}$ and $R^{14}$ in the recurring units (d1) and (d2) may be selected from a variety of such groups. The acid labile groups may be the same or different and preferably include groups of the following formulae (A-1) to (A-3).

$$—(CH_2)_a—\overset{\overset{\displaystyle O}{\|}}{C}—O—R^{30} \tag{A-1}$$

$$—\underset{\underset{\displaystyle R^{32}}{|}}{\overset{\overset{\displaystyle R^{31}}{|}}{C}}—O—R^{33} \tag{A-2}$$

$$—\underset{\underset{\displaystyle R^{35}}{|}}{\overset{\overset{\displaystyle R^{34}}{|}}{C}}—R^{36} \tag{A-3}$$

In formula (A-1), $R^{30}$ is a tertiary alkyl group of 4 to 20 carbon atoms, preferably 4 to 15 carbon atoms, a trialkylsilyl group in which each alkyl moiety has 1 to 6 carbon atoms, an oxoalkyl group of 4 to 20 carbon atoms, or a group of formula (A-3), and "a" is an integer of 0 to 6. Exemplary tertiary alkyl groups are t-butyl, t-pentyl, 1,1-diethylpropyl, 1-ethylcyclopentyl, 1-butylcyclopentyl, 1-ethylcyclohexyl, 1-butylcyclohexyl, 1-ethyl-2-cyclopentenyl, 1-ethyl-2-cyclohexenyl, and 2-methyl-2-adamantyl. Exemplary trialkylsilyl groups are trimethylsilyl, triethylsilyl, and dimethyl-t-butylsilyl. Exemplary oxoalkyl groups are 3-oxocyclohexyl, 4-methyl-2-oxooxan-4-yl, and 5-methyl-2-oxooxolan-5-yl.

In formula (A-2), $R^{31}$ and $R^{32}$ are each independently hydrogen or a straight, branched or cyclic alkyl group of 1 to 18 carbon atoms, preferably 1 to 10 carbon atoms. Exemplary alkyl groups include methyl, ethyl, propyl, isopropyl, n-butyl, s-butyl, t-butyl, cyclopentyl, cyclohexyl, 2-ethylhexyl, and n-octyl. $R^{33}$ is a monovalent hydrocarbon group of 1 to 18 carbon atoms, preferably 1 to 10 carbon atoms, which may contain a heteroatom such as oxygen, examples of which include straight, branched or cyclic alkyl groups and substituted forms of such alkyl groups in which some hydrogen atoms are replaced by hydroxyl, alkoxy, oxo, amino, alkylamino or the like. Illustrative examples of the Substituted alkyl groups are shown below.

$—(CH_2)_4OH$ $—(CH_2)_2O(CH_2)_3CH_3$

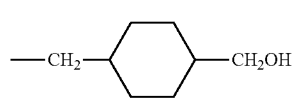

$—(CH_2)_2O(CH_2)_2OH$

-continued $-(CH_2)_6OH$

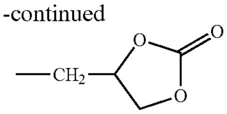

A pair of $R^{31}$ and $R^{32}$, $R^{31}$ and $R^{33}$, or $R^{32}$ and $R^{33}$ may bond together to form a ring with the carbon and oxygen atoms to which they are attached. Ring-forming participants of $R^{31}$, $R^{32}$ and $R^{33}$ represent a straight or branched alkylene group of 1 to 18 carbon atoms, preferably 1 to 10 carbon atoms while the ring preferably has 3 to 10 carbon atoms, more preferably 4 to 10 carbon atoms.

Examples of the acid labile groups of formula (A-1) include t-butoxycarbonyl, t-butoxycarbonylmethyl, t-pentyloxycarbonyl, t-pentyloxycarbonylmethyl, 1,1-diethylpropyloxycarbonyl, 1,1-diethylpropyloxycarbonylmethyl, 1-ethylcyclopentyloxycarbonyl, 1-ethylcyclopentyloxycarbonylmethyl, 1-ethyl-2-cyclopentenyloxycarbonyl, 1-ethyl-2-cyclopentenyloxycarbonylmethyl, 1-ethoxyethoxycarbonylmethyl, 2-tetrahydropyranyloxycarbonylmethyl, and 2-tetrahydrofuranyloxycarbonylmethyl groups.

Also included are substituent groups having the formulae (A-1)-1 to (A-1)-10.

(A-1)-1

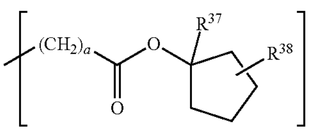

(A-1)-2

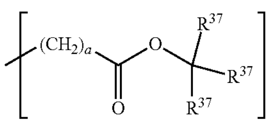

(A-1)-3

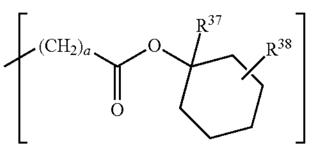

(A-1)-4

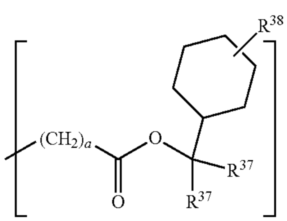

(A-1)-5

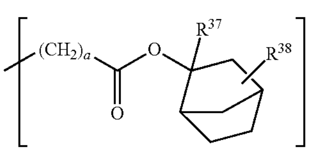

(A-1)-6

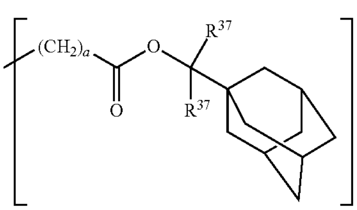

-continued (A-1)-7

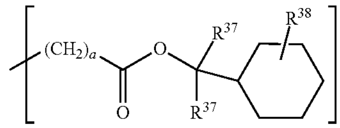

(A-1)-8

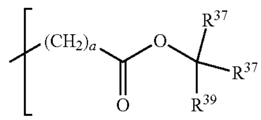

(A-1)-9

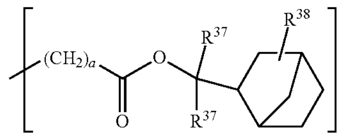

(A-1)-10

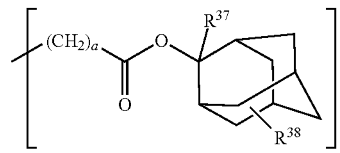

Herein $R^{37}$ is each independently a straight, branched or cyclic $C_1$-$C_{10}$ alkyl group or $C_6$-$C_{20}$ aryl group, $R^{38}$ is hydrogen or a straight, branched or cyclic $C_1$-$C_{10}$ alkyl group, $R^{39}$ is each independently a straight, branched or cyclic $C_2$-$C_{10}$ alkyl group or $C_6$-$C_{20}$ aryl group, and "a" is an integer of 0 to 6.

Of the acid labile groups of formula (A-2), the straight and branched ones are exemplified by groups having the following formulae (A-2)-1 to (A-2)-69.

(A-2)-1 $-CH_2-O-CH_3$ (A-2)-2 $-CH_2-O-CH_2-CH_3$ (A-2)-3 $-CH_2-O-(CH_2)_2-CH_3$ (A-2)-4 $-CH_2-O-(CH_2)_3-CH_3$ (A-2)-5 $-CH_2-O-CH(CH_3)-CH_3$ (A-2)-6 $-CH_2-O-C(CH_3)_2-CH_3$ (A-2)-7 $-CH(CH_3)-O-CH_3$ (A-2)-8 $-CH(CH_2CH_3)-O-CH_3$ (A-2)-9 $-CH((CH_2)_2CH_3)-O-CH_3$

-continued
(A-2)-10
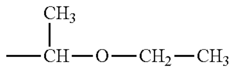
(A-2)-11
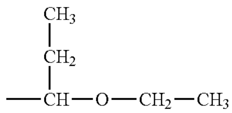
(A-2)-12
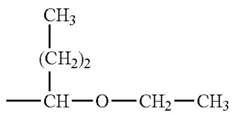
(A-2)-13
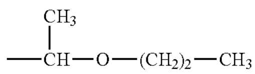
(A-2)-14
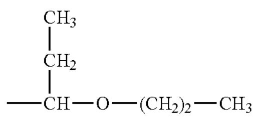
(A-2)-15
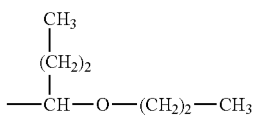
(A-2)-16
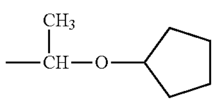
(A-2)-17
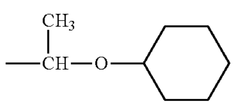
(A-2)-18
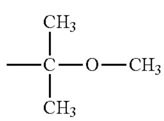
(A-2)-19
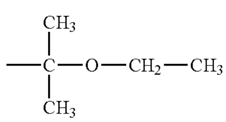
(A-2)-20
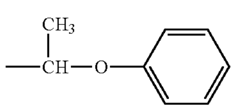
(A-2)-21
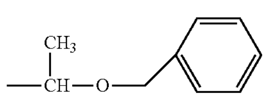
(A-2)-22
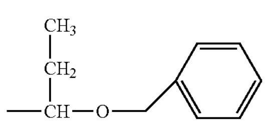
(A-2)-23
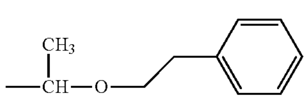
-continued
(A-2)-24
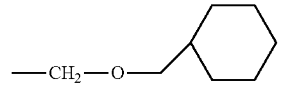
(A-2)-25
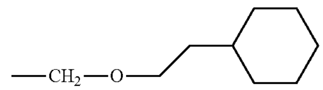
(A-2)-26
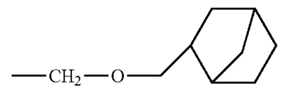
(A-2)-27
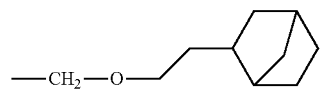
(A-2)-28
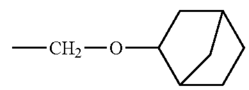
(A-2)-29
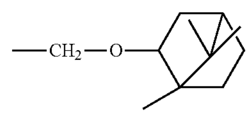
(A-2)-30
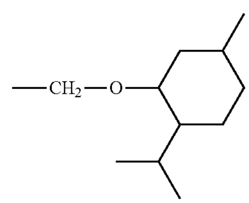
(A-2)-31
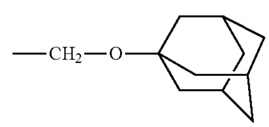
(A-2)-32
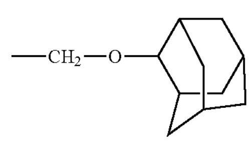
(A-2)-33
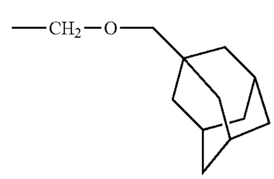
(A-2)-34
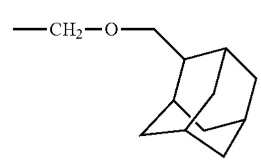

-continued
(A-2)-35
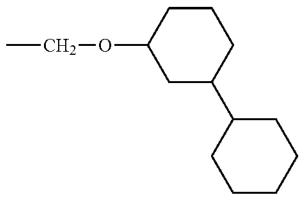
(A-2)-36
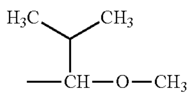
(A-2)-37
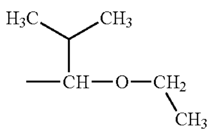
(A-2)-38
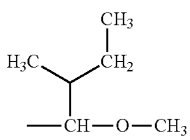
(A-2)-39
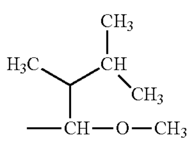
(A-2)-40
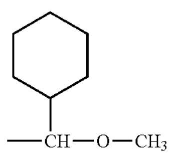
(A-2)-41
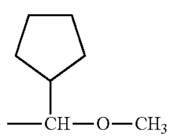
(A-2)-42
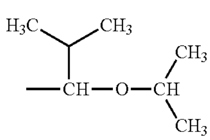
(A-2)-43
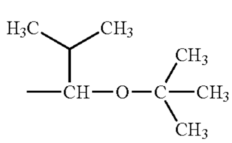
(A-2)-44
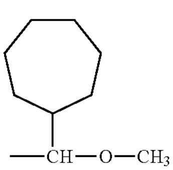
-continued
(A-2)-45
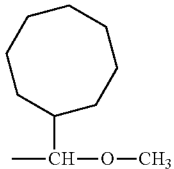
(A-2)-46
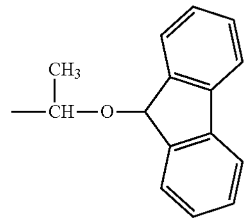
(A-2)-47
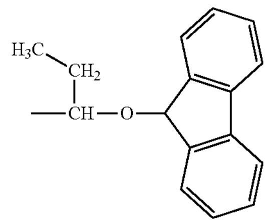
(A-2)-48
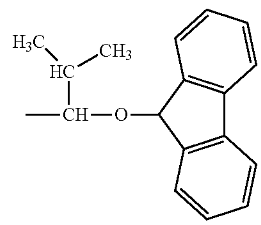
(A-2)-49
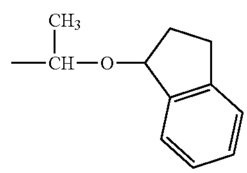
(A-2)-50
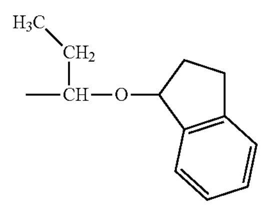
(A-2)-51
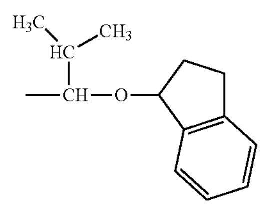
(A-2)-52
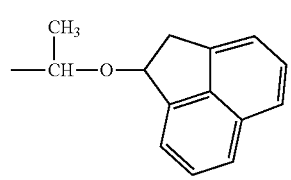

-continued
(A-2)-53
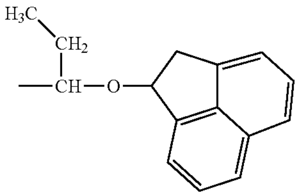
(A-2)-54
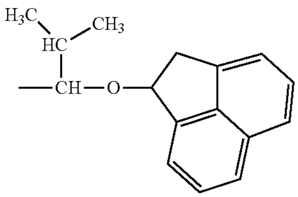
(A-2)-55
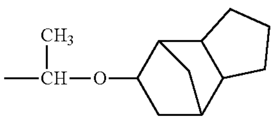
(A-2)-56
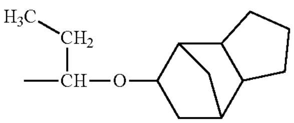
(A-2)-57
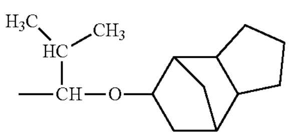
(A-2)-58
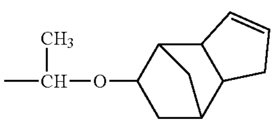
(A-2)-59
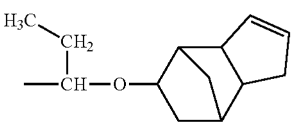
(A-2)-60
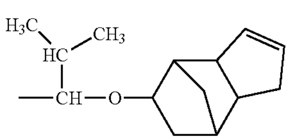
(A-2)-61
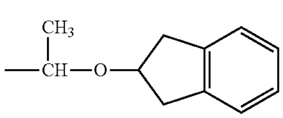
(A-2)-62
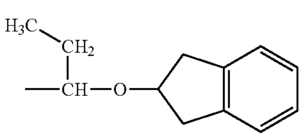
(A-2)-63
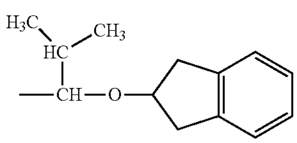
-continued
(A-2)-64
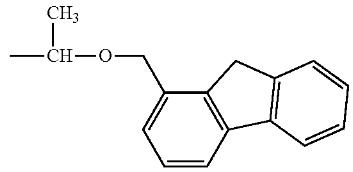
(A-2)-65
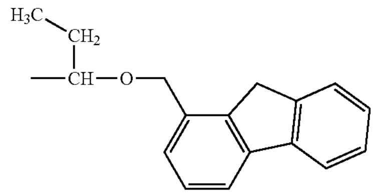
(A-2)-66
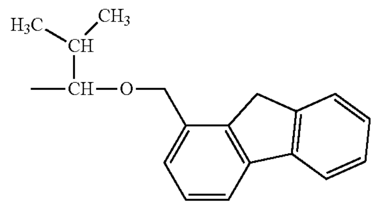
(A-2)-67
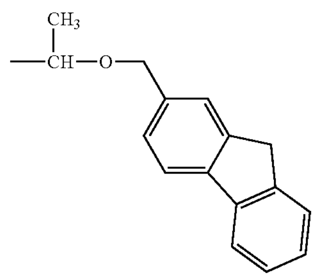
(A-2)-68
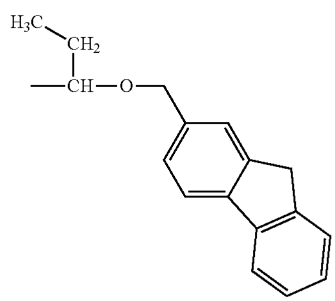
(A-2)-69
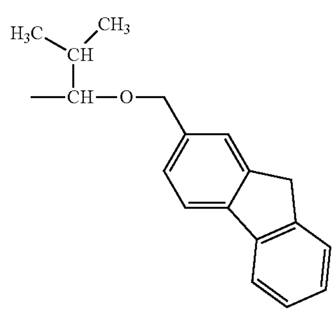
Of the acid labile groups of formula (A-2), the cyclic ones are, for example, tetrahydrofuran-2-yl, 2-methyltetrahydrofuran-2-yl, tetrahydropyran-2-yl, and 2-methyltetrahydropyran-2-yl.
Other examples of acid labile groups include those of the following formula (A-2a) or (A-2b) while the base resin may be crosslinked within the molecule or between molecules with these acid labile groups.

(A-2a)

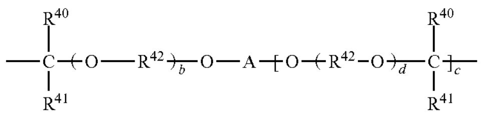

(A-2b)

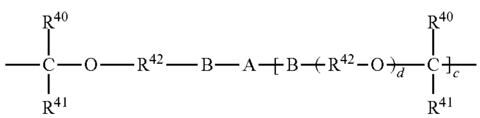

Herein $R^{40}$ and $R^{41}$ are each independently hydrogen or a straight, branched or cyclic $C_1$-$C_8$ alkyl group, or $R^{40}$ and $R^{41}$, taken together, may form a ring with the carbon atom to which they are attached, and $R^{40}$ and $R^{41}$ represent a straight or branched $C_1$-$C_8$ alkylene group when they form a ring. $R^{42}$ is independently a straight, branched or cyclic $C_1$-$C_{10}$ alkylene group. Each of b and d is an integer of 0 to 10, preferably 0 to 5, and c is an integer of 1 to 7, preferably 1 to 3.

"A" is a (c+1)-valent aliphatic or alicyclic saturated hydrocarbon group, aromatic hydrocarbon group or heterocyclic group having 1 to 50 carbon atoms, which may be separated by a heteroatom or in which one or more carbon-bonded hydrogen atoms may be substituted by hydroxyl, carboxyl, acyl or fluorine. Preferably, "A" is selected from straight, branched or cyclic alkylene, alkyltriyl and alkyltetrayl groups, and $C_6$-$C_{36}$ arylene groups. "B" is —CO—O—, —NHCO—O— or —NHCONH—.

The crosslinking acetal groups of formulae (A-2a) and (A-2b) are exemplified by the following formulae (A-2)-70 through (A-2)-77.

(A-2)-70

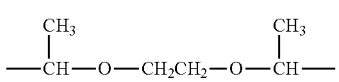

(A-2)-71

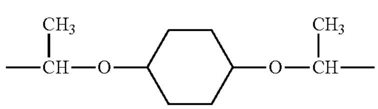

(A-2)-72

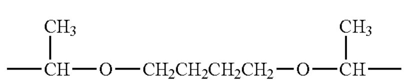

(A-2)-73

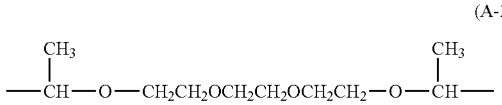

(A-2)-74

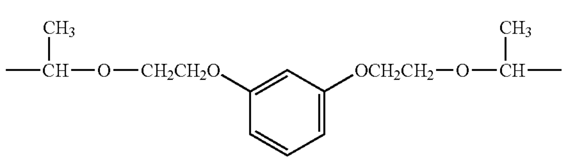

-continued (A-2)-75

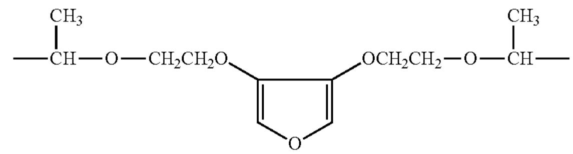

(A-2)-76

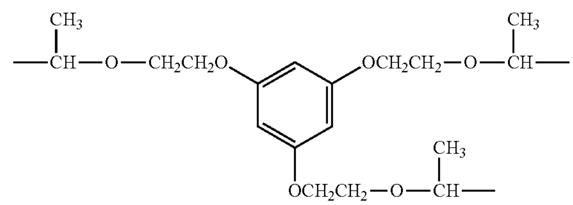

(A-2)-77

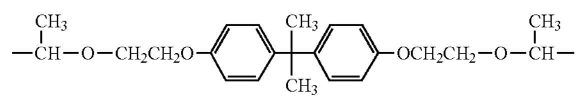

In formula (A-3), $R^{34}$, $R^{35}$ and $R^{36}$ are each independently a monovalent hydrocarbon group, typically a straight, branched or cyclic $C_1$-$C_{20}$, alkyl or $C_2$-$C_{20}$ alkenyl group, which may contain a heteroatom such as oxygen, sulfur, nitrogen or fluorine. A pair of $R^{34}$ and $R^{35}$, $R^{34}$ and $R^{36}$, or $R^{35}$ and $R^{36}$ may bond together to form a $C_3$-$C_{20}$ aliphatic ring with the carbon atom to which they are attached.

Exemplary tertiary alkyl groups of formula (A-3) include t-butyl, triethylcarbyl, 1-ethylnorbornyl, 1-methylcyclohexyl, 1-ethylcyclopentyl, 2-(2-methyl)adamantyl, 2-(2-ethyl)adamantyl, and t-pentyl.

Other exemplary tertiary alkyl groups include those the following formulae (A-3)-1 to (A-3)-18.

(A-3)-1

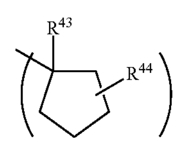

(A-3)-2

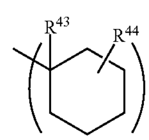

(A-3)-3

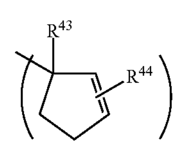

(A-3)-4

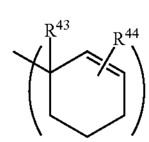

(A-3)-5

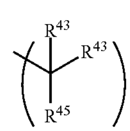

-continued (A-3)-6

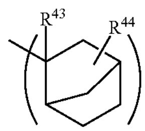

(A-3)-7

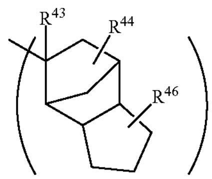

(A-3)-8

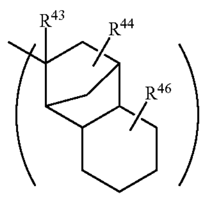

(A-3)-9

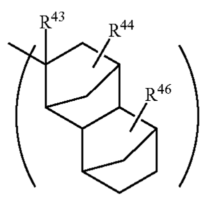

(A-3)-10

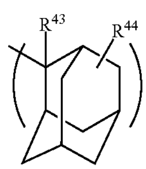

(A-3)-11

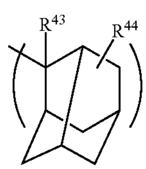

(A-3)-12

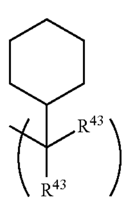

(A-3)-13

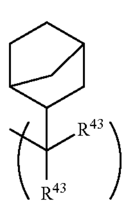

-continued (A-3)-14

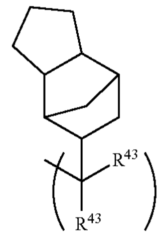

(A-3)-15

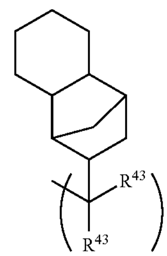

(A-3)-16

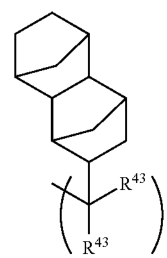

(A-3)-17

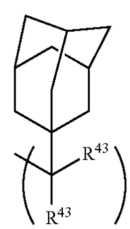

(A-3)-18

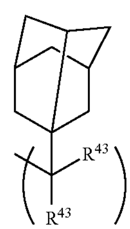

Herein $R^{43}$ is each independently a straight, branched or cyclic $C_1$-$C_8$ alkyl group or $C_6$-$C_{20}$ aryl group, typically phenyl. $R^{44}$ and $R^{46}$ each are hydrogen or a straight, branched or cyclic $C_1$-$C_{20}$ alkyl group. $R^{45}$ is a $C_6$-$C_{20}$ aryl group, typically phenyl.

The base resin may be crosslinked within the molecule or between molecules with an acid labile group having the following formula (A-3)-19 or (A-3)-20.

(A-3)-19

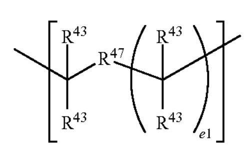

-continued (A-3)-20

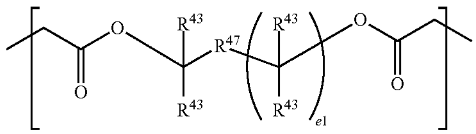

Herein $R^{43}$ is as defined above, $R^{47}$ is a straight branched or cyclic $C_1$-$C_{20}$ alkylene group or $C_4$-$C_{20}$ arylene group, typically phenylene, which may contain a heteroatom such as oxygen, sulfur or nitrogen, and e1 is an integer of 1 to 3.

Of recurring units having acid labile groups of formula (A-3), recurring units of (meth) acrylate having an exo-form structure represented by the formula (A-3)-21 are preferred.

(A-3)-21

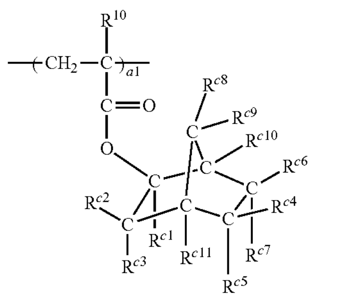

Herein, $R^{10}$ and a1 are as defined above; $R^{c1}$ is a straight, branched or cyclic $C_1$-$C_8$ alkyl group or an optionally substituted $C_6$-$C_{20}$ aryl group; $R^{c2}$ to $R^{c7}$, $R^{c10}$ and $R^{c11}$ are each independently hydrogen or a $C_1$-$C_{15}$ monovalent hydrocarbon group which may contain a heteroatom; and $R^{c8}$ and $R^{c9}$ are hydrogen. Alternatively, a pair of $R^{c2}$ and $R^{c3}$, $R^{c4}$ and $R^{c6}$, $R^{c4}$ and $R^{c7}$, $R^{c5}$ and $R^{c7}$, $R^{c5}$ and $R^{c11}$, $R^{c6}$ and $R^{c10}$, $R^{c8}$ and $R^{c9}$, or $R^{c9}$ and $R^{c10}$, taken together, may form a ring with the carbon atom to which they are attached, and in that event, the ring-forming participants represent a $C_1$-$C_{15}$ divalent hydrocarbon group which may contain a heteroatom. Also, a pair of $R^{c2}$ and $R^{c11}$, $R^{c8}$ and $R^{c11}$, or $R^{c4}$ and $R^{c6}$ which are attached to vicinal carbon atoms may bond together directly to form a double bond. $R^{c14}$ is hydrogen or a straight, branched or cyclic $C_1$-$C_{13}$ alkyl group. The formula also represents an enantiomer.

The monomers from which recurring units having formula (A-3)-21 are derived are described in U.S. Pat. No. 6,448,420 (JP-A 2000-327633). Illustrative non-limiting examples of suitable monomers are given below.

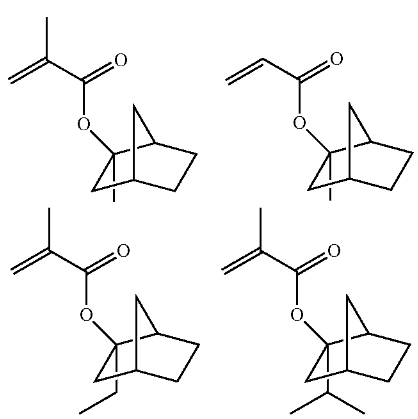

-continued

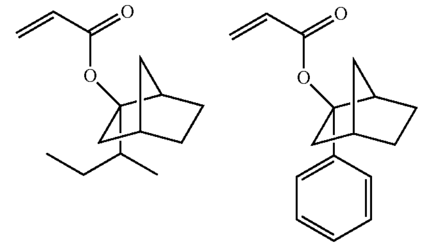

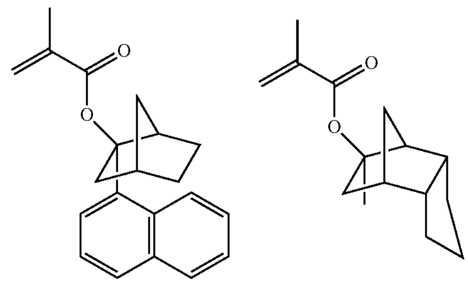

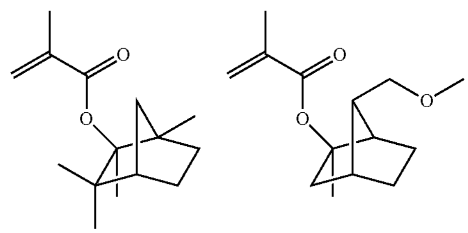

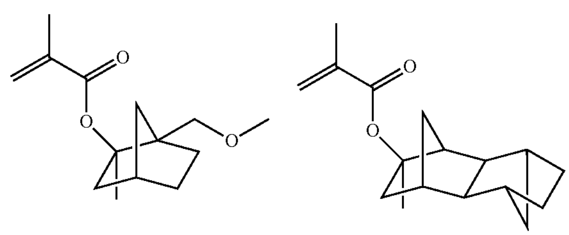

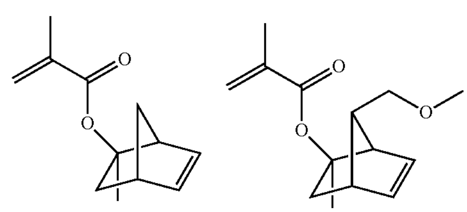

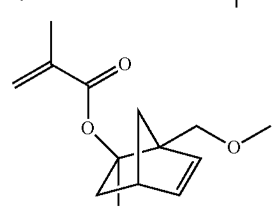

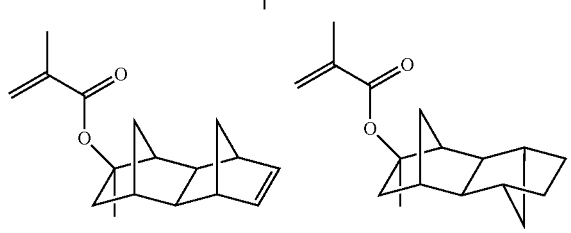

-continued

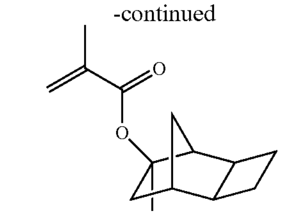

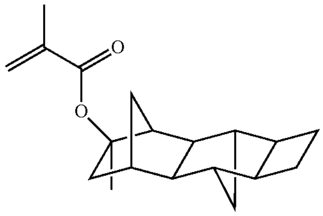

Also included in the recurring units having an acid labile group of formula (A-3) are units of (meth)acrylate having a furandiyl, tetrahydrofurandiyl or oxanorbornanediyl group as represented by the following formula (A-3)-22.

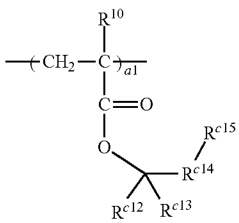

(A-3)-22

Herein $R^{10}$ and a1 are as defined above. $R^{c12}$ and $R^{c13}$ are each independently a straight, branched or cyclic $C_1$-$C_{10}$ monovalent hydrocarbon group, or $R^{c12}$ and $R^{c13}$, taken together, may form an aliphatic hydrocarbon ring with the carbon atom to which they are attached. $R^{c14}$ is a divalent group selected from furandiyl, tetrahydrofurandiyl and oxanorbornanediyl. $R^{c15}$ is hydrogen or a straight, branched or cyclic $C_1$-$C_{10}$ monovalent hydrocarbon group which may contain a heteroatom.

Examples of the monomer from which the recurring units having formula (A-3)-21 are derived are shown below, but not limited thereto.

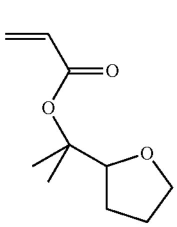 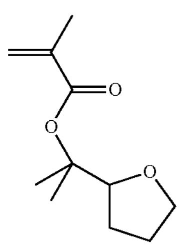 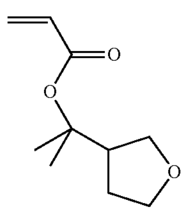

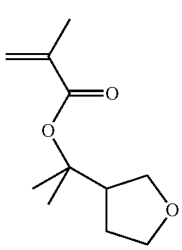 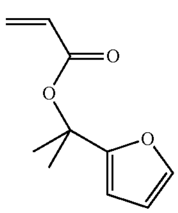 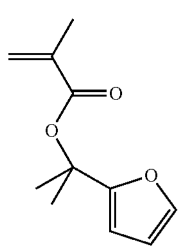

-continued

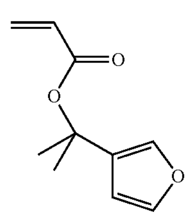 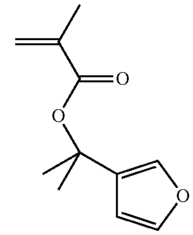 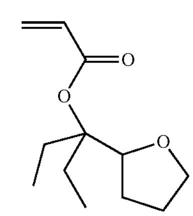

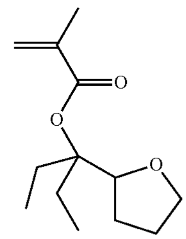 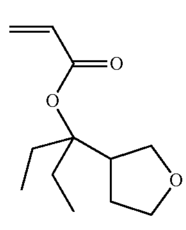 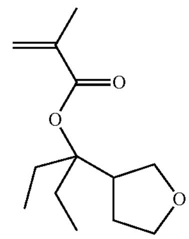

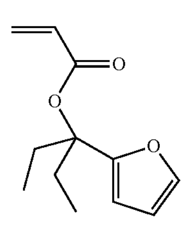 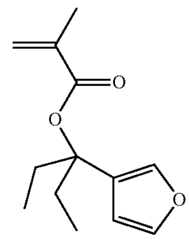 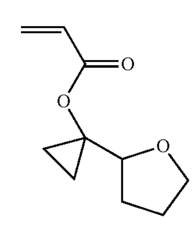

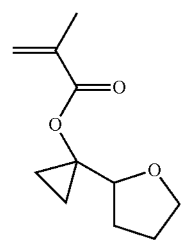 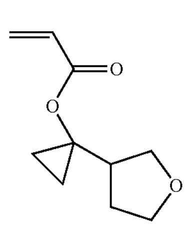 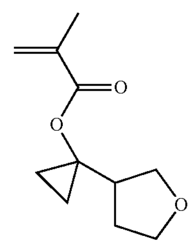

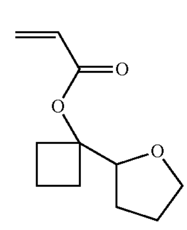 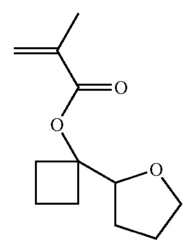 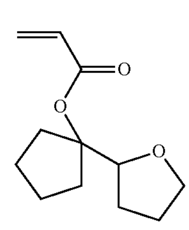

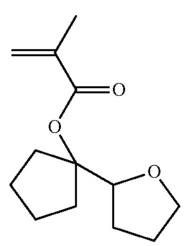 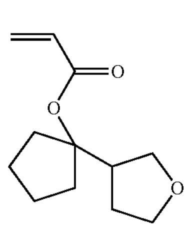 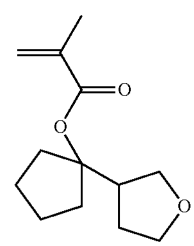

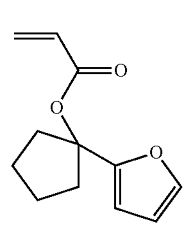 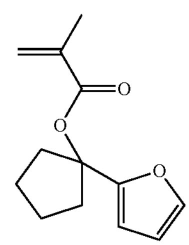 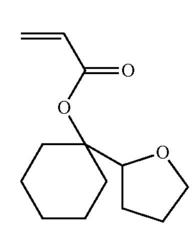

-continued
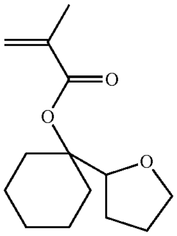
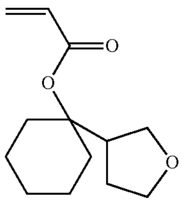
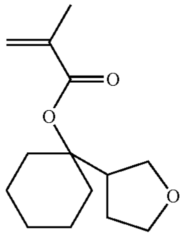
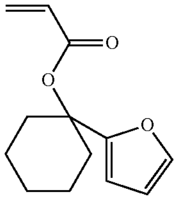
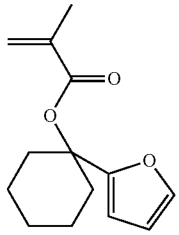
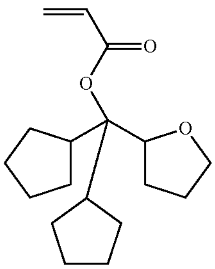
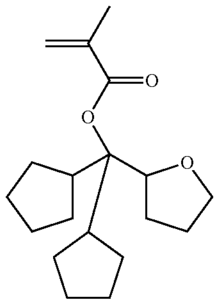
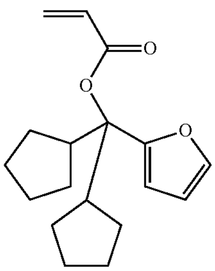
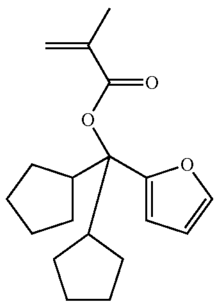
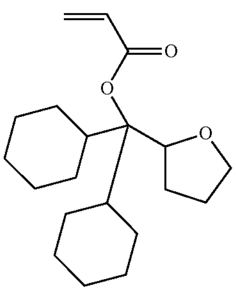
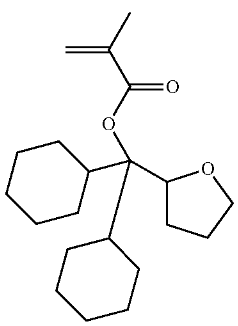
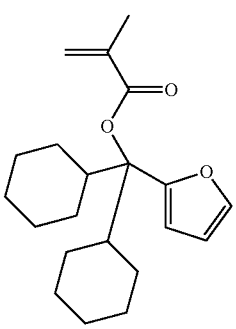
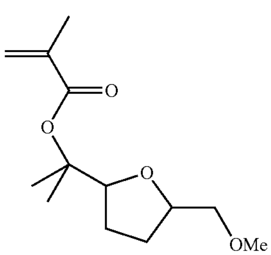
-continued
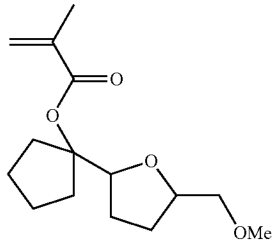
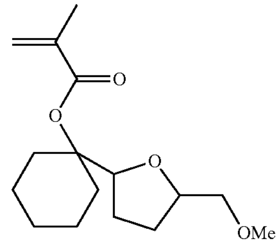
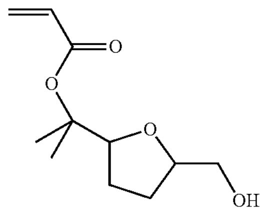
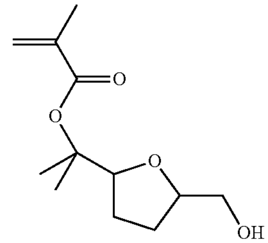
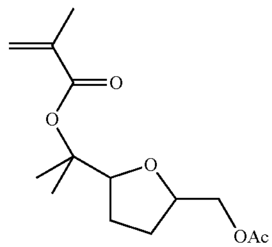
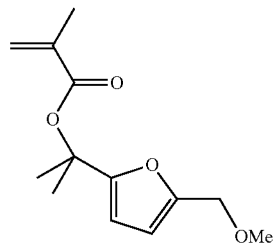
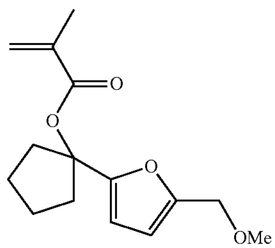
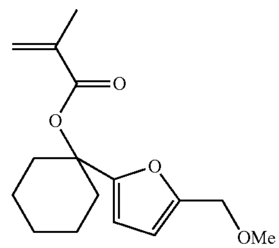
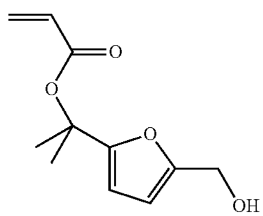
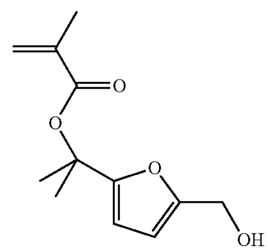
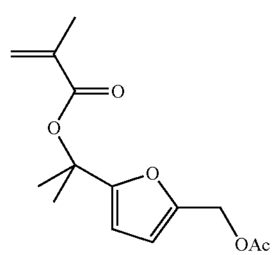
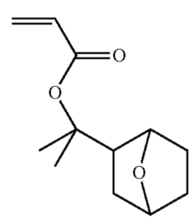
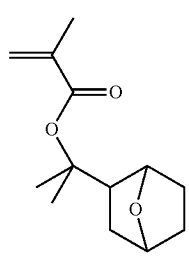
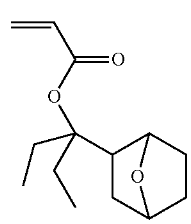
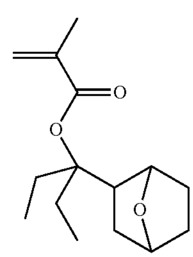

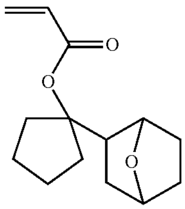
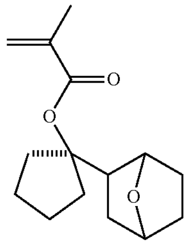
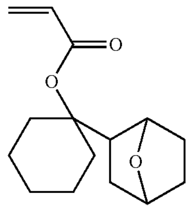
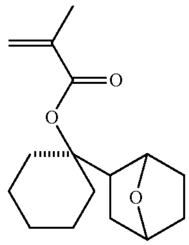
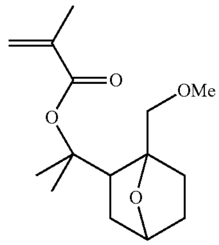
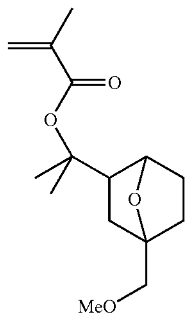
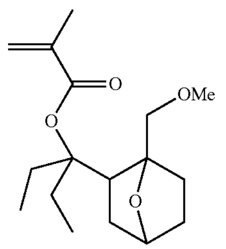
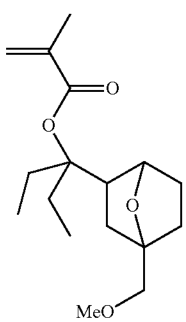
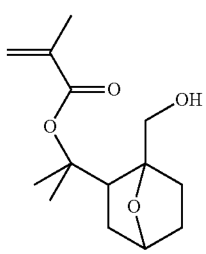
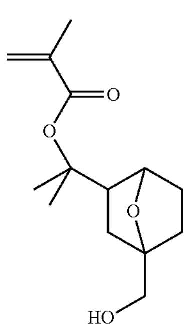
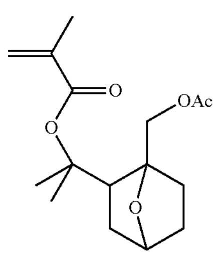
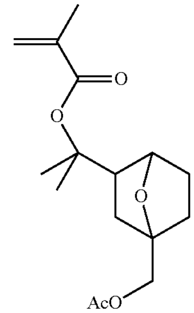
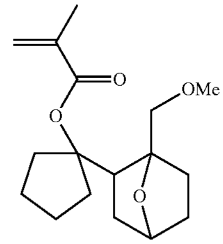
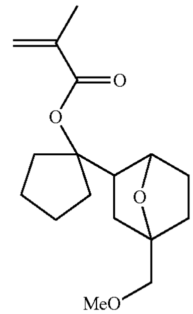
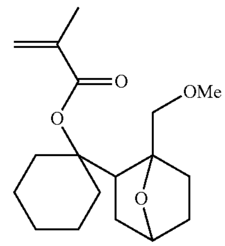
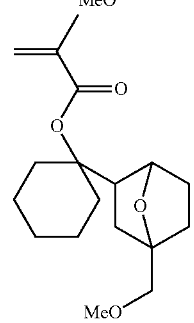
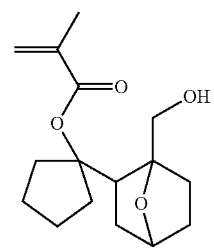
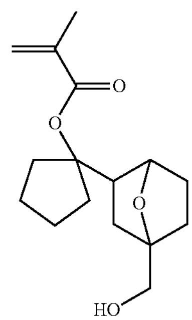
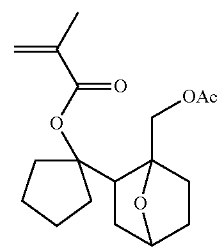
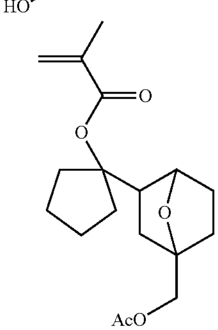
Another example of the acid labile group having formula (A-3) is a group having the following formula (A-3)-23. When an acid labile group of formula (A-3)-23 is contained, it is preferred that the base resin include recurring units (d1) substituted with this acid labile group.

(A-3)-23
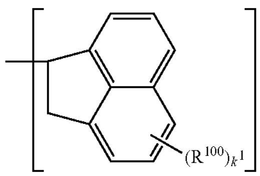
Herein. $R^{100}$ is hydrogen, halogen, cyano, $C_1$-$C_4$ alkyl, $C_1$-$C_4$ alkoxy, $C_2$-$C_5$ acyl, $C_2$-$C_5$ alkoxycarbonyl, or $C_6$-$C_{10}$ aryl group, and k is an integer of 1 to 4.
Examples of the monomer from which the recurring units having formula (A-3)-23 are derived are shown below, but not limited thereto.
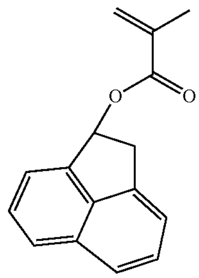
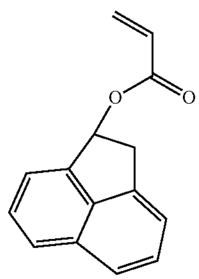
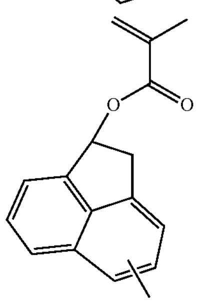
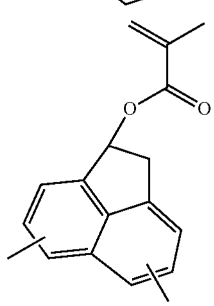
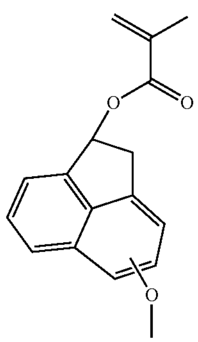
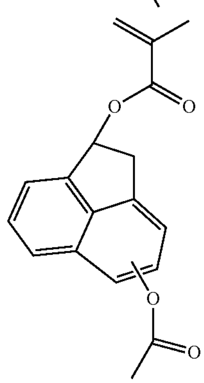
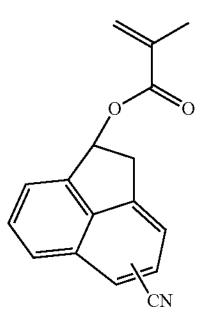
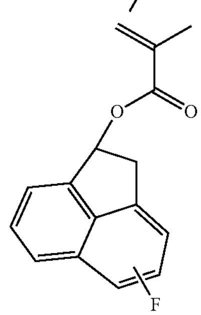
-continued
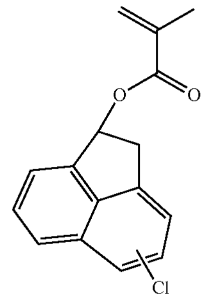
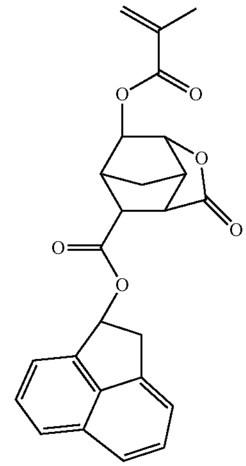
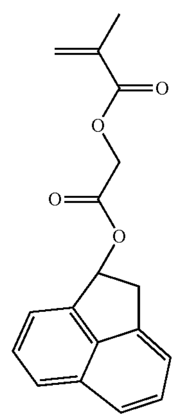
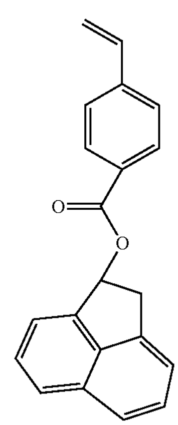
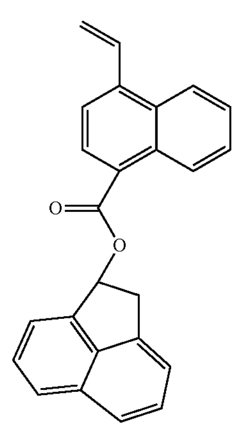

-continued

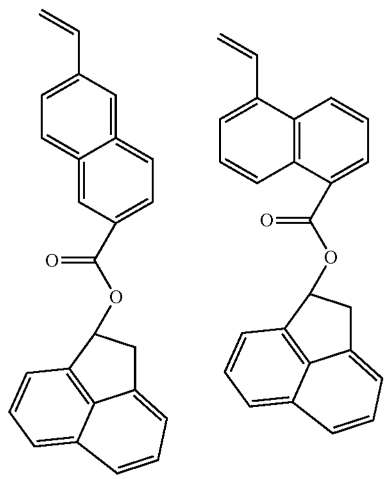

A further example of the acid labile group having formula (A-3) is a group having the following formula (A-3)-24. When an acid labile group of formula (A-3)-24 is contained, it is preferred that the base resin include recurring units (d1) substituted with this acid labile group.

(A-3)-24

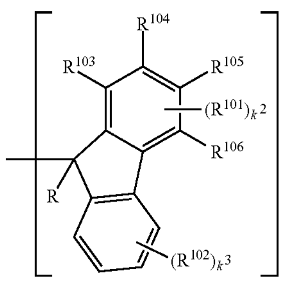

Herein $R^{101}$ and $R^{102}$ are each independently hydrogen, halogen, cyano, hydroxyl, $C_1$-$C_4$ alkyl, $C_1$-$C_4$ alkoxy, $C_2$-$C_5$ acyl, $C_1$-$C_5$ alkoxycarbonyl, or $C_6$-$C_{10}$ aryl group. R is hydrogen, or a straight, branched or cyclic $C_1$-$C_{12}$ alkyl, $C_2$-$C_{12}$ alkenyl, $C_2$-$C_{12}$ alkynyl or $C_6$-$C_{10}$ aryl group, which may contain an oxygen or sulfur atom. $R^{103}$, $R^{104}$, $R^{105}$ and $R^{106}$ are hydrogen, or a pair of $R^{103}$ and $R^{104}$, $R^{104}$ and $R^{105}$, or $R^{105}$ and $R^{106}$ may bond together to form a benzene ring. Each of $k^2$ and $k^3$ is independently an integer of 1 to 4.

Examples of the monomer from which the recurring units having formula (A-3)-24 are derived are shown below, but not limited thereto.

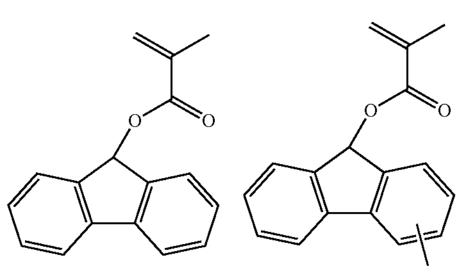

-continued

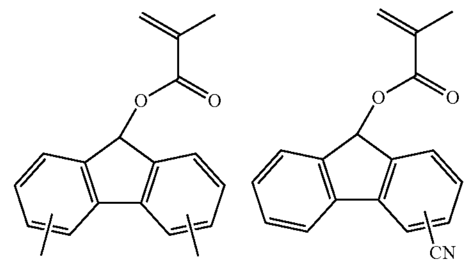

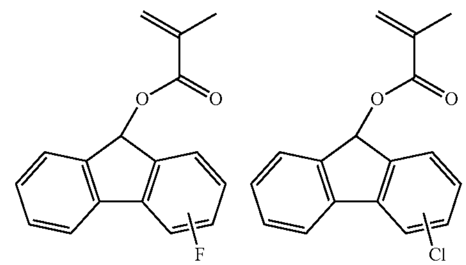

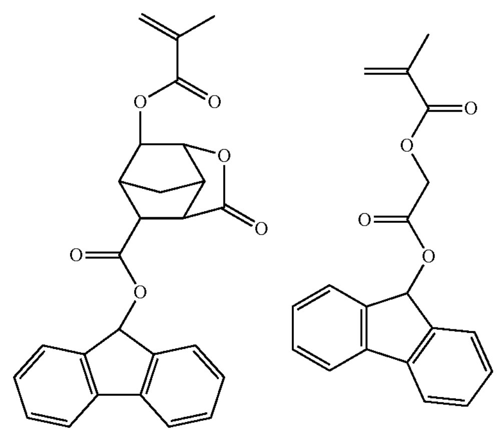

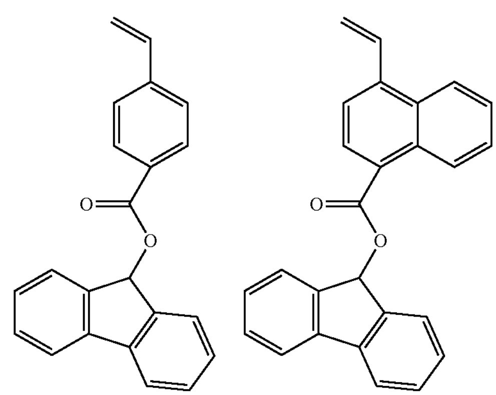

-continued
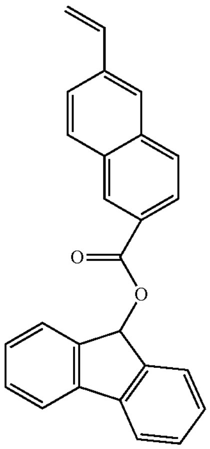
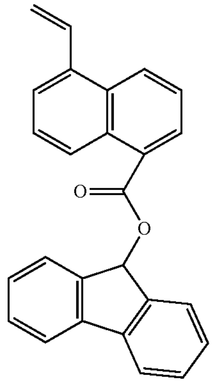
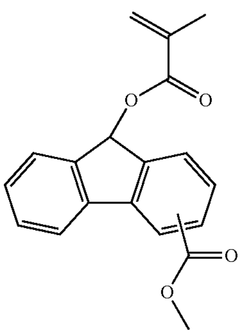
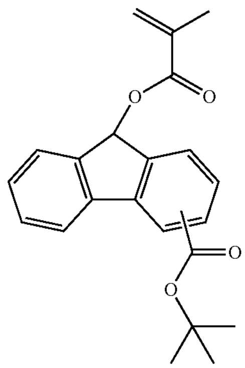
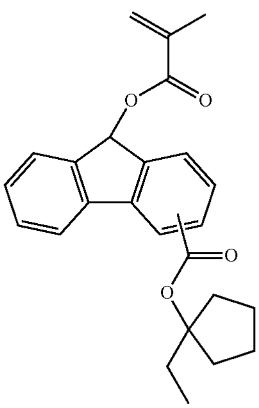
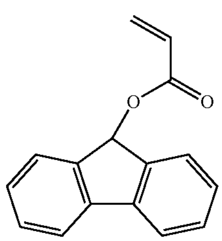
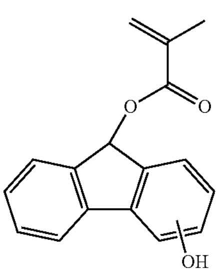
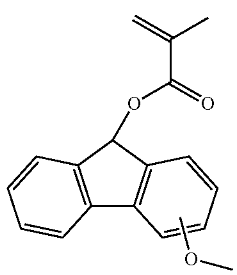
-continued
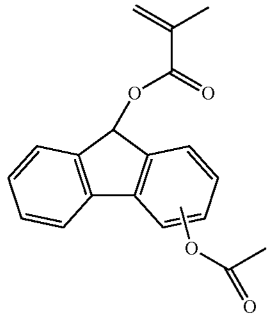
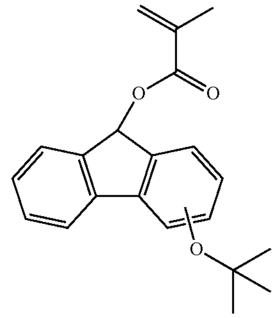
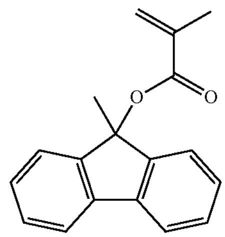
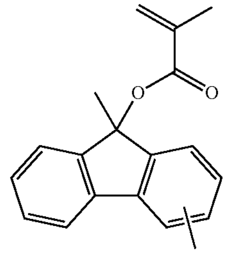
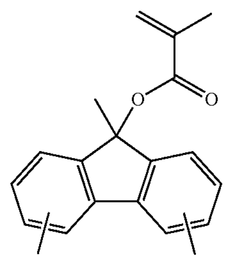
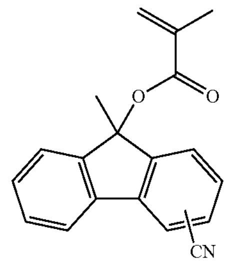
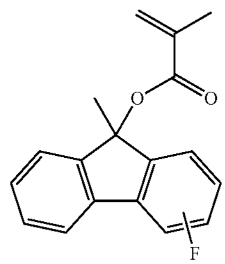
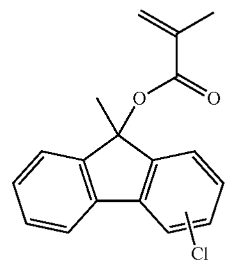
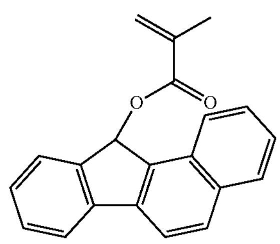
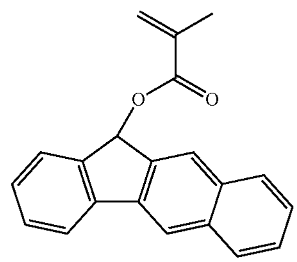
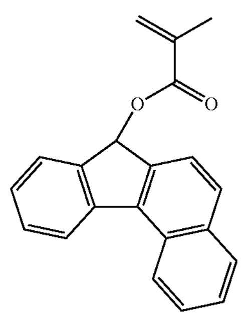
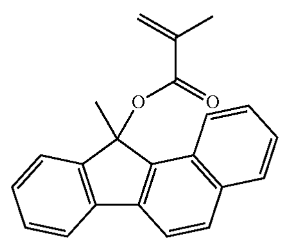

-continued
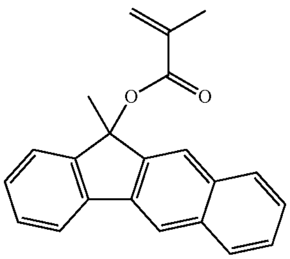
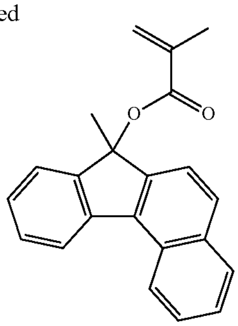
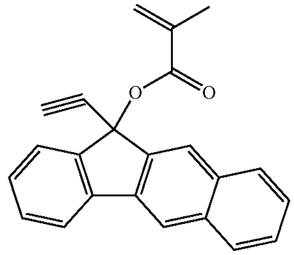
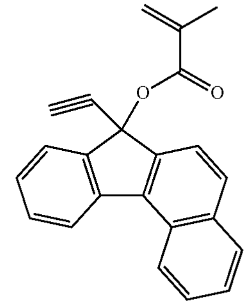
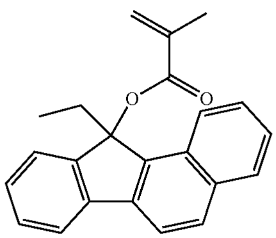
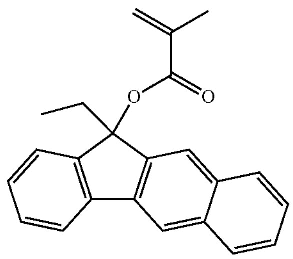
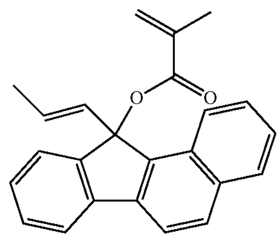
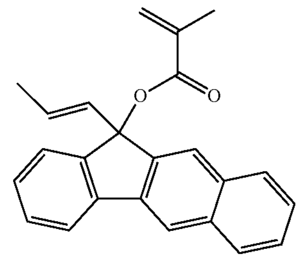
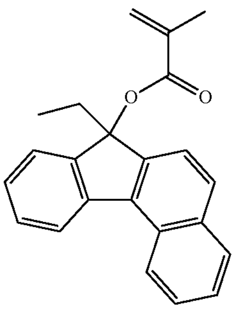
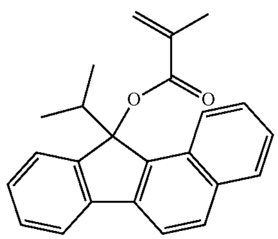
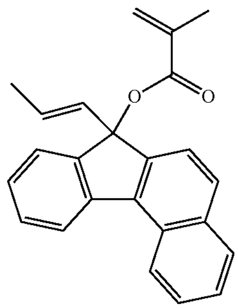
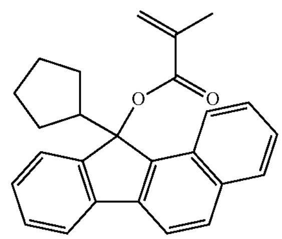
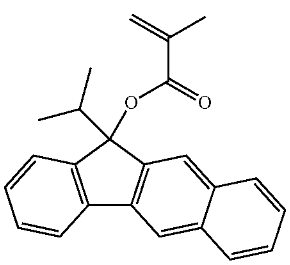
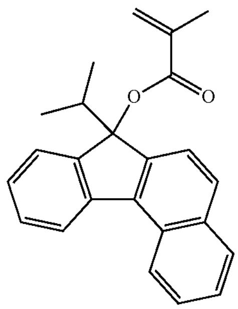
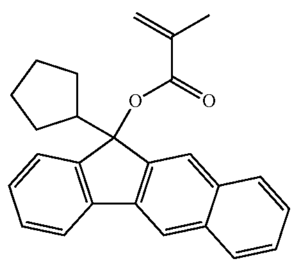
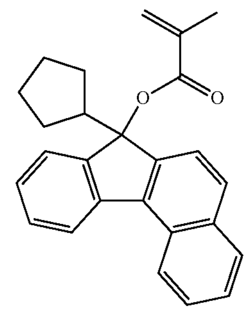
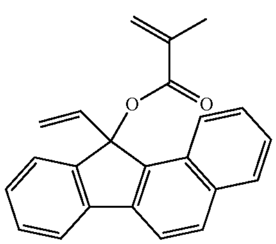
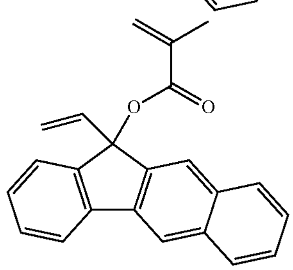
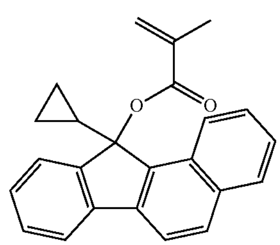
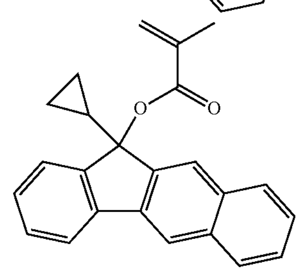
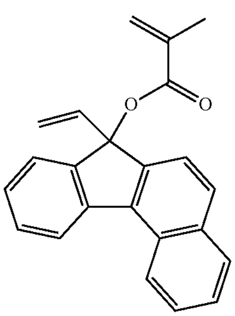
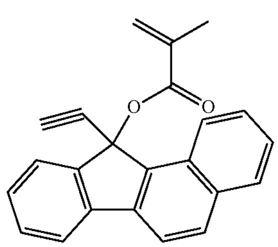
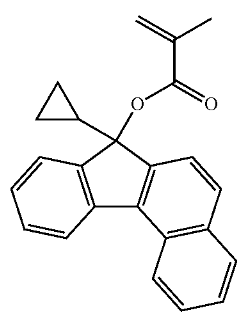
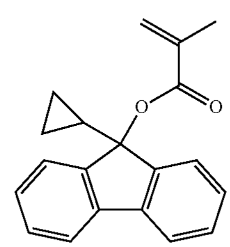

-continued
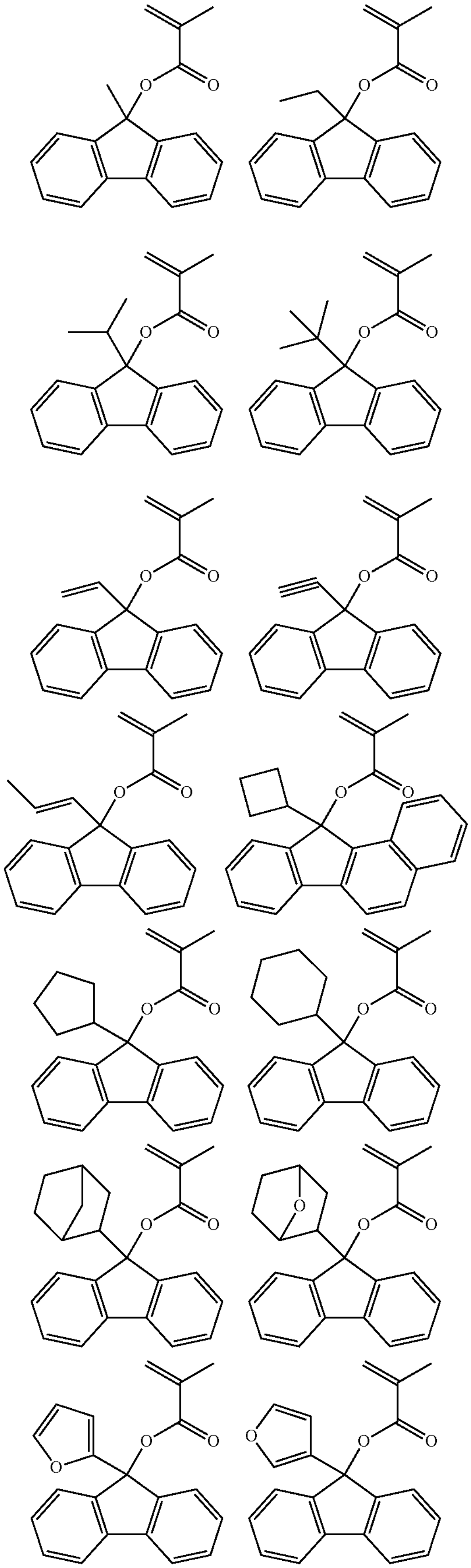
-continued
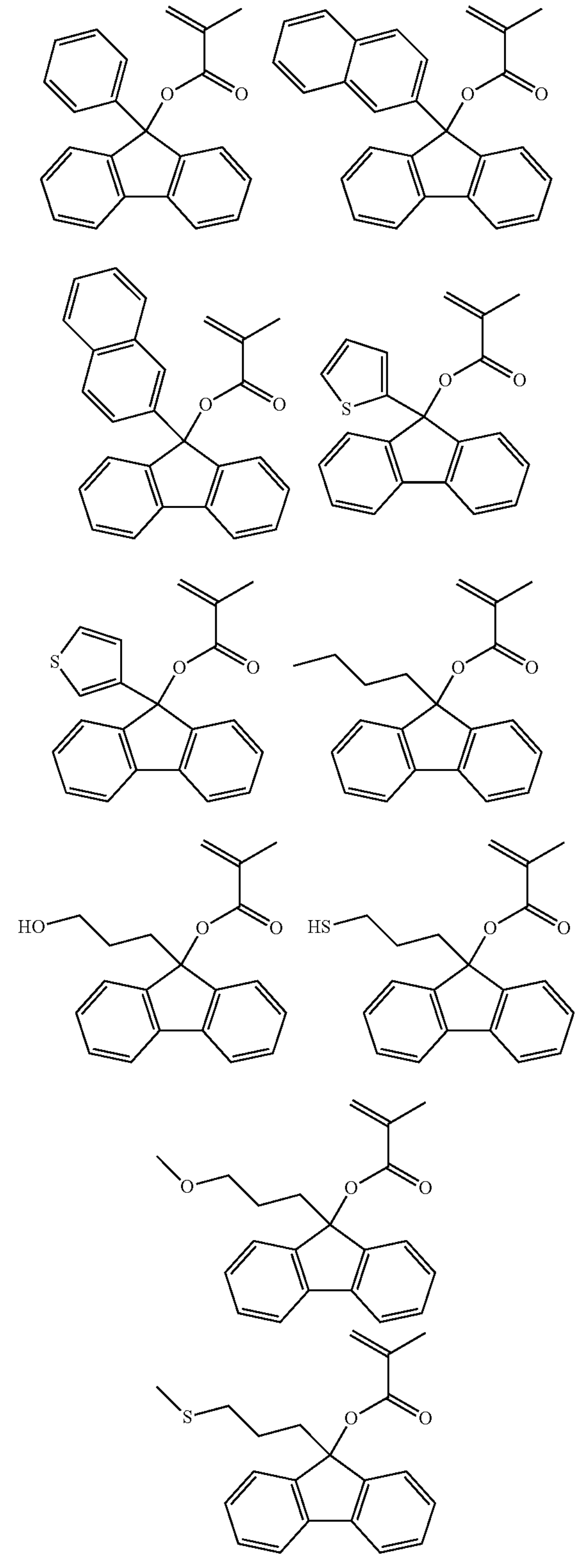
A still further example of the acid labile group having formula (A-33) is a group having the following formula (A-3)-25. When an acid labile group of formula (A-3)-25 is contained, it is preferred that the base resin include recurring units (d1) substituted with this acid labile group.

(A-3)-25

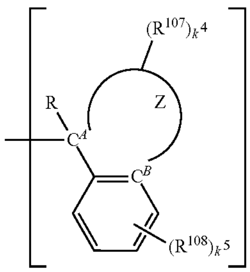

Herein R is as defined above. $R^{107}$ is each independently hydrogen or a straight, branched or cyclic $C_1$-$C_6$ alkyl group, and in case $k^4 \geq 2$, groups $R^{107}$ may bond together to form a $C_2$-$C_8$ ring. The circle Z represents a divalent group linking carbon atoms e and $C^A$ and $C^B$, specifically ethylene, propylene, butylene or pentylene group, with the proviso that $R^{107}$ is not hydrogen when Z is ethylene or propylene. $R^{108}$ is each independently hydrogen, hydroxyl, nitro, halogen, cyano, $C_1$-$C_4$ alkyl, $C_1$-$C_4$ alkoxy, $C_2$-$C_5$ acyl, $C_2$-$C_5$ alkoxycarbonyl, or $C_6$-$C_{10}$ aryl group. Each of $k^4$ and $k^5$ is independently an integer of 1 to 4.

Examples of the monomer from which the recurring units having formula (A-3)-25 are derived are shown below, but not limited thereto.

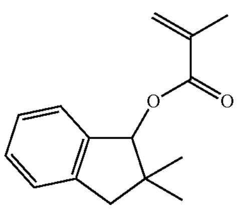
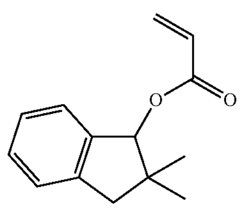
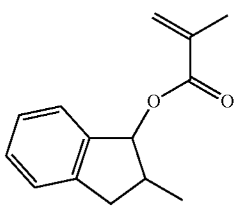
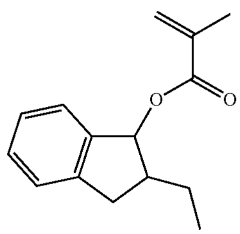
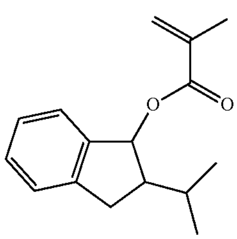
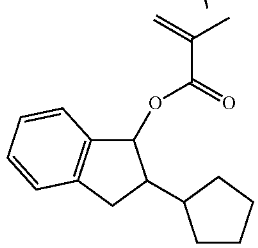
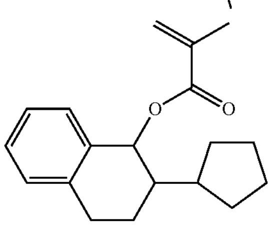
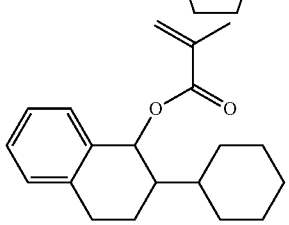

-continued

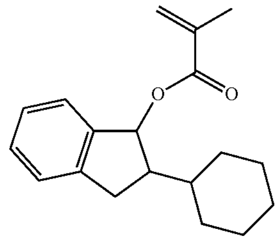
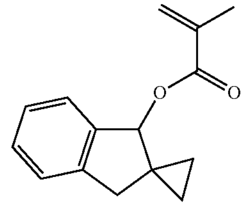
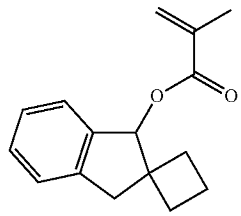
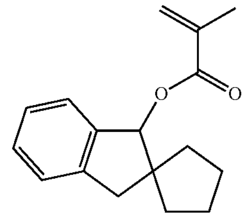
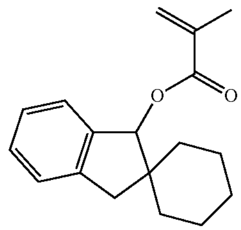
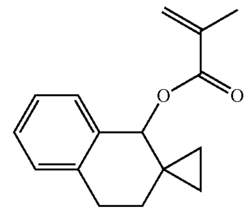
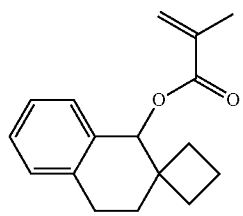
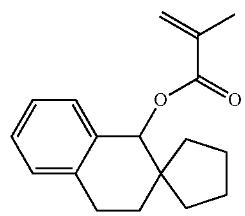
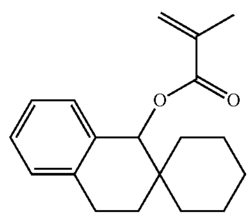
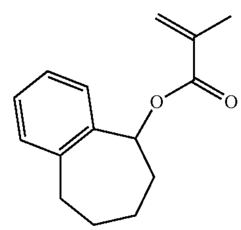
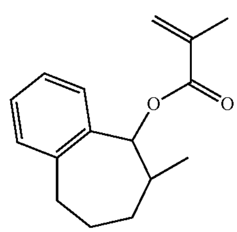
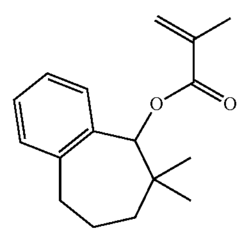
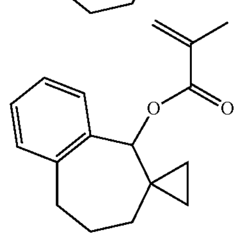
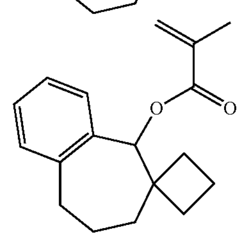

-continued
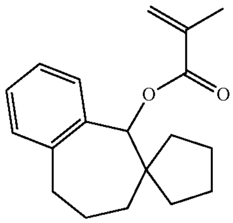
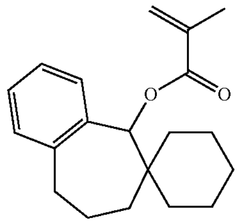
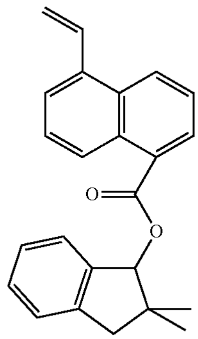
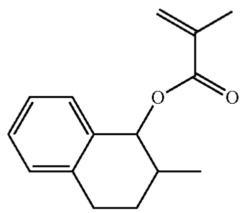
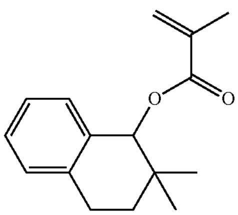
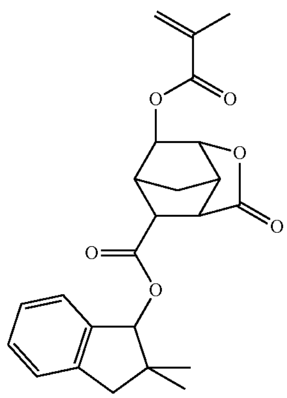
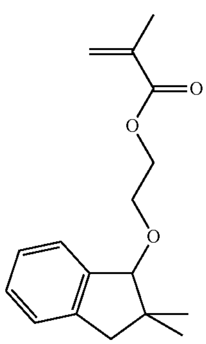
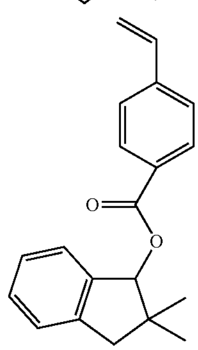
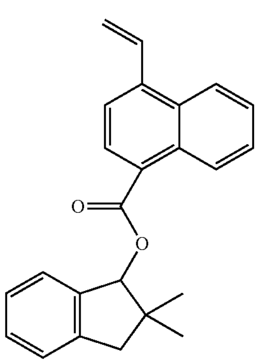
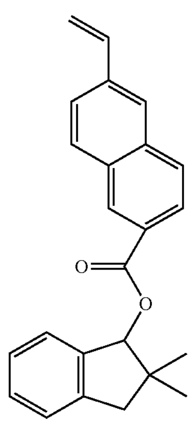
-continued
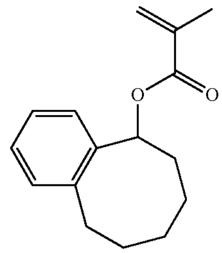
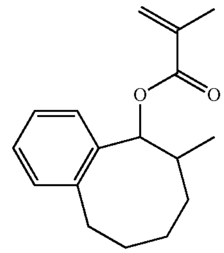
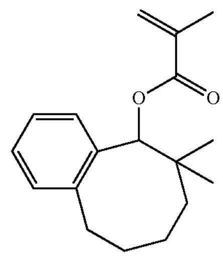
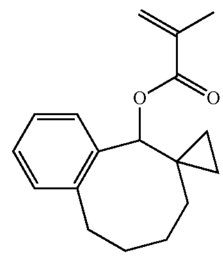
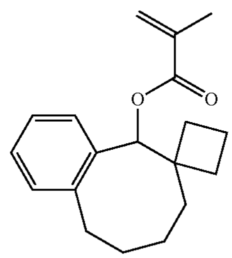
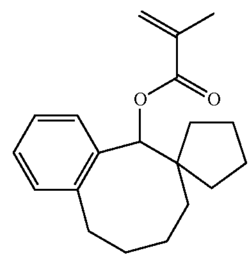
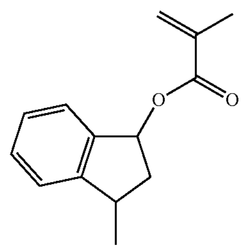
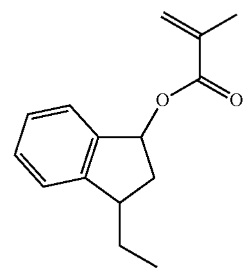
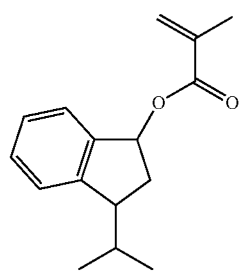
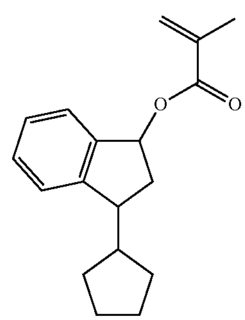
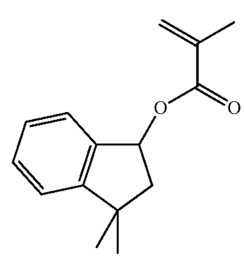
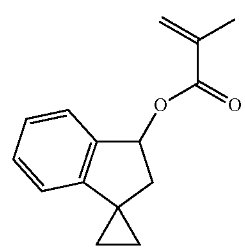

-continued
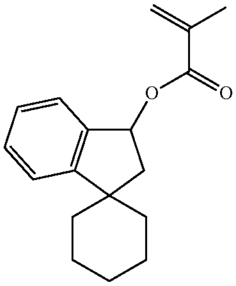
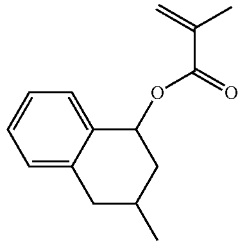
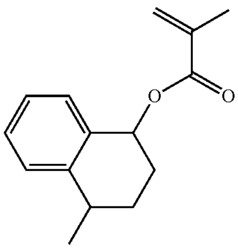
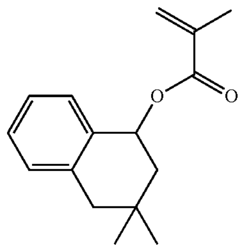
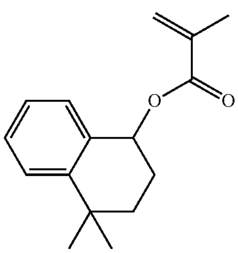
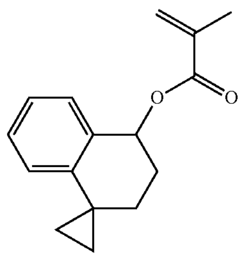
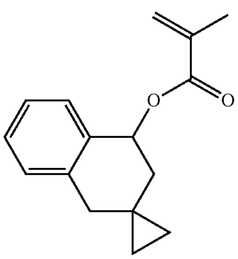
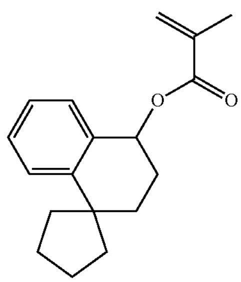
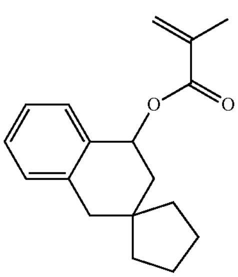
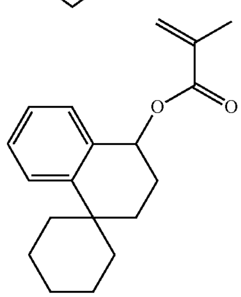
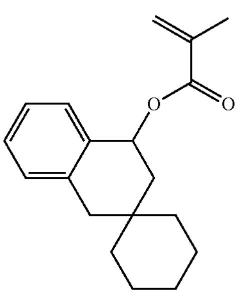
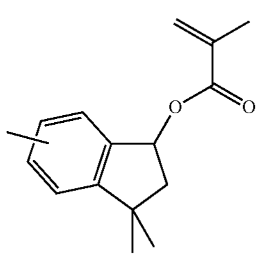
-continued
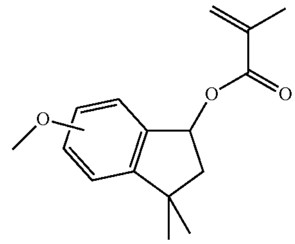
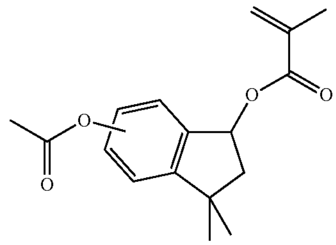
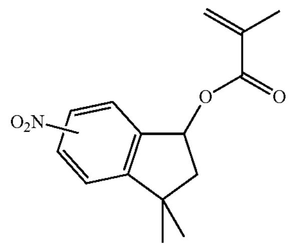
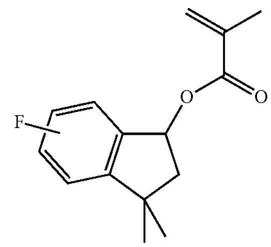
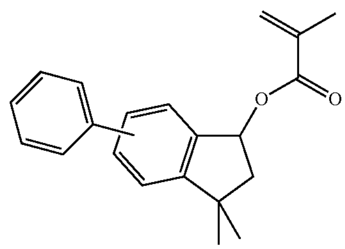
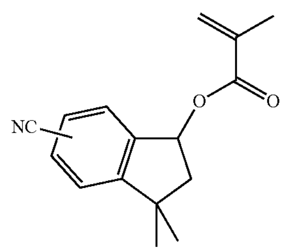
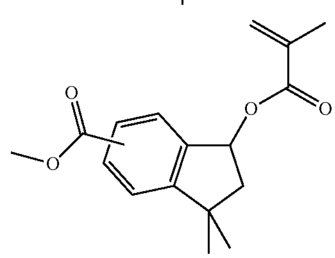
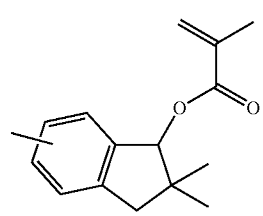
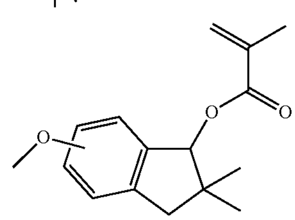

-continued
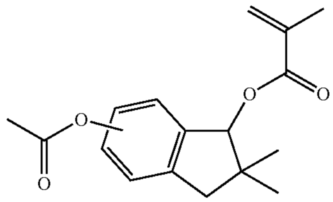
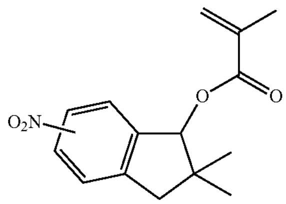
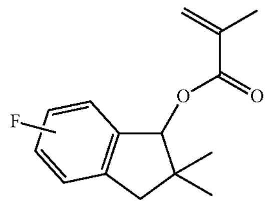
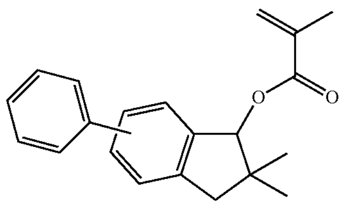
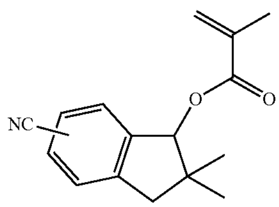
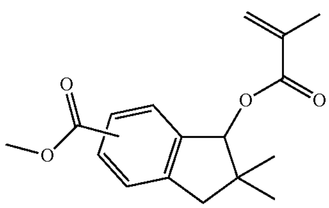
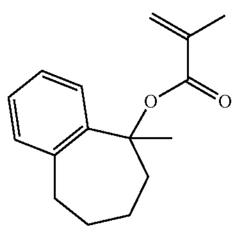
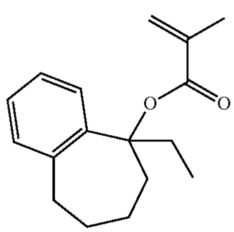
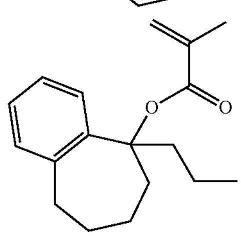
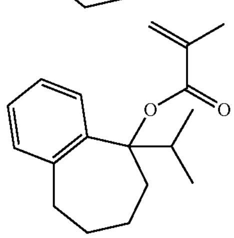
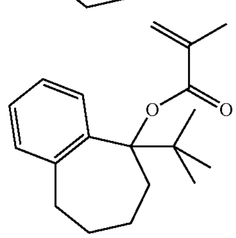
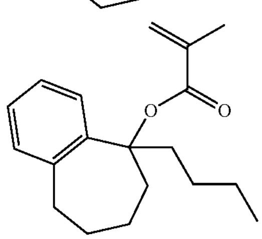
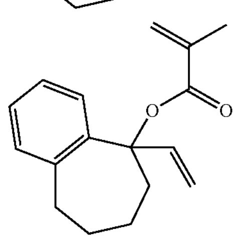
-continued
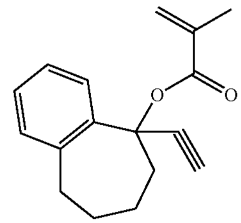
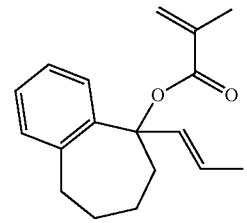
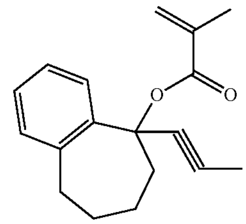
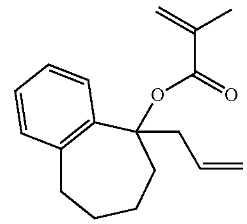
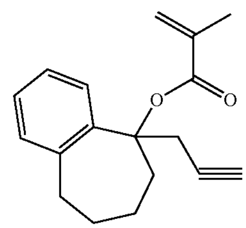
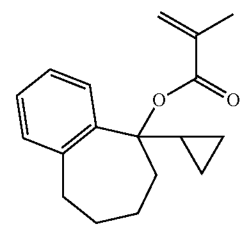
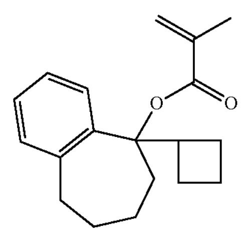
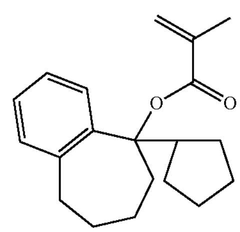
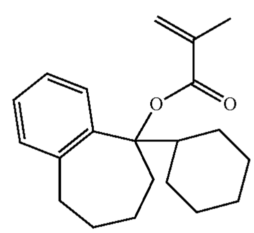
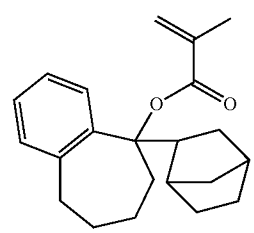
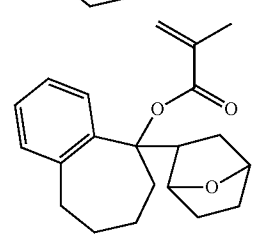
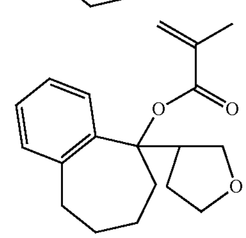
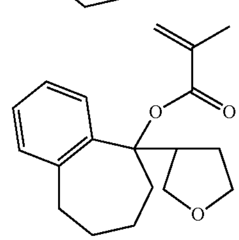
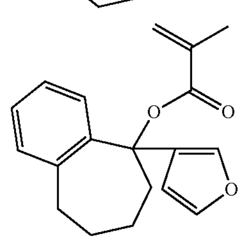

-continued
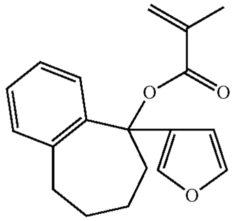
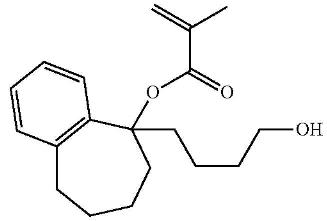
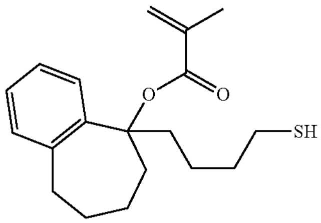
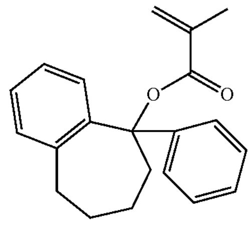
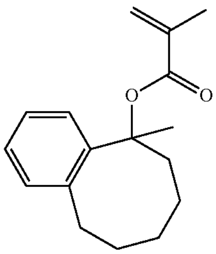
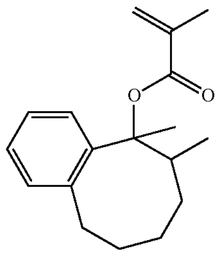
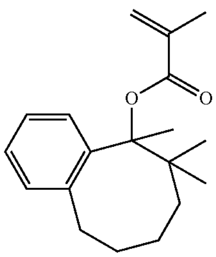
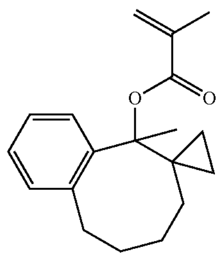
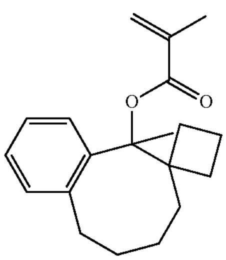
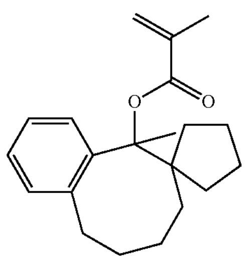
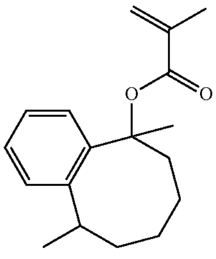
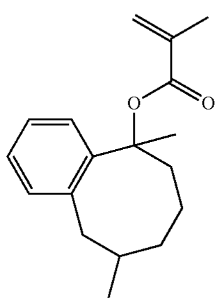
-continued
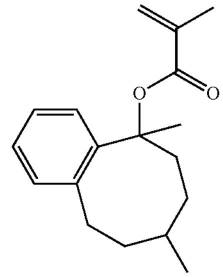
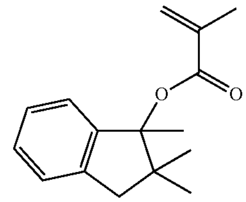
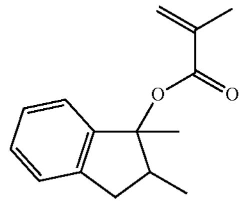
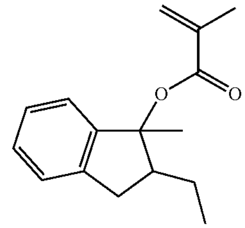
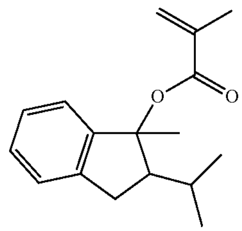
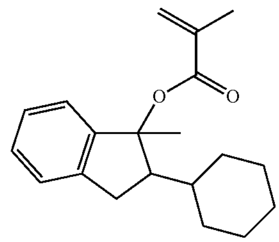
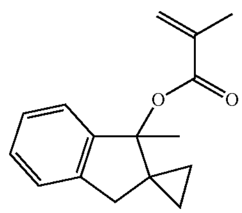
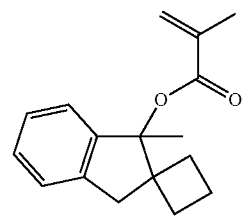
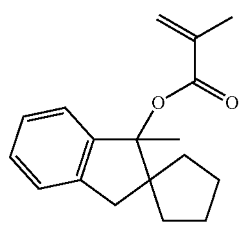
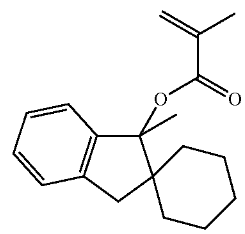
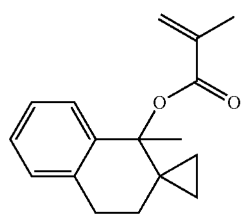
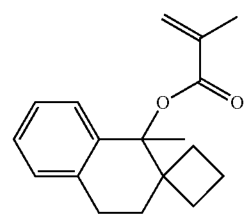
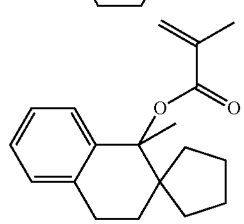
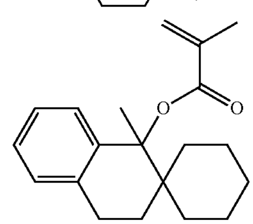

-continued

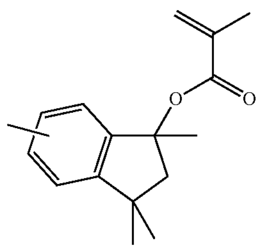

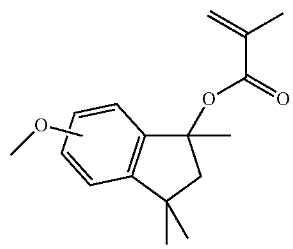

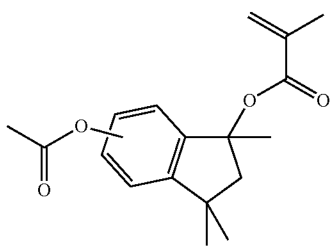

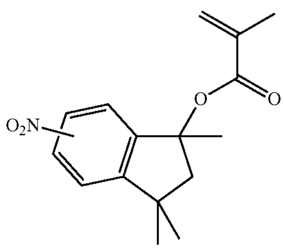

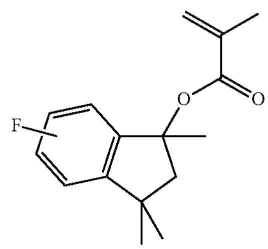

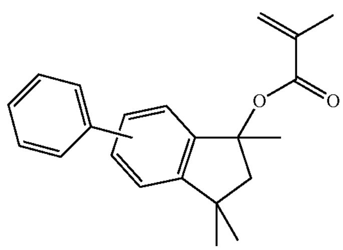

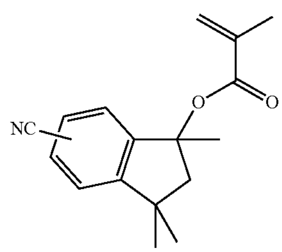

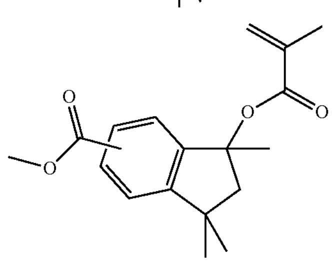

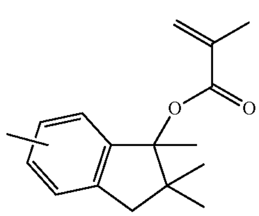

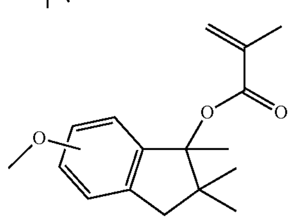

-continued

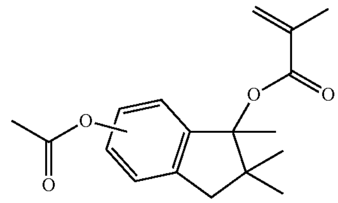

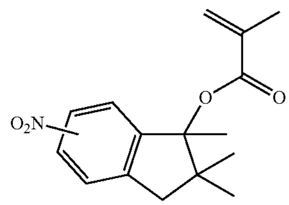

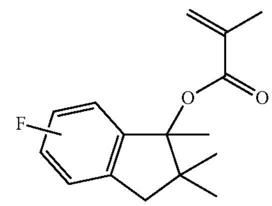

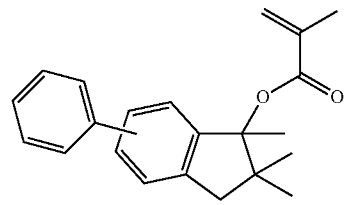

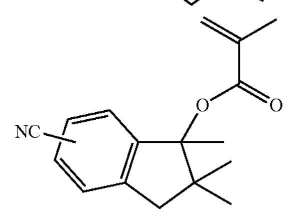

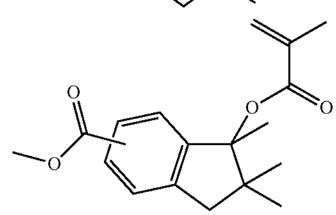

A still further example of the acid labile group having formula (A-3) is a group having the following formula (A-3)-26. When an acid labile group of formula (A-3)-26 is contained, it is preferred that the base resin include recurring units (d1) substituted with this acid labile group.

(A-3)-26

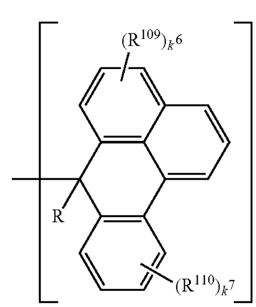

Herein R is as defined above. $R^{109}$ and $R^{110}$ are each independently hydrogen, hydroxyl, nitro, halogen, cyano, $C_1$-$C_4$, alkyl, $C_1$-$C_4$ alkoxy, $C_2$-$C_5$ acyl, $C_2$-$C_5$ alkoxycarbonyl, or $C_6$-$C_{10}$ aryl group. Each of $k^6$ and $k^7$ is independently an integer of 1 to 4.

Examples of the monomer from which the recurring units having formula (A-3)-26 are derived are shown below, but not limited thereto.
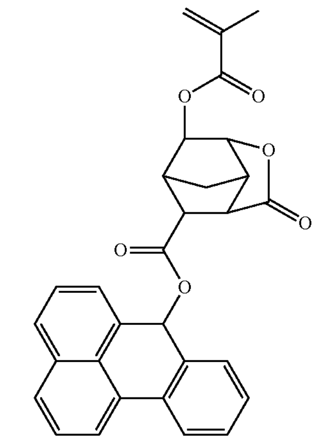
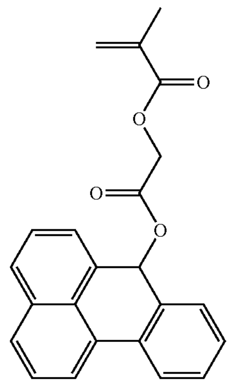
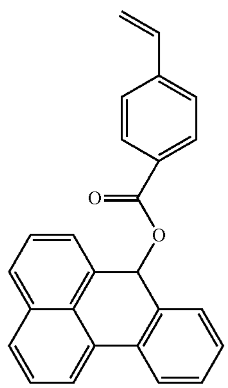
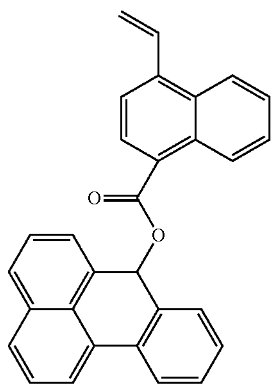
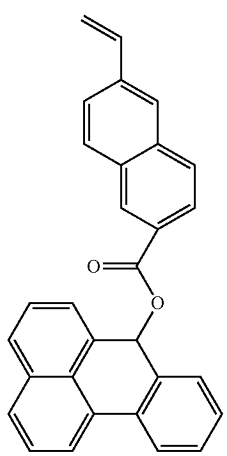
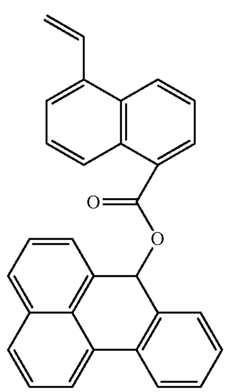
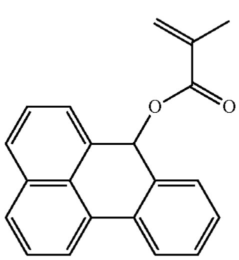
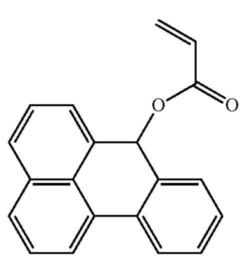
-continued
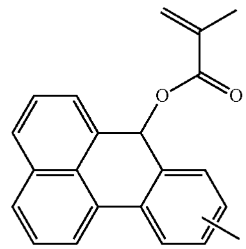
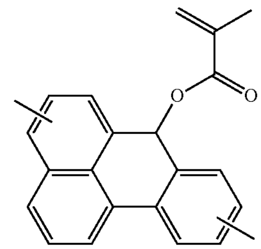
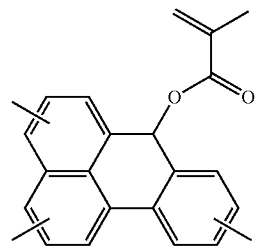
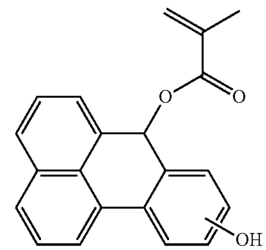
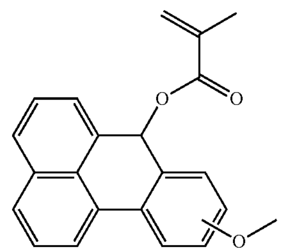
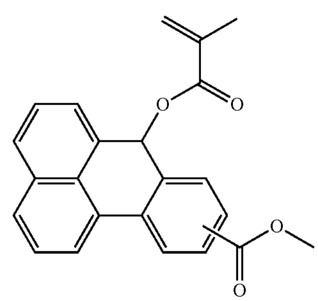
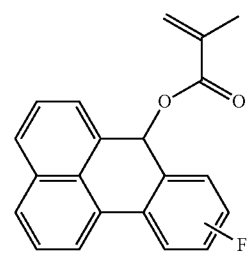
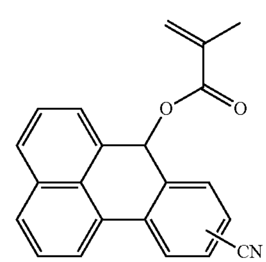
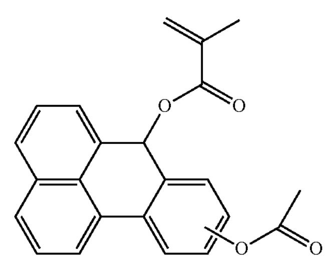

-continued
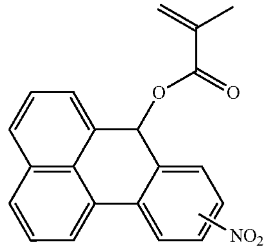
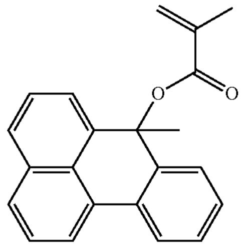
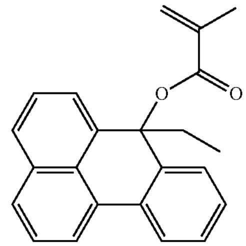
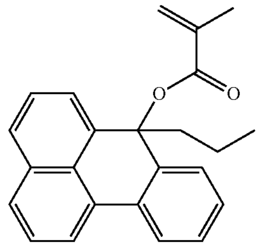
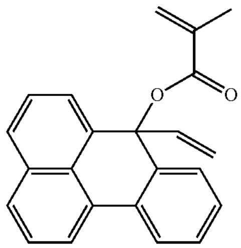
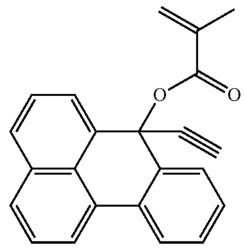
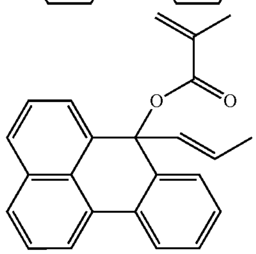
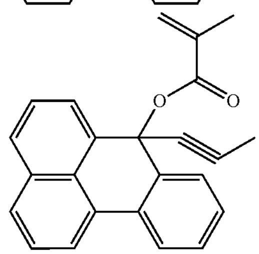
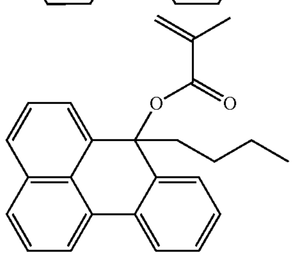
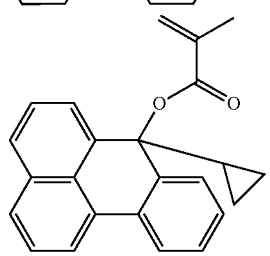
-continued
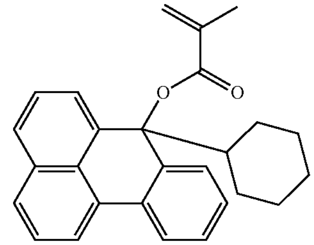
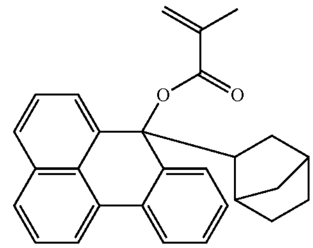
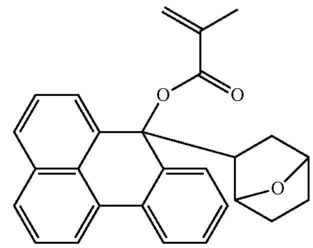
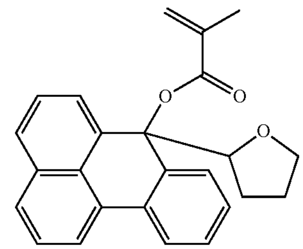
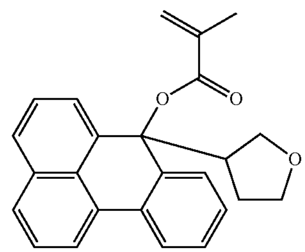
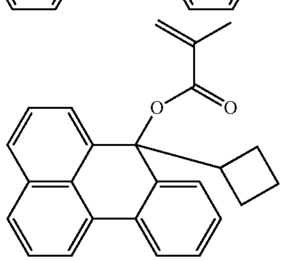
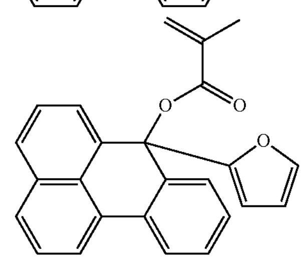
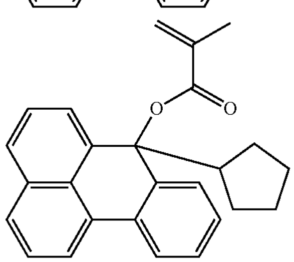
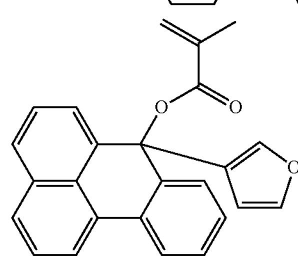
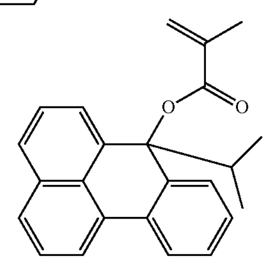

-continued

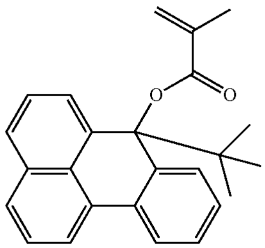

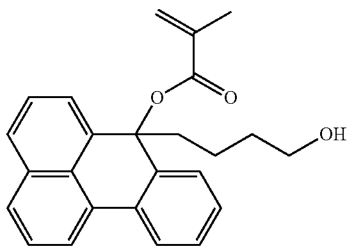

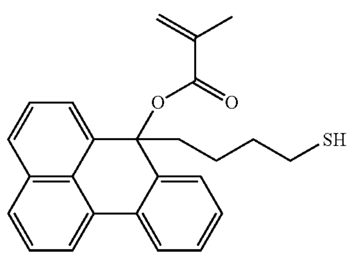

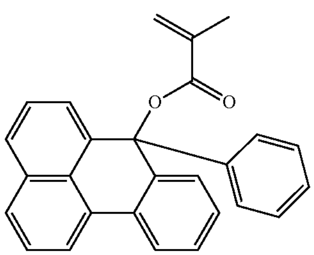

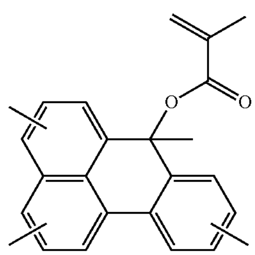

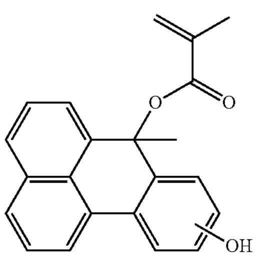

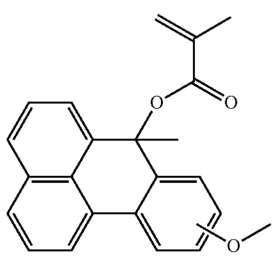

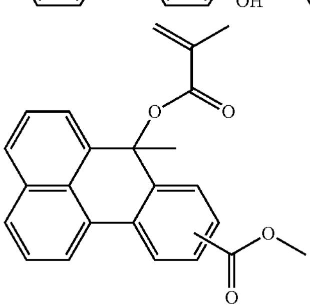

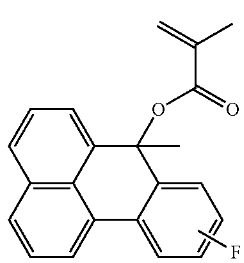

-continued

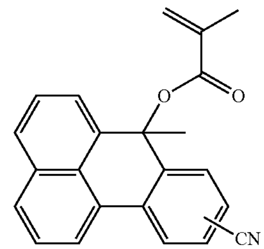

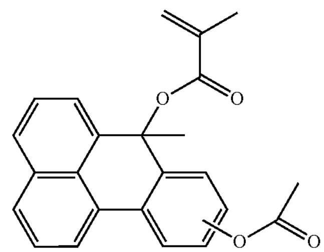

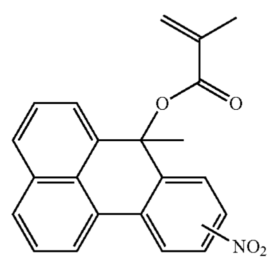

A still further example of the acid labile group having formula (A-3) is a group having the following formula (A-3)-27. When an acid labile group of formula (A-3)-27 is contained, it is preferred that the base resin include recurring units (d1) substituted with this acid labile group.

(A-3)-27

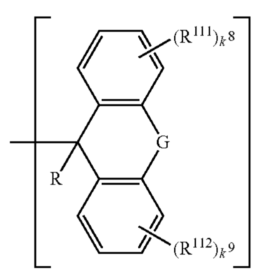

Herein R is as defined above. $R^{111}$ and $R^{112}$ are each independently hydrogen, hydroxyl, halogen, cyano, $C_1$-$C_4$ alkyl, $C_1$-$C_4$, alkoxy, $C_2$-$C_5$ acyl, $C_2$-$C_5$ alkoxycarbonyl, or $C_6$-$C_{10}$ aryl group. Each of $k^8$ and $k^9$ is independently an integer of 1 to 4. G is methylene, ethylene, vinylene or —$CH_2$—S—.

Examples of the monomer from which the recurring units having formula (A-3)-27 are derived are shown below, but not limited thereto.

-continued
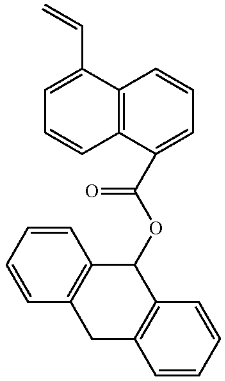
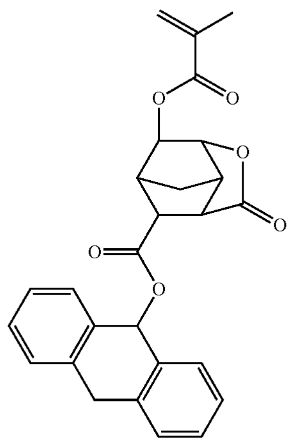
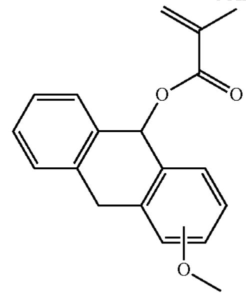
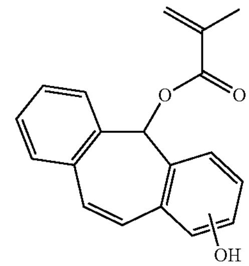
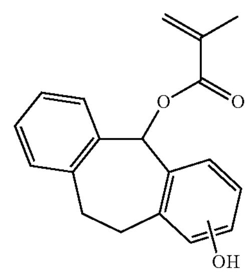
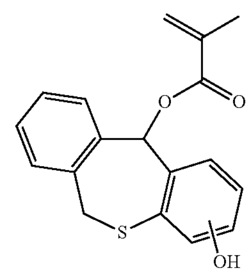
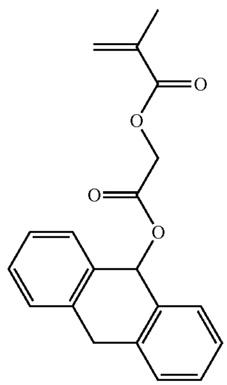
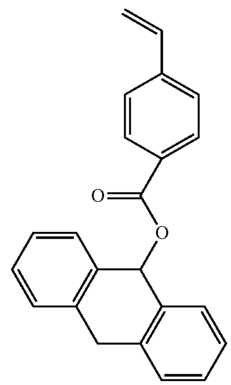
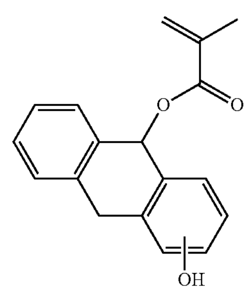
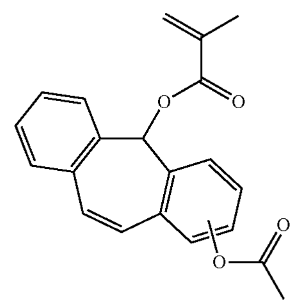
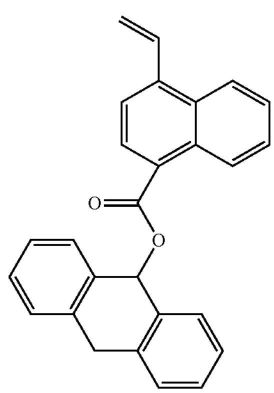
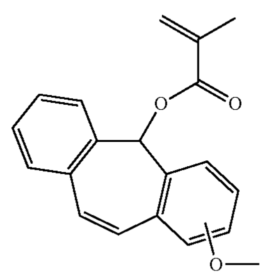
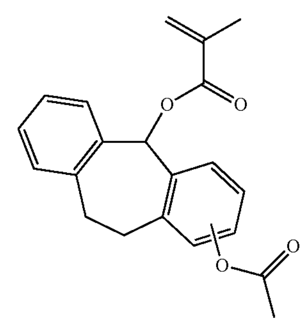
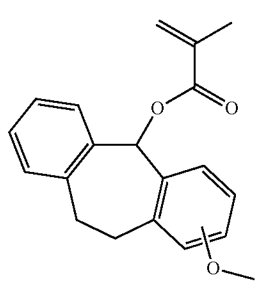
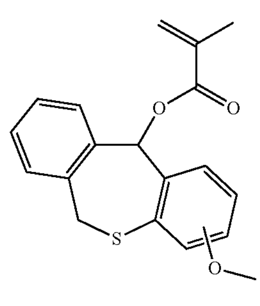
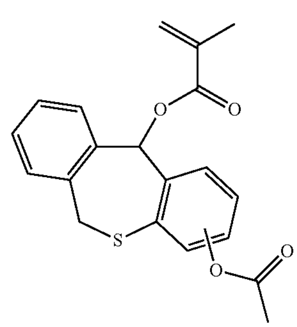
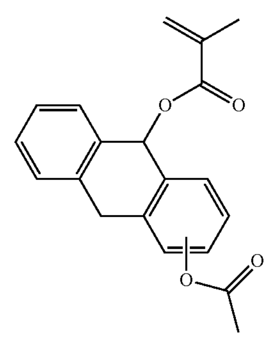

-continued
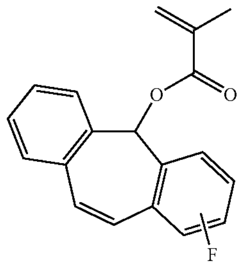
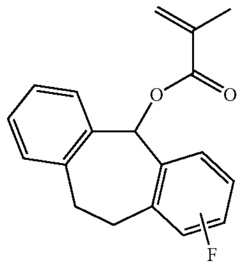
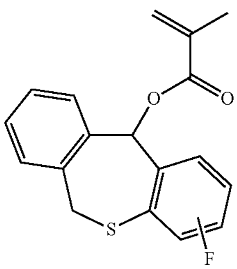
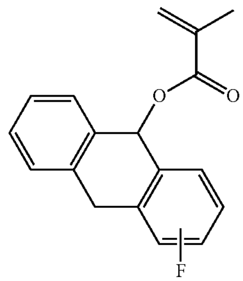
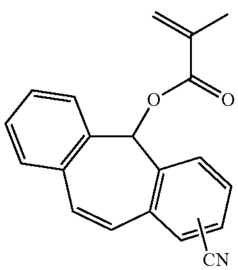
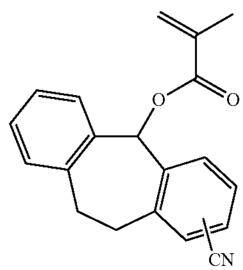
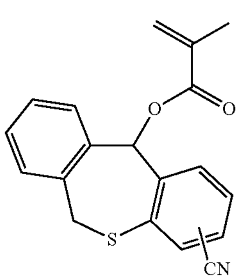
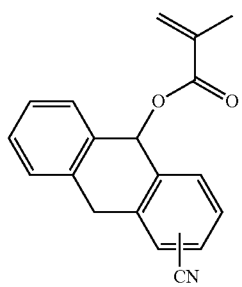
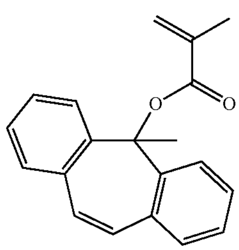
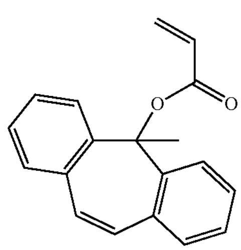
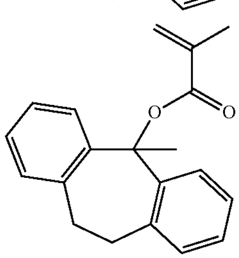
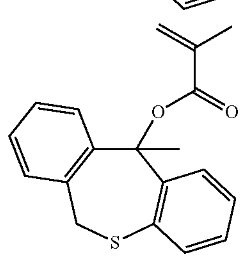
-continued
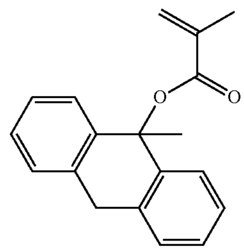
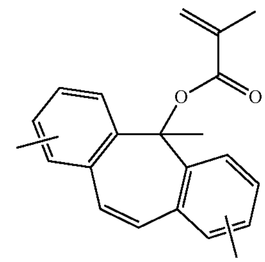
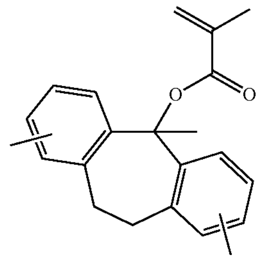
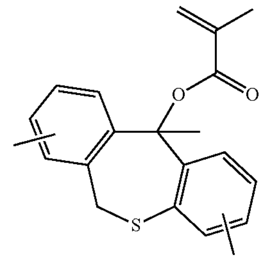
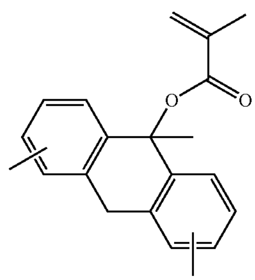
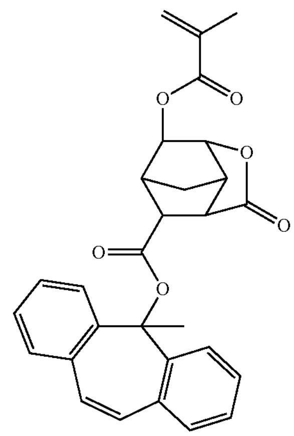
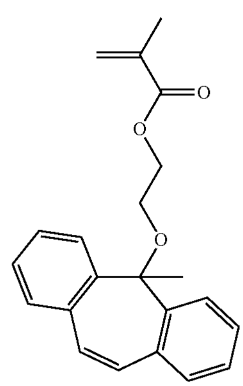
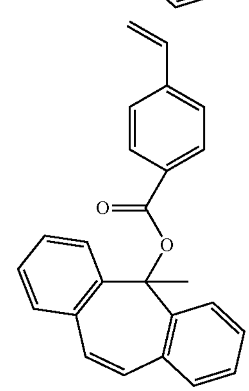
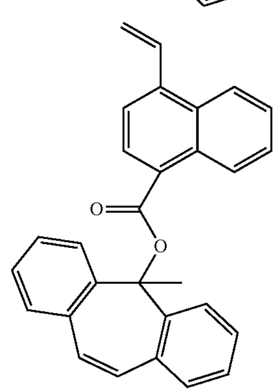
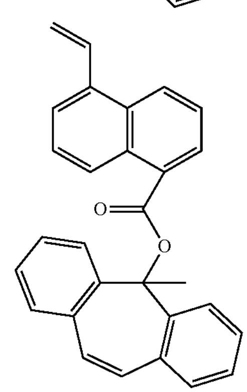

-continued
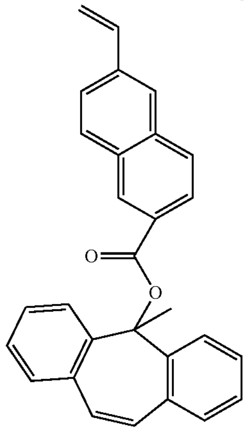
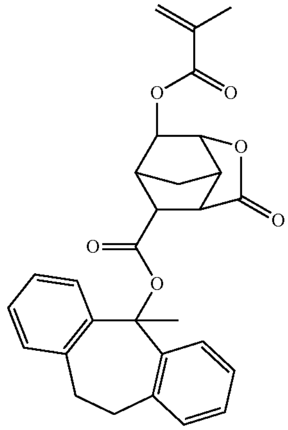
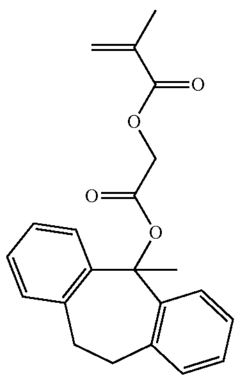
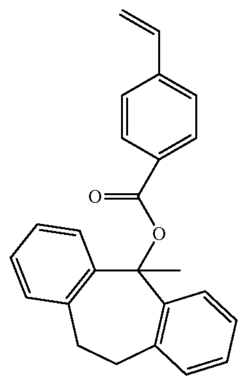
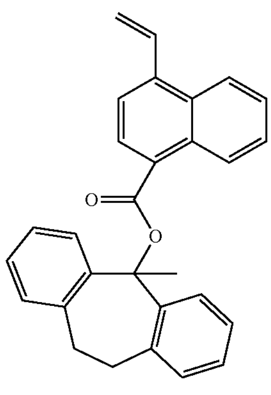
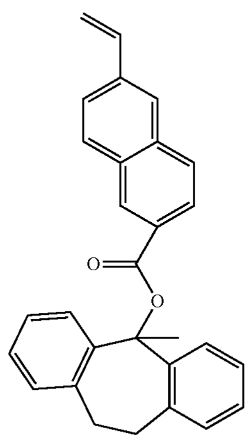
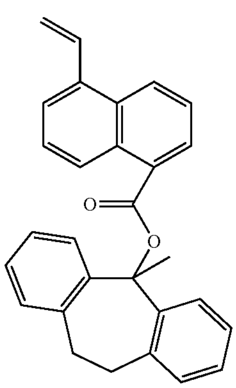
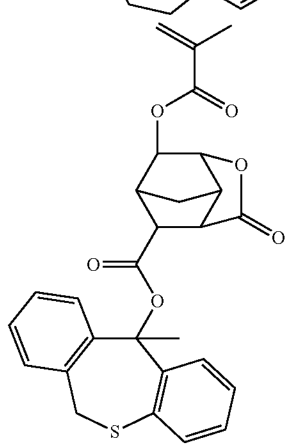
-continued
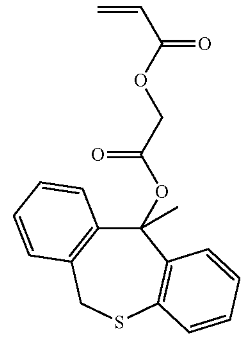
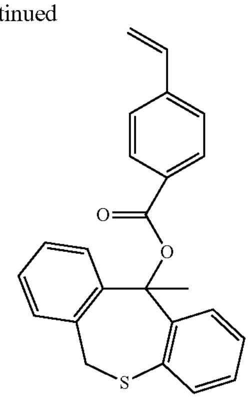
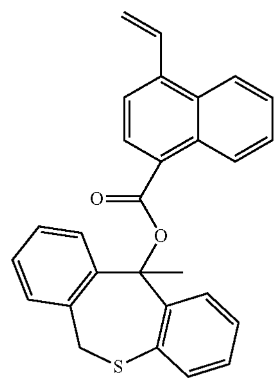
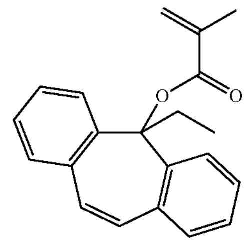
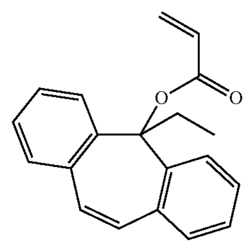
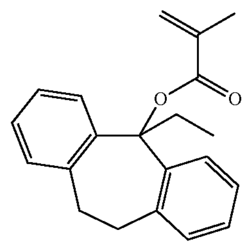
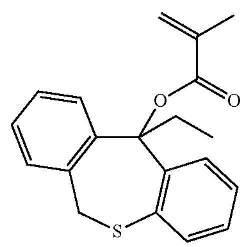
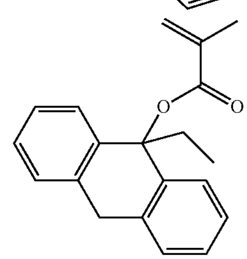
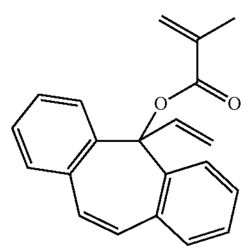
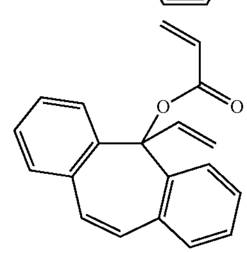
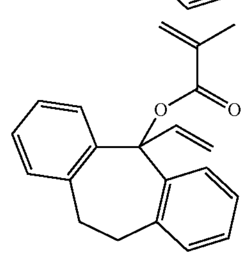
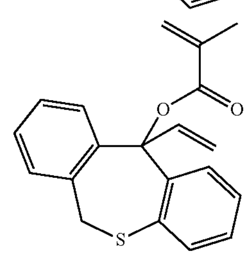

-continued

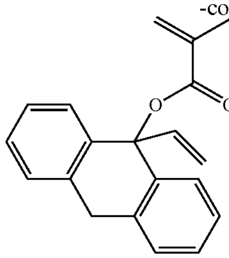
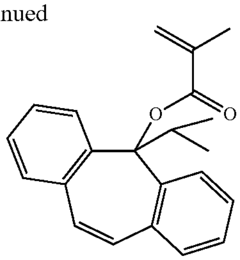
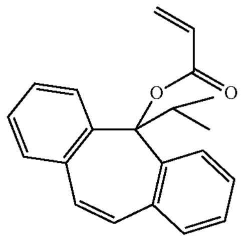
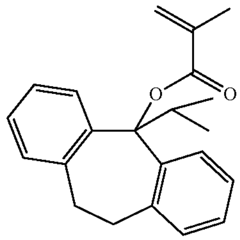
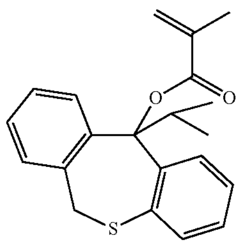
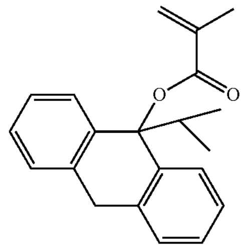
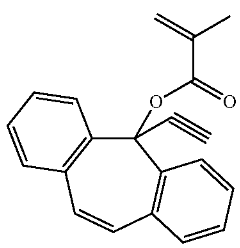
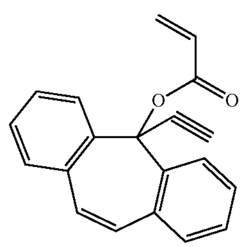
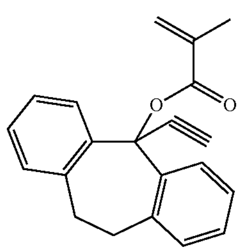
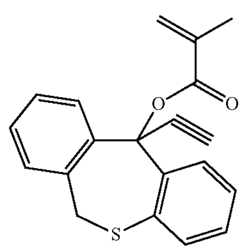
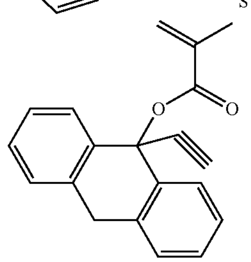

A still further example of the acid labile group having formula (A-3) is a group having the following formula (A-3)-28. When an acid labile group of formula (A-3)-28 is contained, it is preferred that the base resin include recurring units (d1) substituted with this acid labile group.

(A-3)-28

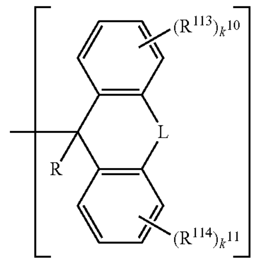

Herein R is as defined above. $R^{113}$ and $R^{114}$ are each independently hydrogen, hydroxyl, halogen, cyano. $C_1$-$C_4$ alkyl, $C_1$-$C_4$ alkoxy, $C_2$-$C_5$ acyl, $C_2$-$C_5$ alkoxycarbonyl, or $C_6$-$C_{10}$ aryl group. Each of $k^{10}$ and $k^{11}$ is independently an integer of 1 to 4. L is carbonyl, ether, sulfide, —S(═C)— or —S(═O)$_2$—.

Examples of the monomer from which the recurring units having formula (A-3)-28 are derived are shown below, but not limited thereto.

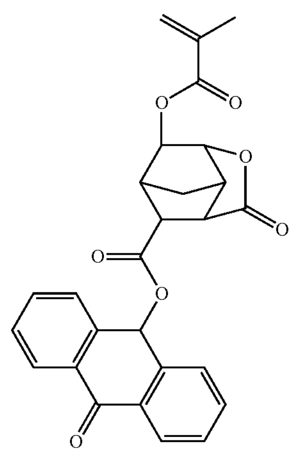
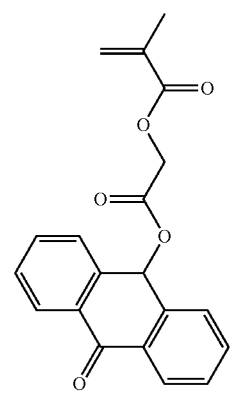
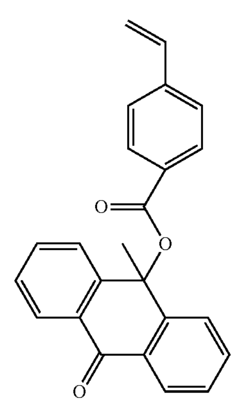
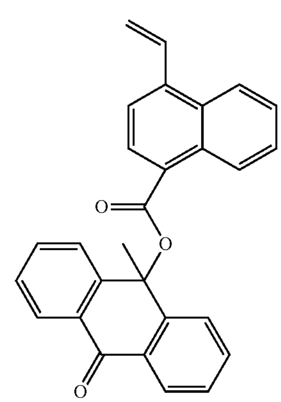

-continued
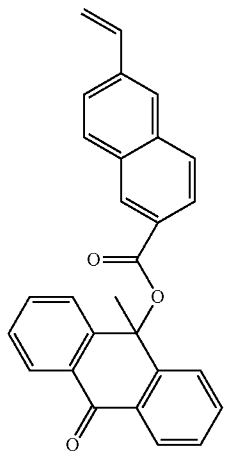
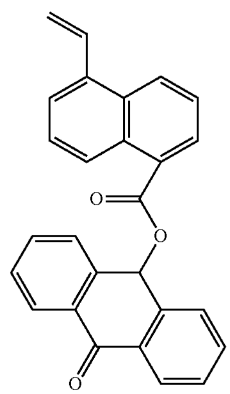
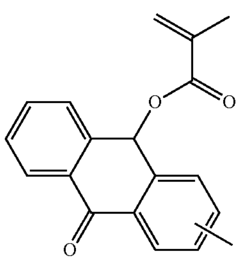
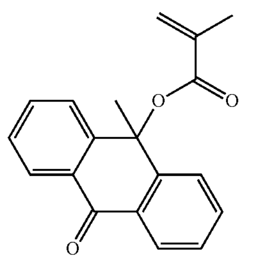
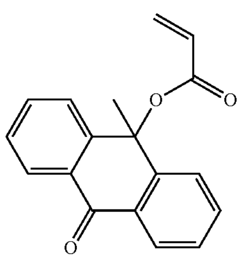
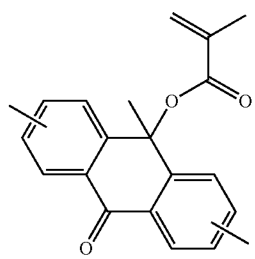
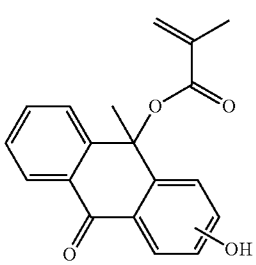
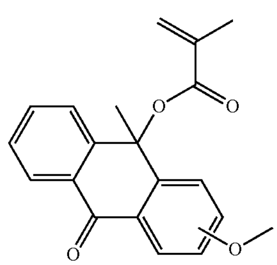
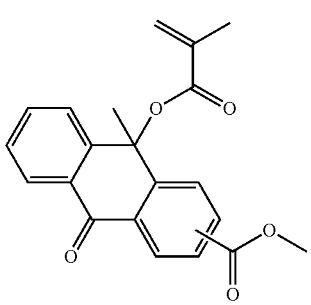
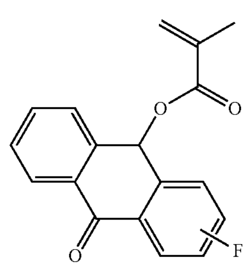
-continued
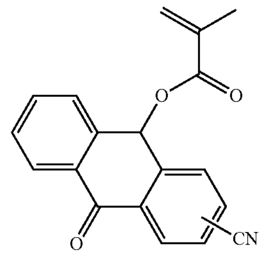
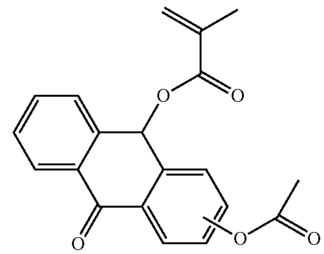
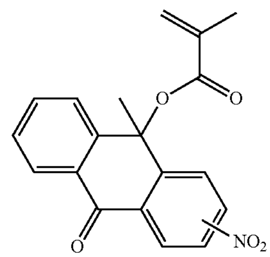
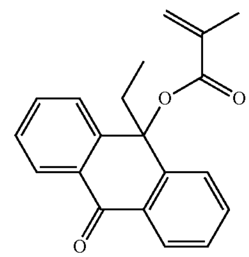
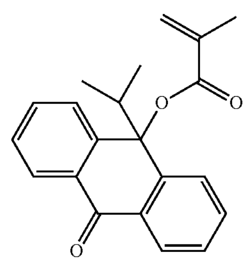
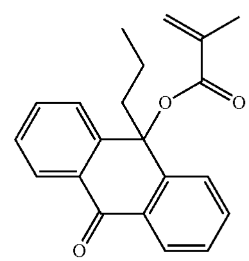
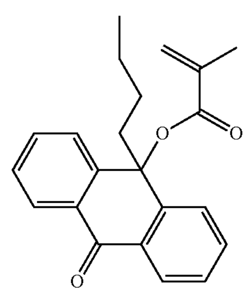
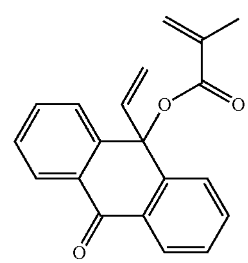
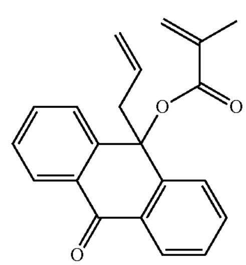
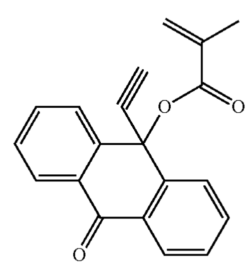
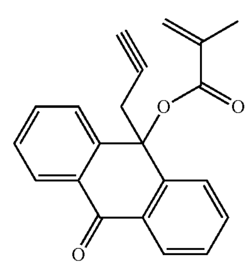
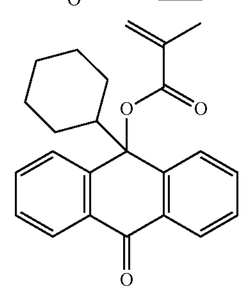

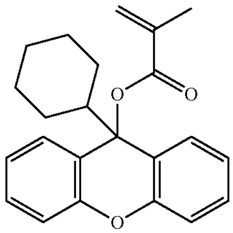
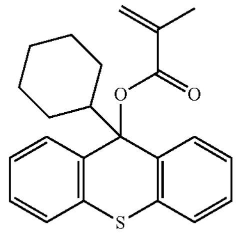
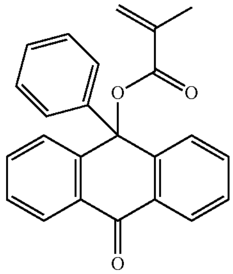
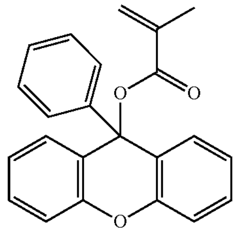
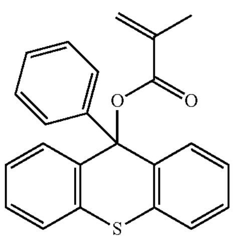
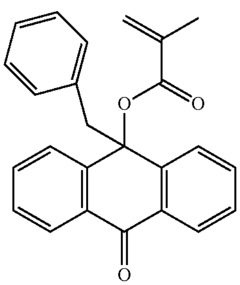
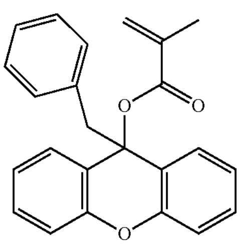
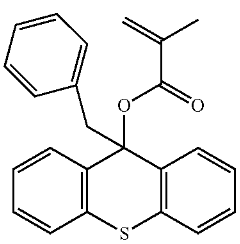
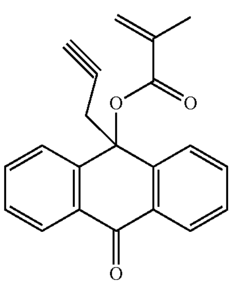
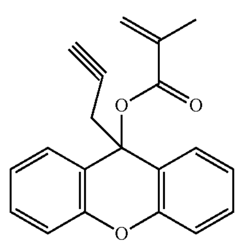
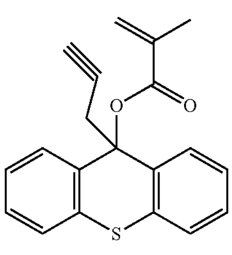
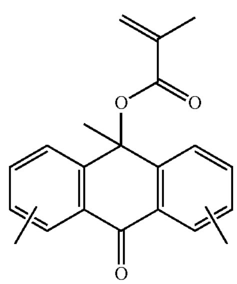
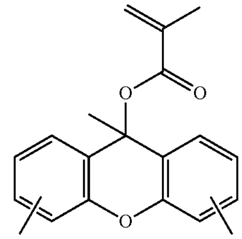
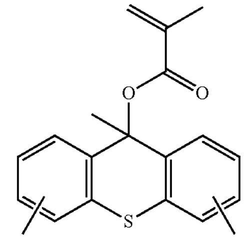
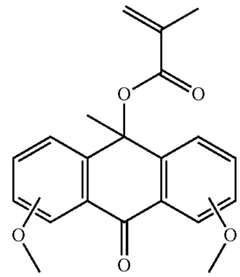
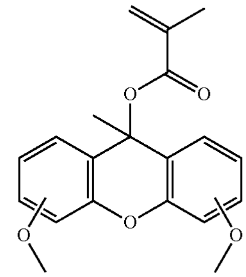
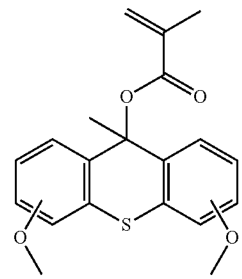
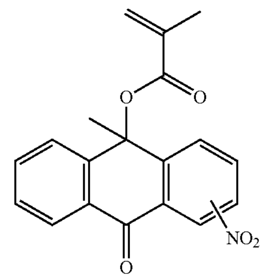
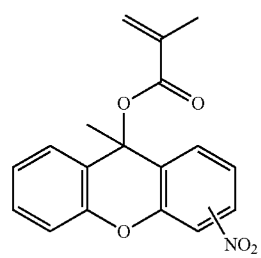
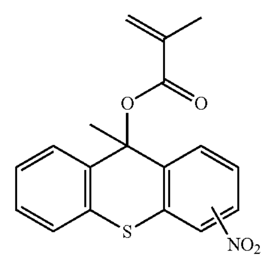
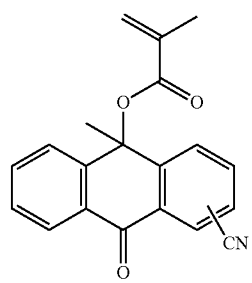
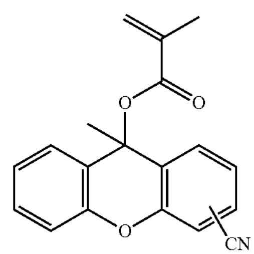
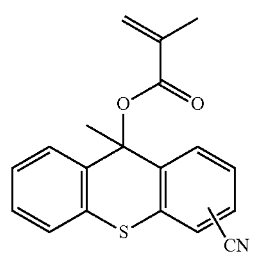
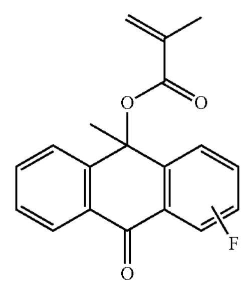

-continued
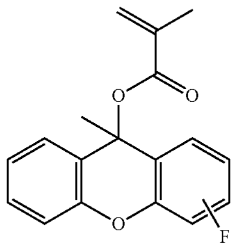
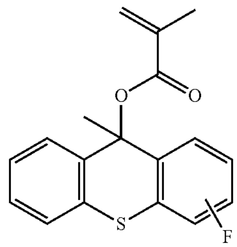
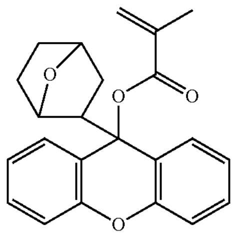
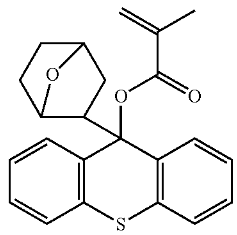
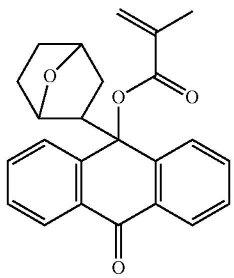
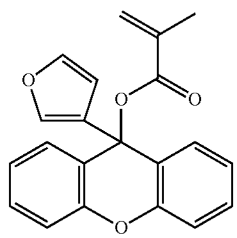
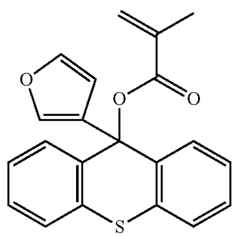
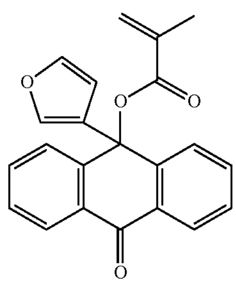
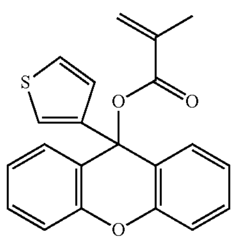
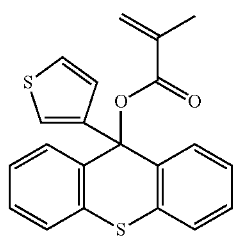
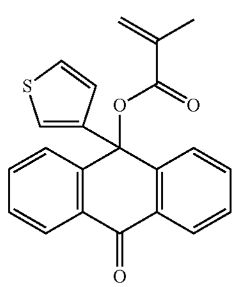
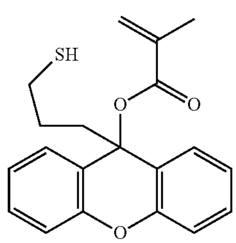
-continued
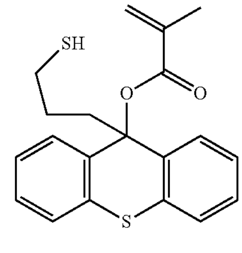
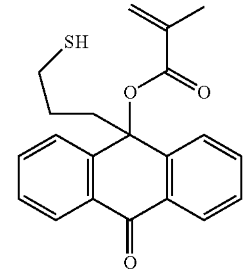
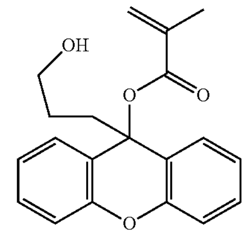
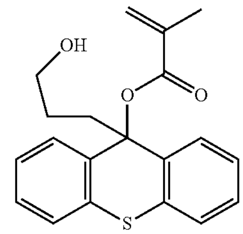
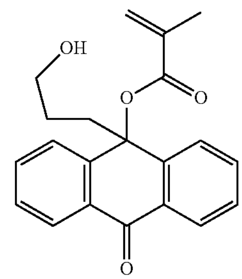
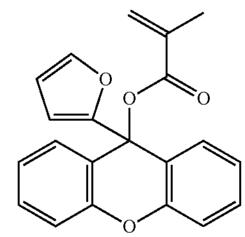
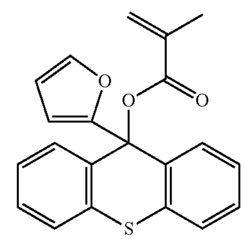
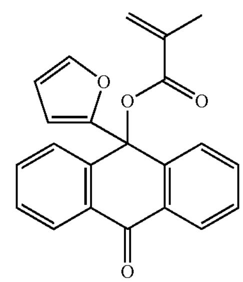
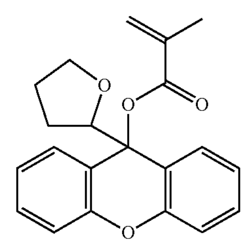
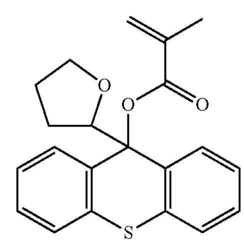
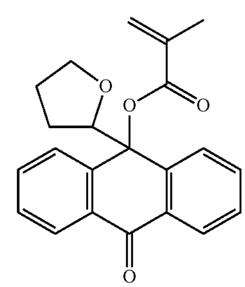
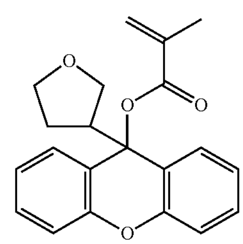

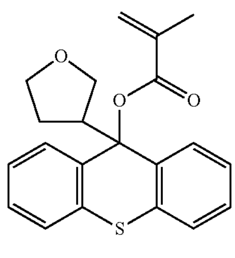
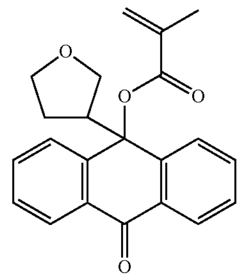
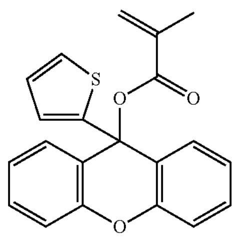
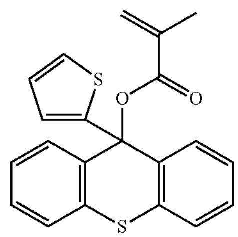
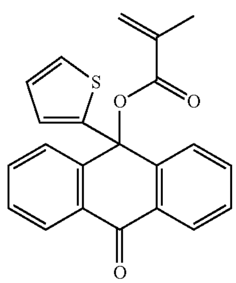
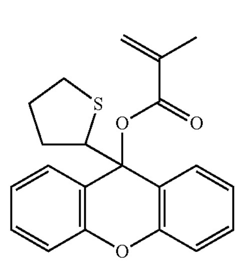
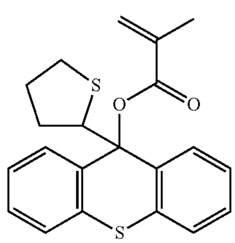
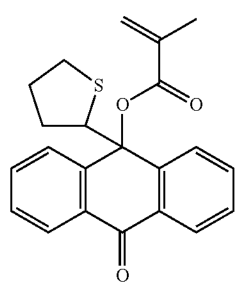
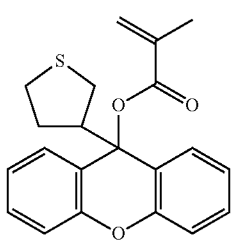
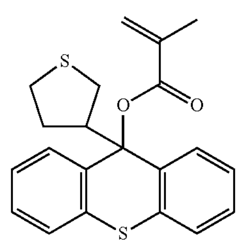
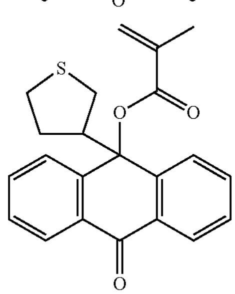
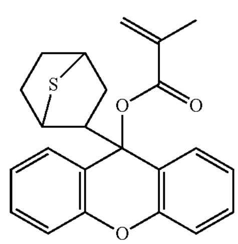
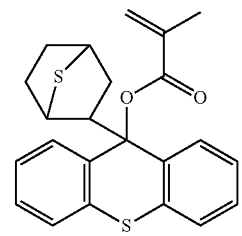
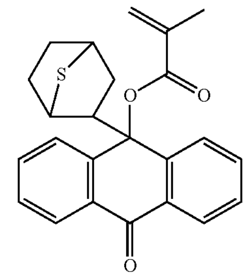
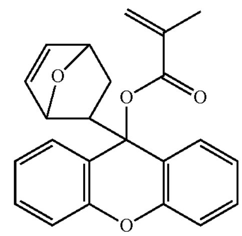
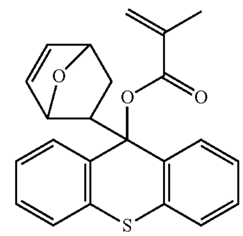
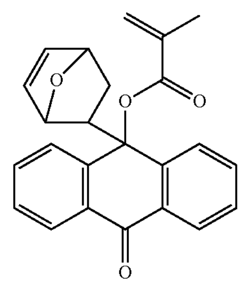
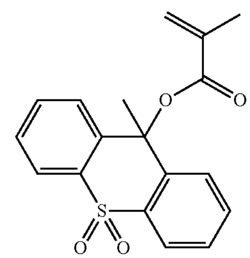
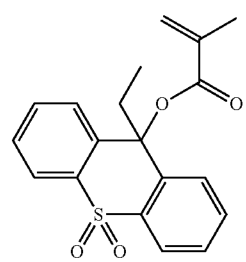
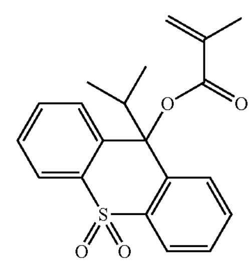
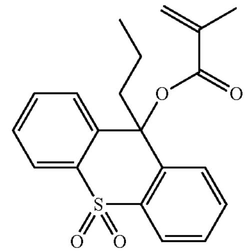
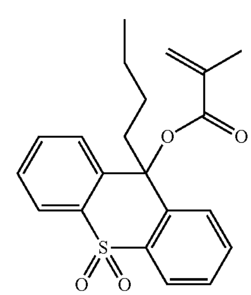
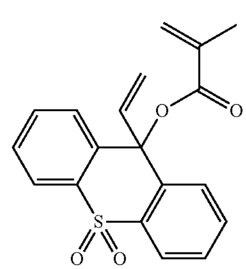
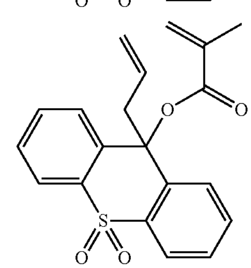

-continued

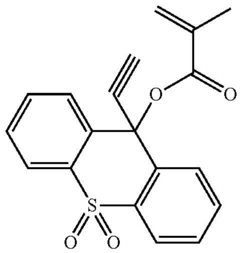
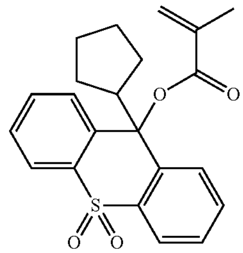
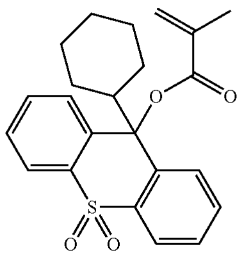
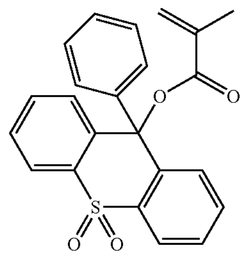
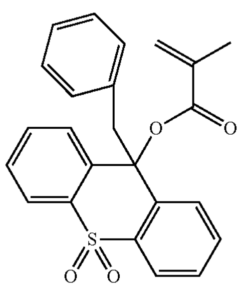
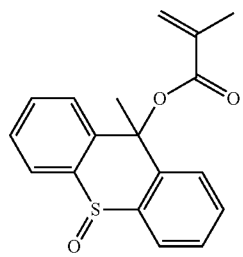
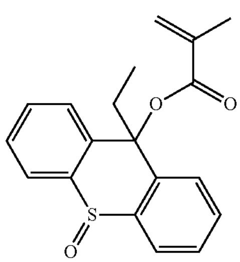
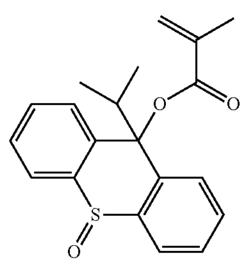
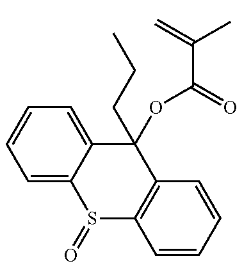
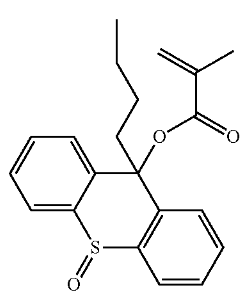
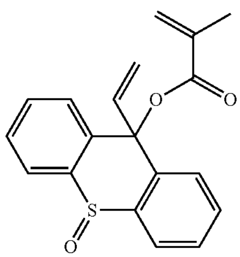
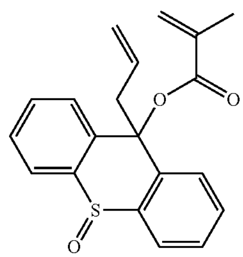

-continued

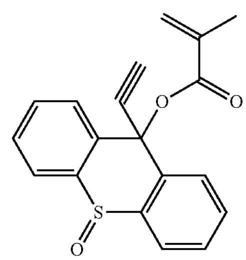
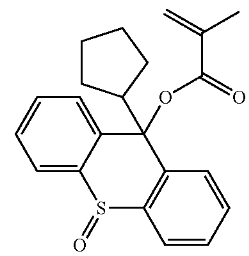
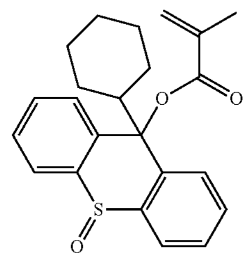
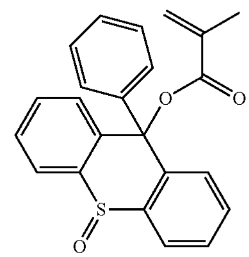
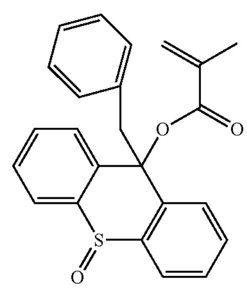

The base resin may further comprise recurring units (e) having an adhesive group which is selected from among hydroxyl, carboxyl, lactone ring, carbonate, thiocarbonate, carbonyl, cyclic acetal, ether, ester, sulfonic acid ester, cyano, amide, and —O—C(═O)-J- wherein J is —S— or —NH. Examples of the monomer from which recurring units (e) are derived are given below, but not limited thereto.

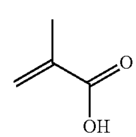
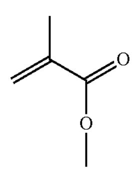
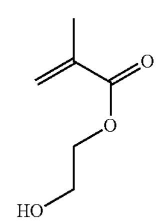
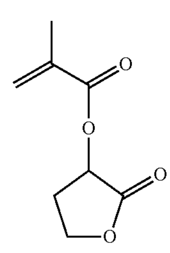
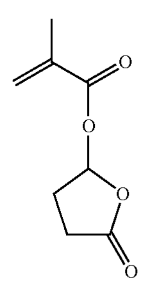
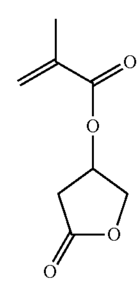

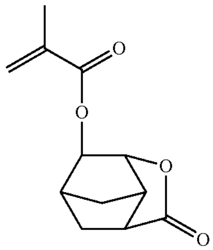
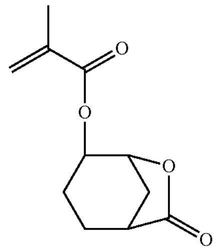
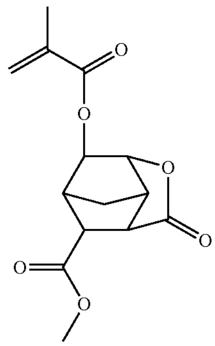
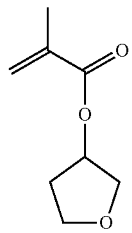
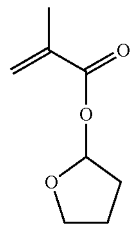
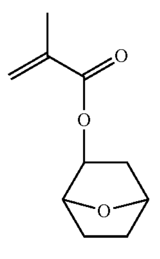
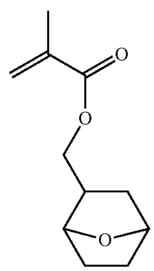
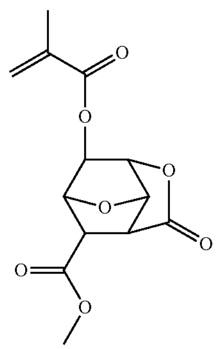
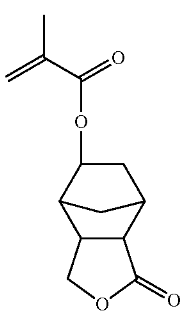
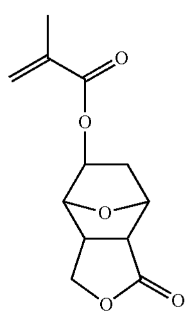
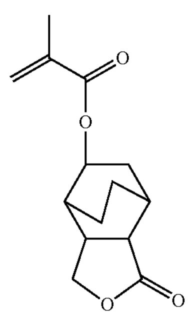
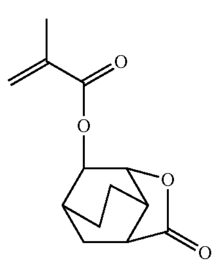
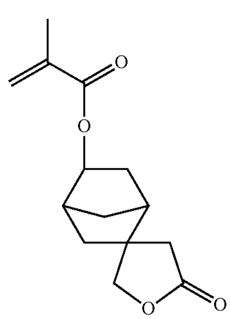
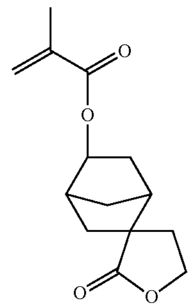
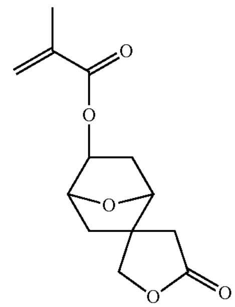
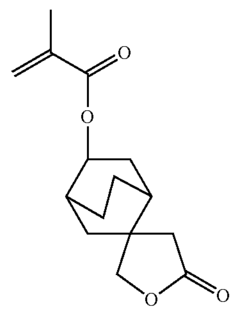
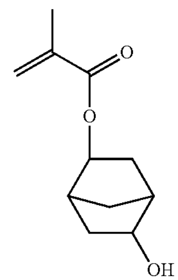
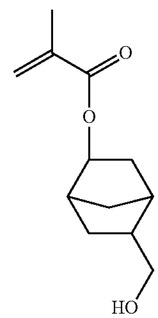
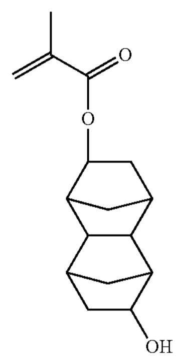
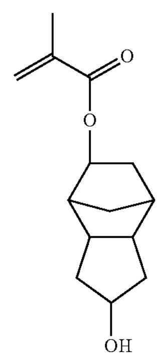
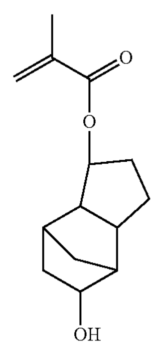
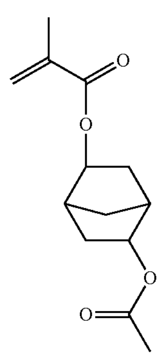
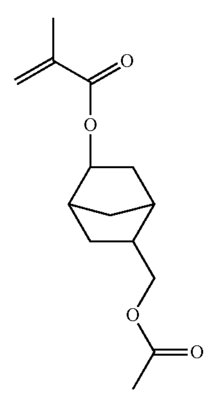
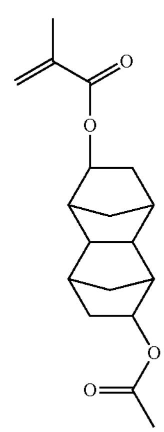

-continued
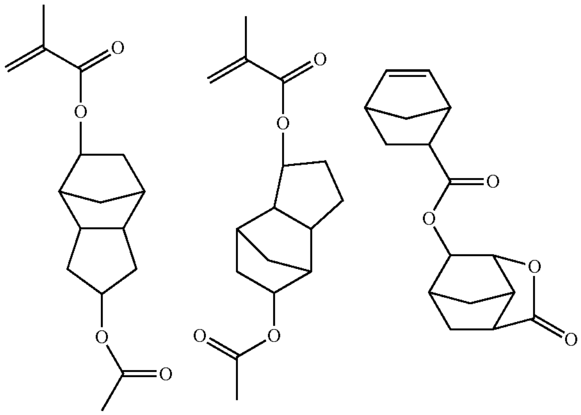
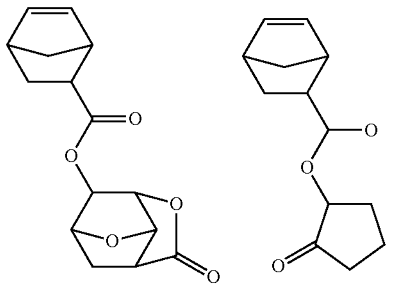
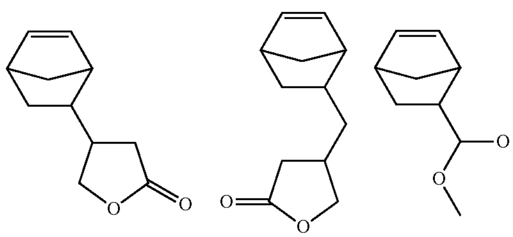
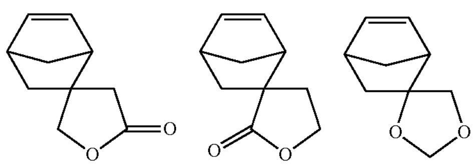
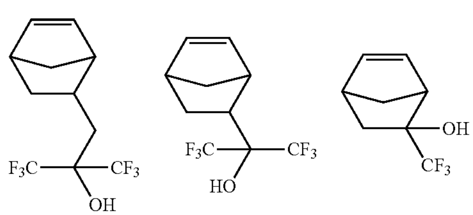
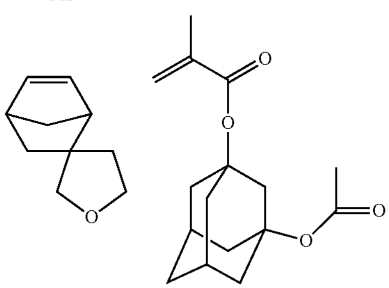
-continued
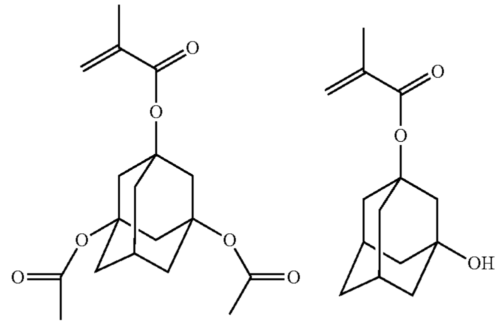
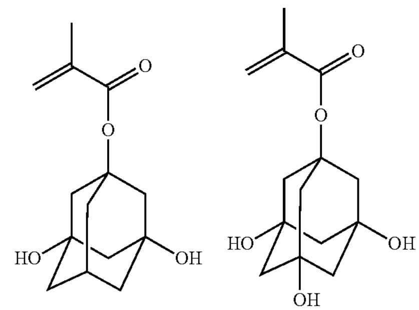
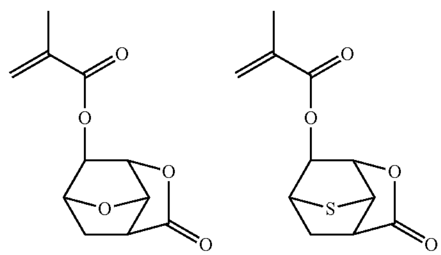
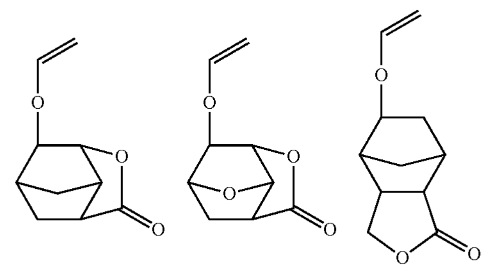
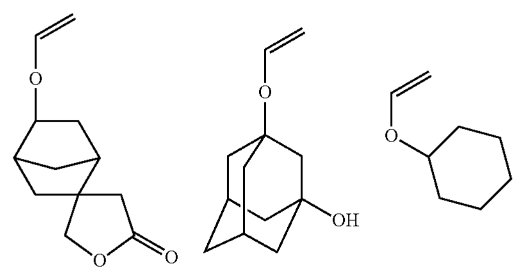
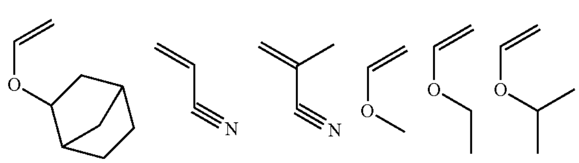

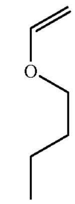
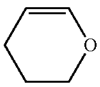
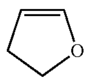
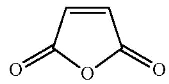
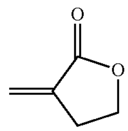
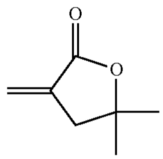
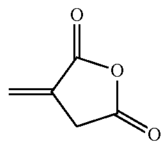
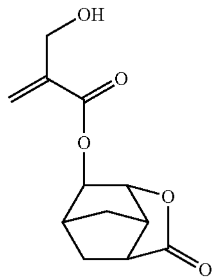
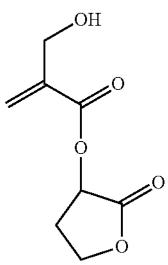
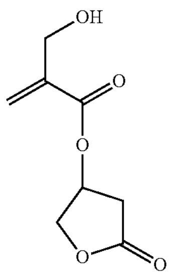
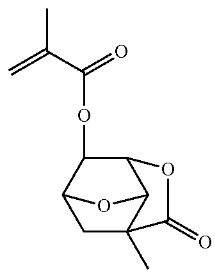
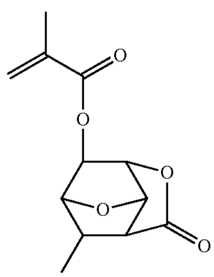
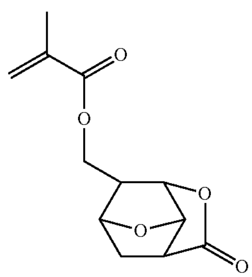
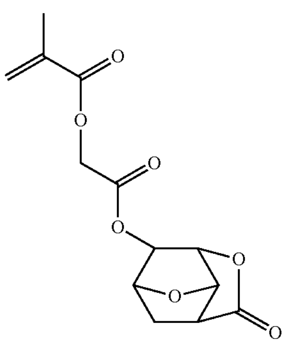
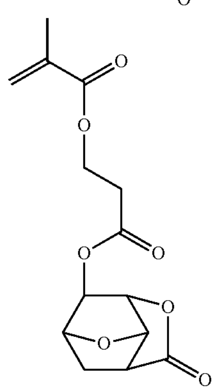
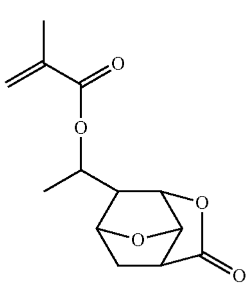
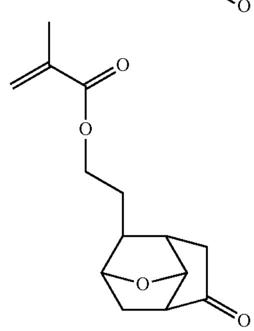
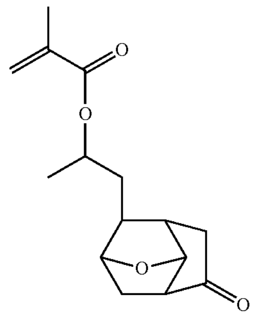
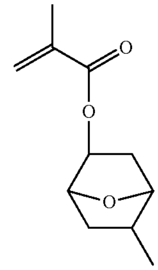
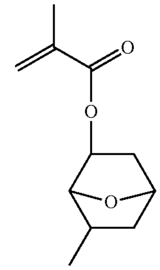
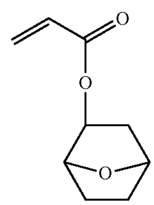
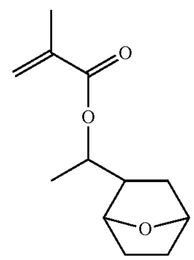
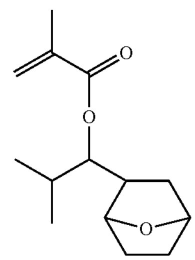
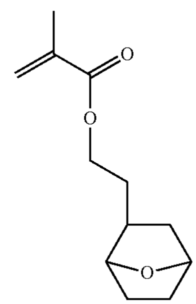
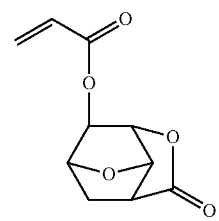
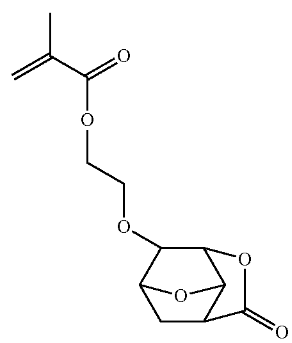
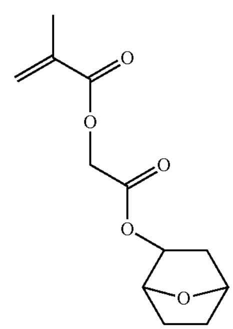
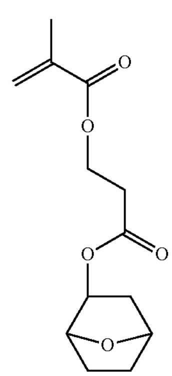
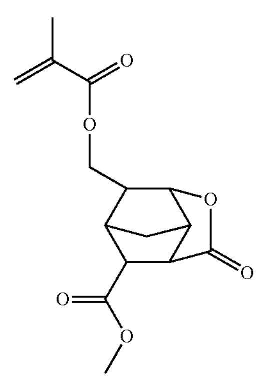

-continued
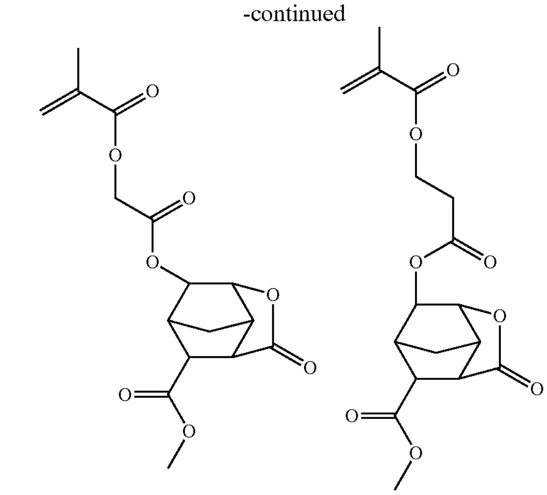
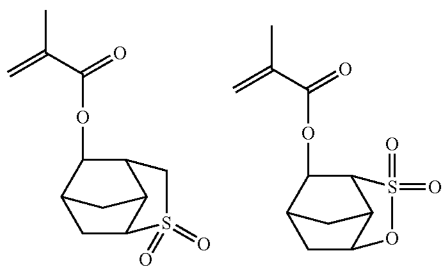
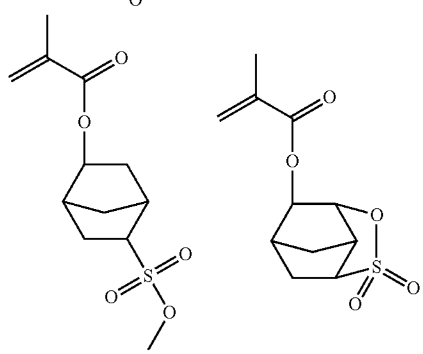
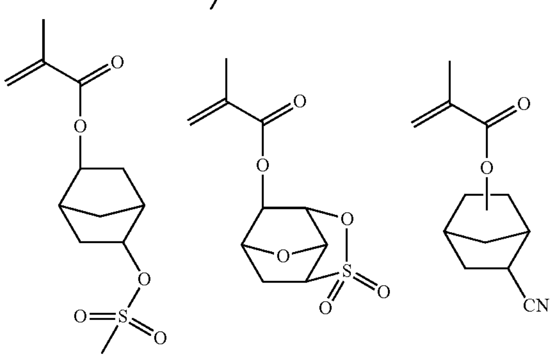
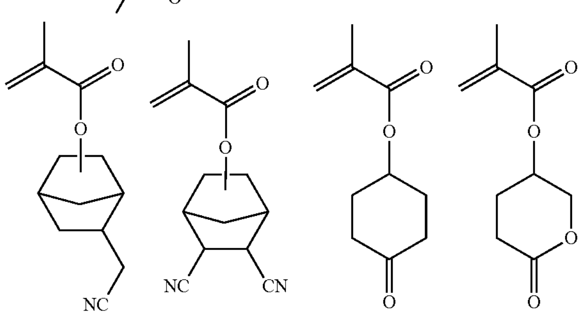
-continued
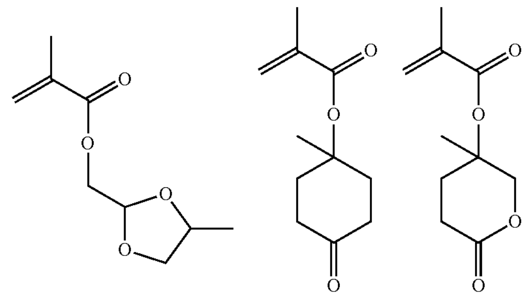
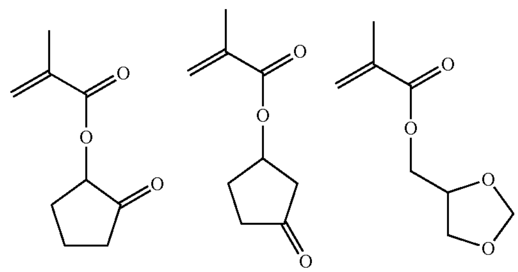
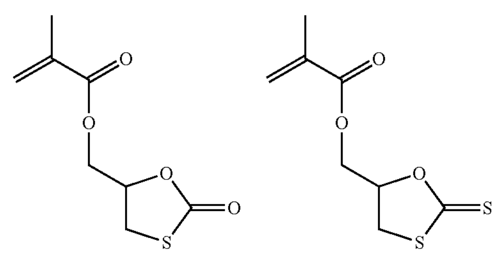
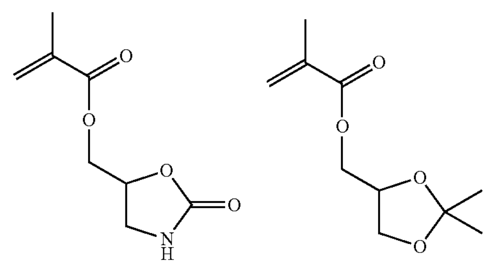
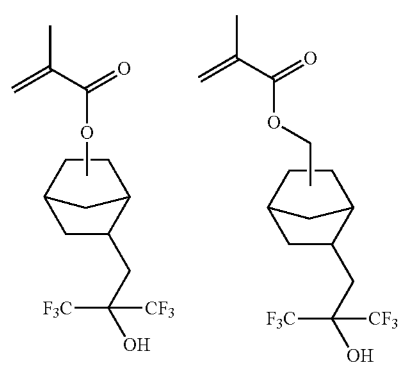

-continued
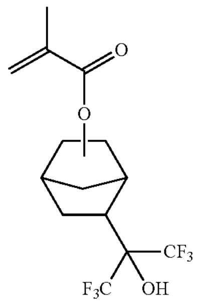
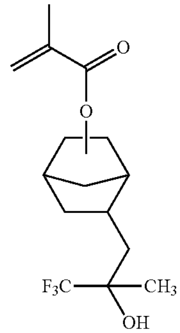
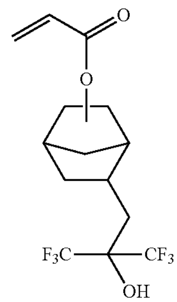
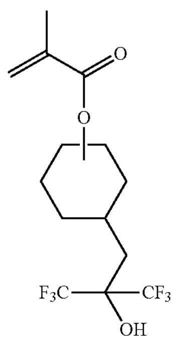
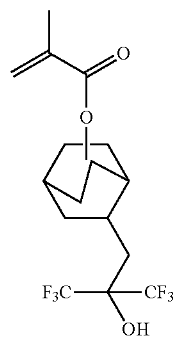
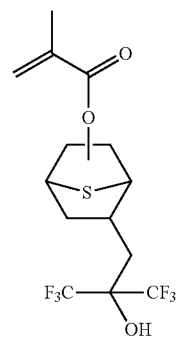
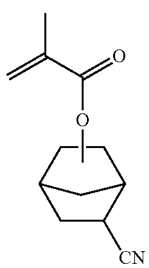
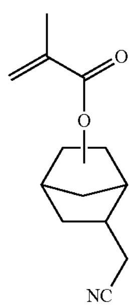
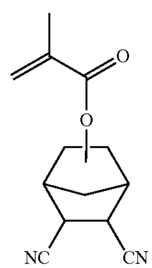
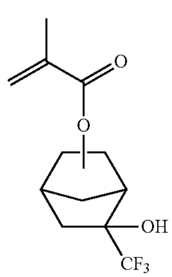
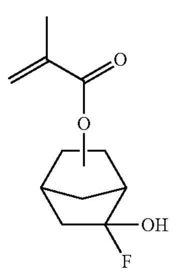
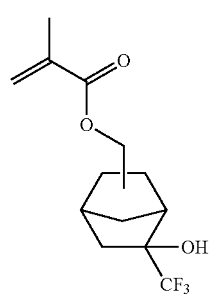
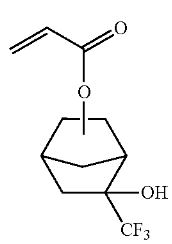
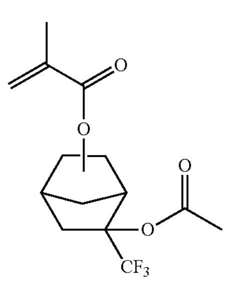
-continued
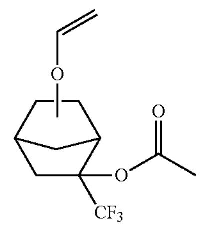
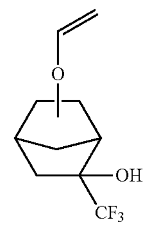
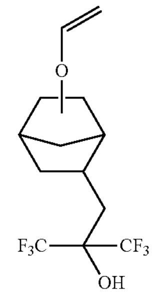
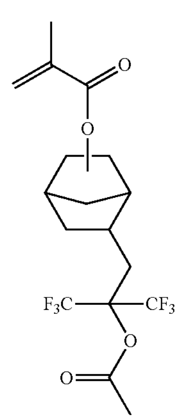
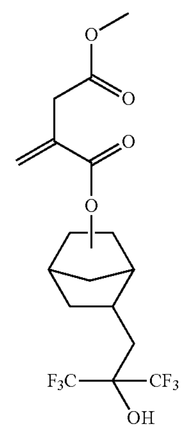
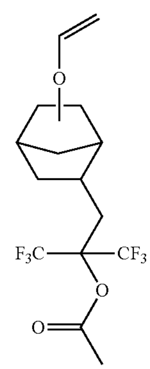
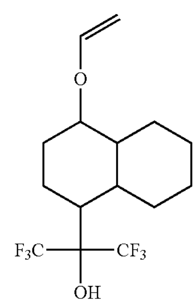
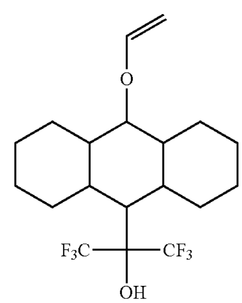
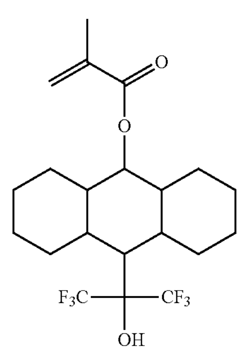
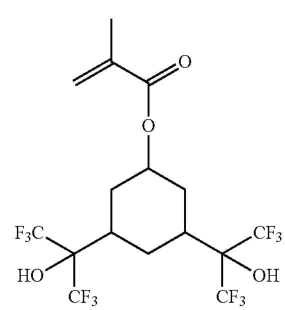
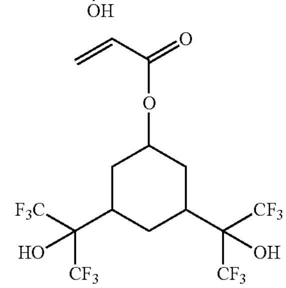
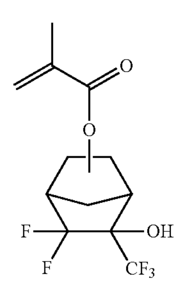

-continued
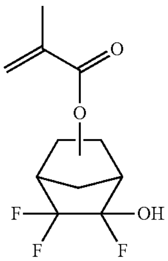
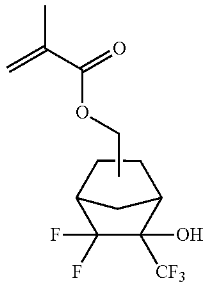
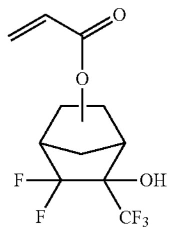
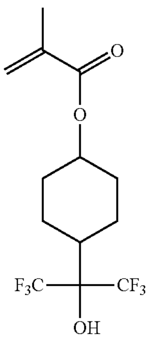
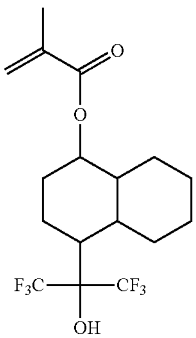
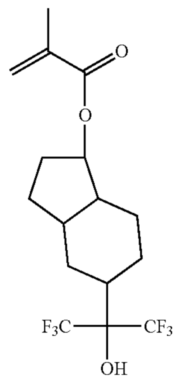
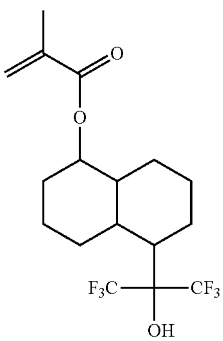
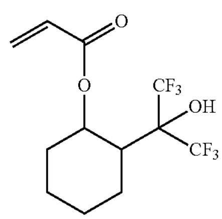
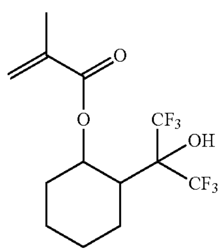
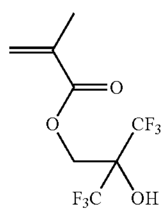
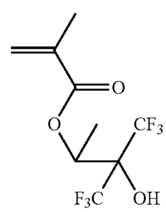
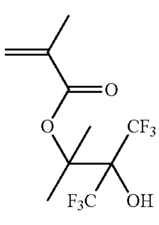
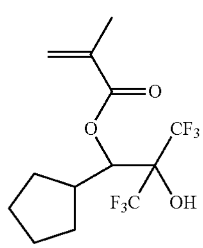
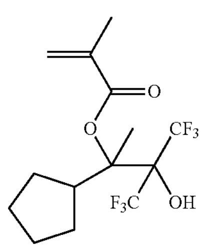
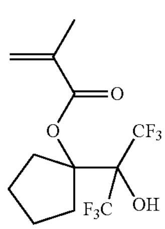
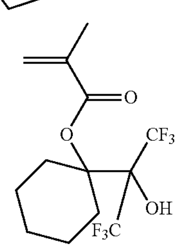
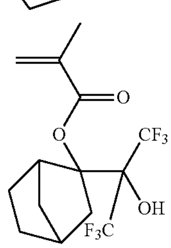
-continued
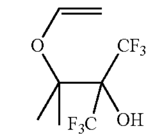
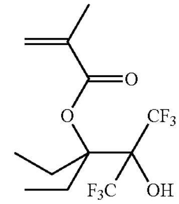
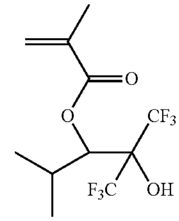
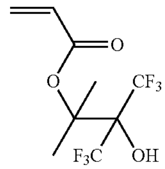
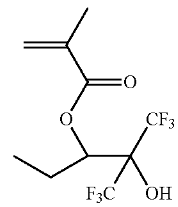
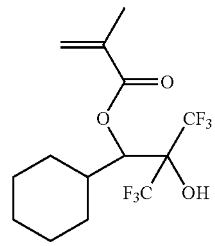
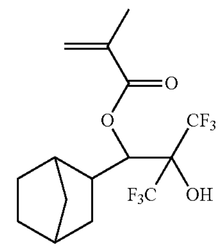
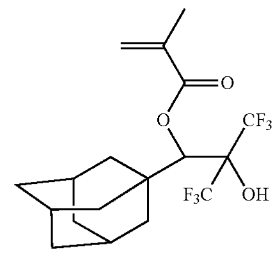
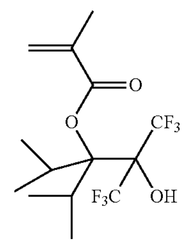
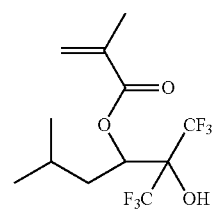
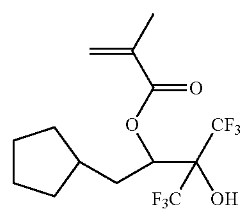
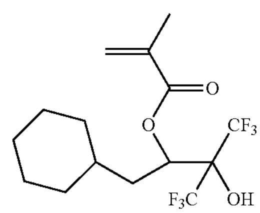
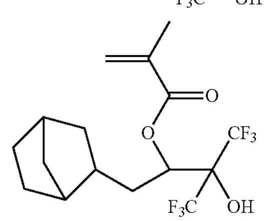
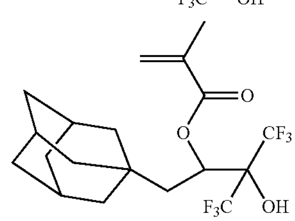
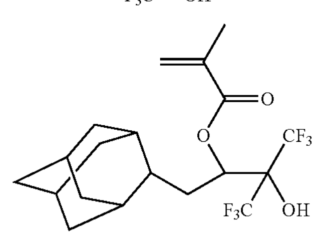
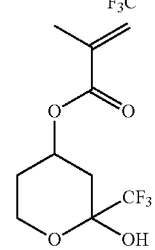

-continued
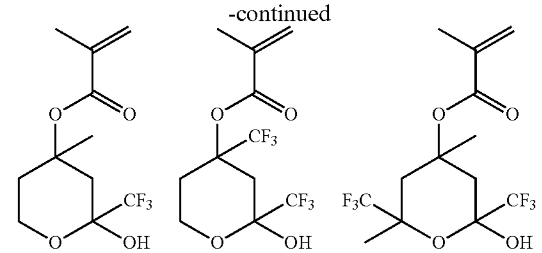
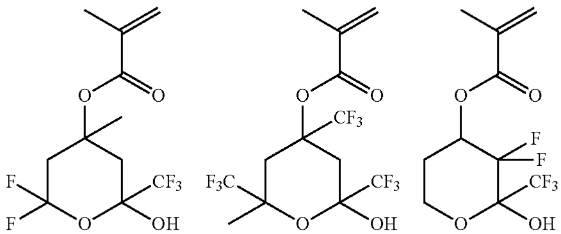
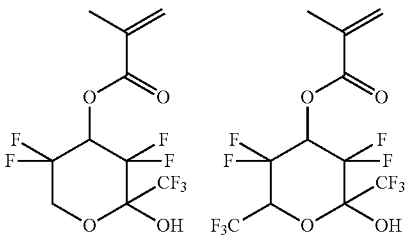
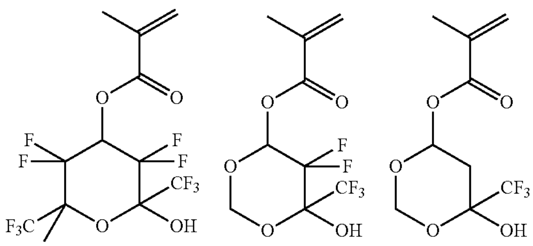
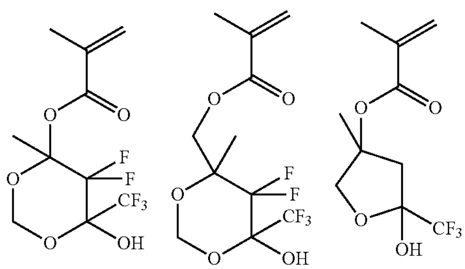
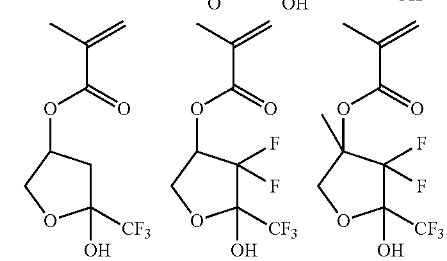
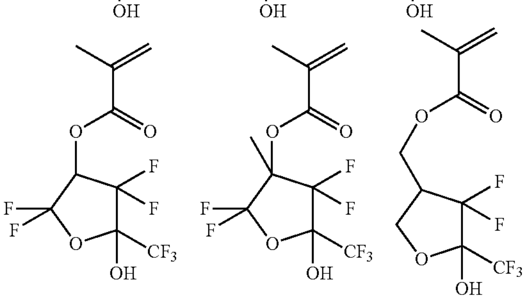
-continued
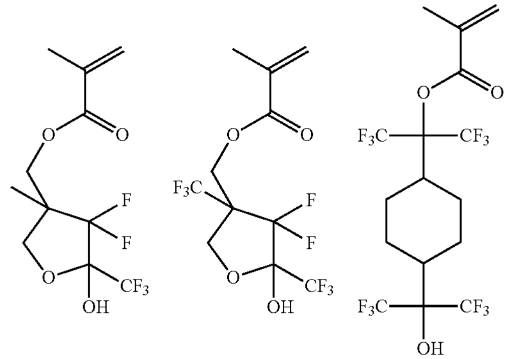
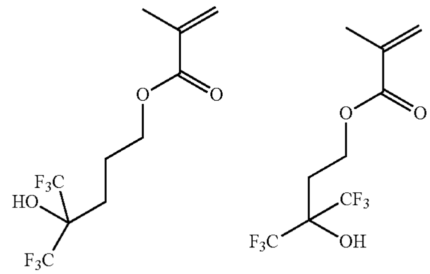
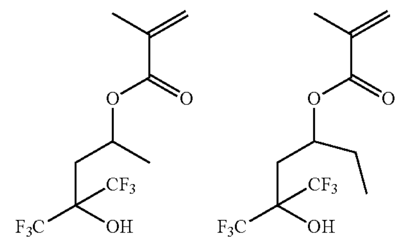
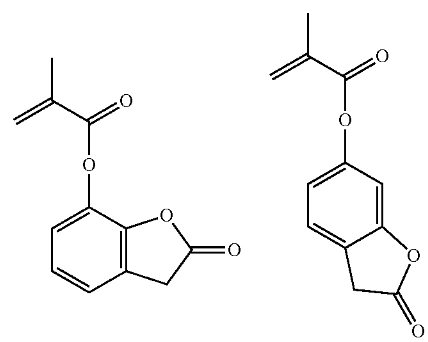
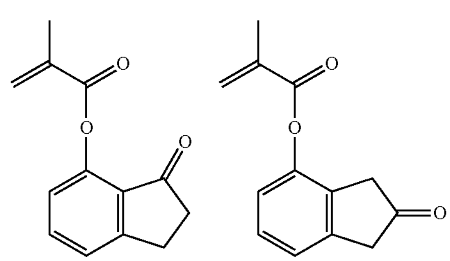

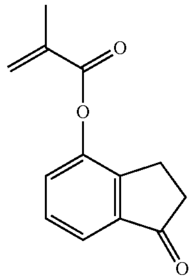
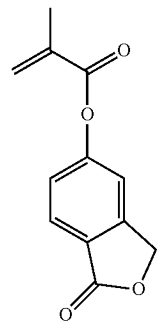
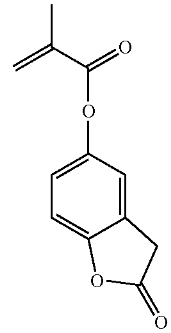
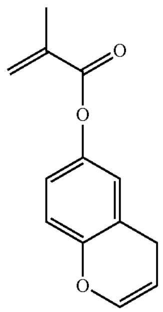
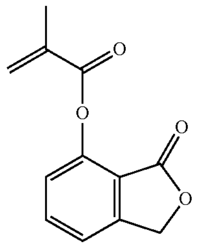
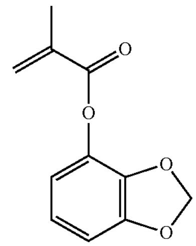
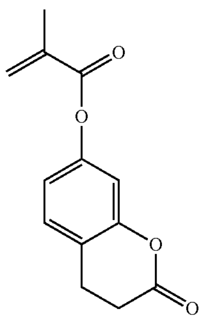
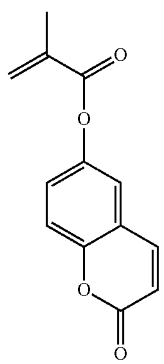
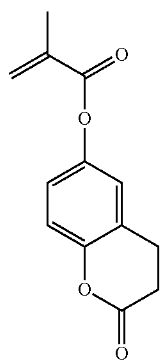
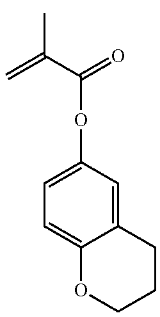
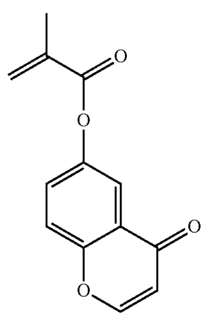
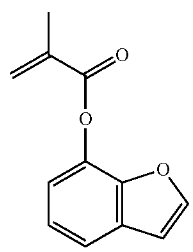
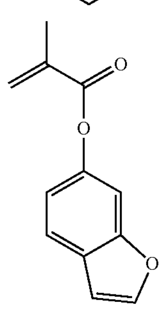
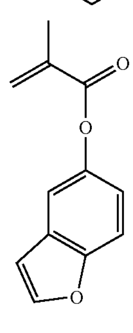
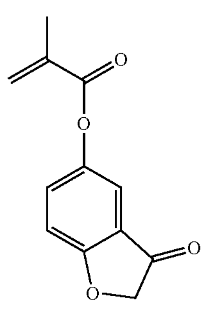
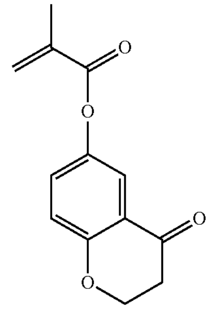
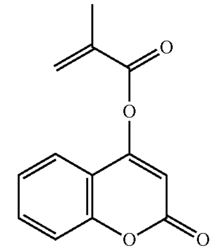
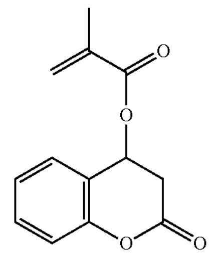
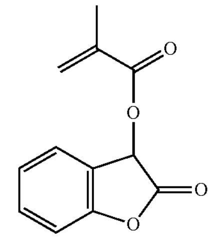
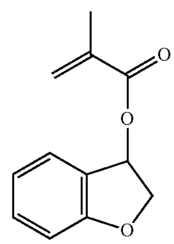
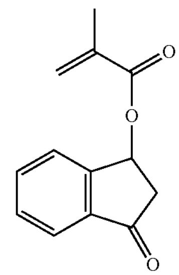
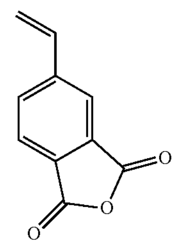
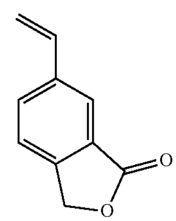
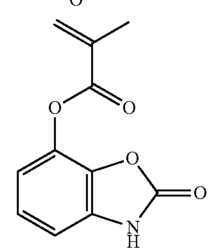
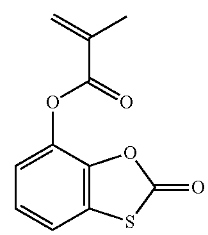
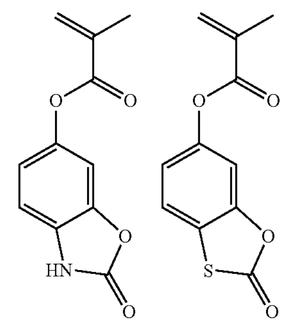
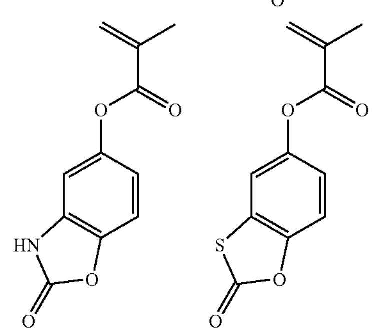

-continued
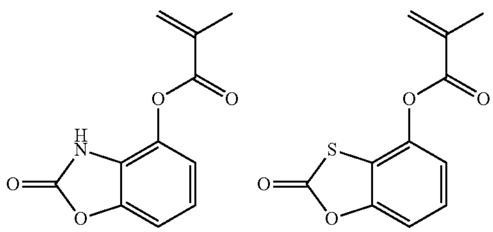
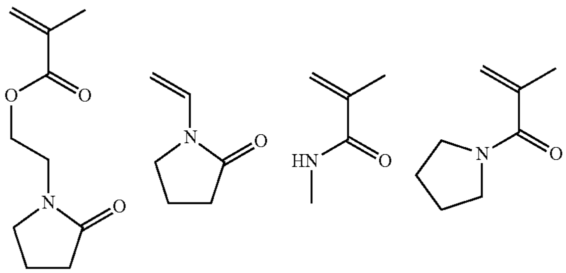
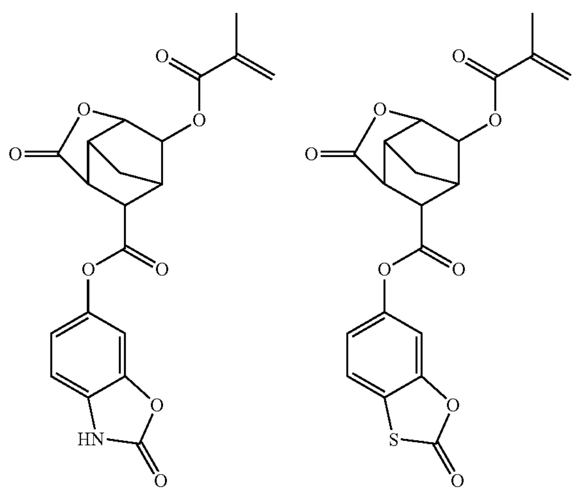
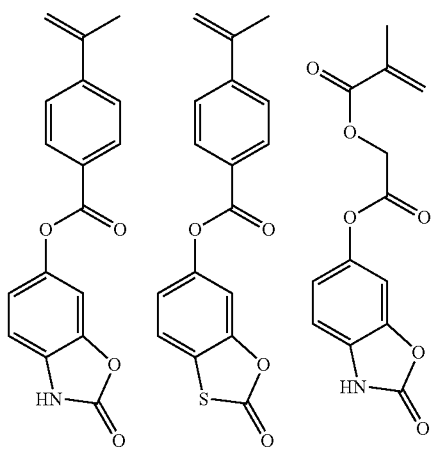
-continued
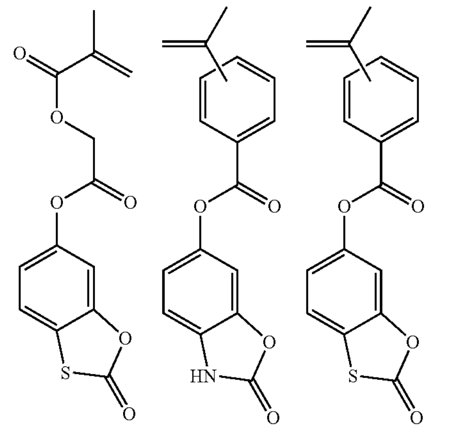
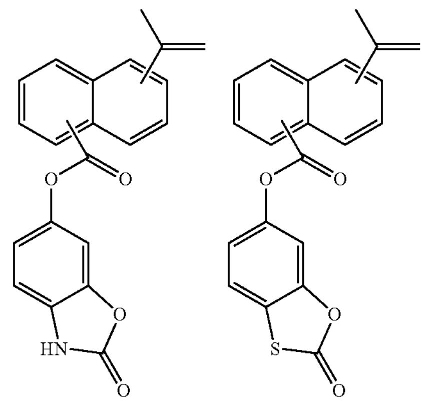
The base resin may further comprise recurring units (f) having a phenolic hydroxyl group as the adhesive group. Examples of the monomer from which recurring units (f) are derived are given below, but not limited thereto.
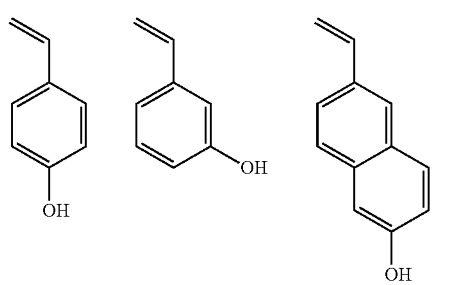
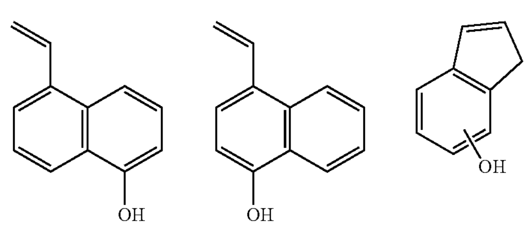

-continued
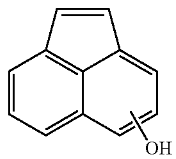
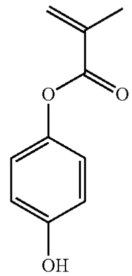
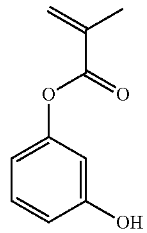
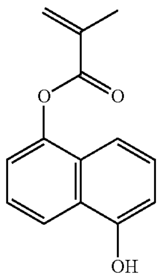
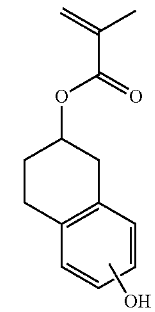
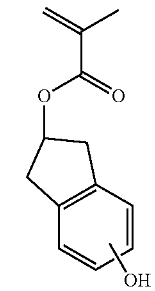
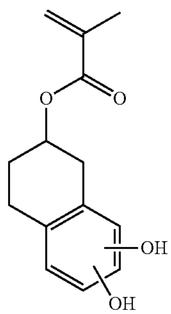
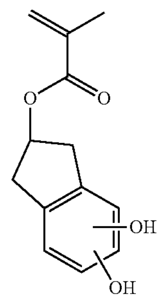
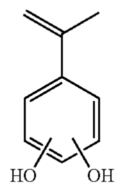
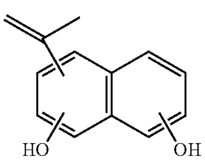
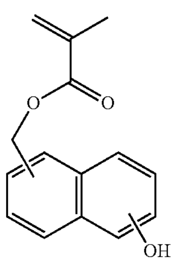
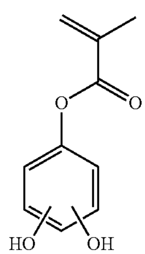
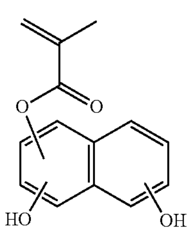
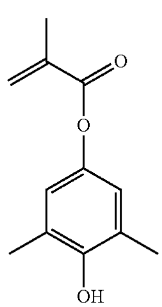
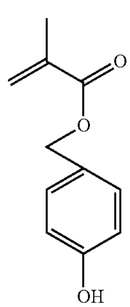
-continued
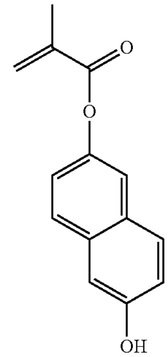
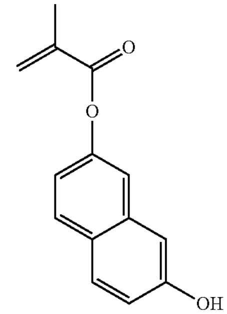
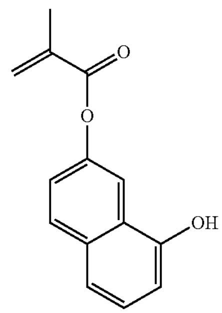
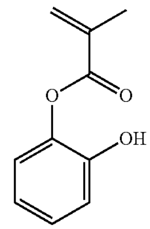
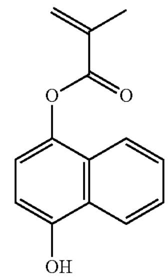
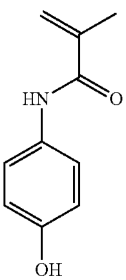
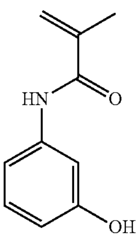
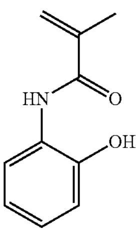
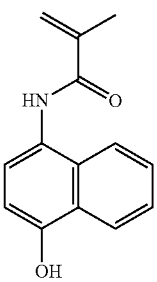
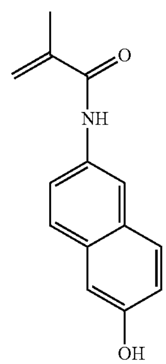
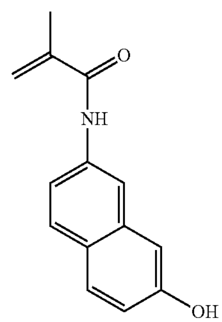
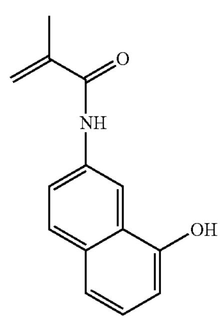
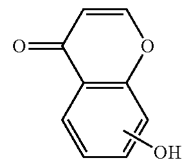

-continued
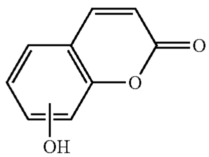
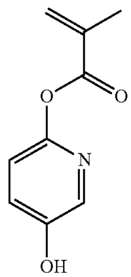
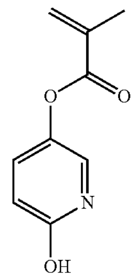
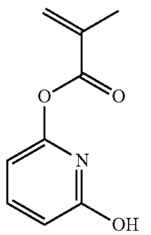
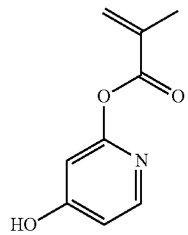
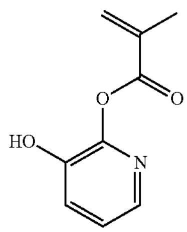
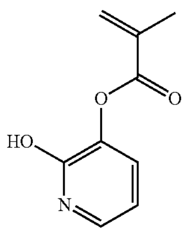
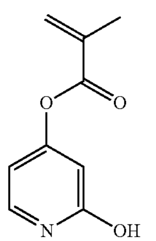
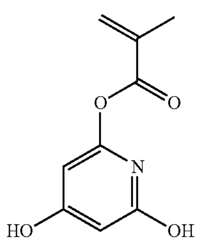
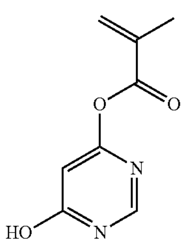
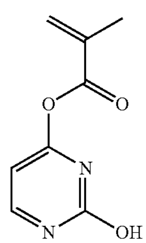
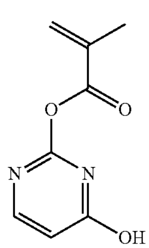
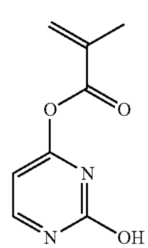
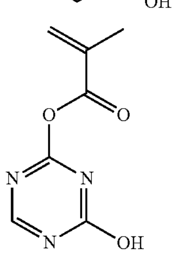
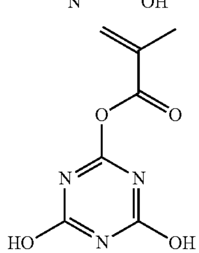
-continued
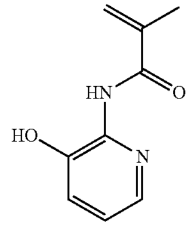
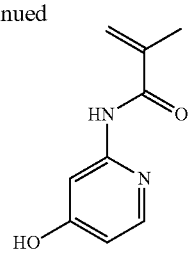
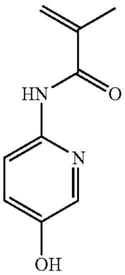
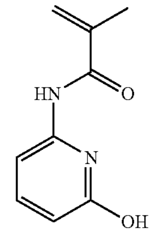
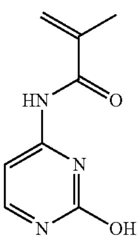
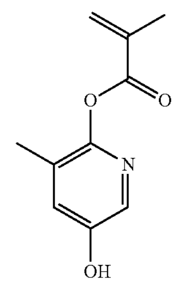
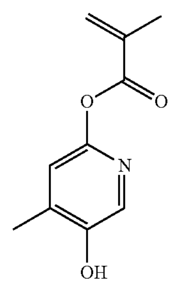
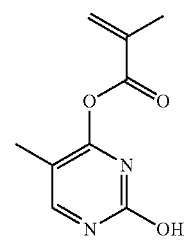
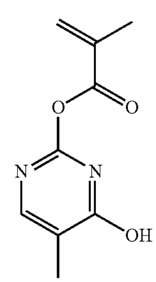
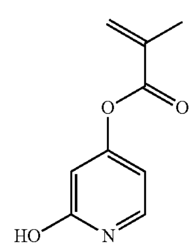
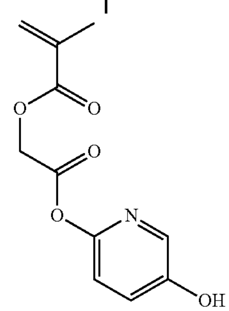
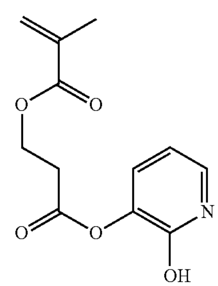

-continued
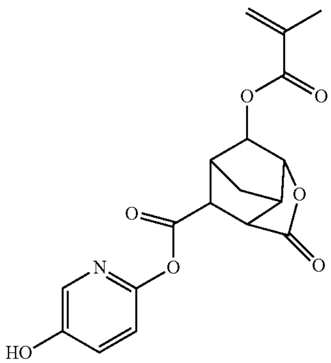
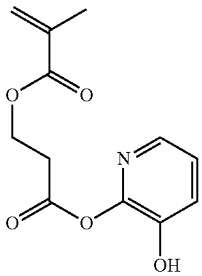
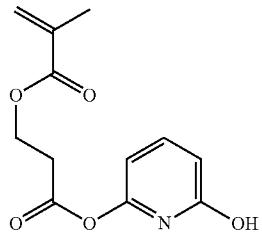
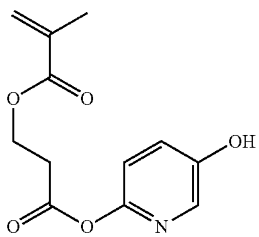
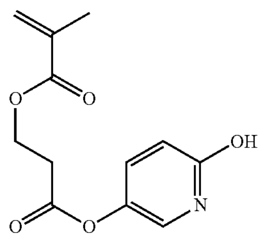
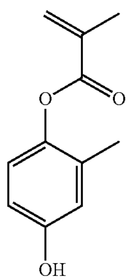
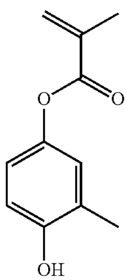
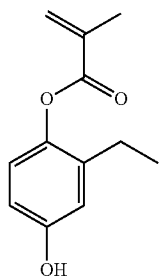
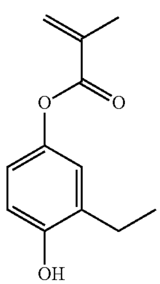
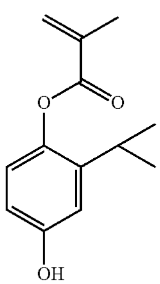
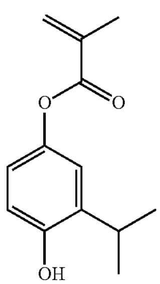
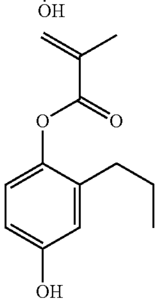
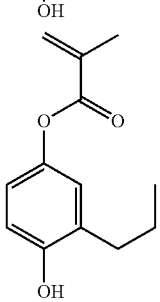
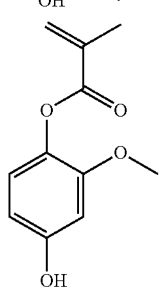
-continued
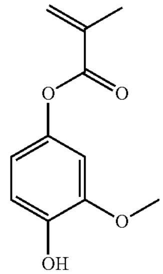
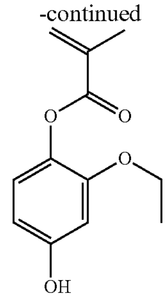
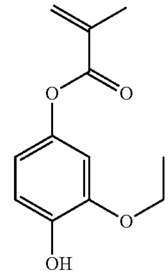
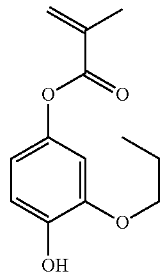
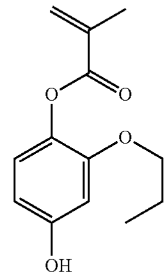
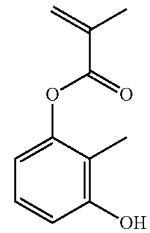
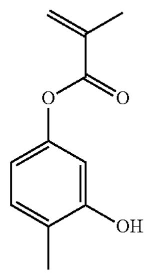
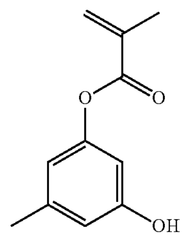
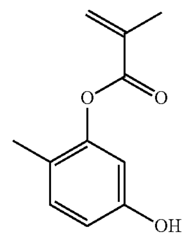
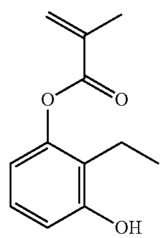
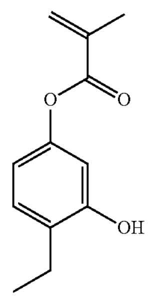
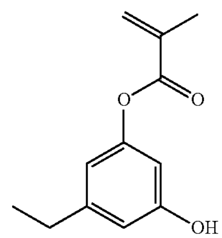
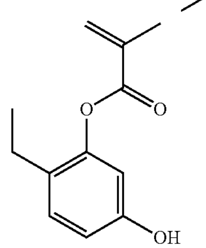
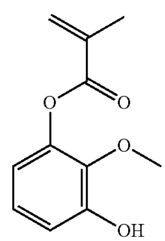
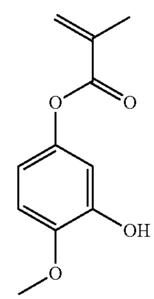
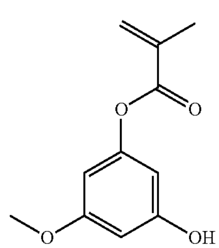
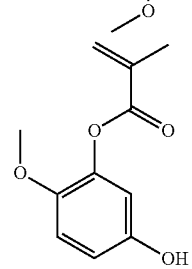

-continued
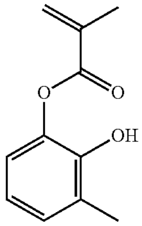
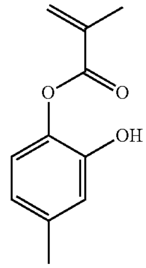
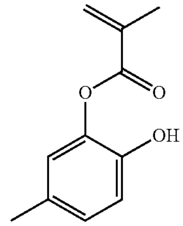
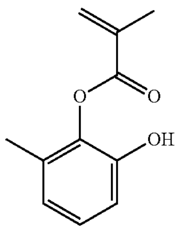
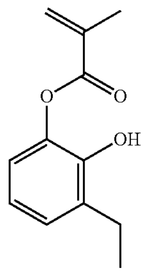
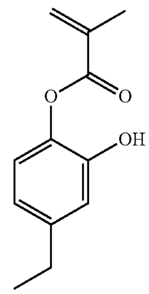
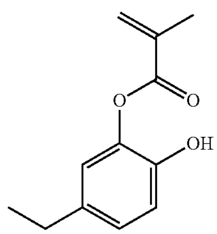
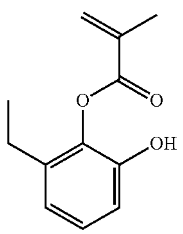
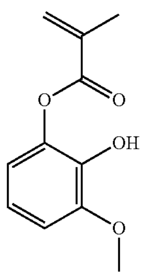
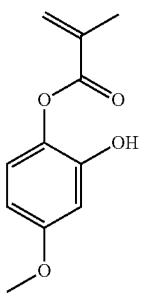
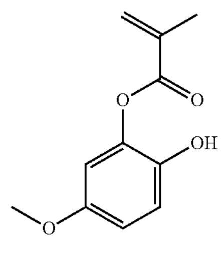
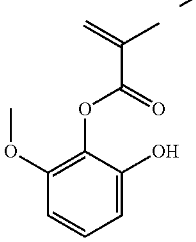
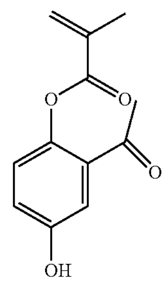
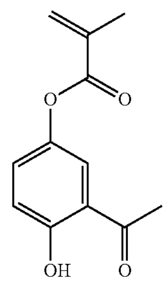
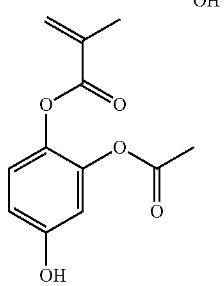
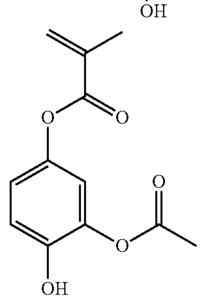
-continued
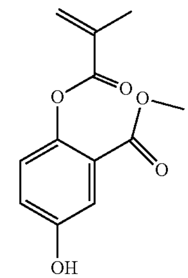
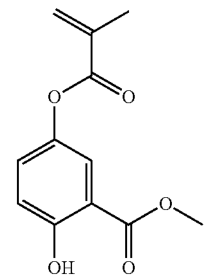
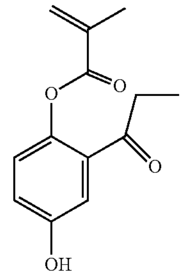
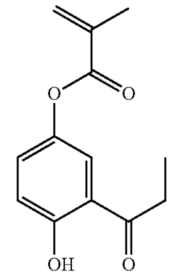
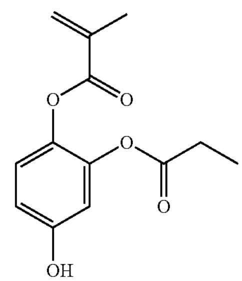
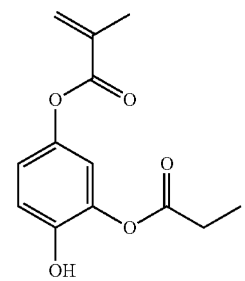
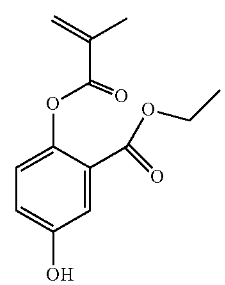
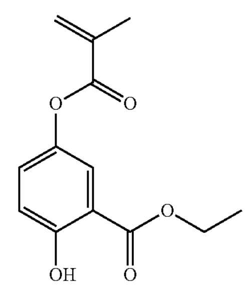
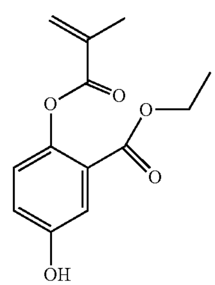
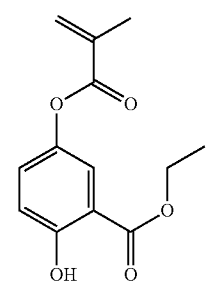
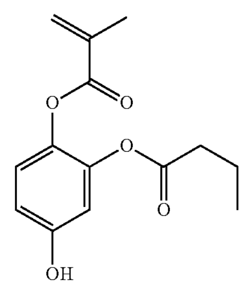
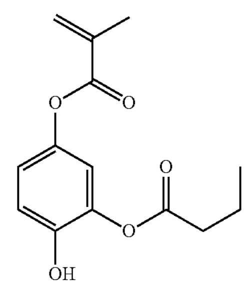

-continued
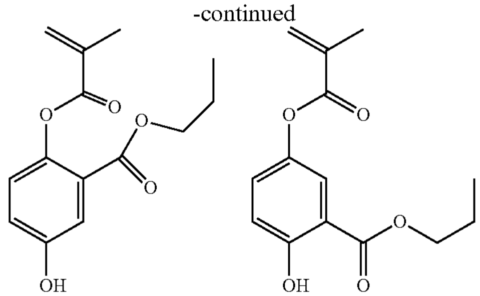
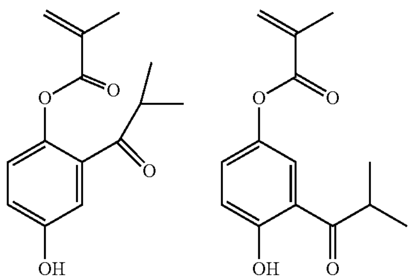
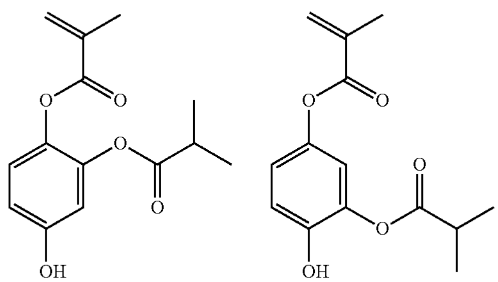
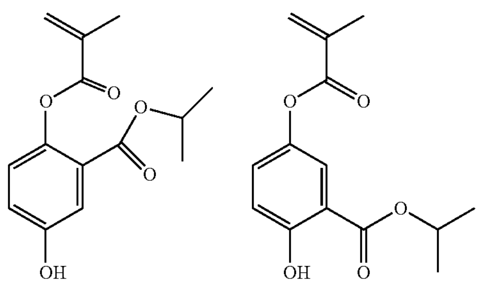
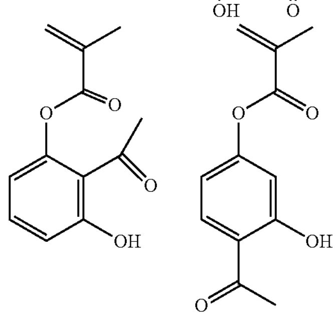
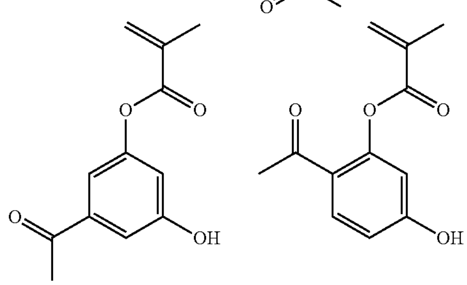
-continued
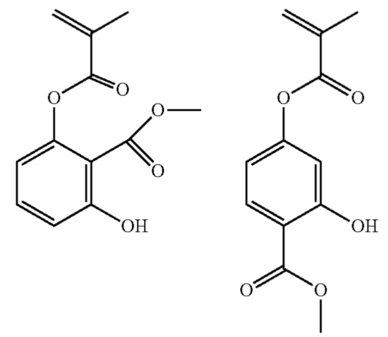
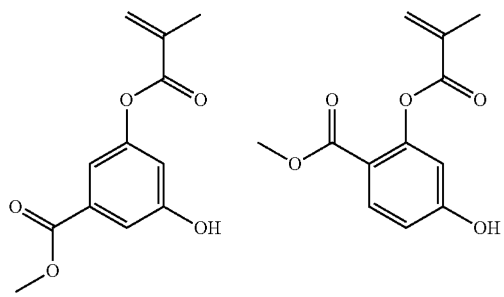
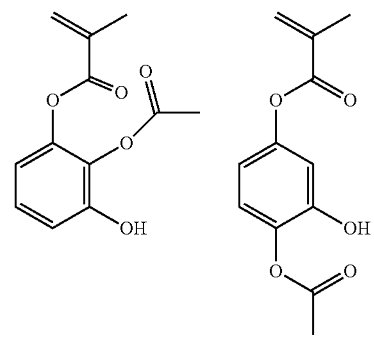
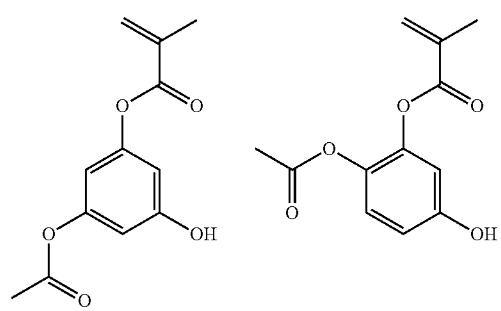
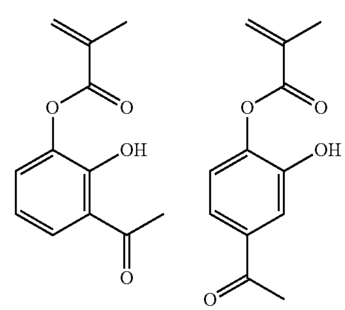

-continued
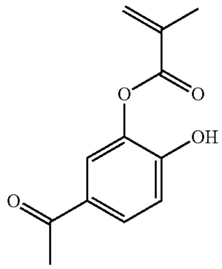
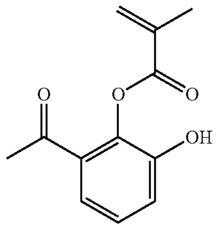
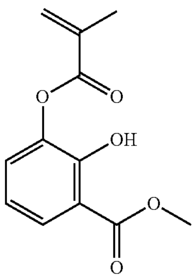
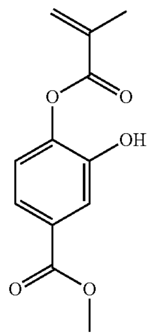
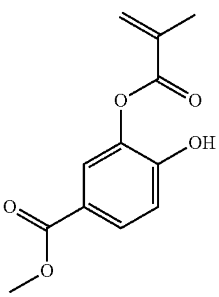
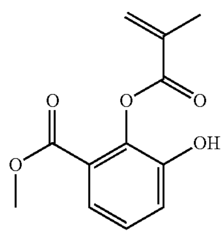
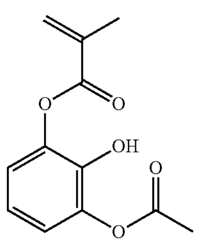
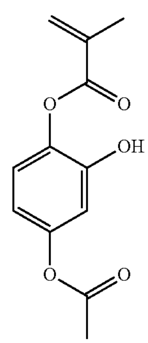
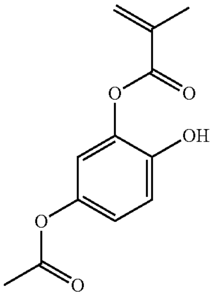
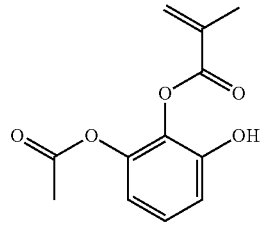
-continued
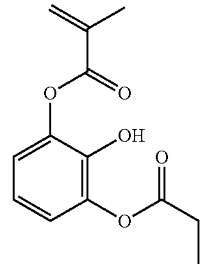
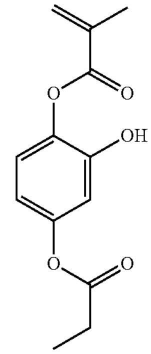
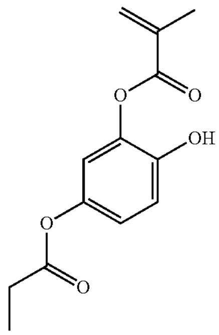
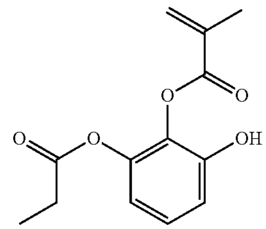
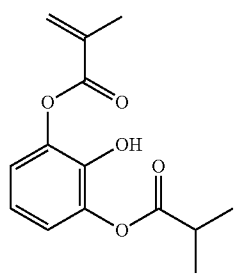
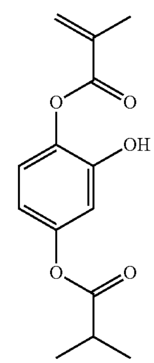
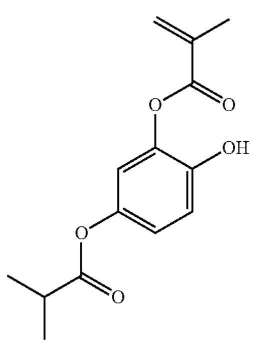
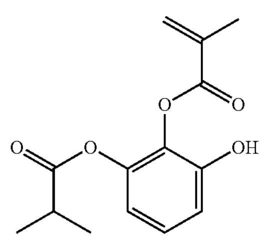

-continued
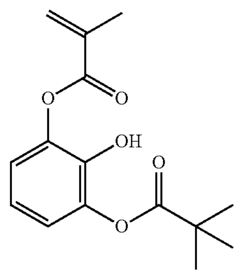
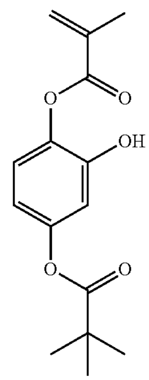
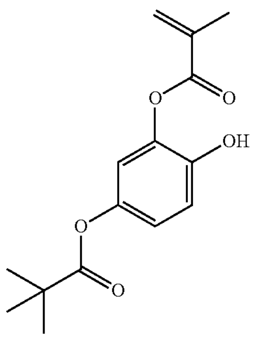
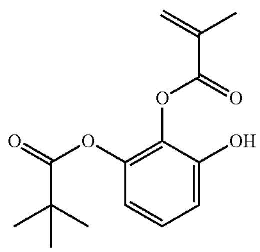
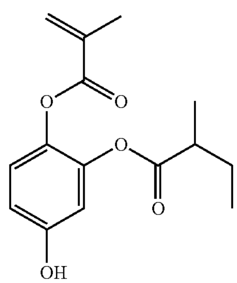
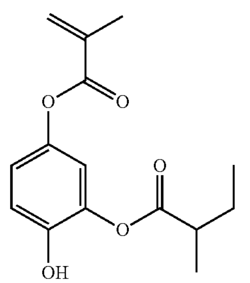
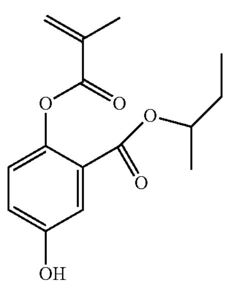
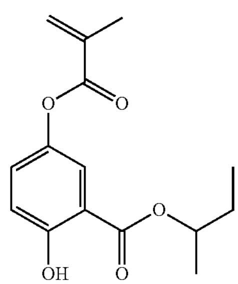
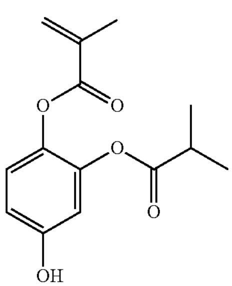
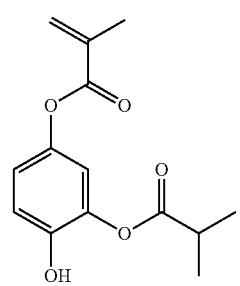
-continued
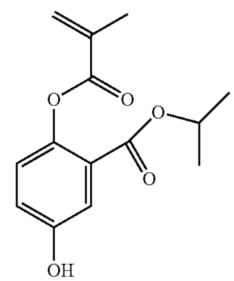
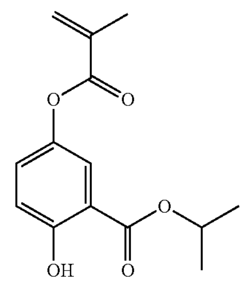
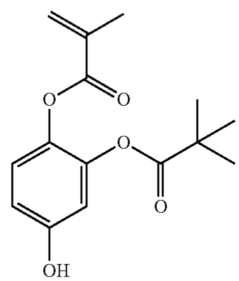
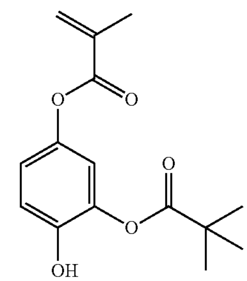
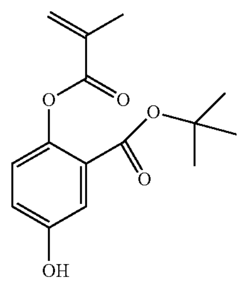
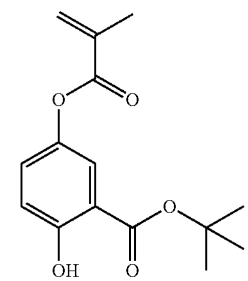
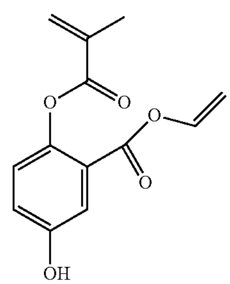
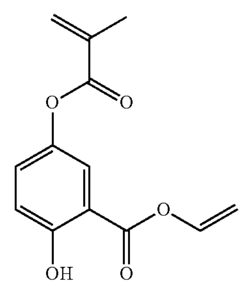
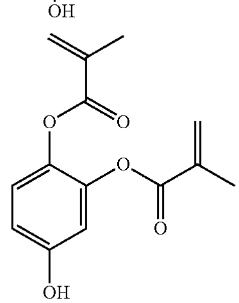
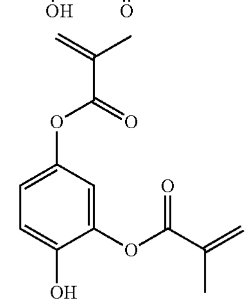
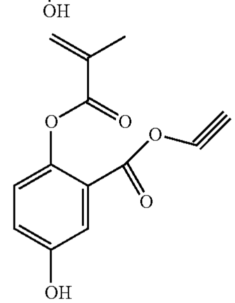
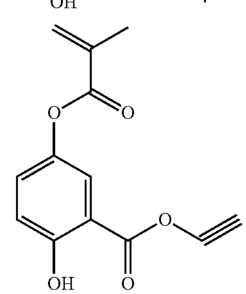

-continued

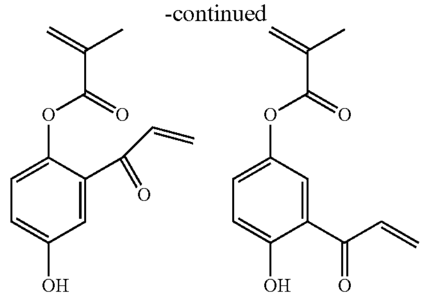

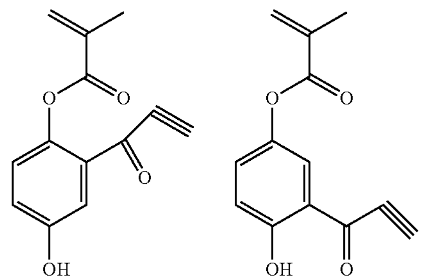

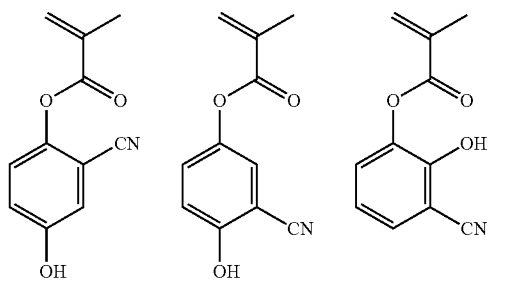

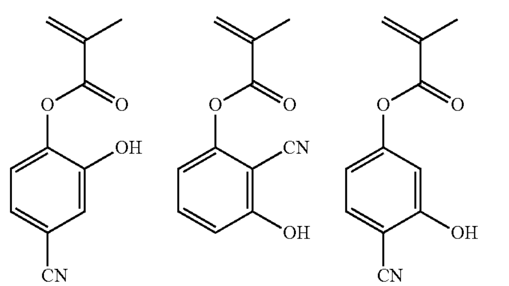

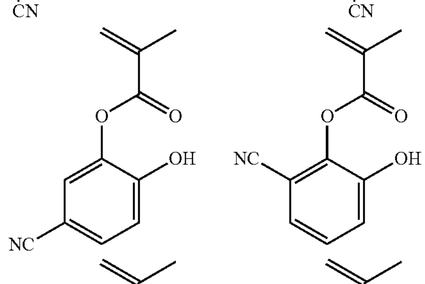

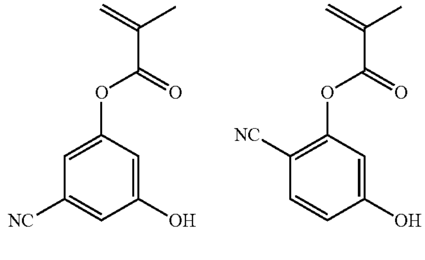

When a monomer corresponding to unit (f) is copolymerized, the hydroxyl group may be replaced by an acetal group susceptible to deprotection with acid, typically ethoxyethoxy, prior to polymerization, and the polymerization be followed by deprotection with weak acid and water. Alternatively, the hydroxyl group may be replaced by an acetyl, formyl, pivaloyl or similar group prior to polymerization, and the polymerization be followed by alkaline hydrolysis.

The base resin may have further copolymerized therein recurring units having a sulfonium salt, represented by the formulae (9) to (11), referred to as recurring units (g1) to (g3), respectively. While the recurring units (g1) to (g3) function as an acid generator, a resist composition comprising a base resin having recurring units (g1) to (g3) incorporated in its main chain is advantageous in that a pattern after development has a reduced edge roughness (LWR).

(9)

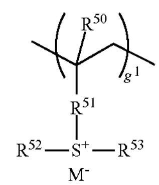

(10)

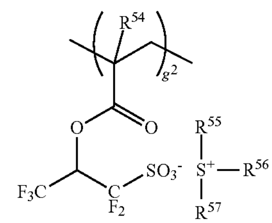

(11)

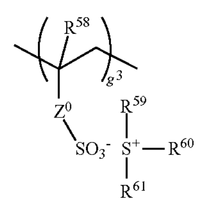

Herein $R^{50}$, $R^{54}$ and $R^{58}$ are each independently hydrogen or methyl. $R^{51}$ is a single bond, phenylene, —O—$R^{63}$—, or —C(═O)—Y—$R^{63}$— wherein Y is —O— or —NH— and $R^{63}$ is a straight, branched or cyclic $C_2$-$C_6$ alkylene group, $C_2$-$C_6$ alkenylene group or phenylene group, which may contain a carbonyl (—CO—), ester (—COO—), ether (—O—) or hydroxyl moiety. $R^{52}$, $R^{53}$, $R^{55}$, $R^{56}$, $R^{57}$, $R^{59}$, $R^{60}$, and $R^{61}$ are each independently a straight, branched or cyclic $C_1$-$C_{12}$ alkyl group, $C_6$-$C_{12}$ aryl group or $C_7$-$C_{20}$ aralkyl group, which may contain a carbonyl, ester or ether moiety. $Z^0$ is a single bond, methylene, ethylene, phenylene, fluorinated phenylene, —O—R—, or —C(═O)—$Z^1$—$R^{62}$— wherein $Z^1$ is —O— or —NH— and $R^{62}$ is a straight, branched or cyclic $C_1$-$C_6$ alkylene, alkenylene or phenylene group which may contain a carbonyl, ester, ether or hydroxyl moiety. $M^-$ is a non-nucleophilic counter ion, and g1, g2 and g3 are positive numbers in the range: $0 \le g1 \le 0.8$, $0 \le g2 \le 0.8$, $0 \le g3 \le 0.8$, and $0 \le g1+g2+g3 \le 0.8$.

Examples of the monomer from which recurring units (g1) are derived are given below, but not limited thereto.

-continued
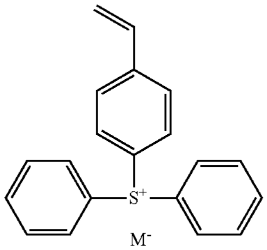
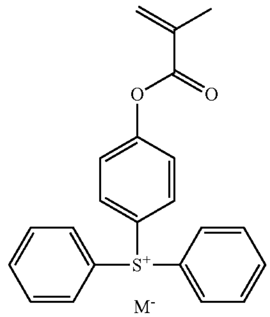
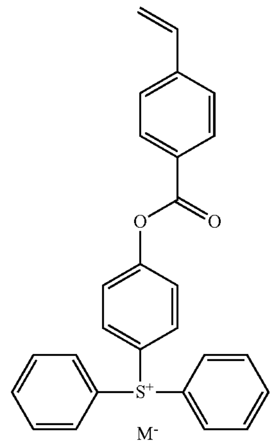
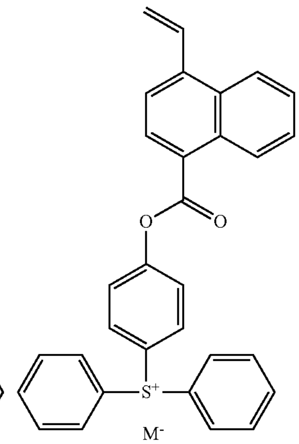
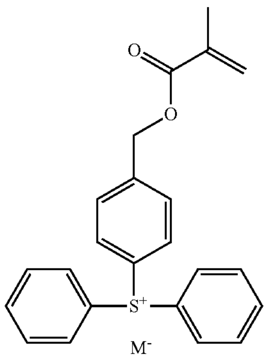
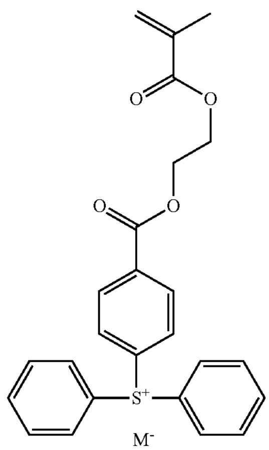
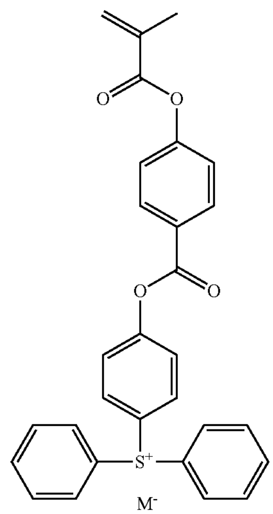
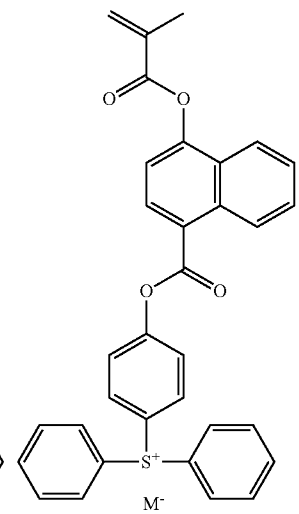
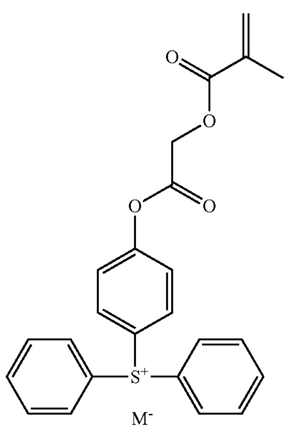
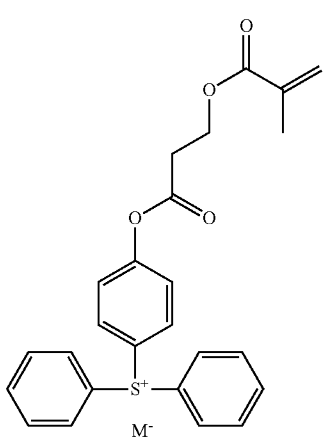
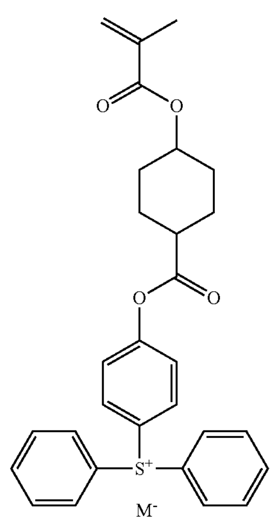
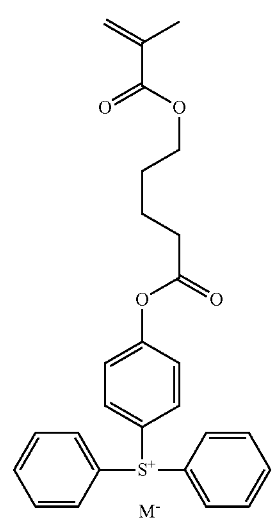

-continued
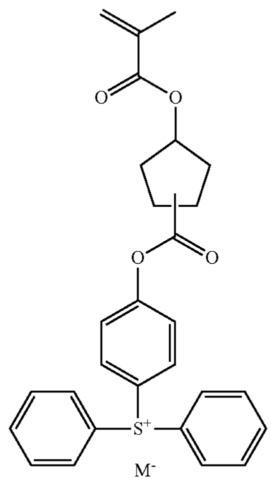
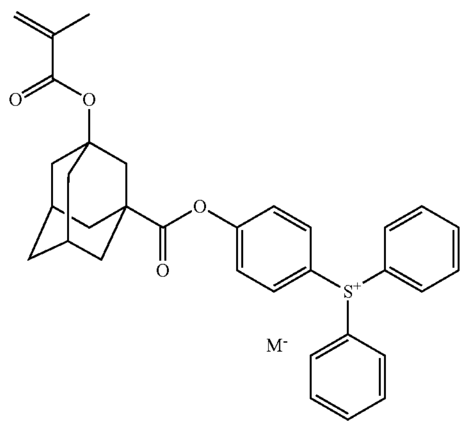
Examples of the monomer from which recurring units (g2) are derived are given below, but not limited thereto.
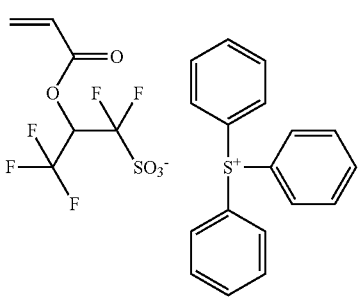
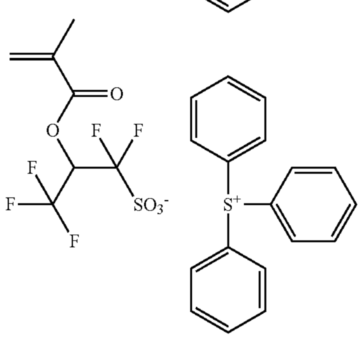
-continued
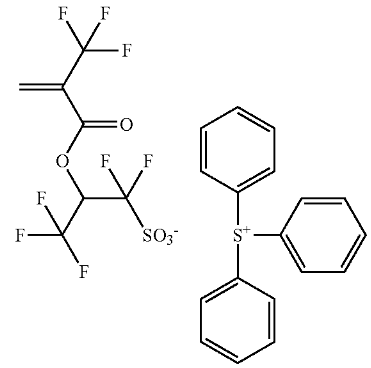
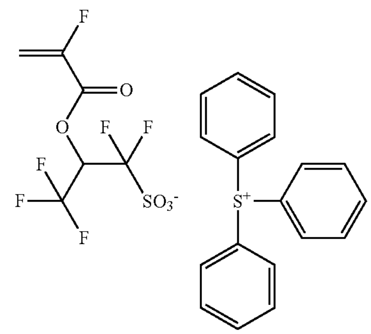
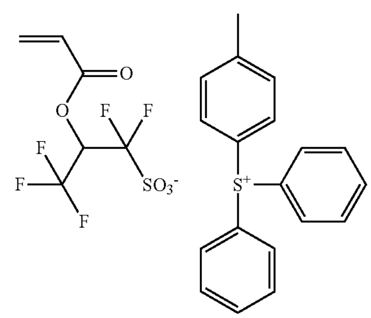
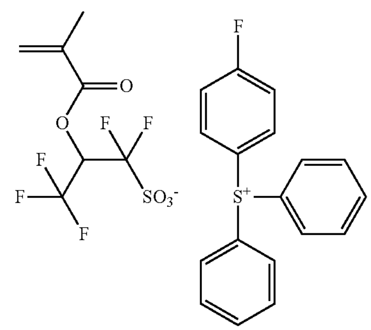
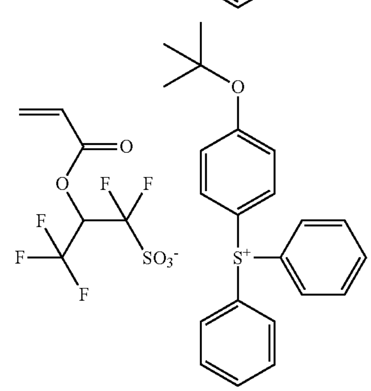

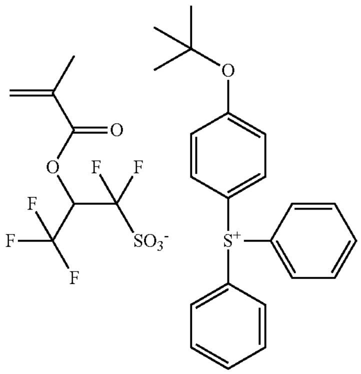
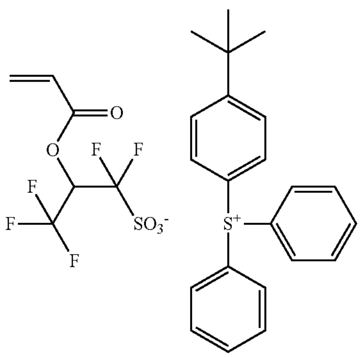
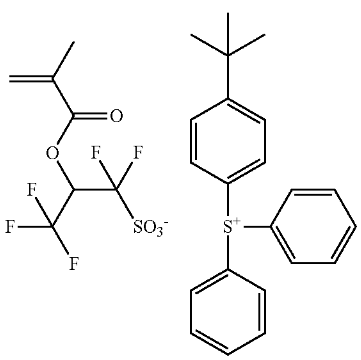
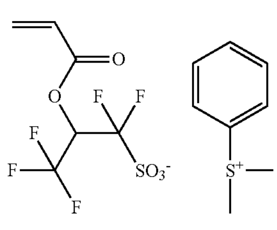
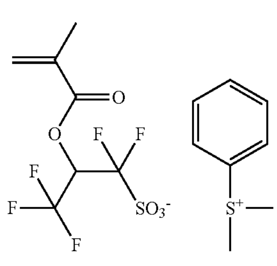
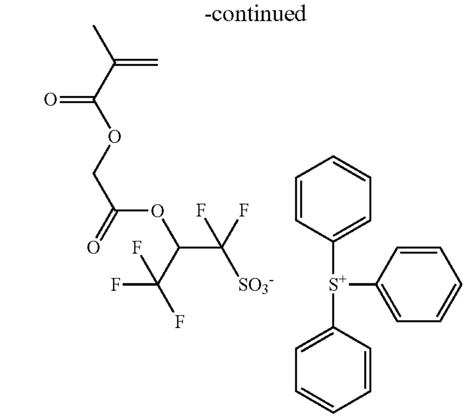
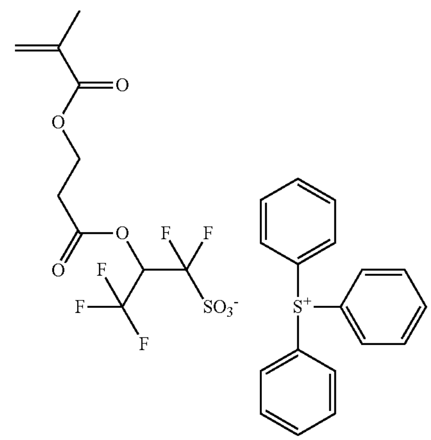
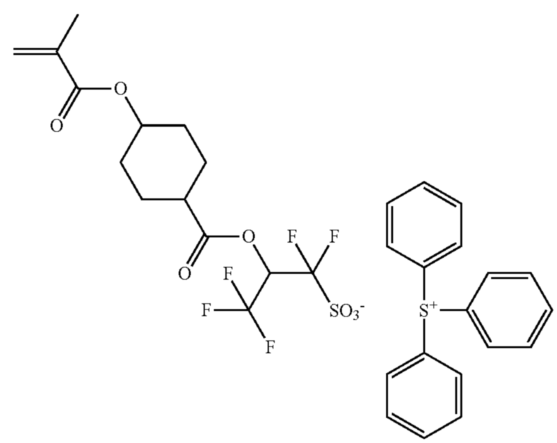
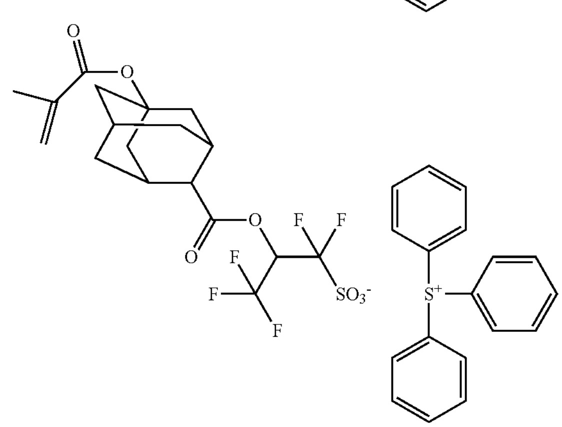

-continued
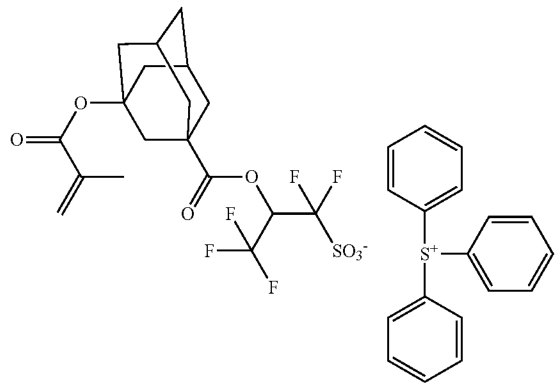
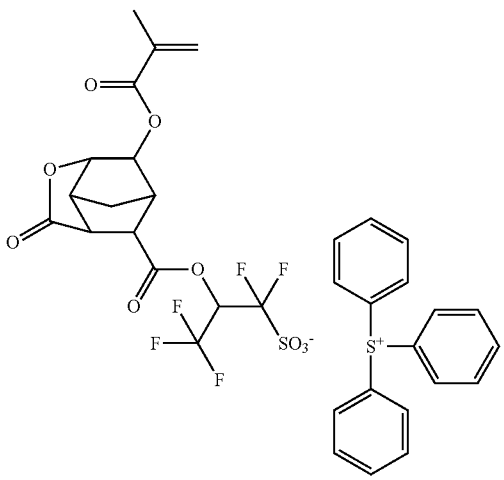
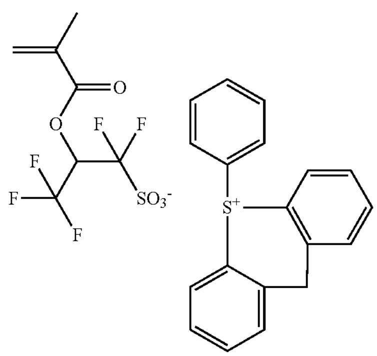
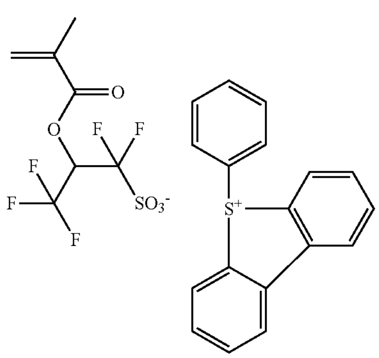
-continued
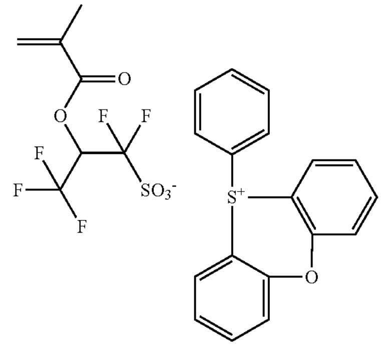
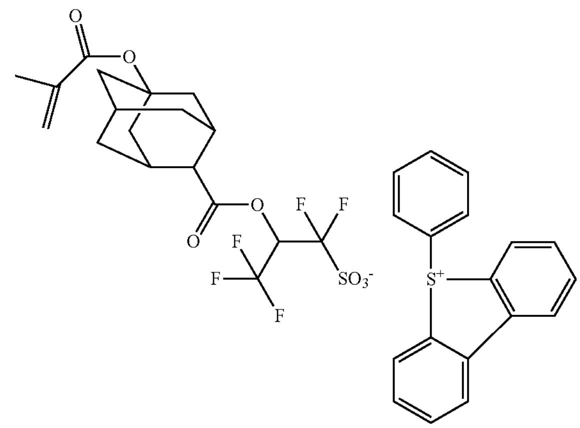
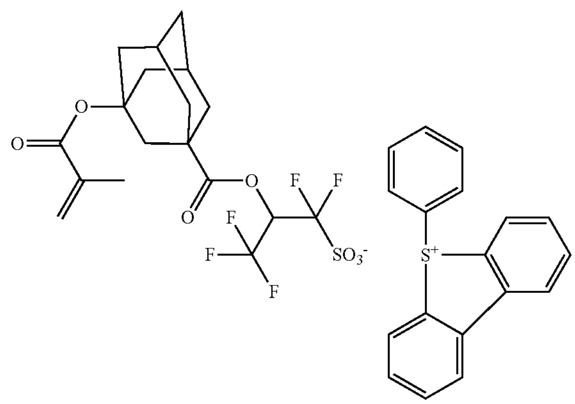
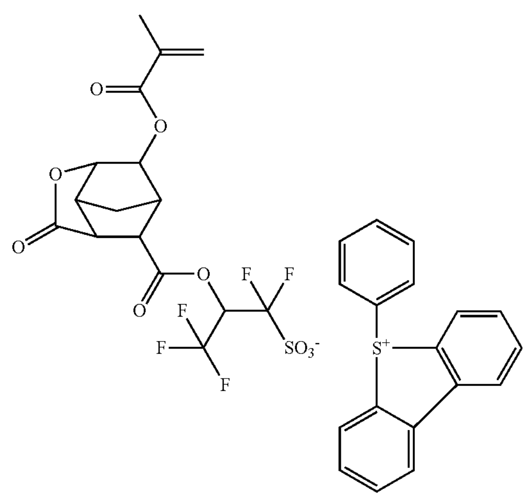

-continued
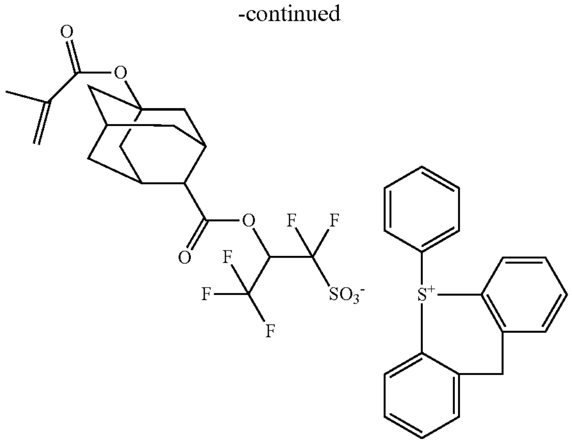
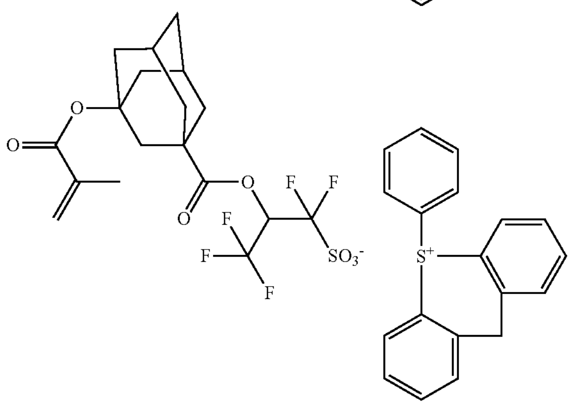
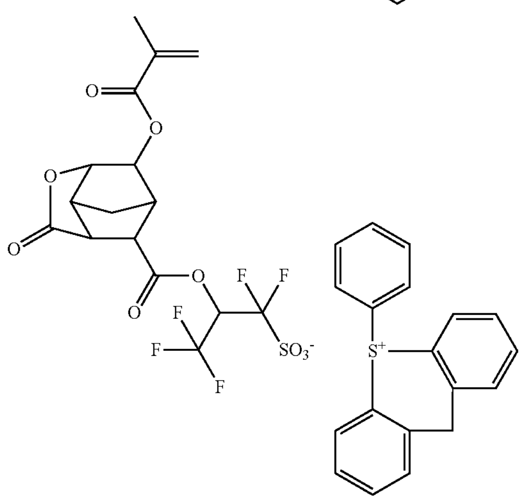
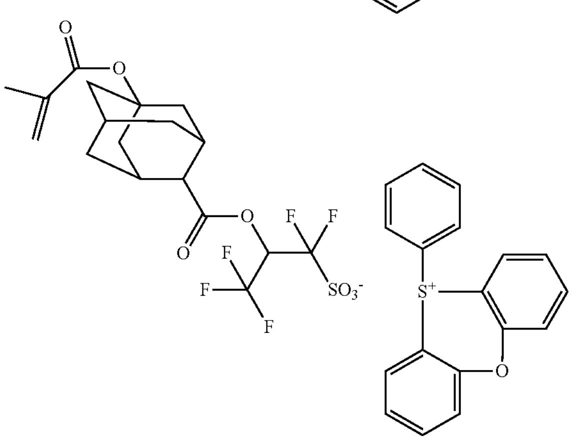
-continued
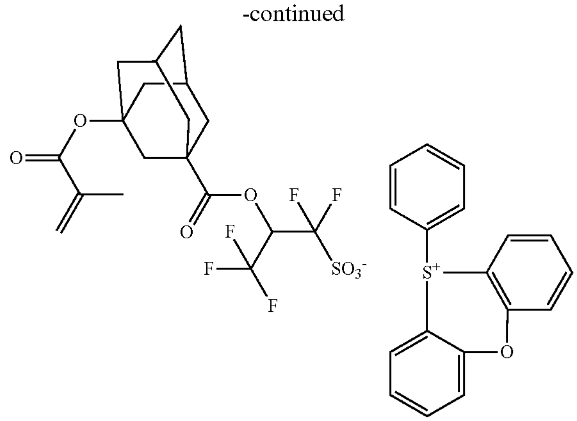
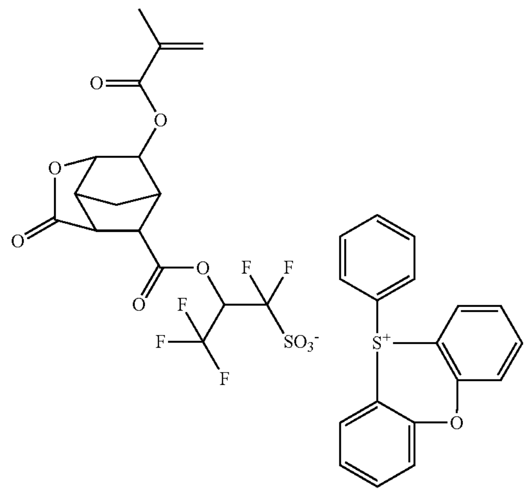
Examples of the monomer from which recurring units (g3) are derived are given below, but not limited thereto.
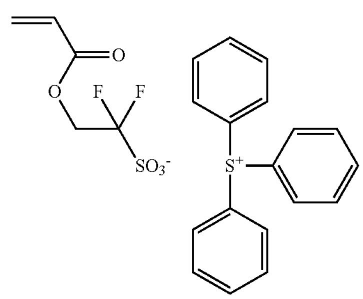
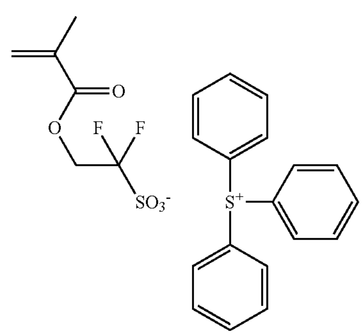

-continued
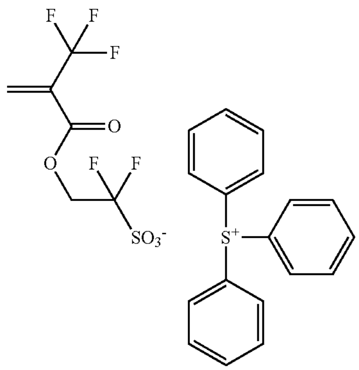
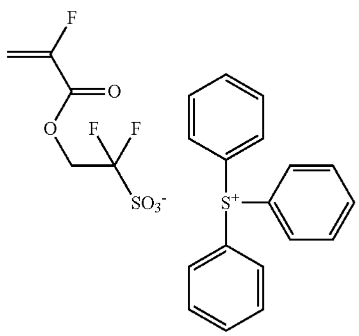
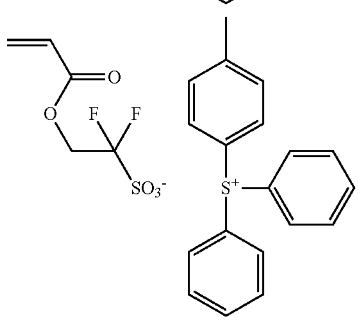
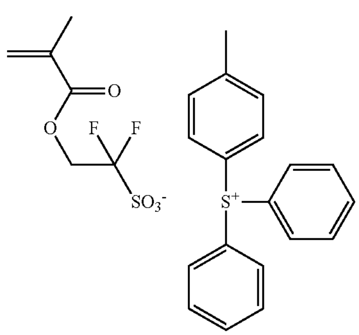
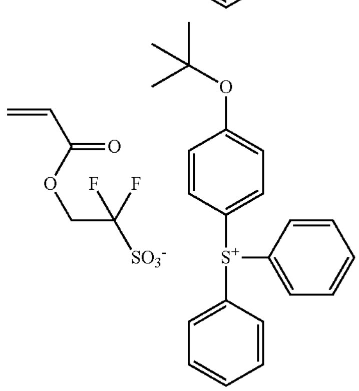
-continued
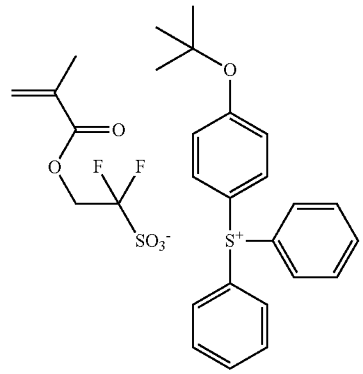
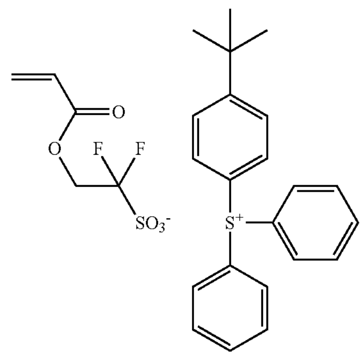
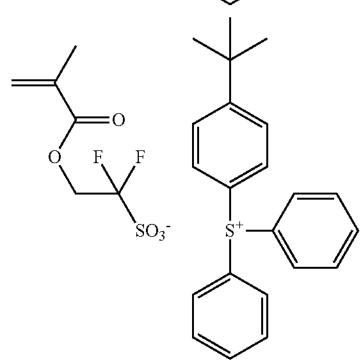
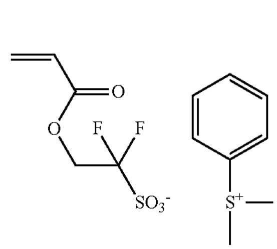
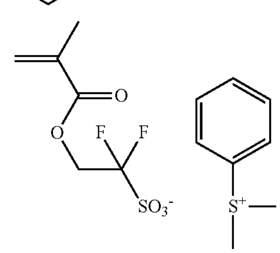
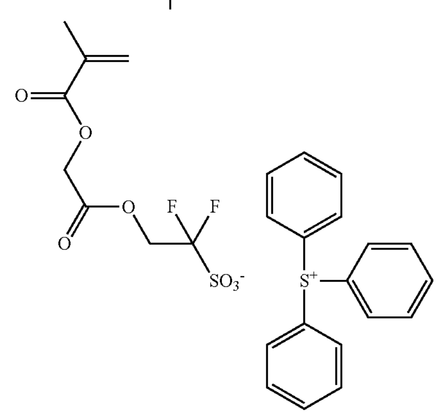

-continued
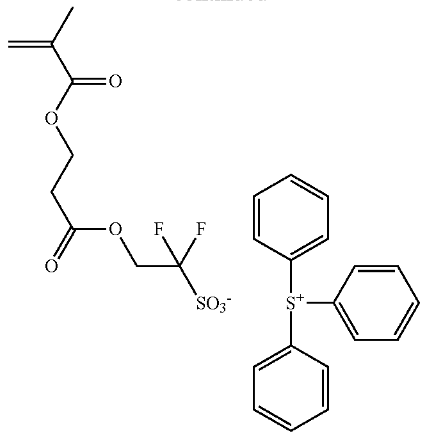
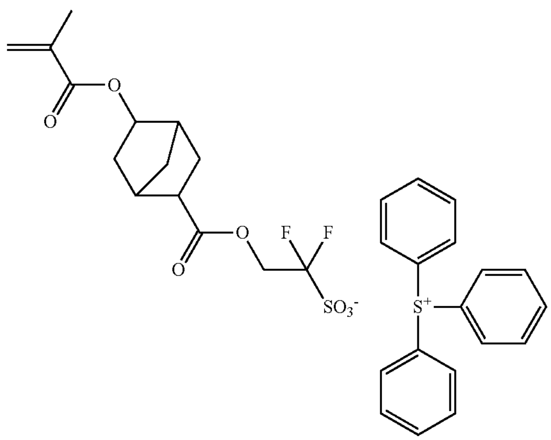
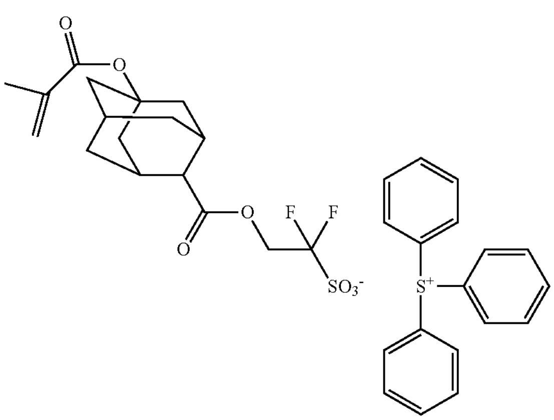
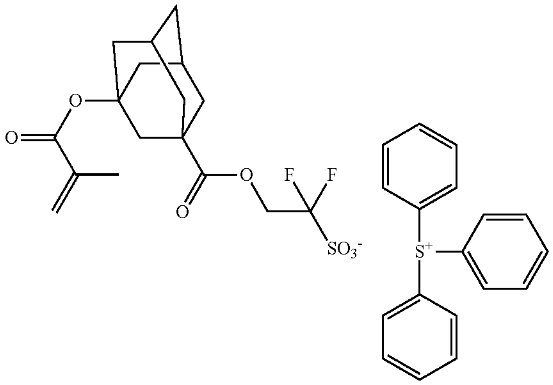
-continued
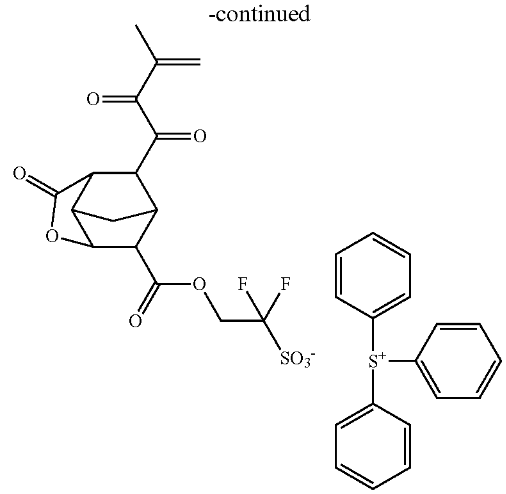
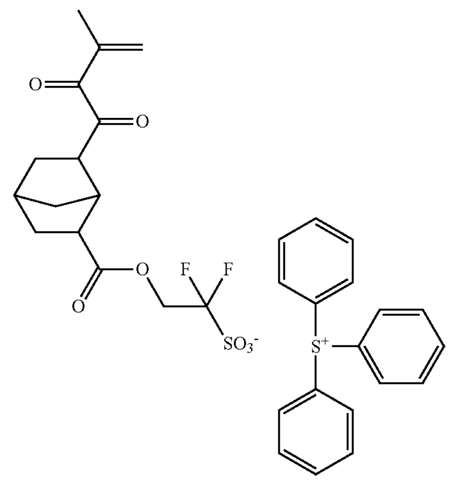
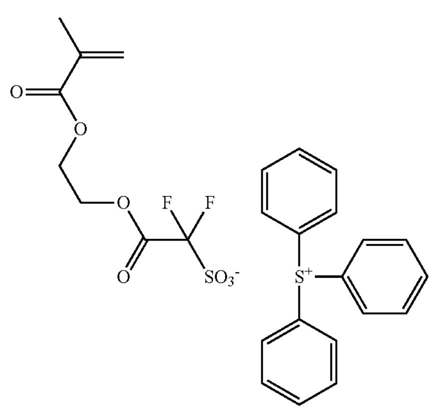
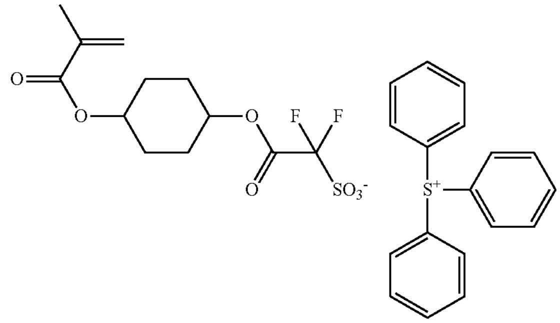

-continued
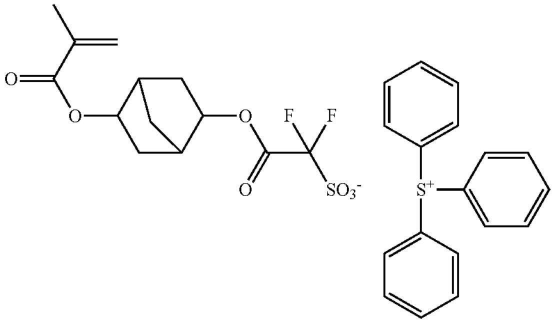
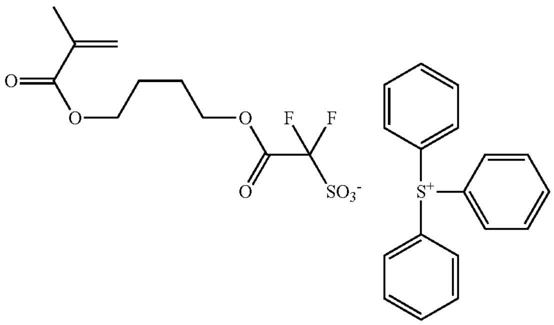
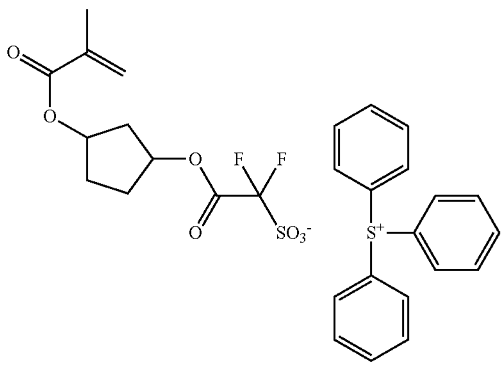
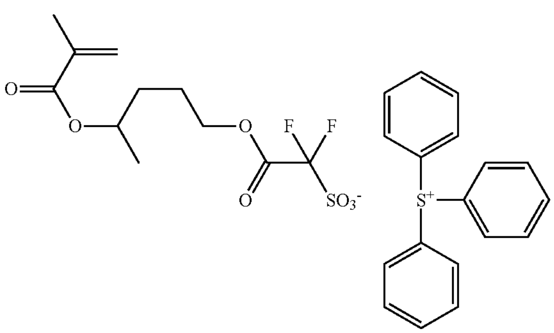
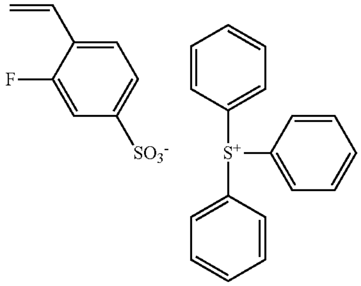
-continued
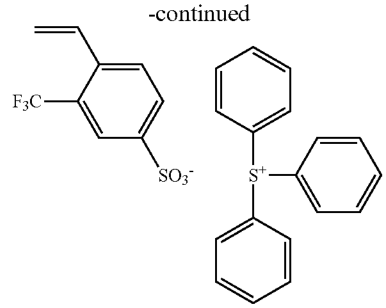
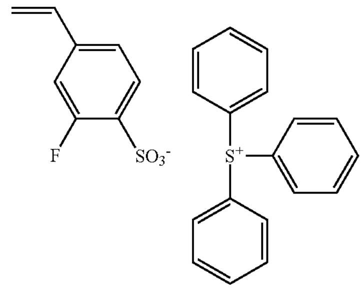
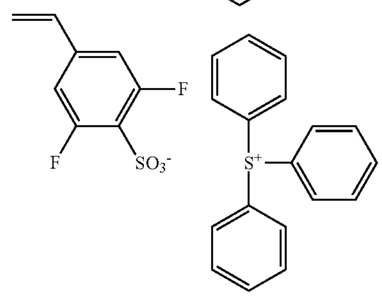
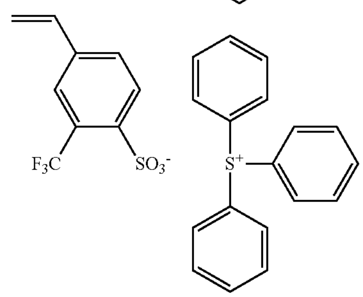
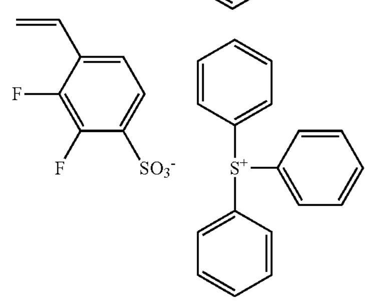
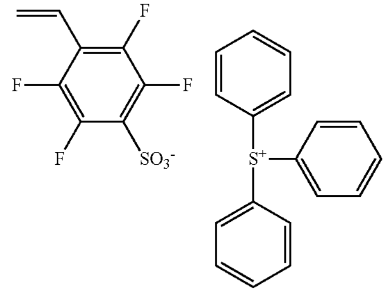

-continued

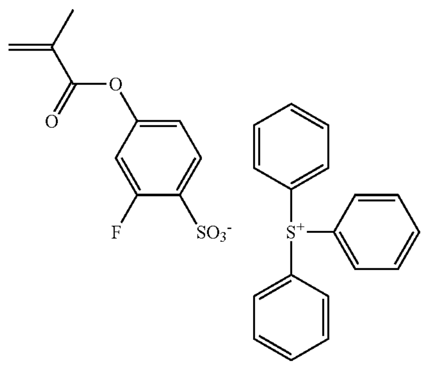

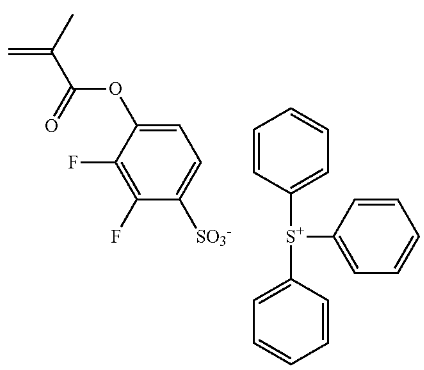

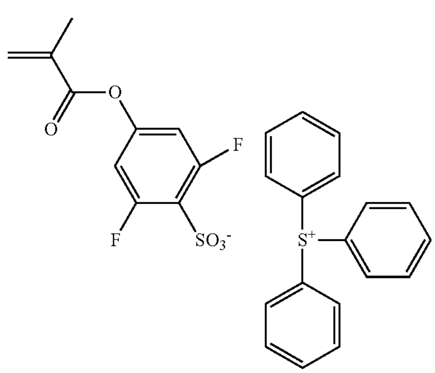

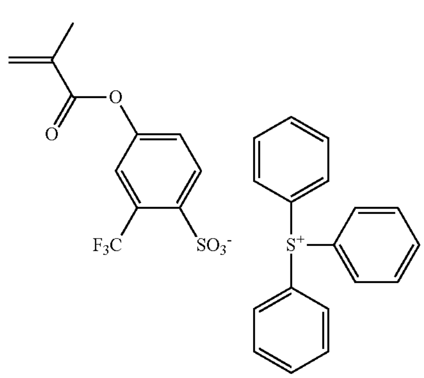

-continued

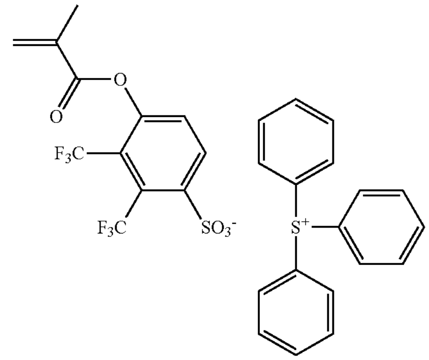

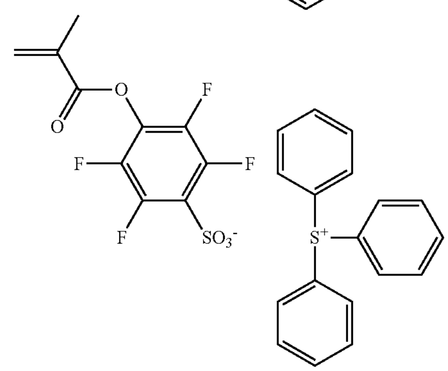

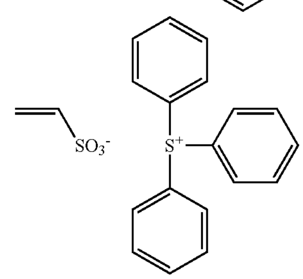

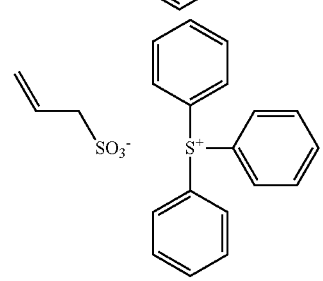

In the base resin, recurring units (d1), (d2), (e), (f), (g1), (g2) and (g3) are copolymerized in the following molar fraction: preferably $0 \le d1 < 1.0$, $0 \le d2 < 1.0$, $0.05 \le d1+d2 < 1.0$, $0 \le e < 1.0$, $0 \le f < 1.0$, $0 \le g1 < 1.0$, $0 \le g2 < 1.0$, $0 \le g3 < 1.0$, and $0 \le g1+g2+g3 < 1.0$; more preferably $0 \le d1 \le 0.8$, $0 \le d2 \le 0.8$, $0.05 \le d1+d2 \le 0.8$, $0 \le e \le 0.8$, $0 \le f \le 0.8$, $0 \le g1 \le 0.8$, $0 \le g2 \le 0.8$, $0 \le g3 \le 0.8$, and $0 \le g1+g2+g3 \le 0.8$.

The base resin may be synthesized by any desired methods, for example, by dissolving one or more monomers selected from the monomers to form recurring units (d1) and/or (d2) and optional recurring units (e), (f), (g1), (g2) and (g3) in an organic solvent, adding a radical polymerization initiator thereto, and effecting heat polymerization. The organic solvent and conditions for the polymerization reaction may be the same as described above for the polymerization of the fluorine-containing polymer.

The base resin should preferably have a weight average molecular weight (Mw) in the range of 1,000 to 500,000, and more preferably 2,000 to 30,000. When Mw≥1,000, the resist composition may be heat resistant. A polymer with a Mw of up to 500,000 may not lose alkaline solubility or give rise to a footing phenomenon after pattern formation.

If a base resin has a wide molecular weight distribution or dispersity (Mw/Mn), which indicates the presence of lower and higher molecular weight polymer fractions, there is a possibility that foreign matter is left on the pattern or the pattern profile is degraded. The influences of molecular weight and dispersity become stronger as the pattern rule becomes finer. Therefore, the base resin should preferably have a narrow dispersity (Mw/Mn) of 1.0 to 2.0, especially 1.0 to 1.5, in order to provide a resist composition suitable for micropatterning to a small feature size.

The base resin wherein the carboxyl or hydroxyl group in unit (d1) or (d2) is substituted with an acid labile group is used in positive tone resist compositions, whereas the base resin wherein the carboxyl or hydroxyl group in unit (d1) or (d2) is not substituted is used in negative tone resist compositions.

In the resist composition, preferably 0.1 to 15 parts by weight of the fluorine-containing polymer is added per 100 parts by weight of the base resin.

Acid Generator

The acid generator used herein preferably has the formula (12) or (13).

(12)

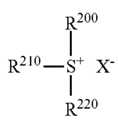

(13)

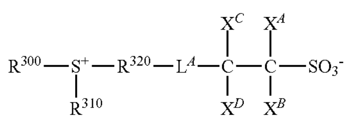

In formula (12), $R^{200}$, $R^{210}$ and $R^{220}$ are each independently a straight, branched or cyclic $C_1$-$C_{20}$ monovalent hydrocarbon group which may contain a heteroatom. Any two or more of $R^{200}$, $R^{210}$ and $R^{220}$ may bond together to form a ring with the sulfur atom to which they are attached. Examples of the sulfonium cation are the same as the above-described sulfonium cations.

In formula (12). $X^-$ is an anion of the following formula (12A), (12B), (12C) or (12D).

$$R^{fa}-CF_2-SO_3^- \quad (12A)$$

(12B)

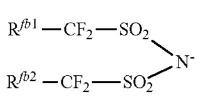

(12C)

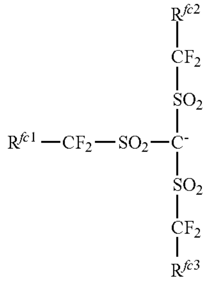

-continued (12D)

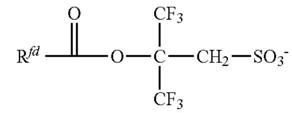

In formula (12A), $R^{fa}$ is fluorine or a straight, branched or cyclic $C_1$-$C_{40}$ monovalent hydrocarbon group which may contain a heteroatom.

Of the anions of formula (12A), an anion having the formula (12A') is preferred.

(12A')

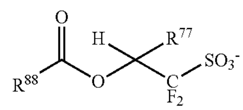

In formula (12A'), $R^{77}$ is hydrogen or trifluoromethyl, preferably trifluoromethyl. $R^{88}$ is a straight, branched or cyclic $C_1$-$C_{35}$ monovalent hydrocarbon group which may contain a heteroatom. As the heteroatom, oxygen, nitrogen, sulfur and halogen atoms are preferred, with oxygen being most preferred. Of the monovalent hydrocarbon groups represented by $R^{88}$, those groups of 6 to 30 carbon atoms are preferred from the aspect of achieving a high resolution in forming patterns of fine feature size. Suitable monovalent hydrocarbon groups include, but are not limited to, methyl, ethyl, propyl, isopropyl, butyl, isobutyl, s-butyl, t-butyl, pentyl, neopentyl, cyclopentyl, hexyl, cyclohexyl, 3-cyclohexenyl, heptyl, 2-ethylhexyl, nonyl, undecyl, tridecyl, pentadecyl, heptadecyl, 1-adamantyl, 2-adamantyl, 1-adamantylmethyl, norbornyl, norbornylmethyl, tricyclodecanyl, tetracyclododecanyl, tetracyclododecanylmethyl, dicyclohexylmethyl, eicosanyl, allyl, benzyl, diphenylmethyl, tetrahydrofuryl, methoxymethyl, ethoxymethyl, methylthiomethyl, acetamidomethyl, trifluoromethyl, (2-methoxyethoxy)methyl, acetoxymethyl, 2-carboxy-1-cyclohexyl, 2-oxopropyl, 4-oxo-1-adamantyl, and 3-oxocyclohexyl. In these groups, one or more hydrogen atoms may be substituted by a moiety containing a heteroatom such as oxygen, sulfur, nitrogen or halogen, or a moiety containing a heteroatom such as oxygen, sulfur or nitrogen may intervene between carbon atoms, so that the group may contain a hydroxyl, cyano, carbonyl, ether bond, ester bond, sulfonic acid ester bond, carbonate bond, lactone ring, sultone ring, carboxylic anhydride or haloalkyl moiety.

With respect to the synthesis of the sulfonium salt having an anion of formula (12A'), reference may be made to JP-A 2007-145797, JP-A 2008-106045, JP-A 2009-007327, and JP-A 2009-258695. Also useful are the sulfonium salts described in JP-A 2010-215608, JP-A 2012-041320, JP-A 2012-106986, and JP-A 2012-153644.

Examples of the sulfonium salt having an anion of formula (1A) are shown below, but not limited thereto.

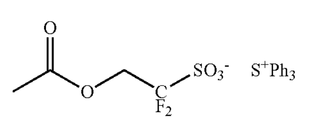

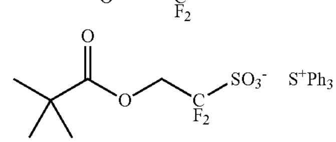

-continued
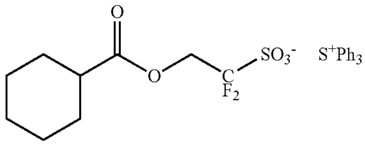
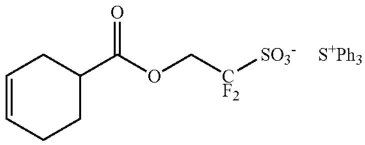
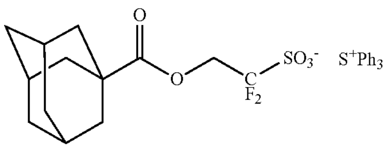
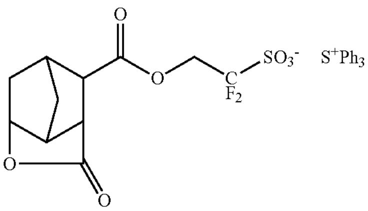
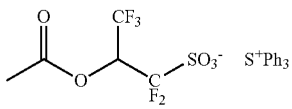
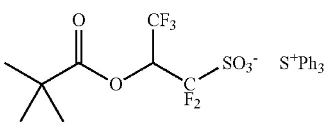
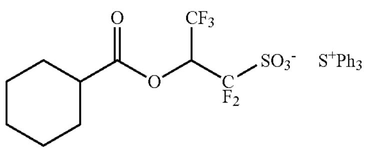
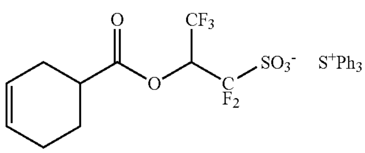
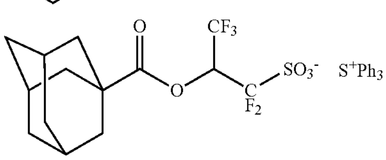
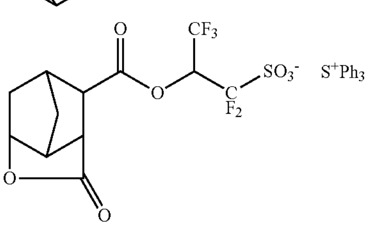
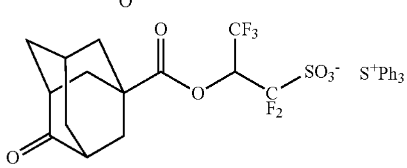
-continued
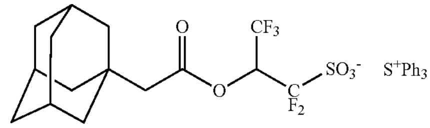
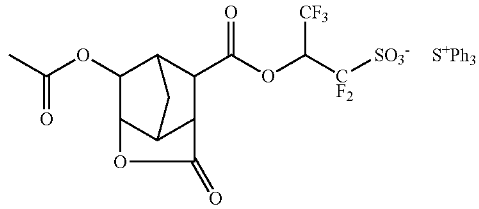
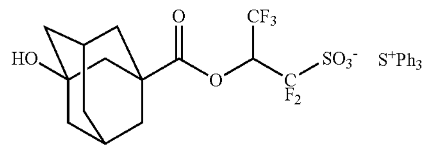
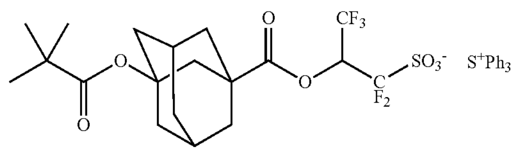
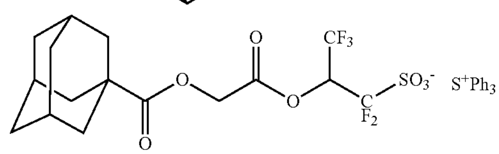
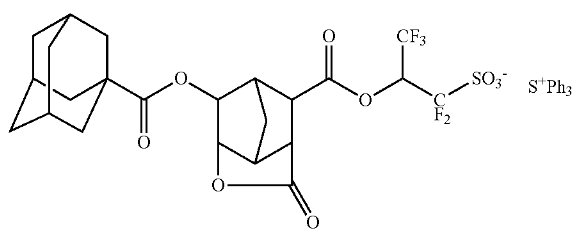
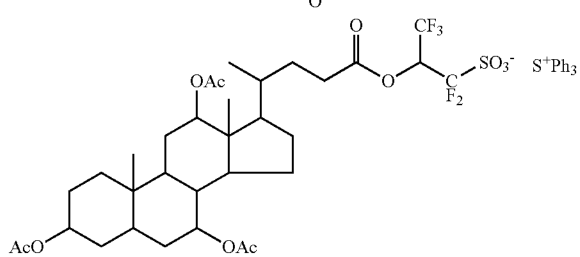
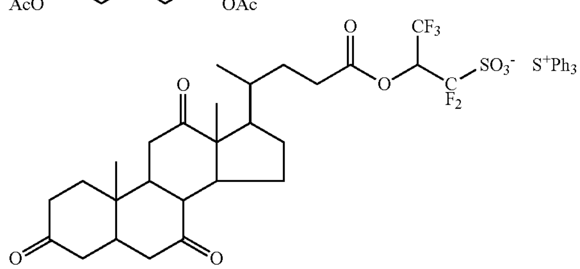
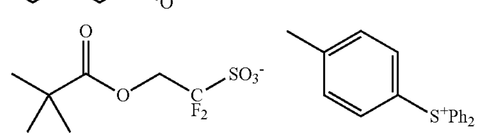

-continued
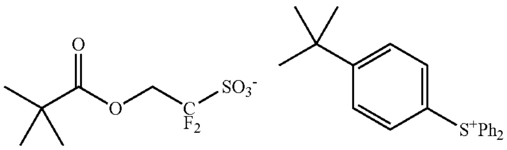
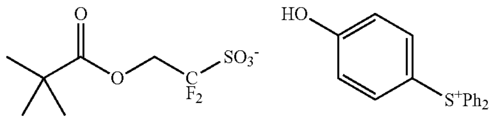
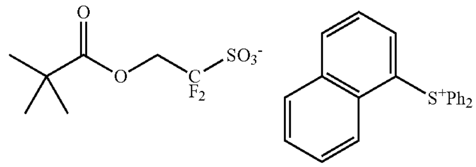
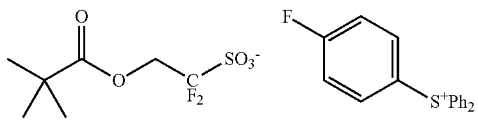
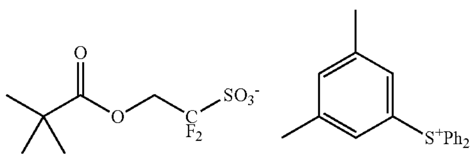
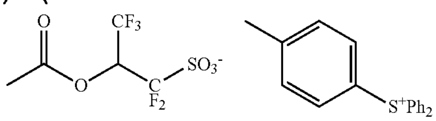
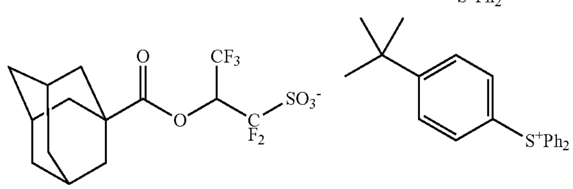
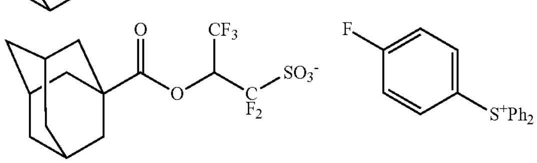
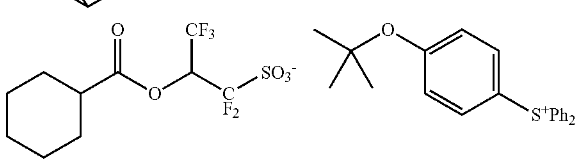
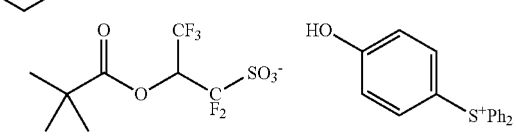
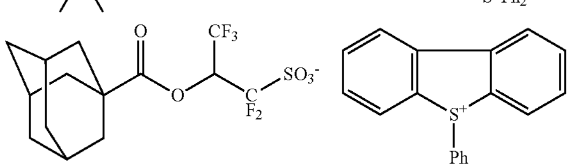
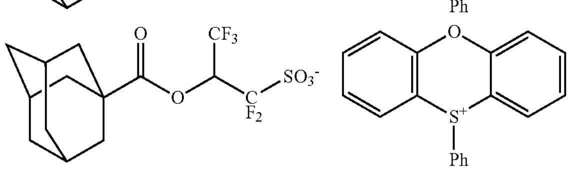
-continued
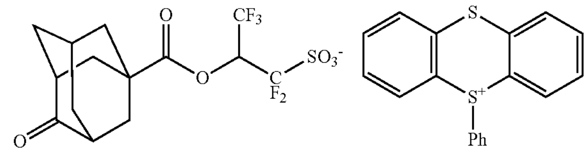
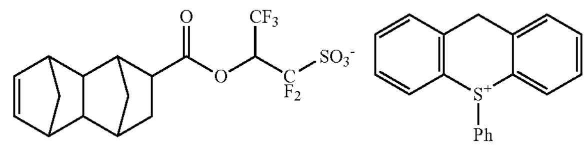
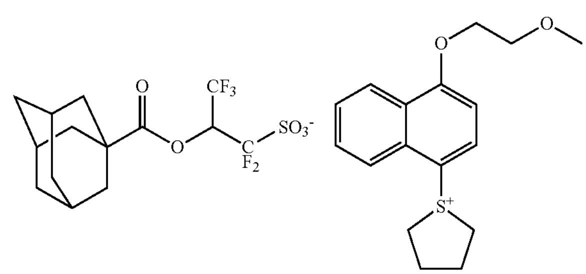
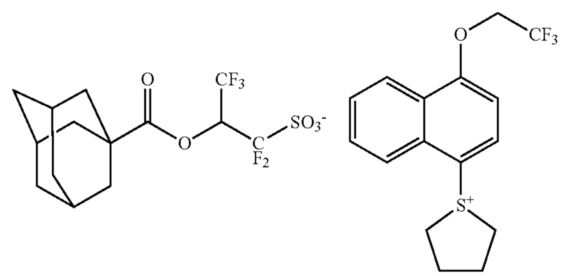
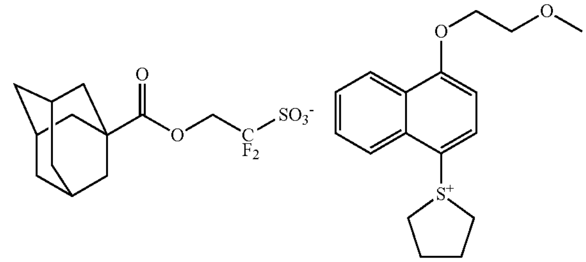
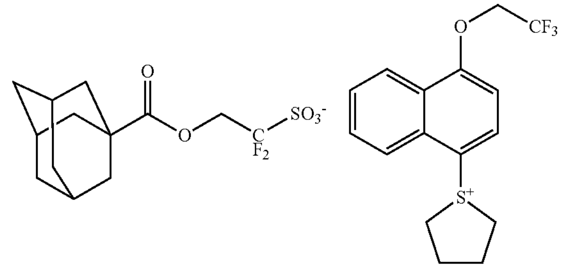
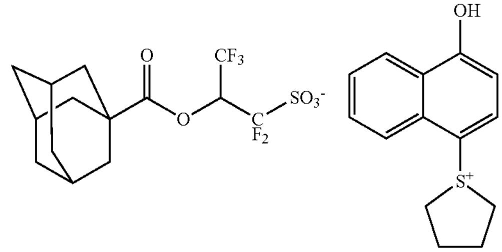

-continued

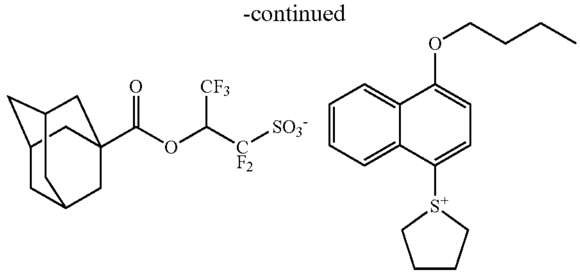

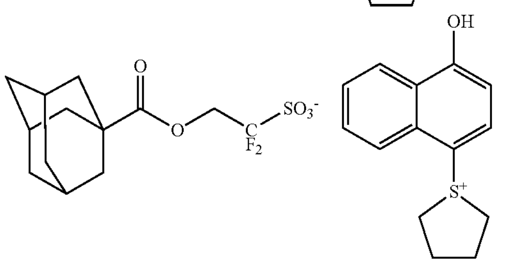

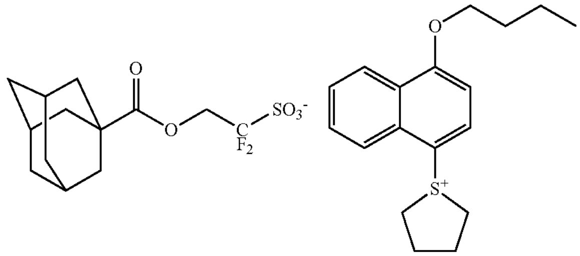

In formula (12B), $R^{fb1}$ and $R^{fb2}$ are each independently fluorine or a straight, branched or cyclic $C_1$-$C_{40}$ monovalent hydrocarbon group which may contain a heteroatom. Illustrative examples of the monovalent hydrocarbon group are as exemplified for $R^{88}$. Preferably $R^{fb1}$ and $R^{fb2}$ are fluorine or $C_1$-$C_4$ straight fluorinated alkyl groups. Also, $R^{fb1}$ and $R^{fb2}$ may bond together to form a ring with the linkage: —$CF_2$—SO—$N^-$—$SO_2$—$CF_2$— to which they are attached. It is preferred to form a ring structure via a fluorinated ethylene or fluorinated propylene group.

In formula (12C), $R^{fc1}$, $R^{fc2}$ and $R^{fc3}$ are each independently fluorine or a straight, branched or cyclic $C_1$-$C_{40}$ monovalent hydrocarbon group which may contain a heteroatom. Illustrative examples of the monovalent hydrocarbon group are as exemplified for $R^{88}$. Preferably $R^{fc1}$, $R^{fc2}$ and $R^{fc3}$ are fluorine or $C_1$-$C_4$ straight fluorinated alkyl groups. Also, $R^{fc1}$ and $R^{fc2}$ may bond together to form a ring with the linkage: —$CF_2$—$SO_2$—$C^-$—$SO_2$—$CF_2$— to which they are attached. It is preferred to form a ring structure via a fluorinated ethylene or fluorinated propylene group.

In formula (12D). $R^{fd}$ is a straight, branched or cyclic $C_1$-$C_{40}$ monovalent hydrocarbon group which may contain a heteroatom. Illustrative examples of the monovalent hydrocarbon group are as exemplified for $R^{88}$.

With respect to the synthesis of the sulfonium salt having an anion of formula (12D), reference may be made to JP-A 2010-215608 and JP-A 2014-133723.

Examples of the sulfonium salt having an anion of formula (12D) are shown below, but not limited thereto.

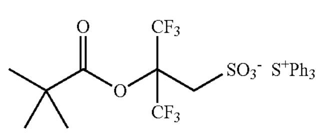

-continued

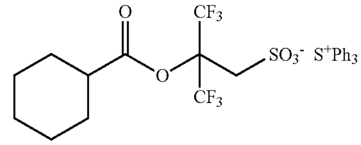

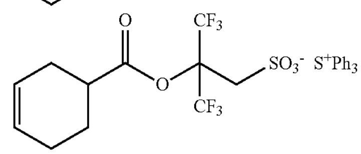

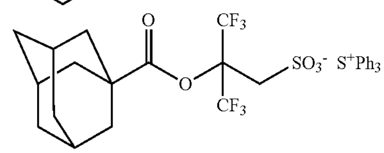

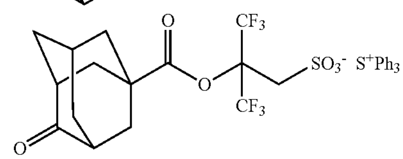

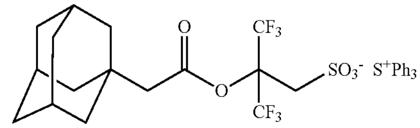

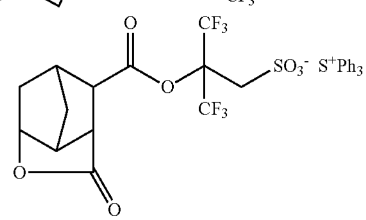

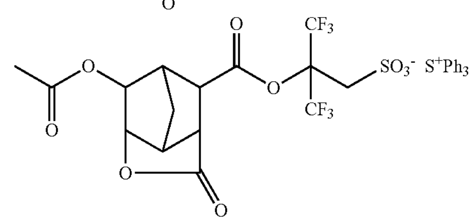

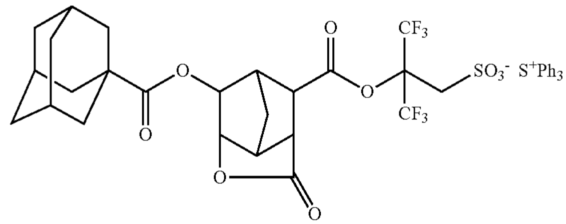

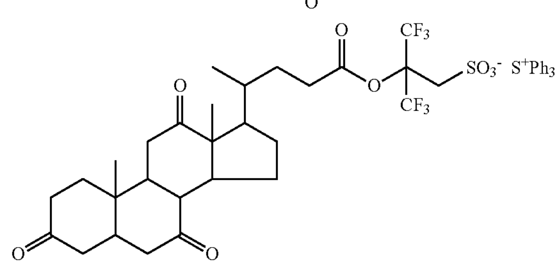

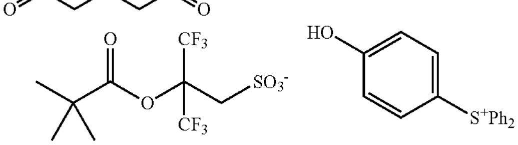

-continued

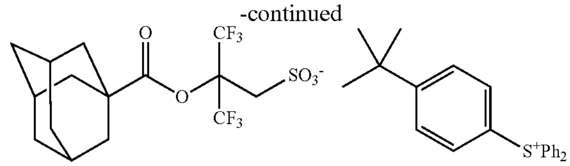

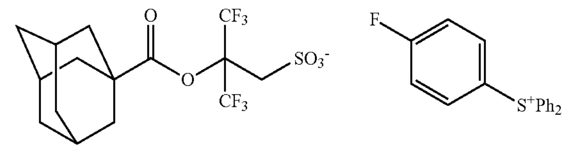

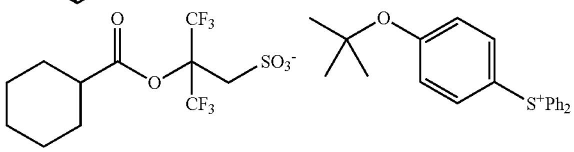

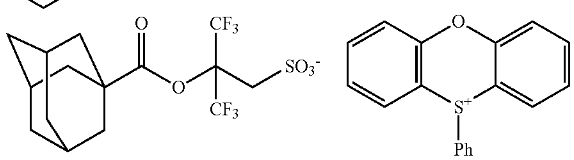

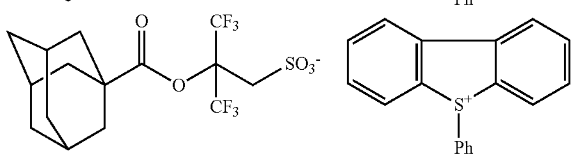

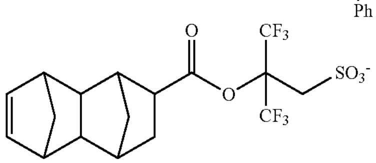

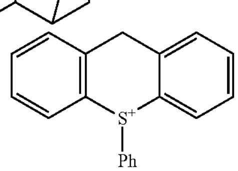

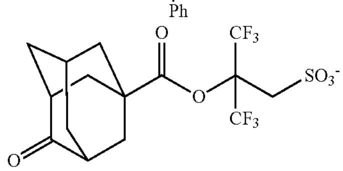

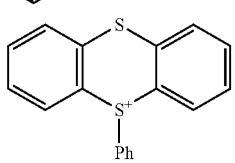

Notably, the compound having the anion of formula (12D) does not have fluorine at the α-position relative to the sulfo group, but two trifluoromethyl groups at the β-position. For this reason, it has a sufficient acidity to sever the acid labile groups in the base resin. Thus the compound is an effective PAG.

In formula (13), $R^{300}$ and $R^{310}$ are each independently a straight, branched or cyclic $C_1$-$C_{30}$ monovalent hydrocarbon group which may contain a heteroatom. $R^{320}$ is a straight, branched or cyclic $C_1$-$C_{30}$ divalent hydrocarbon group which may contain a heteroatom. Any two or more of $R^{300}$, $R^{310}$ and $R^{320}$ may bond together to form a ring with the sulfur atom to which they are attached. $L^A$ is a single bond or a straight, branched or cyclic $C_1$-$C_{20}$ divalent hydrocarbon group which may contain a heteroatom. $X^A$, $X^B$, $X^C$ and $X^D$ are each independently hydrogen, fluorine or trifluoromethyl, with the proviso that at least one of $X^A$, $X^B$, $X^C$ and $X^D$ is fluorine or trifluoromethyl.

Examples of the monovalent hydrocarbon group are as exemplified above for R.

Suitable divalent hydrocarbon groups include straight alkane-diyl groups such as methylene, ethylene, propane-1,3-diyl, butane-1,4-diyl, pentane-1,5-diyl, hexane-1,6-diyl, heptane-1,7-diyl, octane-1,8-diyl, nonane-1,9-diyl, decane-1,10-diyl, undecane-1,11-diyl, dodecane-1,12-diyl, tridecane-1,13-diyl, tetradecane-1,14-diyl, pentadecane-1,15-diyl, hexadecane-1,16-diyl, and heptadecane-1,17-diyl; saturated cyclic divalent hydrocarbon groups such as cyclopentanediyl, cyolohexanediyl, norbornanediyl and adamantanediyl; and unsaturated cyclic divalent hydrocarbon groups such as phenylene and naphthylene. In these groups, one or more hydrogen atom may be replaced by an alkyl radical such as methyl, ethyl, propyl, n-butyl or t-butyl; one or more hydrogen atom may be replaced by a moiety containing a heteroatom such as oxygen, sulfur, nitrogen or halogen; or a moiety containing a heteroatom such as oxygen, sulfur or nitrogen may intervene between carbon atoms, so that the group may contain a hydroxyl, cyano, carbonyl, ether bond, ester bond, sulfonic acid ester bond, carbonate bond, lactone ring, sultone ring, carboxylic anhydride or haloalkyl moiety.

Of the PAGs having formula (13), one having formula (13') is preferred.

(13')

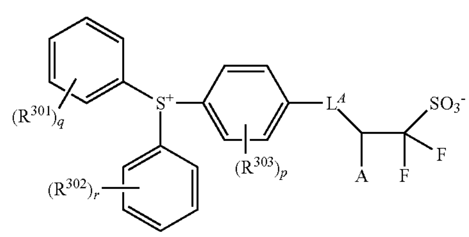

In formula (13'), $L^A$ is as defined above. A is hydrogen or trifluoromethyl, preferably trifluoromethyl. $R^{301}$, $R^{302}$ and $R^{303}$ are each independently hydrogen or a straight, branched its or cyclic $C_1$-$C_{20}$ monovalent hydrocarbon group which may contain a heteroatom. Suitable monovalent hydrocarbon groups are as described above for $R^{55}$. The subscripts q and r are each independently an integer of 0 to 5, and p is an integer of 0 to 4.

Examples of the PAG having formula (13) are shown below, but not limited thereto. Notably, A is as defined above.

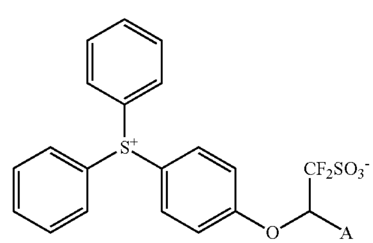

-continued
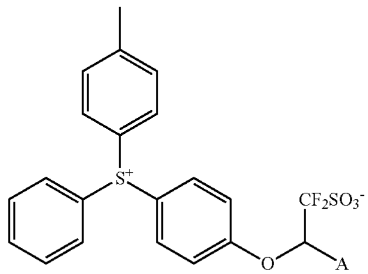
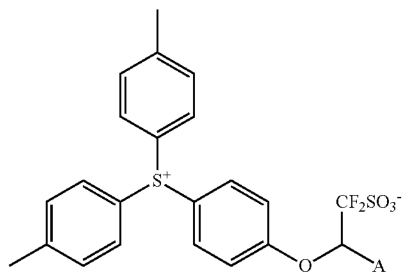
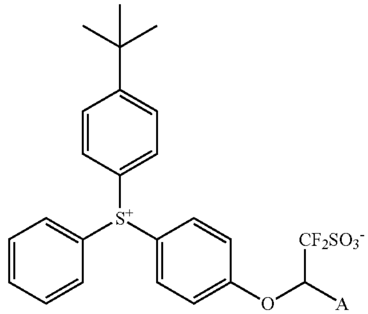
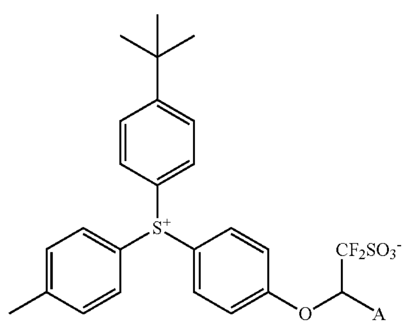
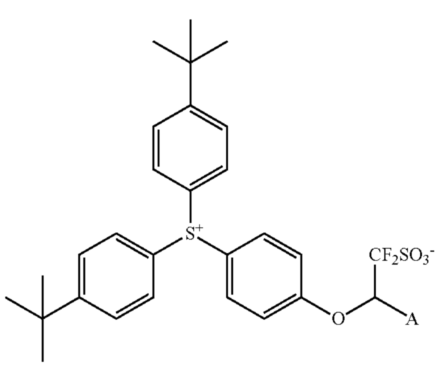
-continued
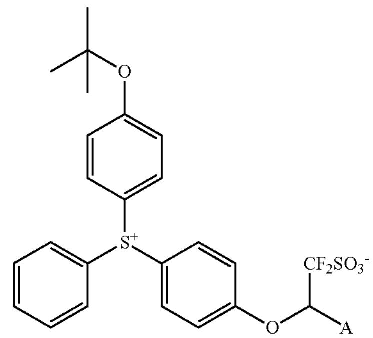
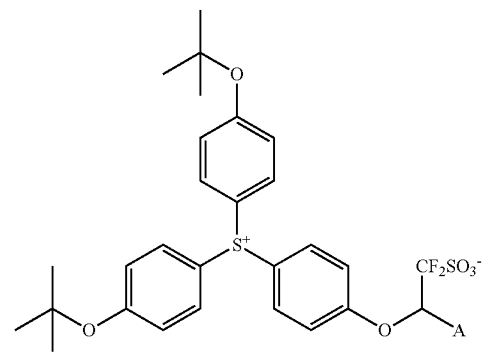
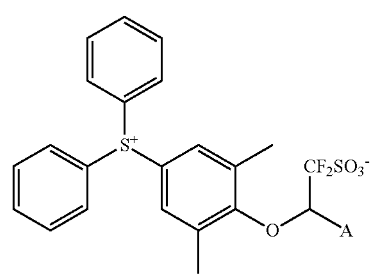
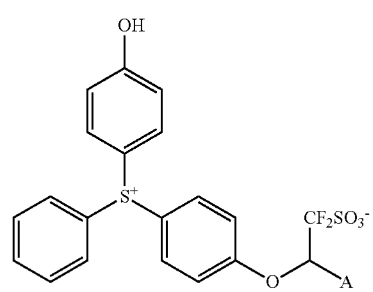
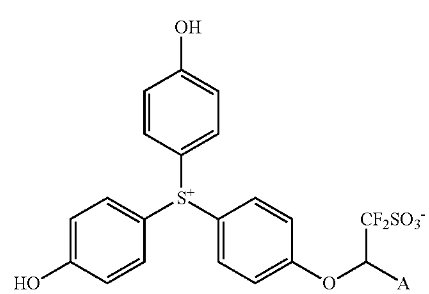

-continued
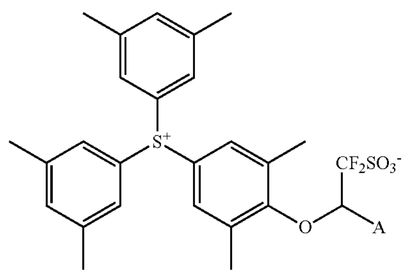
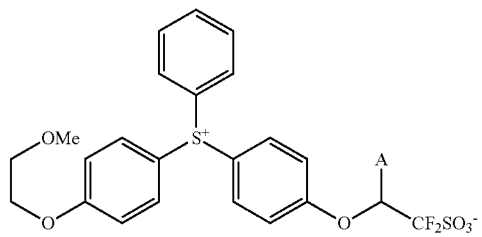
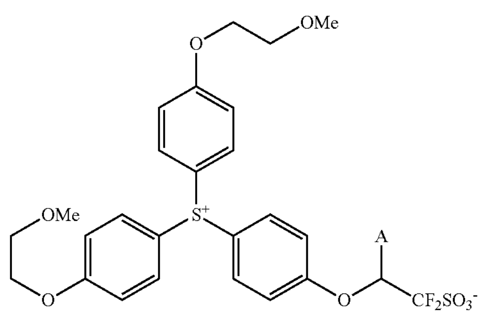
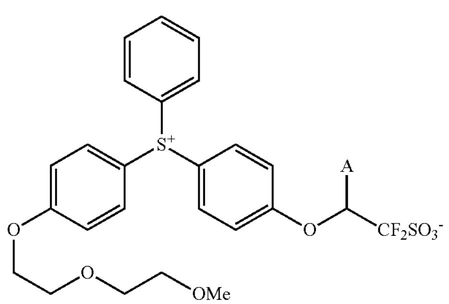
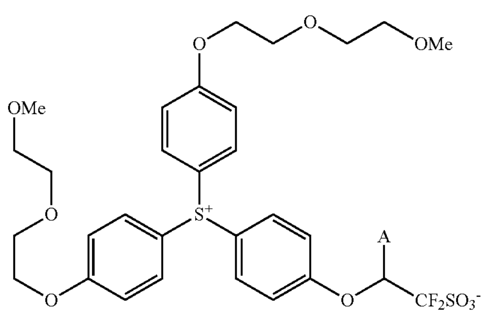
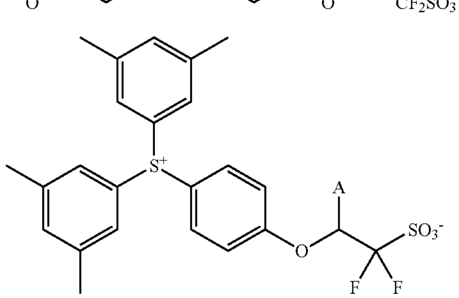
-continued
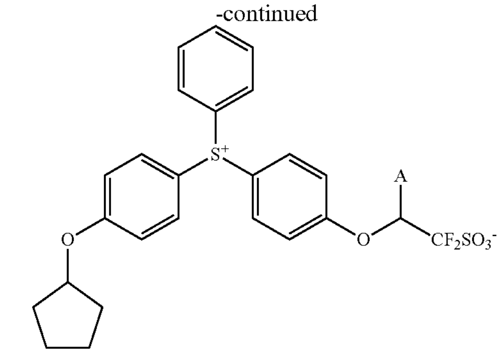
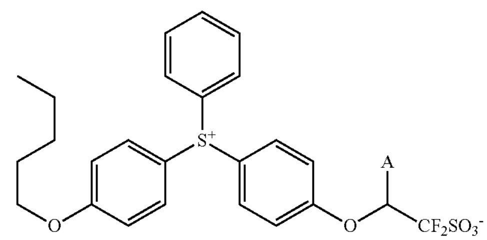
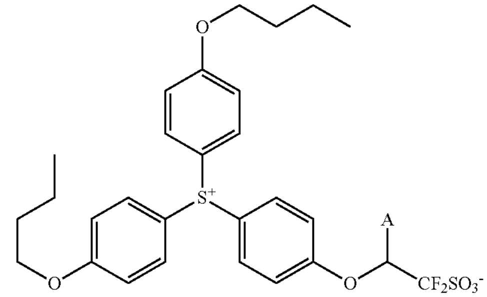
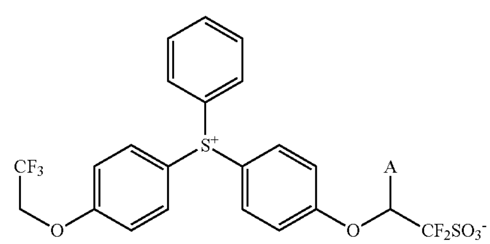
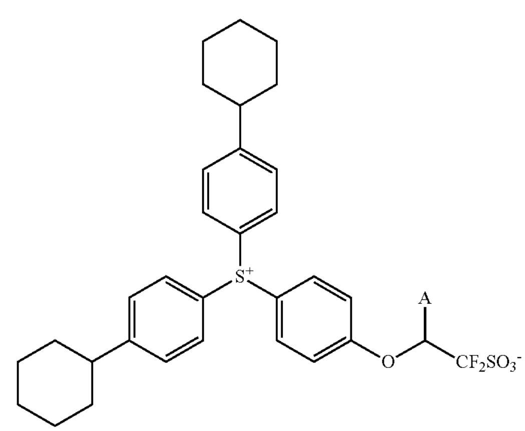

-continued
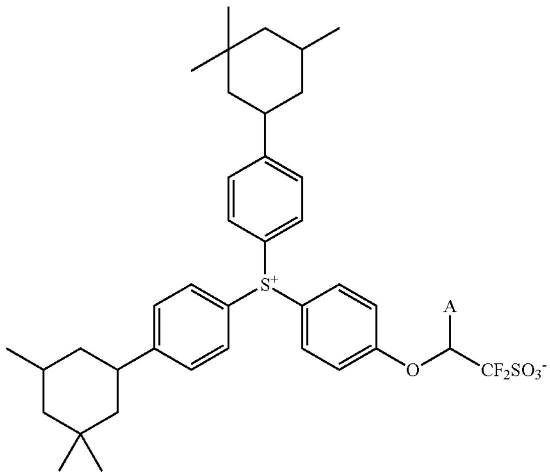
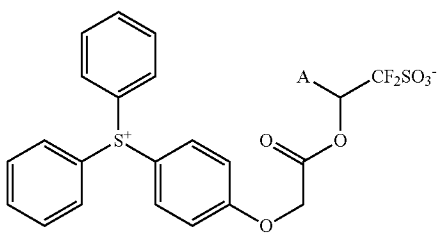
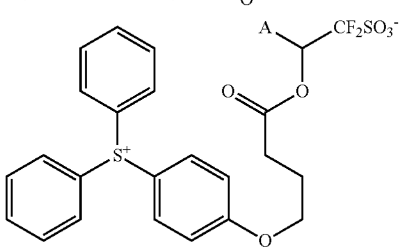
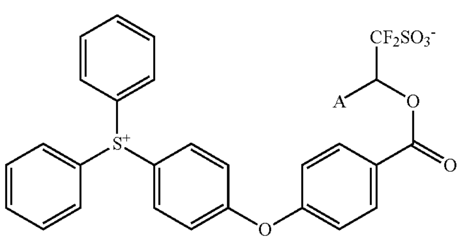
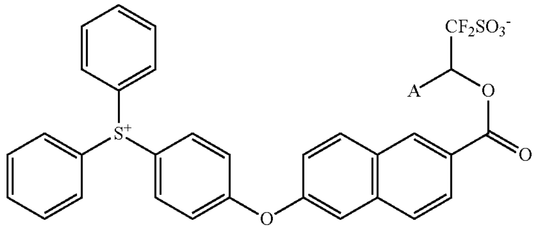
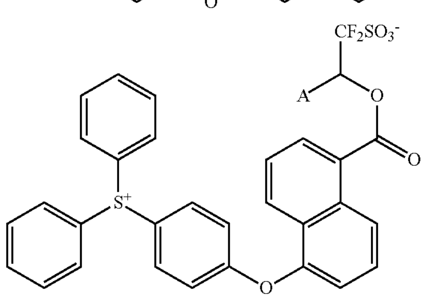
-continued
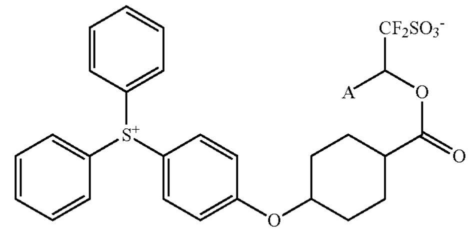
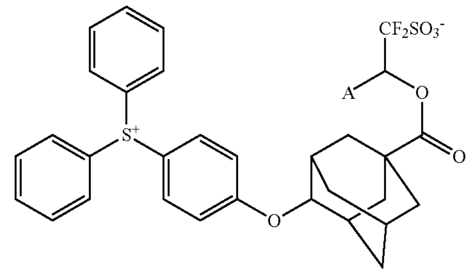
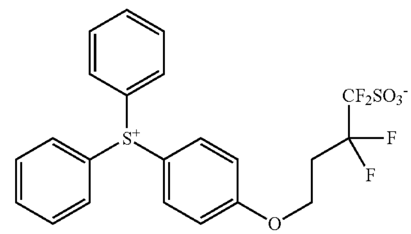
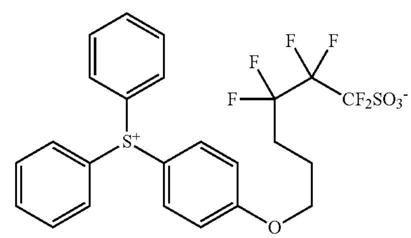
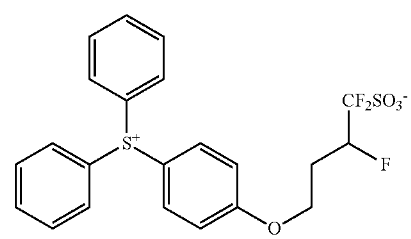
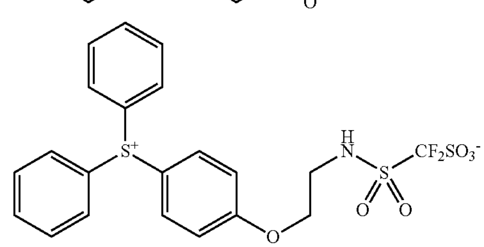
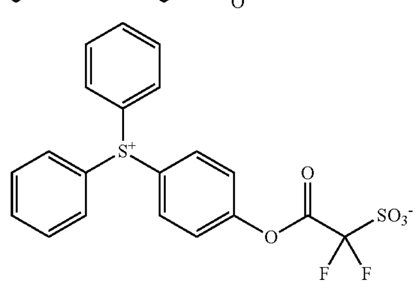

-continued

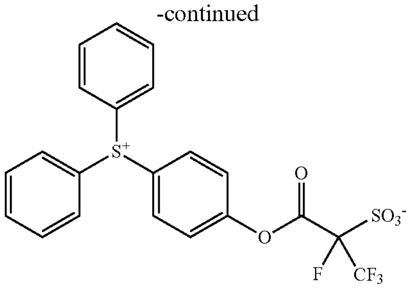

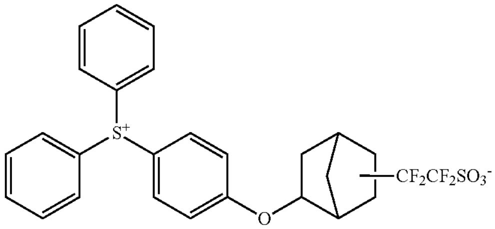

Of the foregoing PAGs, those having an anion of formula (12A') or (12D) are especially preferred because of reduced acid diffusion and high solubility in the resist solvent. Also those having an anion of formula (13') are especially preferred because of extremely reduced acid diffusion.

The acid generator is preferably added in an amount of 0 to 40 parts, more preferably 0.1 to 40 parts, and even more preferably 0.1 to 20 parts by weight per 100 parts by weight of the base resin. This range ensures satisfactory resolution and no risk of foreign particles being formed on the resist film after development or during stripping.

Organic Solvent

The organic solvent used herein may be any organic solvent in which resist components are soluble. Examples of the organic solvent include ketones such as cyclohexanone and methyl-2-n-pentyl ketone; alcohols such as 3-methoxybutanol, 3-methyl-3-methoxybutanol, 1-methoxy-2-propanol, and 1-ethoxy-2-propanol; ethers such as propylene glycol monomethyl ether, ethylene glycol monomethyl ether, propylene glycol monoethyl ether, ethylene glycol monoethyl ether, propylene glycol dimethyl ether, and diethylene glycol dimethyl ether; esters such as propylene glycol monomethyl ether acetate (PGMEA), propylene glycol monoethyl ether acetate, ethyl lactate, ethyl pyruvate, butyl acetate, methyl 3-methoxypropionate, ethyl 3-ethoxypropionate, t-butyl acetate, t-butyl propionate, and propylene glycol mono-t-butyl ether acetate; and lactones such as γ-butyrolactone, and mixtures thereof, as described in U.S. Pat. No. 7,537,880 (JP-A 2008-111103, paragraphs [0144]-[0145]). Where an acid labile group of acetal type is used, a high-boiling alcohol solvent may be added for accelerating deprotection reaction of acetal, for example, diethylene glycol, propylene glycol, glycerol, 1,4-butanediol, or 1,3-butanediol.

An appropriate amount of the organic solvent used is 50 to 10,000 parts, more preferably 100 to 8,000 parts by weight per 100 parts by weight of the base resin.

Other Components

To the resist composition comprising the fluorine-containing polymer, base resin, acid generator and organic solvent, any additives such as a basic compound, surfactant, dissolution regulator, and acetylene alcohol may be added in any suitable combination, depending on a particular purpose.

Addition of a basic compound may be effective in suppressing the diffusion rate of acid in the resist film, achieving a further improvement in resolution. Addition of a surfactant may improve or control the coating characteristics of the resist composition.

Exemplary basic compounds are described in JP-A 2008-111103, paragraphs [0146] to [0164]. Exemplary surfactants are described in JP-A 2008-111103, paragraphs [0165] to [0166]. Exemplary dissolution regulators are described in JP-A 2008-122932 (US 2008090172), paragraphs [0155] to [0178], and exemplary acetylene alcohols in paragraphs [0179] to [0182].

Also useful are quenchers of polymer type as described in JP-A 2008-239918. The polymeric quencher segregates at the resist surface after coating and thus enhances the rectangularity of resist pattern. When a protective film is applied, the polymeric quencher is also effective for preventing a film thickness loss of resist pattern or rounding of pattern top.

The resist composition for use in the pattern forming process may be of either positive or negative tone. A positive resist composition performs in such a way that the unexposed region of resist film is insoluble in the developer, whereas in the exposed region of resist film, the rate of dissolution in the developer is accelerated due to deprotection reaction of acid labile groups on the base resin, forming a positive tone pattern. A negative resist composition performs in such a way that the unexposed region of resist film is dissolved in the developer, whereas in the exposed region of resist film, the solubility in the developer is reduced via polarity switch (a change from hydrophilic group to hydrophobic group) or crosslinking reaction, forming a negative tone pattern.

Pattern Forming Process

The invention provides a pattern forming process comprising the steps of coating the resist composition onto a substrate, baking the composition at a temperature of 50 to 300° C. in an atmosphere of a solvent having a boiling point of 60 to 250° C. under atmospheric pressure, to form a resist film, exposing the resist film, and developing the exposed resist film.

The technique of coating the resist composition is not particularly limited. Any of coating techniques such as spin coating, roll coating, flow coating, dip coating, spray coating, and doctor coating may be used, with spin coating being preferred. Since it is desirable to reduce the amount of the resist composition dispensed for spin coating, preferably the substrate is previously wetted with the resist solvent or a solvent miscible with the resist solvent before the resist composition is dispensed. See JP-A H09-246173, for example. The previous wetting assists in spreading of the resist composition solution over the substrate for thereby saving the amount of the resist composition dispensed for spin coating.

Then a coating of the resist composition on the substrate is prebaked in a solvent atmosphere. Prebake may be performed either on a hot plate or in an oven, but essentially in a solvent atmosphere. The atmosphere preferably has a solvent concentration of at least 100 ppm, more preferably at least 200 ppm, and even more preferably at least 500 ppm. For the purpose of improving adhesion to inorganic substrates, typically silicon substrates, the lithography track system generally includes a vapor priming section for bubbling hexamethyldisilazane (HMDS) and priming the substrate with HMDS vapor. In the practice of the invention, using the vapor priming section, the substrate coated with the resist composition is prebaked while bubbling a solvent and spraying the resulting gas mixture to the substrate. A solvent atmosphere having a higher concentration may be established by heating the bubbling section. Due to the heat of solvent vaporization, the solvent temperature may drop, leading to a lowering of the solvent concentration in the gas mixture. For adjustment of the solvent concentration, bubbling is intermittently done and a timing thereof is adjusted. Besides the bubbling method, a solvent gas mixture may be produced by either a bake method of heating a solvent for evaporation or a direct gasifying method of spraying a solvent through a nozzle.

The solvent necessary to form the solvent atmosphere should have a boiling point of 60 to 250° C. preferably 80 to 250° C., and more preferably 90 to 230° C. under atmospheric pressure. The solvent is typically selected from among ester solvents of 4 to 10 carbon atoms, ketone solvents of 5 to 10 carbon atoms, ether solvents of 8 to 12 carbon atoms, aromatic solvents of 7 to 12 carbon atoms, and amide solvents of 4 to 8 carbon atoms.

Suitable ester solvents of 4 to 10 carbon atoms include propylene glycol monomethyl ether acetate, propylene glycol monoethyl ether acetate, propylene glycol monopropyl ether acetate, propylene glycol monobutyl ether acetate, propylene glycol mono-t-butyl ether acetate, ethyl pyruvate, methyl 3-methoxypropionate, methyl 3-ethoxypropionate, ethyl 3-methoxypropionate, ethyl 3-ethoxypropionate, t-butyl acetate, t-butyl propionate, propyl acetate, butyl acetate, isobutyl acetate, pentyl acetate, butenyl acetate, isopentyl acetate, propyl formate, butyl formate, isobutyl formate, pentyl formate, isopentyl formate, methyl valerate, methyl pentenoate, methyl crotonate, ethyl crotonate, methyl propionate, ethyl propionate, ethyl 3-ethoxypropionate, methyl lactate, ethyl lactate, propyl lactate, butyl lactate, isobutyl lactate, pentyl lactate, isopentyl lactate, methyl 2-hydroxyisobutyrate, ethyl 2-hydroxyisobutyrate, methyl benzoate, ethyl benzoate, phenyl acetate, benzyl acetate, methyl phenylacetate, benzyl formate, phenylethyl formate, methyl 3-phenylpropionate, benzyl propionate, ethyl phenylacetate, and 2-phenylethyl acetate.

Suitable ketone solvents of 5 to 10 carbon atoms include 2-octanone, 2-nonanone, 2-heptanone, 3-heptanone, 4-heptanone, 2-hexanone, 3-hexanone, diisobutyl ketone, methyl cyclohexanone, acetophenone, methylacetophenone, cyclopentanone, cyclohexanone, cyclooctanone, and methyl-2-n-pentyl ketone.

Suitable ether solvents of 8 to 12 carbon atoms include di-n-butyl ether, diisobutyl ether, di-s-butyl ether, di-n-pentyl ether, diisopentyl ether, di-s-pentyl ether, di-t-pentyl ether, di-n-hexyl ether, and anisole.

Suitable aromatic solvents of 7 to 12 carbon atoms include toluene, xylene, ethylbenzene, isopropylbenzene, t-butylbenzene, and mesitylene.

Suitable amide solvents of 4 to 8 carbon atoms include N,N-dimethylacetamide. N,N-diethylacetamide, N,N-dimethylpropionamide, N-ethylpropionamide, and pivalamide.

The fluorine-containing polymer segregates on the resist surface during spin coating or subsequent bake. If the solvent within the resist film evaporates and solidifies during bake, surface segregation of the fluorine-containing polymer is interrupted. As the evaporation rate of the solvent is retarded, a percent surface segregation of the fluorine-containing polymer is increased.

If a high boiling solvent is used in the resist composition, then the evaporation rate of the solvent is slowed down. In consequence, a percent surface segregation of the fluorine-containing polymer is increased. However, if a large fraction of the solvent is left within the resist coating during the latter half of spin coating, then a problem arises that the resist composition is spread out even after edge cutting with the edge cutting solvent during the latter half of spin coating, interfering with the edge cleaning step.

Intending to retard drying of the solvent by carrying out prebake in a solvent atmosphere, the invention ensures definite edge cutting because a need for a high-boiling solvent as the resist solvent is eliminated. Prebake in a solvent atmosphere may be followed by prebake under solvent-free conditions, which ensures that the solvent is completely evaporated off.

At the end of prebake, the resist film preferably has a thickness of 10 to 500 nm, more preferably 20 to 300 nm.

After the resist film is formed in this way, it is exposed to radiation, typically KrF excimer laser of wavelength 248 nm, ArF excimer laser of wavelength 193 nm, EUV of wavelength 3 to 15 nm, or EB.

The ArF excimer laser lithography may be either dry lithography or immersion lithography in water, preferably immersion lithography with water inserted between the lens and the wafer. Now that the resist surface has been improved in water repellency and water slip by the prebake in a solvent atmosphere, the invention has the advantages that the scanning rate is accelerated, the throughput is improved, the amount of resist film leached out into water is reduced, and the projection lens in contact with water is prevented from fogging.

The EUV or EB lithography is carried out in vacuum. During exposure in vacuum, outgassing from the resist film occurs, and outgassed components deposit within the exposure tool. Most outgassed components are decomposition products of the acid generator and acid labile group. Since the fluorine-containing polymer does not contain an acid generator and acid labile group, the surface coverage with the fluorine-containing polymer shuts off outgassing.

The exposure may be followed by PEB if necessary. PEB may be carried out by heating on a hot plate at 60 to 150° C. for 1 to 5 minutes, preferably at 80 to 140° C. for 1 to 3 minutes.

Finally the resist film is developed. The development step may be performed, for example, in an alkaline developer for 3 to 300 seconds. An aqueous solution of 2.38 wt % tetramethylammonium hydroxide (TMAH) is most commonly used as the alkaline developer. Instead of the TMAH solution, an aqueous solution of tetrabutylammonium hydroxide may also be used. The resist film is developed in an alkaline developer to form a pattern of the resist film.

In addition to the foregoing steps, any extra steps such as etching, resist stripping and cleaning may be included.

EXAMPLE

Preparation Examples, Examples and Comparative Examples are given below for further illustrating the invention, but they should not be construed as limiting the invention thereto. All parts (pbw) are by weight.

[1] Preparation of Resist Composition

Preparation Examples 1 to 5

A resist composition was prepared by dissolving a base resin, fluorine-containing polymer, acid generator, quencher and surfactant in a solvent in accordance with the recipe shown in Table 1, and filtering through a polyethylene filter having a pore size of 0.2 μm. The components used herein are identified below.

-continued
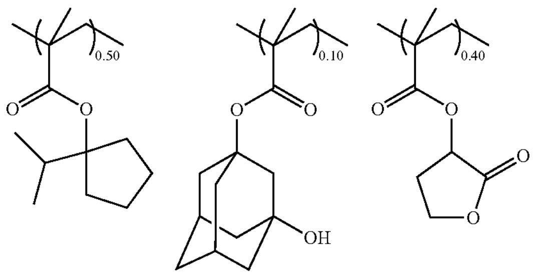
Base resin 1
Mw = 9,800
Mw/Mn = 1.70
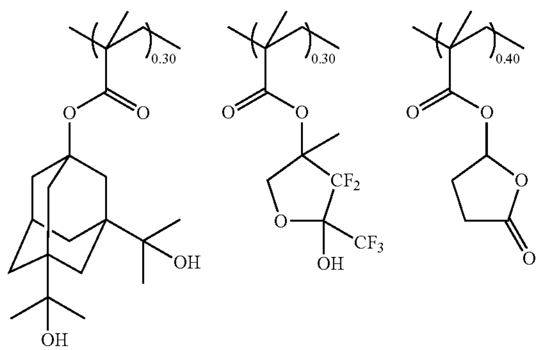
Base resin 2
Mw = 6,500
Mw/Mn = 1.68
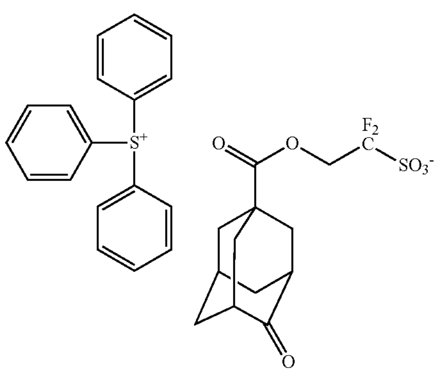
PAG 1
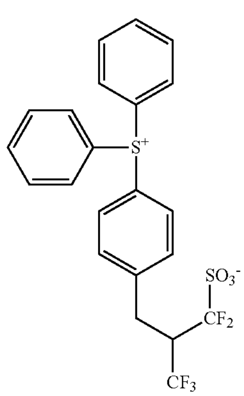
PAG 2
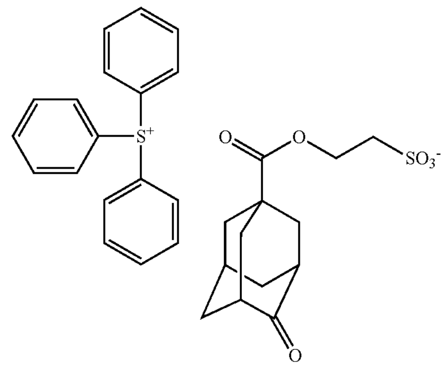
Quencher 1
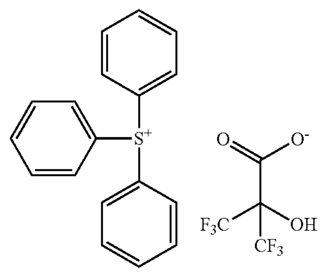
Quencher 2
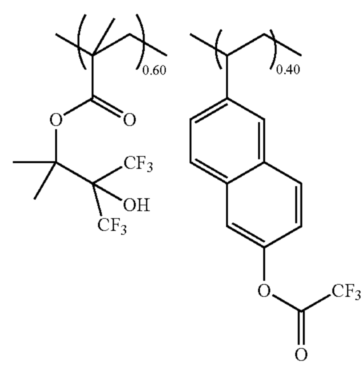
Fluorine-containing polymer 1
Mw = 7,600
Mw/Mn = 1.89
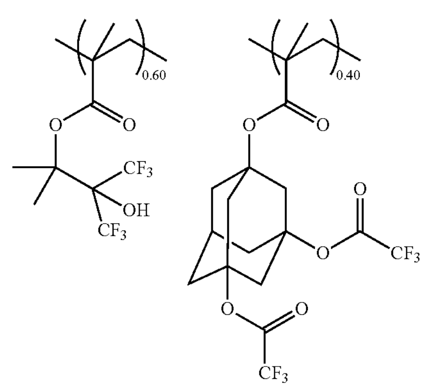
Fluorine-containing polymer 2
Mw = 9,700
Mw/Mn = 1.65

-continued

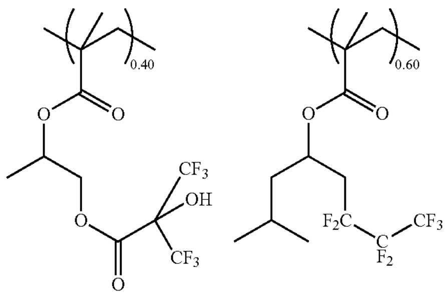

Fluorine-containing polymer 3

Mw = 10,300
Mw/Mn = 1.88

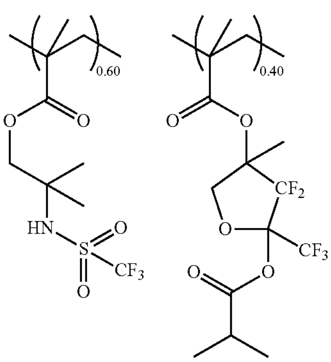

Fluorine-containing polymer 4

Mw = 8,800
Mw/Mn = 1.55

TABLE 1

| Resist composition | Polymer (pbw) | Fluorine-containing polymer (pbw) | Acid generator (pbw) | Quencher (pbw) | Surfactant (pbw) | Solvent (pbw) |
|---|---|---|---|---|---|---|
| R-1 | Base resin 1 (100) | Fluorine-containing polymer 1 (3.0) | PAG1 (6.0) | Quencher 1 (6.0) | FC-4430 (0.001) | PGMEA (2,000) GBL (250) |
| R-2 | Base resin 1 (100) | Fluorine-containing polymer 2 (3.0) | PAG1 (6.0) | Quencher 1 (6.0) | FC-4430 (0.001) | PGMEA (2,000) GBL (250) |
| R-3 | Base resin 1 (100) | Fluorine-containing polymer 3 (3.0) | PAG1 (6.0) | Quencher 1 (6.0) | FC-4430 (0.001) | PGMEA (2,000) GBL (250) |
| R-4 | Base resin 1 (100) | Fluorine-containing polymer 4 (3.0) | PAG1 (6.0) | Quencher 1 (6.0) | FC-4430 (0.001) | PGMEA (2,000) GBL (250) |
| R-5 | Base resin 2 (100) | Fluorine-containing polymer 1 (3.0) | PAG2 (6.0) | Quencher 2 (6.0) | FC-4430 (0.001) | PGMEA (2,000) GBL (250) |

* PGMEA: propylene glycol monomethyl ether acetate
GBL: gamma-butyrolactone
FC-4430: fluorochemical surfactant by 3M

[2] Evaluation of Resist Film—Measurement of Sliding Angle and Receding Contact Angle

Examples 1-1 to 1-8 & Comparative Examples 1-1 to 1-2

Using a coater/developer system Clean Track ACT-8 (Tokyo Electron Ltd.), each of the resist compositions in Preparation Examples was coated onto a silicon substrate and prebaked at the temperature shown in Table 2 for 60 seconds while bubbling the solvent shown in Table 2 in the priming section of the system. A resist film of 90 nm thick was formed.

A contact angle with water of the resist film was measured, using an inclination contact angle meter Drop Master 500 (Kyowa Interface Science Co., Ltd.). Specifically, the wafer coated with the resist film was kept horizontal, and 50 μL of pure water was dropped on the resist film to form a droplet. While the wafer was gradually inclined, the angle (sliding angle) at which the droplet started sliding down was determined as well as receding contact angle. The results are shown in Table 2.

TABLE 2

| | | Resist composition | Solvent | Prebake temp. (° C.) | Sliding angle (°) | Receding contact angle (°) |
|---|---|---|---|---|---|---|
| Example | 1-1 | R-1 | PGMEA | 100 | 6 | 82 |
| | 1-2 | R-2 | PGMEA | 100 | 6 | 82 |
| | 1-3 | R-3 | ethyl pyruvate | 100 | 6 | 80 |
| | 1-4 | R-4 | PGMEA | 100 | 8 | 81 |
| | 1-5 | R-5 | PGBEA | 100 | 10 | 79 |
| | 1-6 | R-1 | pentyl acetate | 100 | 6 | 82 |
| | 1-7 | R-1 | 2-heptanone | 100 | 7 | 80 |
| | 1-8 | R-1 | methyl benzoate | 110 | 8 | 80 |

TABLE 2-continued

| | | Resist composition | Solvent | Prebake temp. (° C.) | Sliding angle (°) | Receding contact angle (°) |
|---|---|---|---|---|---|---|
| Comparative | 1-1 | R-1 | — | 100 | 12 | 75 |
| Example | 1-2 | R-5 | — | 100 | 14 | 73 |

* PGMEA: propylene glycol monomethyl ether acetate
PGBEA: propylene glycol monobutyl ether acetate

[3] ArF Immersion Lithography Patterning Test

Examples 2-1 to 2-8 & Comparative Examples 2-1 to 2-2

A spin-on carbon film ODL-102 (Shin-Etsu Chemical Co., Ltd.) was deposited on a silicon wafer to a thickness of 200 nm and a silicon-containing spin-on hard mask film SHB-A940 (Shin-Etsu Chemical Co., Ltd,) was deposited thereon to a thickness of 35 nm. Using a coater/developer system Clean Track ACT-8 (Tokyo Electron Ltd.), each of the resist compositions in Preparation Examples was spin coated on this substrate for trilayer process. Then it was prebaked for 60 seconds while bubbling the solvent shown in Table 3 in the priming section of the system, and baked on a hot plate at 100° C. for 60 seconds. A resist film of 90 nm thick was formed.

Using an ArF excimer laser immersion lithography scanner NSR-610C (Nikon Corp., NA 1.30, σ0.98/0.78, dipole opening 20 deg., azimuthally polarized illumination), the resist film was exposed in a varying dose through a 6% halftone phase shift mask. The resist film was baked (PEB) at the temperature shown in Table 3 for 60 seconds and puddle developed in an aqueous solution of 2.38 wt % tetramethylammonium hydroxide for 30 seconds, forming a 40-nm line-and-space pattern. At the end of development, the pattern was measured for LWR by a CD-SEM CG-4000 (Hitachi, Ltd.), with the results shown in Table 3.

TABLE 3

| | | Resist composition | Solvent | PEB temp. (° C.) | LWR (nm) |
|---|---|---|---|---|---|
| Example | 2-1 | R-1 | PGMEA | 100 | 2.1 |
| | 2-2 | R-2 | PGMEA | 100 | 2.2 |
| | 2-3 | R-3 | ethyl pyruvate | 100 | 2.3 |
| | 2-4 | R-4 | PGMEA | 100 | 2.3 |
| | 2-5 | R-5 | PGBEA | 100 | 3.2 |
| | 2-6 | R-1 | pentyl acetate | 100 | 2.3 |
| | 2-7 | R-1 | 2-heptanone | 100 | 2.2 |
| | 2-8 | R-1 | methyl benzoate | 110 | 2.4 |
| Comparative | 2-1 | R-1 | — | 100 | 2.8 |
| Example | 2-2 | R-5 | — | 100 | 4.2 |

* PGMEA: propylene glycol monomethyl ether acetate
PGBEA: propylene glycol monobutyl ether acetate Japanese Patent Application No. 2016-116739 is incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

The invention claimed is:

1. A pattern forming process comprising the steps of:

coating a resist composition comprising a fluorine-containing polymer, a base resin adapted to change its alkaline solubility under the action of acid, an acid generator, and an organic solvent, baking the composition at a temperature of 50 to 300° C. in an atmosphere of a solvent having a boiling point of 60 to 250° C. under atmospheric pressure, to form a resist film, exposing the resist film, and developing the exposed resist film, wherein the fluorine-containing polymer contains an α-trifluoromethylhydroxy or fluorosulfonamide group, and dissolves in an alkaline developer, said fluorine-containing polymer consisting of recurring units (a1) having the formula (1), recurring units (a2) having the formula (2), recurring units (a3) having a fluorinated alkyl or aryl group, recurring units (b1) to (b4) represented by the following formulae (3) to (6), and recurring units (c1) having a carboxyl or sulfo group:

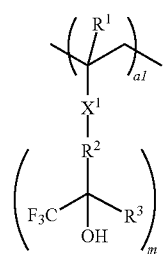

(1)

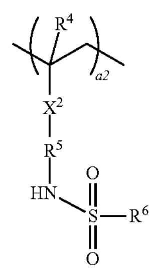

(2)

wherein $R^1$ and $R^4$ are each independently hydrogen or methyl, $R^2$ is a single bond, or a straight, or branched $C_1$-$C_{12}$ alkylene group which may contain an ether, ester or carbonyl moiety, $R^3$ is hydrogen, fluorine, methyl, trifluoromethyl or difluoromethyl, or $R^3$ may bond with $R^2$ to form a ring which may contain an ether moiety, fluorinated alkylene moiety or trifluoromethyl moiety, $R^5$ is a single bond or a straight, branched or cyclic $C_1$-$C_{12}$ alkylene group which may contain an ether, ester or carbonyl moiety, $R^6$ is a fluorinated, straight, branched or cyclic $C_1$-$C_{10}$ alkyl or phenyl group, m is 1 or 2, in case of m=1, $X^1$ is a single bond, —O—, —C(═O)—O—$R^7$— or —C(═O)—NH—$R^7$—, $R^7$ is a straight or branched $C_1$-$C_{10}$ alkylene group which may contain an ester or ether moiety, in case of m=2, $X^1$ is —C(═O)—O—$R^8$═ or —C(═O)—NH—$R^8$═, $R^8$ is an optionally ester or ether-containing, straight or branched $C_1$-$C_{10}$ alkylene group, with one hydrogen atom eliminated, $X^2$ is a single bond, phenylene group, —O—, —C(═O)—O—$R^7$— or —C(═O)—NH—$R^7$—, (3)

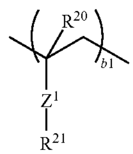

(4)

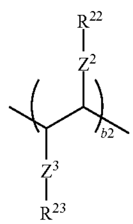

(5)

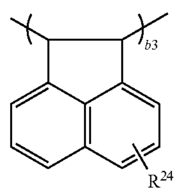

(6)

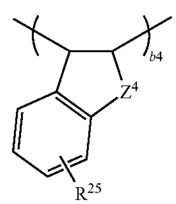

wherein $R^{20}$ is hydrogen or methyl, $Z^1$ is a single bond, —C(═O)—O— or —O—, $Z^2$ and $Z^3$ are each independently phenylene or naphthylene, $Z^4$ is methylene, —O— or —S—, $R^{21}$ is a $C_6$-$C_{20}$ aryl group or $C_2$-$C_{20}$ alkenyl group, $R^{22}$, $R^{23}$, $R^{24}$ and $R^{25}$ are each independently hydrogen, hydroxyl, cyano, nitro, amino, halogen, straight, branched or cyclic $C_1$-$C_{10}$ alkyl group, straight, branched or cyclic $C_2$-$C_6$ alkenyl group, $C_6$-$C_{10}$ aryl group, straight, branched or cyclic $C_1$-$C_{10}$ alkoxy group, or straight, branched or cyclic $C_2$-$C_{10}$ acyloxy group, and wherein recurring units (a1) to (a3), recurring units (b1) to (b4), and recurring units (c1) are incorporated in the range of $0 \le a1 \le 1.0$, $0 \le a2 \le 1.0$, $0.5 \le a1+a2 \le 1.0$, $0 \le a3 < 1.0$, $0 \le b1 \le 0.9$, $0 \le b2 \le 0.9$, $0 \le b3 \le 0.9$, $0 \le b4 \le 0.9$, $0 \le b1+b2+b3+b4 \le 0.9$, $0 \le c1 \le 0.6$, and $a1+a2+a3+b1+b2+b3+b4+c1=1$.

2. The process of claim 1 wherein as a result of the baking step, the resist film is surface covered with the fluorine-containing polymer.

3. The process of claim 1 wherein the solvent having a boiling point of 60 to 250° C. under atmospheric pressure is selected from the group consisting of ester solvents of 4 to 10 carbon atoms, ketone solvents of 5 to 10 carbon atoms, ether solvents of 8 to 12 carbon atoms, aromatic solvents of 7 to 12 carbon atoms, and amide solvents of 4 to 8 carbon atoms.

4. The process of claim 3 wherein the ester solvents of 4 to 10 carbon atoms include propylene glycol monomethyl ether acetate, propylene glycol monoethyl ether acetate, propylene glycol monopropyl ether acetate, propylene glycol monobutyl ether acetate, propylene glycol mono-t-butyl ether acetate, ethyl pyruvate, methyl 3-methoxypropionate, methyl 3-ethoxypropionate, ethyl 3-methoxypropionate, ethyl 3-ethoxypropionate, t-butyl acetate, t-butyl propionate, propyl acetate, butyl acetate, isobutyl acetate, pentyl acetate, butenyl acetate, isopentyl acetate, propyl formate, butyl formate, isobutyl formate, pentyl formate, isopentyl formate, methyl valerate, methyl pentenoate, methyl crotonate, ethyl crotonate, methyl propionate, ethyl propionate, ethyl 3-ethoxypropionate, methyl lactate, ethyl lactate, propyl lactate, butyl lactate, isobutyl lactate, pentyl lactate, isopentyl lactate, methyl 2-hydroxyisobutyrate, ethyl 2-hydroxyisobutyrate, methyl benzoate, ethyl benzoate, phenyl acetate, benzyl acetate, methyl phenylacetate, benzyl formate, phenylethyl formate, methyl 3-phenylpropionate, benzyl propionate, ethyl phenylacetate, and 2-phenylethyl acetate, the ketone solvents of 5 to 10 carbon atoms include 2-octanone, 2-nonanone, 2-heptanone, 3-heptanone, 4-heptanone, 2-hexanone, 3-hexanone, diisobutyl ketone, methyl cyclohexanone, acetophenone, methylacetophenone, cyclopentanone, cyclohexanone, cyclooctanone, and methyl-2-n-pentyl ketone, the ether solvents of 8 to 12 carbon atoms include di-n-butyl ether, diisobutyl ether, di-s-butyl ether, di-n-pentyl ether, diisopentyl ether, di-s-pentyl ether, di-t-pentyl ether, di-n-hexyl ether, and anisole, the aromatic solvents of 7 to 12 carbon atoms include toluene, xylene, ethylbenzene, isopropylbenzene, t-butylbenzene, and mesitylene, and the amide solvents of 4 to 8 carbon atoms include N,N-dimethylacetamide, N,N-diethylacetamide, N,N-dimethylpropionamide, N-ethylpropionamide, and pivalamide.

5. The process of claim 1 wherein the exposure step is to expose the resist film to KrF excimer laser of wavelength 248 nm, ArF excimer laser of wavelength 193 nm, EUV of wavelength 3 to 15 nm, or EB.

6. The process of claim 5 wherein the exposure step is to expose the resist film to ArF excimer laser by immersion lithography.

7. The process of claim 1 wherein the base resin comprises recurring units having the formula (7) and/or recurring units having the formula (8):

(7)

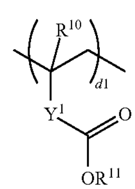

(8)

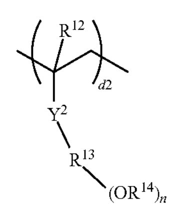

wherein $R^{10}$ and $R^{12}$ are each independently hydrogen or methyl, $R^{11}$ and $R^{14}$ are each independently hydrogen or an acid labile group, $Y^1$ is a single bond, phenylene, naphthylene or —C(=O)—O—$R^{15}$—, $R^{15}$ is a straight, branched or cyclic $C_1$-$C_{10}$ alkylene group which may contain an ether moiety, ester moiety, lactone ring or hydroxyl moiety, a phenylene group or naphthylene group, $Y^2$ is a single bond, phenylene, naphthylene, —C(=O)—O—$R^{16}$—, —C(=O)—NH—$R^{16}$—, —O—$R^{16}$— or —S—$R^{16}$—, $R^{16}$ is a straight, branched or cyclic $C_1$-$C_{10}$ alkylene group which may contain an ether moiety, ester moiety, lactone ring or hydroxyl moiety, $R^{13}$ is a single bond, a straight, branched or cyclic $C_1$-$C_{16}$ divalent to pentavalent aliphatic hydrocarbon group which may contain an ether or ester moiety, or a phenylene group, d1 and d2 are positive numbers satisfying $0 \leq d1 < 1.0$, $0 \leq d2 < 1.0$, and $0 < d1+d2 \leq 1.0$, and n is an integer of 1 to 4.

8. The process of claim 1 wherein in the resist composition, 0.1 to 15 parts by weight of the fluorine-containing polymer is present per 100 parts by weight of the base resin.

9. The process of claim 1 wherein the recurring units (a1) having a fluorinated alkyl or aryl group are derived from monomers selected from the group consisting of the following formulae:

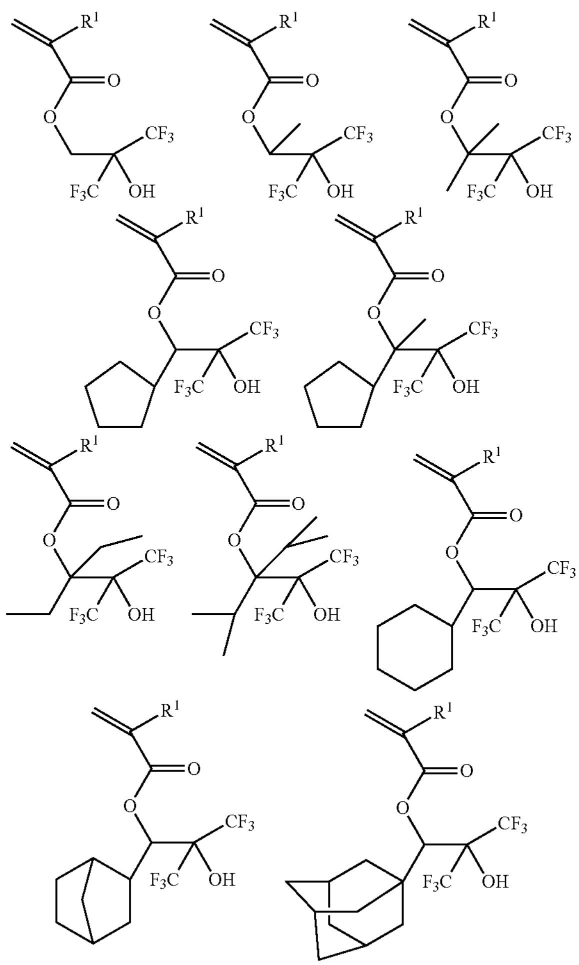

-continued

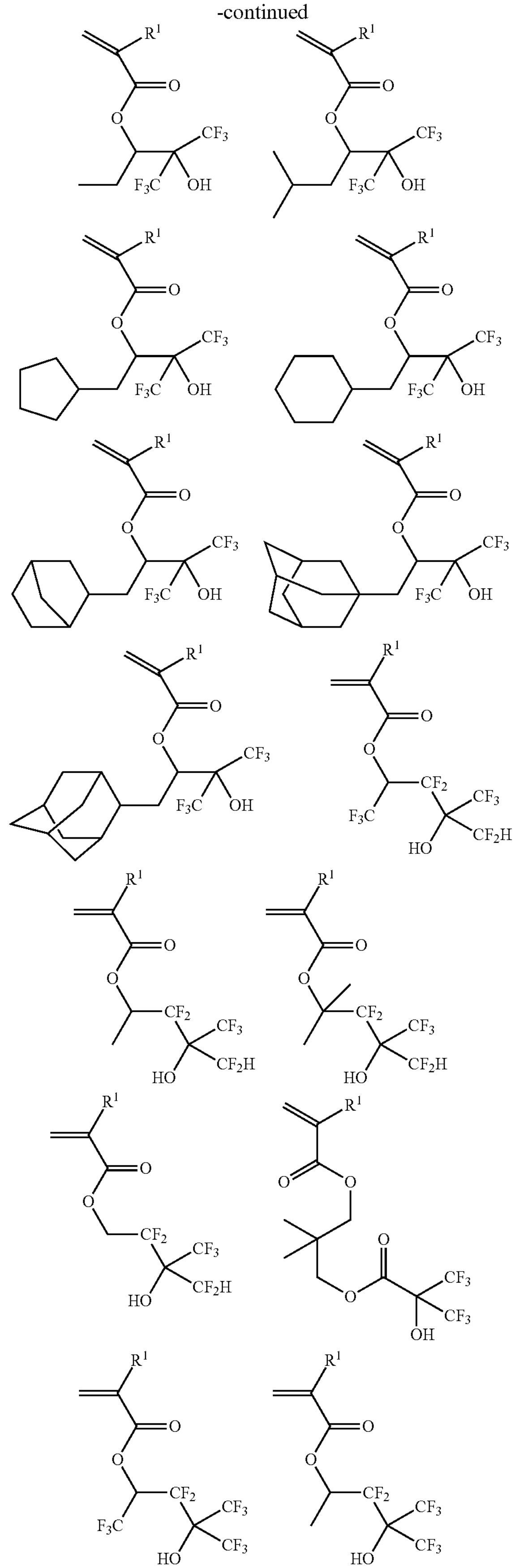

-continued
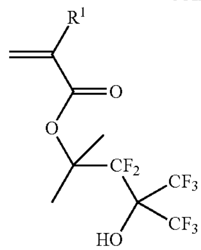
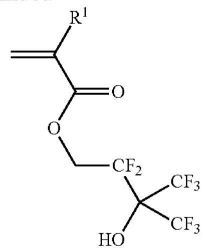
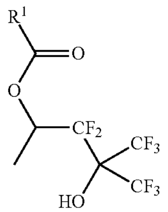
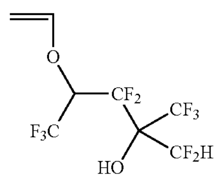
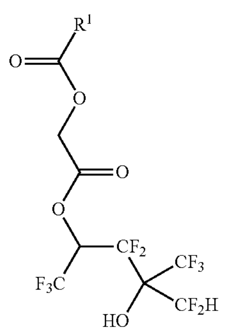
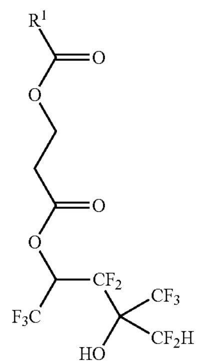
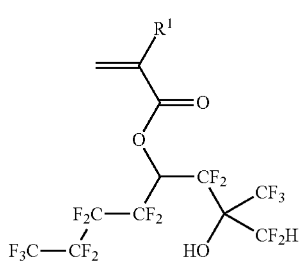
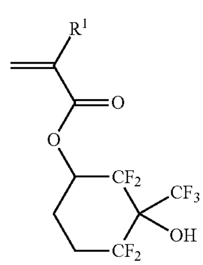
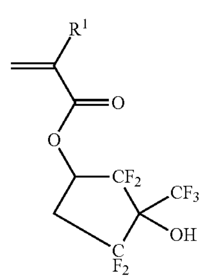
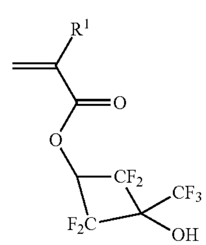
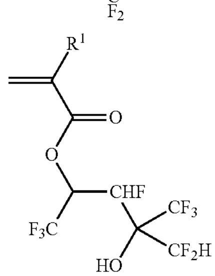
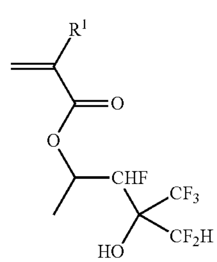
-continued
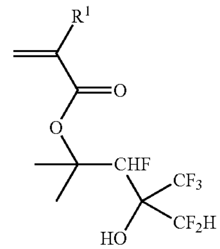
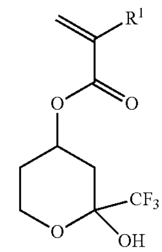
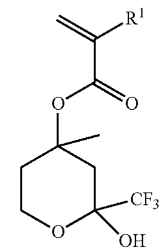
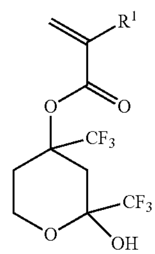
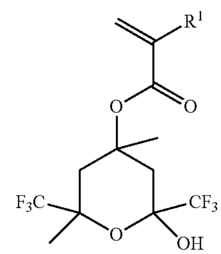
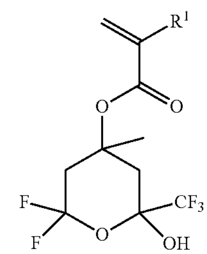
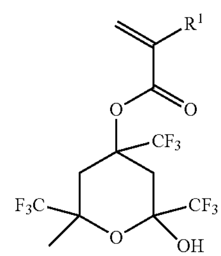
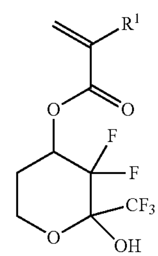
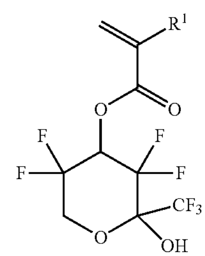
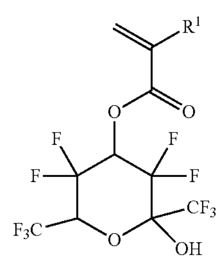
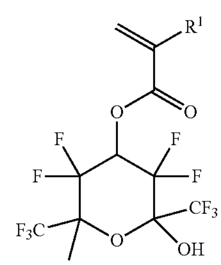
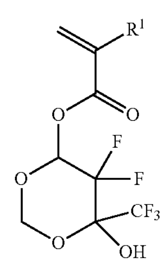
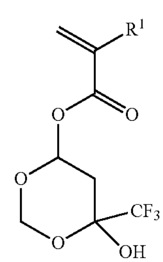
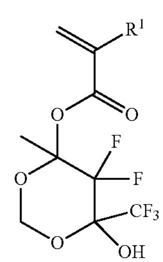
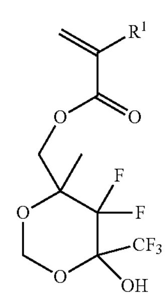
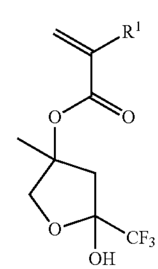
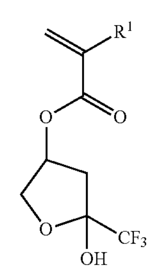

-continued
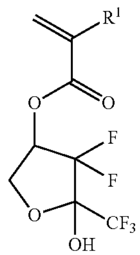
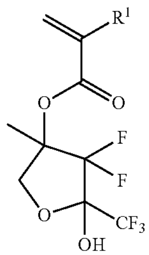
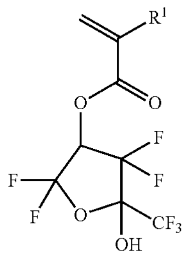
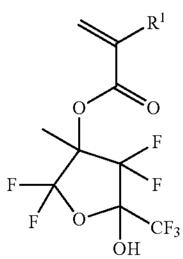
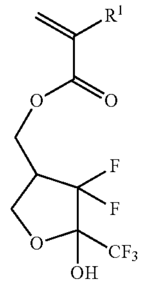
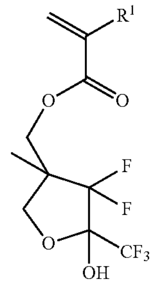
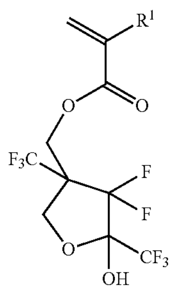
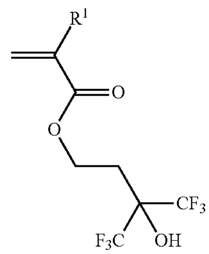
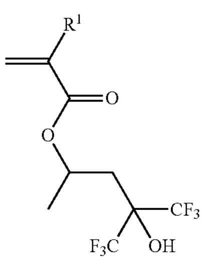
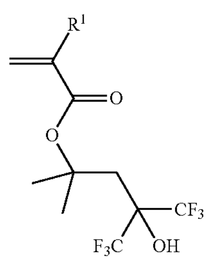
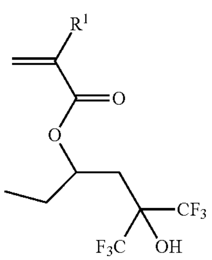
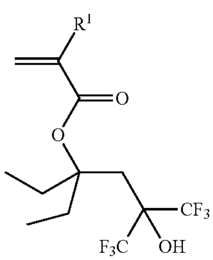
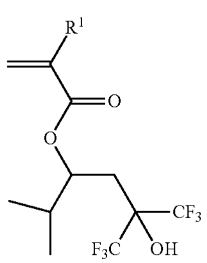
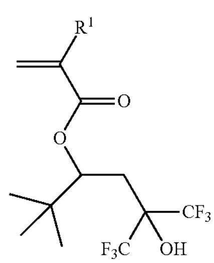
-continued
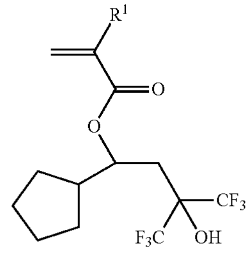
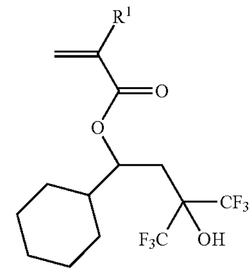
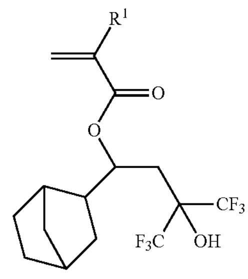
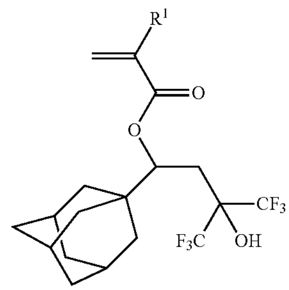
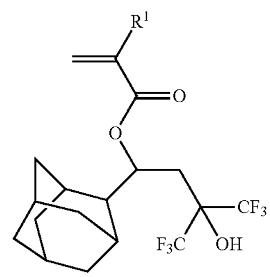
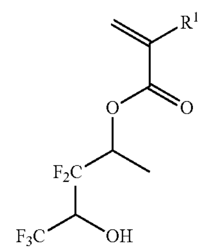
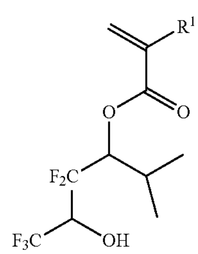
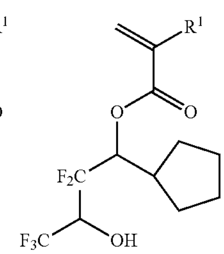
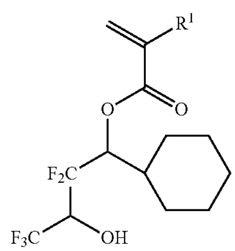
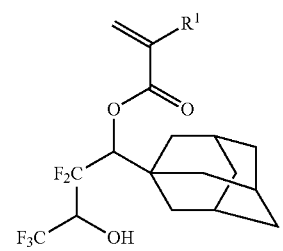
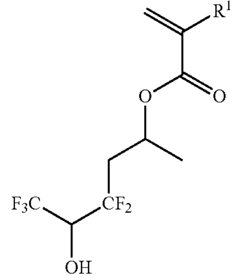
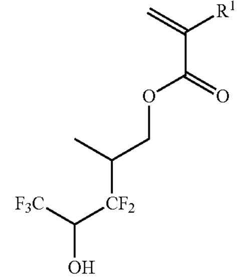

-continued
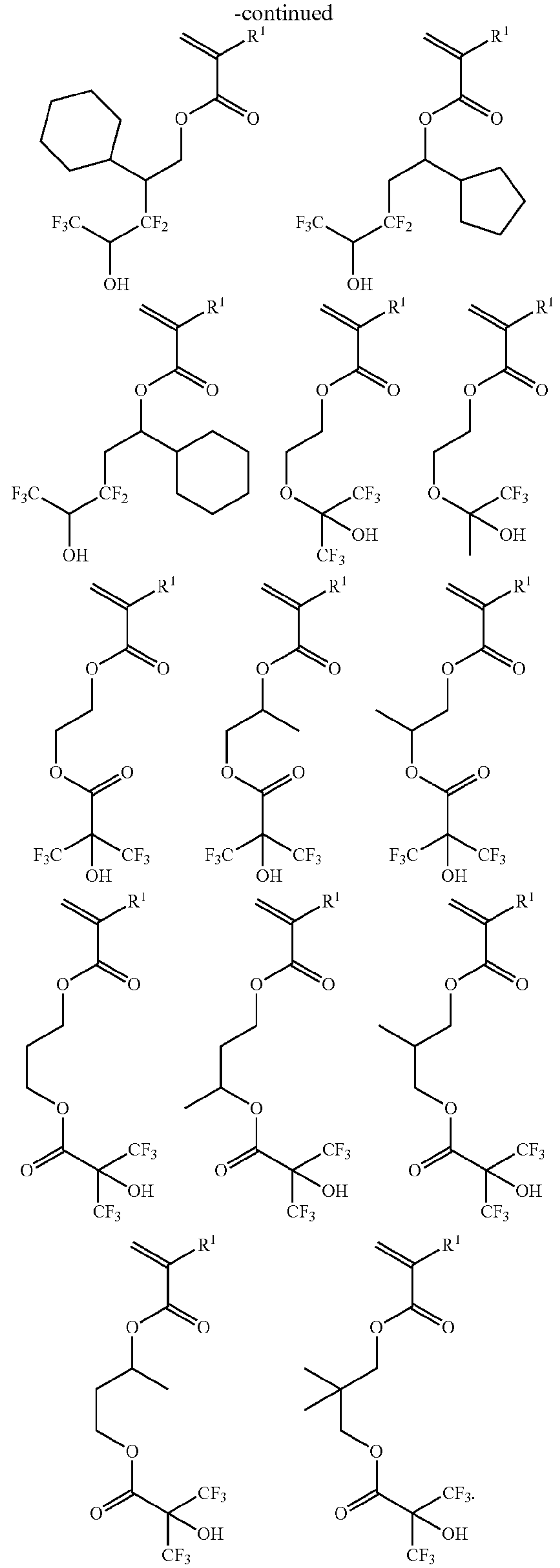
10. The process of claim 1 wherein the recurring units (a3) having a fluorinated alkyl or aryl group are derived from monomers selected from the group consisting of the following formulae:
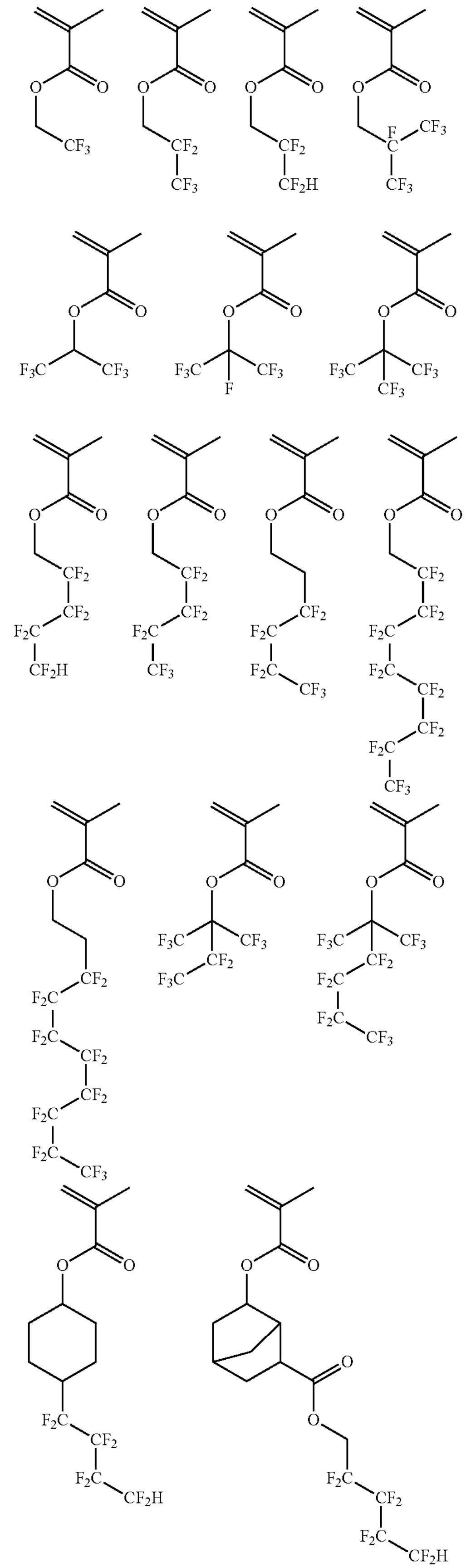

-continued
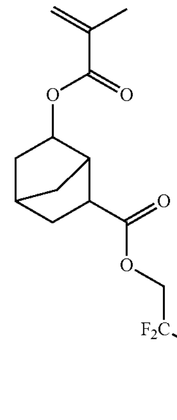
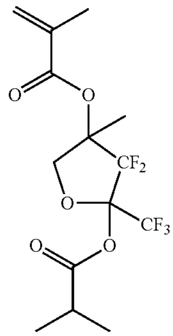
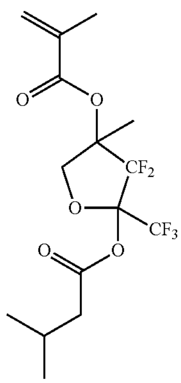
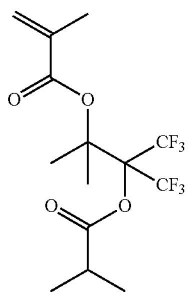
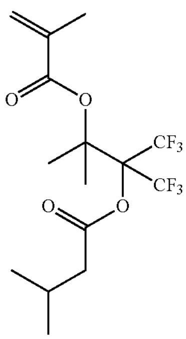
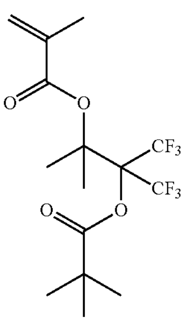
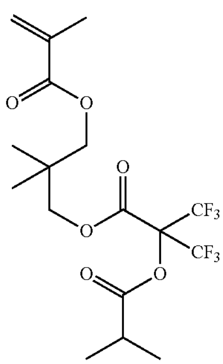
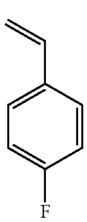
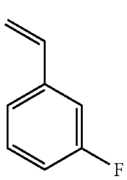
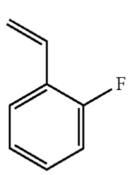
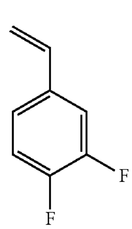
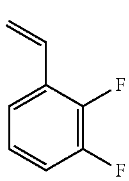
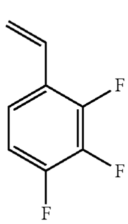
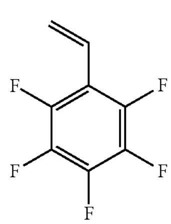
-continued
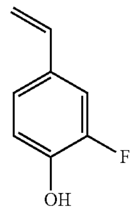
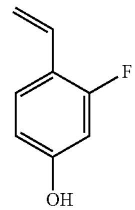
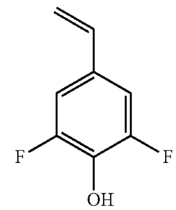
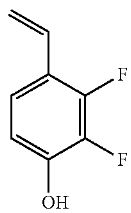
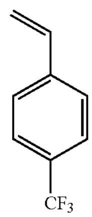
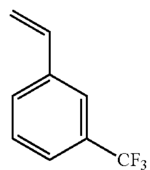
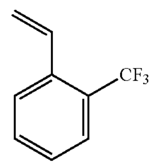
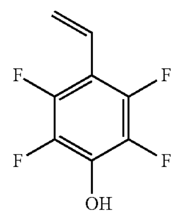
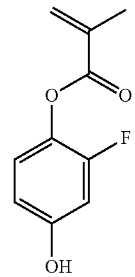
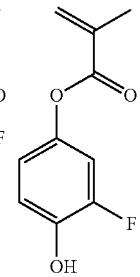
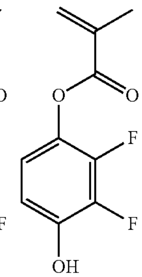
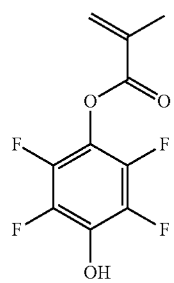
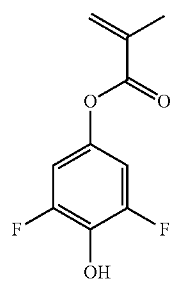
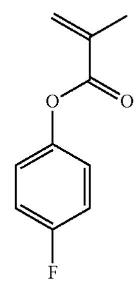
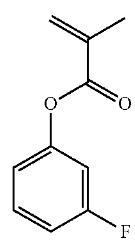
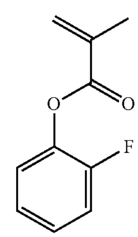
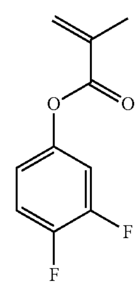
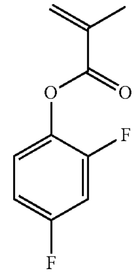

-continued
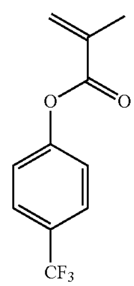
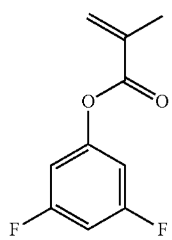
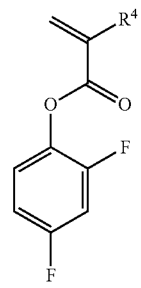
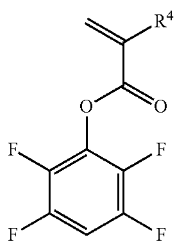
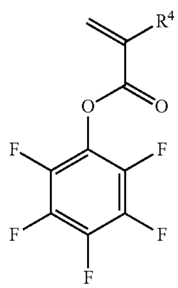
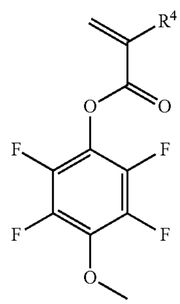
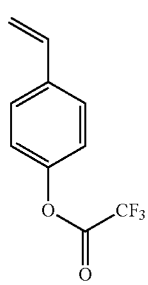
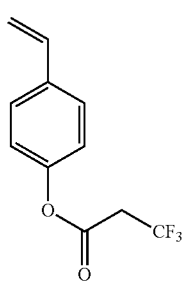
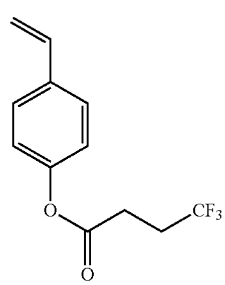
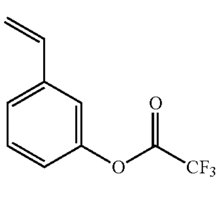
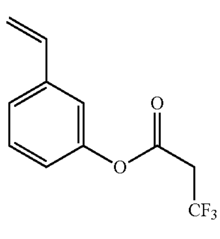
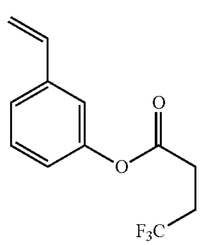
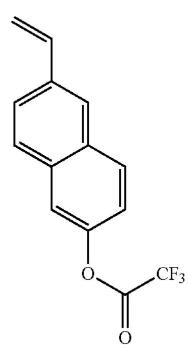
-continued
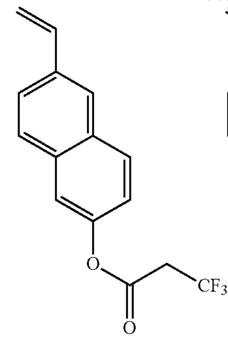
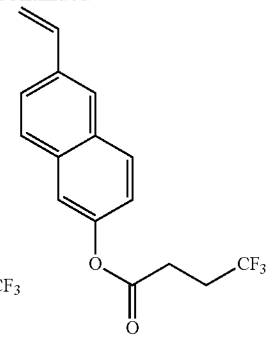
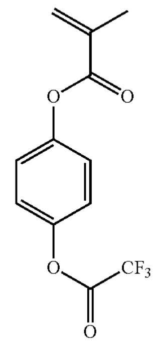
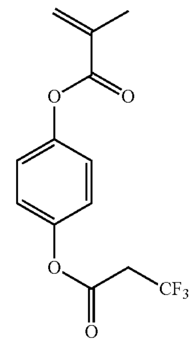
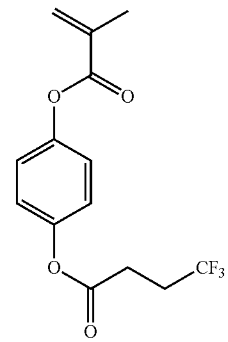
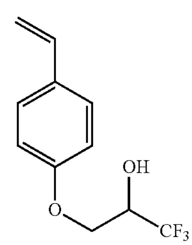
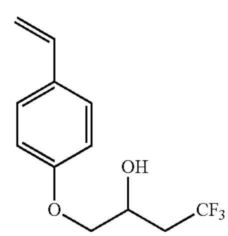
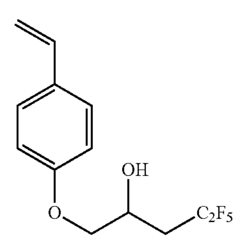
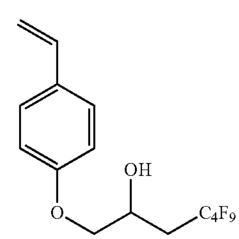
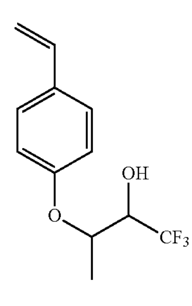
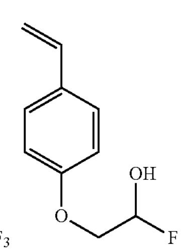
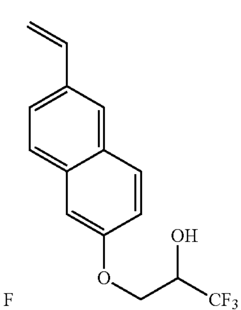

-continued
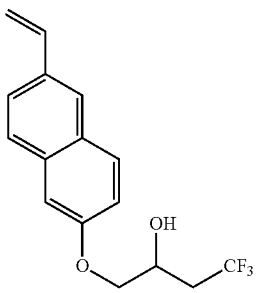
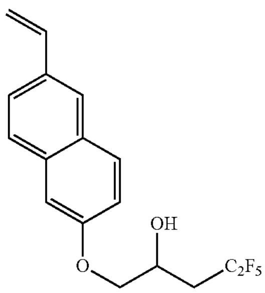
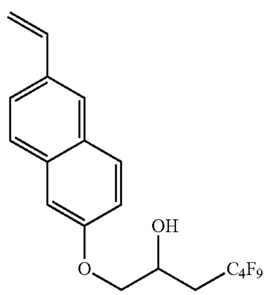
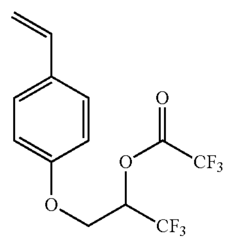
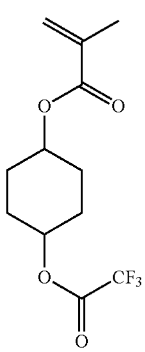
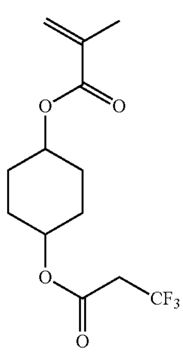
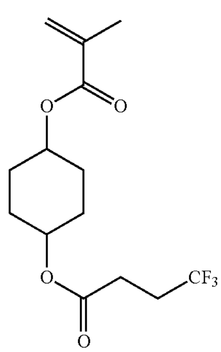
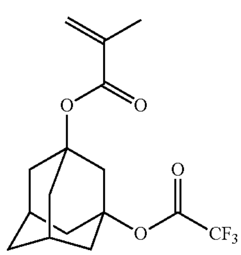
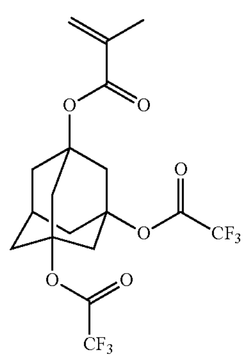
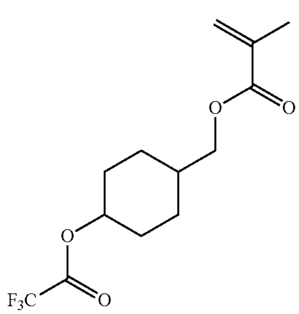
-continued
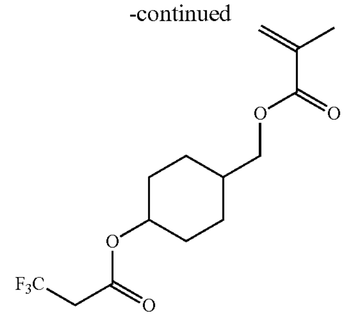
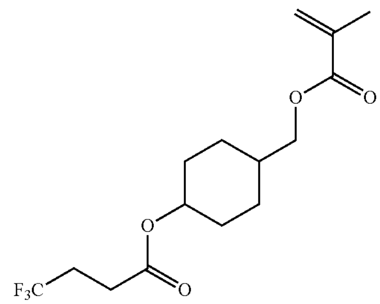
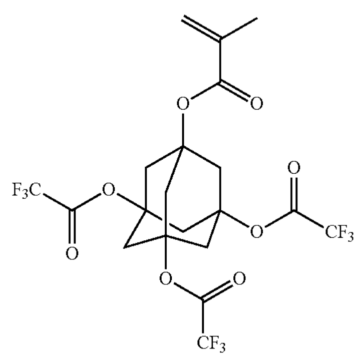
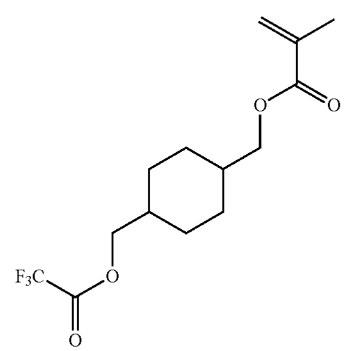
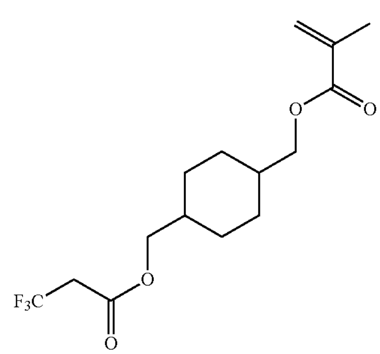

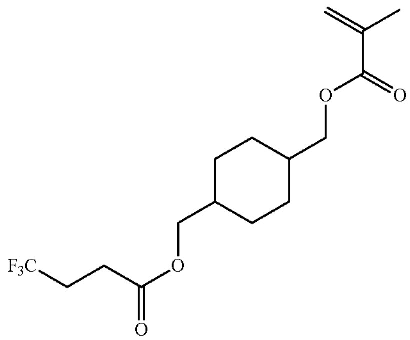
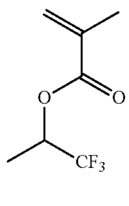
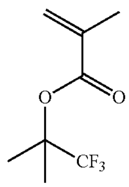
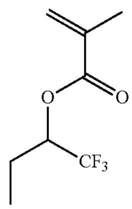
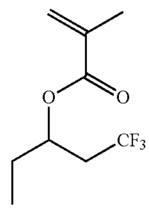
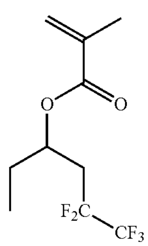
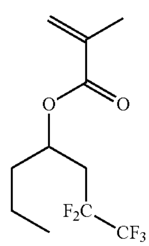
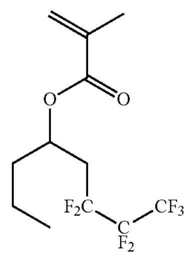
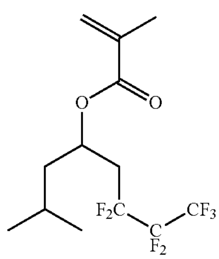
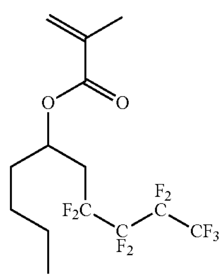
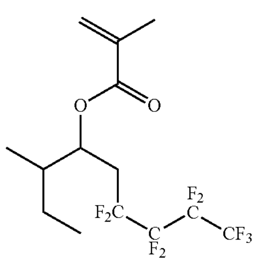
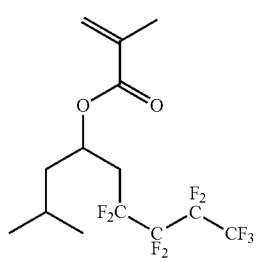
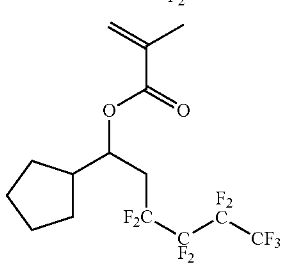
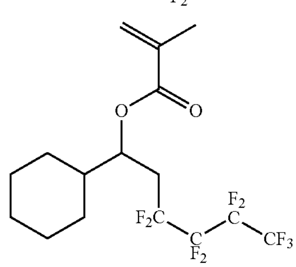
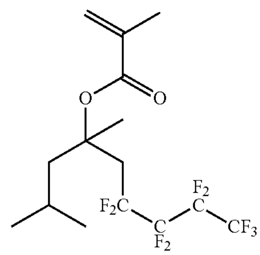
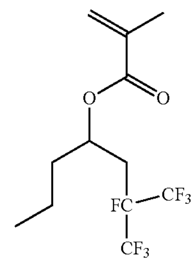
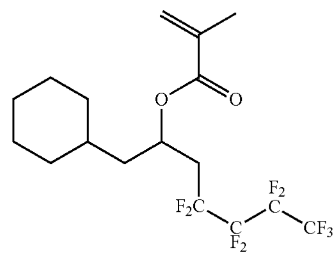
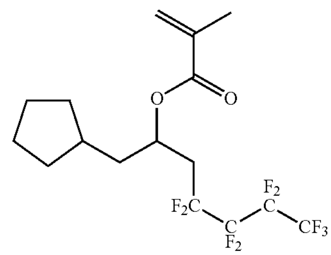
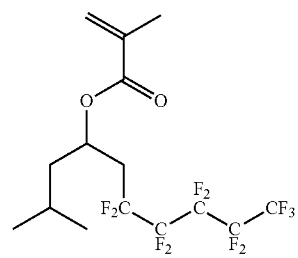
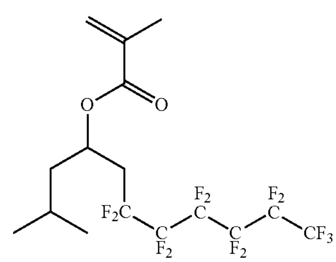
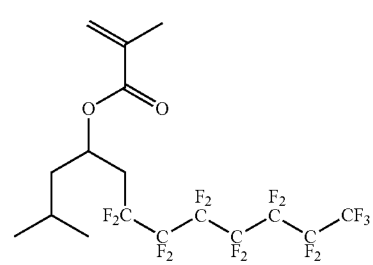

-continued
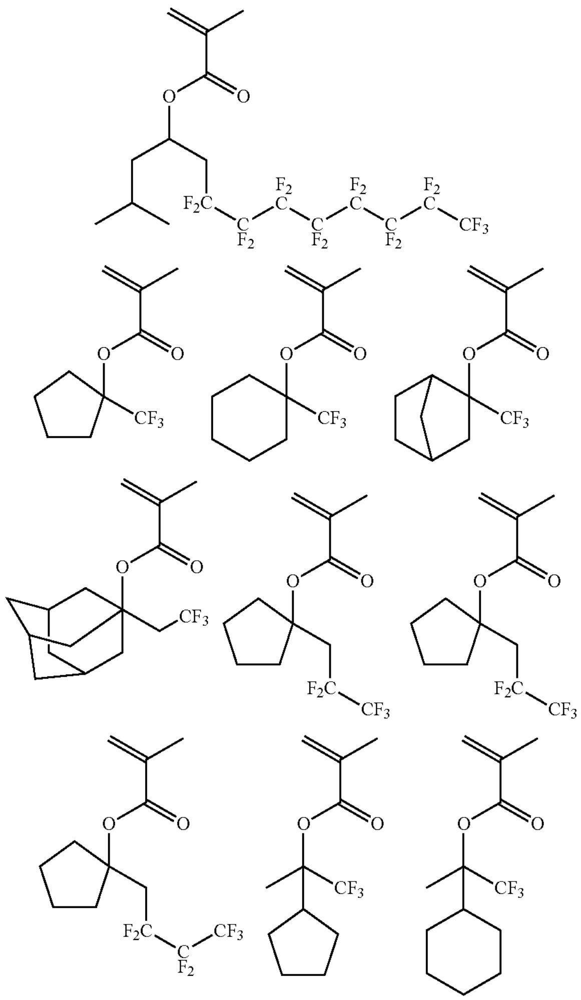
-continued
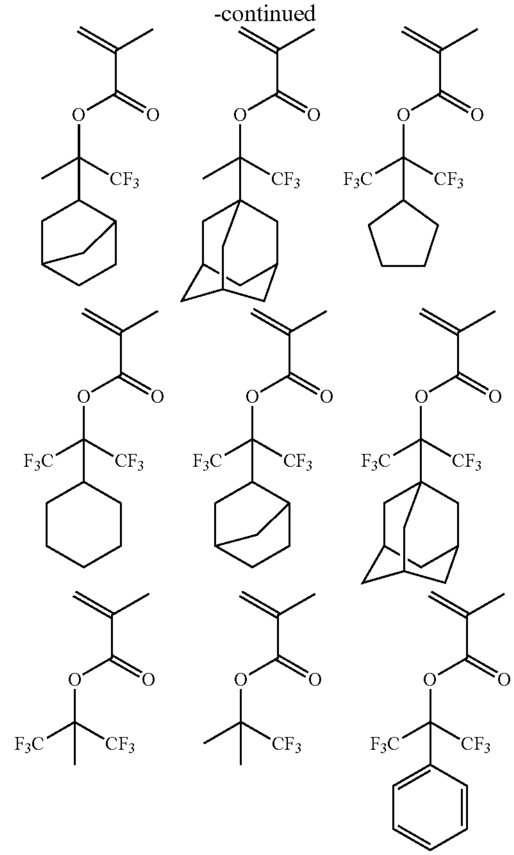
wherein $R^4$ is as defined above.
11. The process of claim 1 wherein the fluorine-containing polymer consists of recurring units (a1), recurring units (a2), and recurring units (a3) wherein the recurring units (a1) to (a3) are incorporated in the range of $0 \le a1 \le 1.0$, $0 \le a2 \le 1.0$, $0.5 \le a1+a2 \le 1.0$, $0 \le a3 < 1.0$, and $a1+a2+a3=1.0$.
* * * * *